US011204553B2

(12) United States Patent
Hatakeyama et al.

(10) Patent No.: US 11,204,553 B2
(45) Date of Patent: Dec. 21, 2021

(54) CHEMICALLY AMPLIFIED RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Masaki Ohashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 98 days.

(21) Appl. No.: 16/528,905

(22) Filed: Aug. 1, 2019

(65) Prior Publication Data

US 2020/0050104 A1 Feb. 13, 2020

(30) Foreign Application Priority Data

Aug. 9, 2018 (JP) ............................ JP2018-150146

(51) Int. Cl.

*G03F 7/004* (2006.01)
*G03F 7/027* (2006.01)
*G03F 7/039* (2006.01)
*G03F 7/038* (2006.01)

(52) U.S. Cl.

CPC ............ *G03F 7/0045* (2013.01); *G03F 7/027* (2013.01); *G03F 7/0382* (2013.01); *G03F 7/0392* (2013.01)

(58) Field of Classification Search

CPC .... G03F 7/0045; G03F 7/0382; G03F 7/0392; G03F 7/027; G03F 7/0397; G03F 7/004

USPC ........................................................ 430/270.1

See application file for complete search history.

(56) References Cited

U.S. PATENT DOCUMENTS

| | | | | |
|---|---|---|---|---|
| 9,176,379 | B2 | 11/2015 | Ichikawa et al. | |
| 9,448,475 | B2 | 9/2016 | Masuyama et al. | |
| 9,563,123 | B2 | 2/2017 | Masuyama et al. | |
| 2006/0223000 | A1* | 10/2006 | Chandhok | G03F 7/0392 430/270.1 |
| 2008/0153030 | A1 | 6/2008 | Kobayashi et al. | |
| 2018/0136558 | A1* | 5/2018 | Hatakeyama | G03F 7/2004 |
| 2018/0143532 | A1* | 5/2018 | Hatakeyama | G03F 7/0045 |

FOREIGN PATENT DOCUMENTS

| | | | |
|---|---|---|---|
| JP | 2013-83957 | A | 5/2013 |
| JP | 2015-172746 | A | 10/2015 |
| JP | 2015-180928 | A | 10/2015 |
| JP | 5852490 | B2 | 2/2016 |
| TW | I379163 | B | 12/2012 |

OTHER PUBLICATIONS

Office Action dated Jan. 4, 2021, issued in counterpart Taiwanese Application No. 108127986. (6 pages).

* cited by examiner

*Primary Examiner* — Caleen O Sullivan

(74) *Attorney, Agent, or Firm* — Westerman, Hattori, Daniels & Adrian, LLP

(57) ABSTRACT

A chemically amplified resist composition comprising a quencher containing an ammonium salt of an iodized or brominated aromatic ring-bearing carboxylic acid, and an acid generator exhibits a sensitizing effect and an acid diffusion suppressing effect and forms a pattern having improved resolution, LWR and CDU.

17 Claims, No Drawings

CHEMICALLY AMPLIFIED RESIST COMPOSITION AND PATTERNING PROCESS

CROSS-REFERENCE TO RELATED APPLICATION

This non-provisional application claims priority under 35 U.S.C. § 119(a) on Patent Application No. 2018-150146 filed in Japan on Aug. 9, 2018, the entire contents of which are hereby incorporated by reference.

TECHNICAL FIELD

This invention relates to a chemically amplified resist composition comprising a quencher containing an ammonium salt of a carboxylic acid having an iodized or brominated aromatic ring, and an acid generator, and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 kV to 30 kV and reached 50 kV in the current mainstream system, with a voltage of 100 kV being under investigation.

As the pattern feature size is reduced, approaching to the diffraction limit of light, light contrast lowers. In the case of positive resist film, a lowering of light contrast leads to reductions of resolution and focus margin of hole and trench patterns.

As the pattern feature size is reduced, the edge roughness (LWR) of line patterns and the critical dimension uniformity (CDU) of hole patterns are regarded significant. It is pointed out that these factors are affected by the segregation or agglomeration of a base polymer and acid generator and the diffusion of generated acid. There is a tendency that as the resist film becomes thinner, LWR becomes greater. A film thickness reduction to comply with the progress of size reduction causes a degradation of LWR, which becomes a serious problem.

The EUV lithography resist must meet high sensitivity, high resolution and low LWR at the same time. As the acid diffusion distance is reduced, LWR is reduced, but sensitivity becomes lower. For example, as the PEB temperature is lowered, the outcome is a reduced LWR, but a lower sensitivity. As the amount of quencher added is increased, the outcome is a reduced LWR, but a lower sensitivity. It is necessary to overcome the tradeoff relation between sensitivity and LWR. It would be desirable to have a resist material having a high sensitivity and resolution as well as improved LWR and CDU.

Patent Document 1 proposes a quencher of iodonium carboxylate type having a carboxylate ion bonded to an iodonium cation. Patent Documents 2 and 3 propose the use of hypervalent iodine compounds as the quencher. Since iodine has a large atomic weight, quenchers in the form of iodized compounds are fully effective for suppressing acid diffusion.

Patent Document 4 discloses a resist material having an iodized benzoic acid or iodized phenol added thereto, which exerts a sensitizing effect due to the strong absorption of iodine atoms.

CITATION LIST

Patent Document 1: JP 5852490 (U.S. Pat. No. 9,176,379)

Patent Document 2: JP-A 2015-180928 (U.S. Pat. No. 9,563,123)

Patent Document 3: JP-A 2015-172746 (U.S. Pat. No. 9,448,475)

Patent Document 4: JP-A 2013-83957

SUMMARY OF INVENTION

As the wavelength of light becomes shorter, the energy density thereof becomes higher and hence, the number of photons generated upon exposure becomes smaller. A variation in photon number causes variations in LWR and CDU. As the exposure dose increases, the number of photons increases, leading to a less variation of photon number. Thus there is a tradeoff relationship between sensitivity and resolution, LWR and CDU. In particular, the EUV lithography resist materials have the tendency that a lower sensitivity leads to better LWR and CDU.

An increase in acid diffusion also causes degradation of resolution, LWR and CDU. This is because acid diffusion not only causes image blur, but also proceeds non-uniformly in a resist film. For suppressing acid diffusion, it is effective to lower the PEB temperature, to use a bulky acid which is least diffusive, or to increase the amount of quencher added. However, any of these means for reducing acid diffusion results in a lowering of sensitivity. Either the means for reducing photon variation or the means for reducing acid diffusion variation leads to a lowering of resist sensitivity.

An object of the invention is to provide a chemically amplified resist composition which exerts a high sensitizing effect and an acid diffusion suppressing effect and has improved resolution, LWR and CDU, and a pattern forming process using the same.

A significant increase of acid generation efficiency and a significant suppression of acid diffusion must be achieved before the tradeoff relationship between sensitivity and resolution, LWR and CDU can be overcome.

Iodine is substantially absorptive to EUV of wavelength 13.5 nm and EB because of its large atomic weight, and releases many secondary electrons upon exposure because of many electron orbits in its molecule. The secondary electrons thus released provide energy transfer to an acid generator, achieving a high sensitizing effect.

The inventors have found that when an ammonium salt of a carboxylic acid having an iodized or brominated aromatic ring is added as the quencher to a chemically amplified resist composition comprising an acid generator, the resulting resist composition forms a resist film which exerts a high sensitizing effect and an acid diffusion suppressing effect, experiences no film thickness loss after development, and has a high sensitivity, minimized LWR and improved CDU.

In one aspect, the invention provides a chemically amplified resist composition comprising a quencher containing an ammonium salt of a carboxylic acid having an iodized or brominated aromatic ring, and an acid generator.

In a preferred embodiment, the ammonium salt has the formula (1) or (2).

(1)

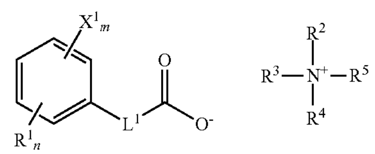

(2)

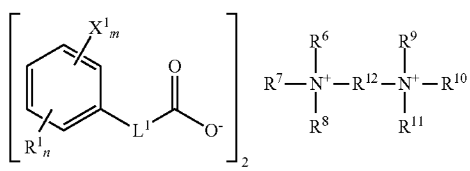

Herein $R^1$ is hydrogen, hydroxyl, fluorine, chlorine, amino, nitro, or cyano group, or a $C_1$-$C_6$ alkyl, $C_1$-$C_6$ alkoxy, $C_2$-$C_6$ acyloxy or $C_1$-$C_6$ alkylsulfonyloxy group, which may be substituted with halogen, or —$NR^{1A}$—C(═O)—$R^{1B}$ or —$NR^{1A}$—C(═O)—O—$R^{1B}$, wherein $R^{1A}$ is hydrogen or a $C_1$-$C_6$ alkyl group, $R^{1B}$ is a $C_1$-$C_6$ alkyl or $C_2$-$C_8$ alkenyl group. $R^2$ to $R^{11}$ are each independently hydrogen or a $C_1$-$C_{24}$ monovalent hydrocarbon group which may contain a halogen, hydroxyl, carboxyl, ether bond, ester bond, thioether bond, thioester bond, thionoester bond, dithioester bond, amino, nitro, sulfone or ferrocenyl moiety, at least two of $R^2$ to $R^5$ may bond together to form a ring, $R^2$ and $R^3$, taken together, may form ═C($R^{2A}$)($R^{3A}$), wherein $R^{2A}$ and $R^{3A}$ are each independently hydrogen or a $C_1$-$C_{16}$ monovalent hydrocarbon group, $R^{2A}$ and $R^4$ may bond together to form a ring with the carbon and nitrogen atoms to which they are attached, the ring optionally containing a double bond, oxygen, sulfur or nitrogen atom. $R^{12}$ is a $C_2$-$C_{12}$ alkanediyl group which may contain an ether bond, ester bond, carboxy moiety, thioester bond, thionoester bond or dithioester bond. $X^1$ is iodine or bromine, and may be the same or different when m is at least 2. $L^1$ is a single bond or a $C_1$-$C_{20}$ divalent linking group which may contain an ether bond, carbonyl moiety, ester bond, amide bond, sultone ring, lactam ring, carbonate bond, halogen, hydroxyl or carboxyl moiety, m and n each are an integer, meeting $1 \le m \le 5$, $0 \le n \le 3$, and $1 \le m+n \le 5$.

In a preferred embodiment, the acid generator is capable of generating sulfonic acid, imidic acid or methide acid.

The resist composition may further comprise a base polymer, preferably a base polymer comprising recurring units of at least one type selected from recurring units having the formulae (f1) to (f3).

(f1)

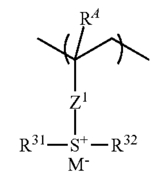

(f2)

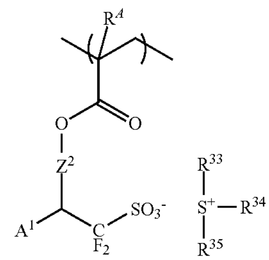

(f3)

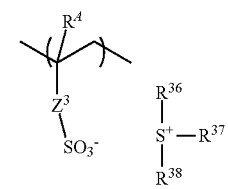

Herein $R^A$ is each independently hydrogen or methyl. $Z^1$ is a single bond, phenylene, —O—$Z^{11}$—, —C(═O)—O—$Z^{11}$—, or —C(═O)—NH—$Z^{11}$—, $Z^{11}$ is a $C_1$-$C_6$ alkanediyl group, $C_2$-$C_6$ alkenediyl group or phenylene group, which may contain a carbonyl moiety, ester bond, ether bond or hydroxyl moiety. $Z^2$ is a single bond, —$Z^{21}$—C(═O)—O—, —$Z^{21}$—O—, or —$Z^{21}$—O—C(═O)—, $Z^{21}$ is a $C_1$-$C_{12}$ alkanediyl group which may contain a carbonyl moiety, ester bond or ether bond. $Z^3$ is a single bond, methylene, ethylene, phenylene, fluorinated phenylene, —O—$Z^{31}$—, —C(═O)—O—$Z^{31}$—, or —C(═O)—NH—$Z^{31}$—, $Z^{31}$ is a $C_1$-$C_6$ alkanediyl group, $C_2$-$C_6$ alkenediyl group, phenylene, fluorinated phenylene, or trifluoromethyl-substituted phenylene group, which may contain a carbonyl moiety, ester bond, ether bond or hydroxyl moiety. $R^{31}$ to $R^{38}$ are each independently a $C_1$-$C_{20}$ monovalent hydrocarbon group which may contain a heteroatom, any two of $R^{33}$, $R^{34}$ and $R^{35}$ or any two of $R^{36}$, $R^{37}$ and $R^{38}$ may bond together to form a ring with the sulfur atom to which they are attached. $A^1$ is hydrogen or trifluoromethyl. $M^-$ is a non-nucleophilic counter ion.

In a preferred embodiment, the acid generator also functions as a base polymer. More preferably, the acid generator is a polymer comprising recurring units of at least one type selected from recurring units having the formulae (f1) to (f3).

(f1)

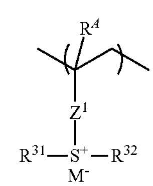

-continued (f2)

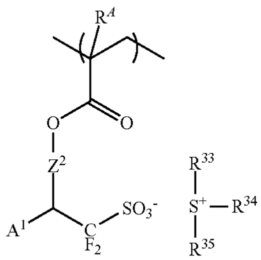

(f3)

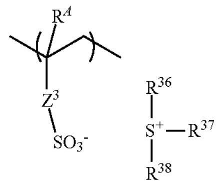

Herein $R^A$ is each independently hydrogen or methyl. $Z^1$ is a single bond, phenylene, —O—$Z^{11}$—, —C(═O)—O—$Z^{11}$—, or —C(═O)—NH—$Z^{11}$—, $Z^{11}$ is a $C_1$-$C_6$ alkanediyl group, $C_2$-$C_6$ alkenediyl group or phenylene group, which may contain a carbonyl moiety, ester bond, ether bond or hydroxyl moiety. $Z^2$ is a single bond, —$Z^{21}$—C(═O)—O—, —$Z^{21}$—O—, or —$Z^{21}$—O—C(═O)—, $Z^{21}$ is a $C_1$-$C_{12}$ alkanediyl group which may contain a carbonyl moiety, ester bond or ether bond. $Z^3$ is a single bond, methylene, ethylene, phenylene, fluorinated phenylene, —O—$Z^{31}$—, —C(═O)—O—$Z^{31}$—, or —C(═O)—NH—$Z^{31}$—, $Z^{31}$ is a $C_1$-$C_6$ alkanediyl group, $C_2$-$C_6$ alkenediyl group, phenylene, fluorinated phenylene, or trifluoromethyl-substituted phenylene group, which may contain a carbonyl moiety, ester bond, ether bond or hydroxyl moiety. $R^{31}$ to $R^{38}$ are each independently a $C_1$-$C_{20}$ monovalent hydrocarbon group which may contain a heteroatom, any two of $R^{33}$, $R^{34}$ and $R^{35}$ or any two of $R^{36}$, $R^{37}$ and $R^{38}$ may bond together to form a ring with the sulfur atom to which they are attached. $A^1$ is hydrogen or trifluoromethyl. $M^-$ is a non-nucleophilic counter ion.

In a preferred embodiment, the base polymer comprises recurring units having the formula (a1) or recurring units having the formula (a2).

(a1)

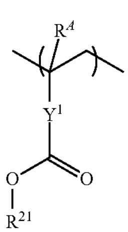

(a2)

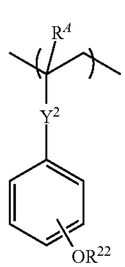

Herein $R^A$ is each independently hydrogen or methyl, $R^{21}$ and $R^{22}$ are each independently an acid labile group, $Y^1$ is a single bond, phenylene, naphthylene, or a $C_1$-$C_{12}$ linking group containing an ester bond and/or lactone ring, and $Y^2$ is a single bond or ester bond.

In one preferred embodiment, the resist composition is a chemically amplified positive resist composition.

In another preferred embodiment, the base polymer is an acid labile group-free polymer. Typically the resist composition is a chemically amplified negative resist composition.

The resist composition may further comprise an organic solvent and/or a surfactant.

In another aspect, the invention provides a pattern forming process comprising the steps of coating the resist composition defined above onto a substrate, baking, exposing the resulting resist film to high-energy radiation, and developing the exposed resist film in a developer.

In a preferred embodiment, the high-energy radiation is ArF excimer laser of wavelength 193 am, KrF excimer laser of wavelength 248 nm, EB or EUV of wavelength 3 to 15 nm.

Advantageous Effects of Invention

Since the ammonium salt of an iodized or brominated aromatic ring-bearing carboxylic acid contains an iodine or bromine atom featuring substantial light absorption, a resist film containing the ammonium salt as a quencher exhibits a sensitizing effect due to secondary electrons released therefrom upon exposure. Since iodine or bromine has a large atomic weight, the resist film exerts an acid diffusion suppressing effect. In addition, since the ammonium salt is fully alkali soluble, a high dissolution contrast is obtainable. Thus the resist film exhibits high resolution, high sensitivity, minimal LWR, and improved CDU as a positive or negative resist film subject to alkaline development or as a negative resist film subject to organic solvent development.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. The term "iodized" or "brominated" compound means an iodine or bromine-substituted compound. In chemical formulae, Me stands for methyl, and Ac for acetyl.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity

Chemically Amplified Resist Composition

The chemically amplified resist composition of the invention is defined as comprising a quencher containing an ammonium salt of a carboxylic acid having an iodized or brominated aromatic ring, and an acid generator. The ammonium salt of carboxylic acid undergoes ion exchange with an acid generated from the acid generator to form another ammonium salt and release an iodized or brominated aromatic ring-bearing carboxylic acid. The ammonium salt of an iodized or brominated aromatic ring-bearing carboxylic acid has an acid trapping ability and an acid diffusion suppressing effect.

The acid diffusion suppressing effect and contrast enhancing effect of the ammonium salt of an iodized or brominated aromatic ring-bearing carboxylic acid are valid in both the positive or negative pattern formation by alkaline development and the negative pattern formation by organic solvent development.

Quencher

The quencher in the chemically amplified resist composition contains an ammonium salt of an iodized or brominated aromatic ring-bearing carboxylic acid. The preferred ammonium salt has the formula (1) or (2).

(1)

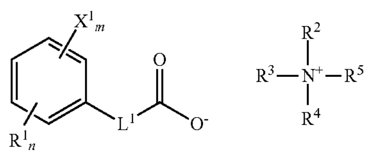

(2)

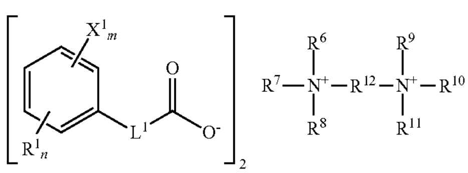

In formulae (1) and (2), $R^1$ is a hydrogen atom, hydroxyl group, fluorine atom, chlorine atom, amino group, nitro group or cyano group, or a $C_1$-$C_6$ alkyl, $C_1$-$C_6$ alkoxy, $C_2$-$C_6$ acyloxy or $C_1$-$C_6$ alkylsulfonyloxy group, which may be substituted with halogen, or —$NR^{1A}$—C(═O)—$R^{1B}$ or —$NR^{1A}$—C(═O)—O—$R^{1B}$. $R^{1A}$ is hydrogen or a $C_1$-$C_6$ alkyl group, and $R^{1B}$ is a $C_1$-$C_6$ alkyl group or $C_2$-$C_8$ alkenyl group.

The $C_1$-$C_6$ alkyl group may be straight, branched or cyclic, and examples thereof include methyl, ethyl, n-propyl, isopropyl, cyclopropyl, n-butyl, isobutyl, sec-butyl, tert-butyl, cyclobutyl, n-pentyl, cyclopentyl, n-hexyl, and cyclohexyl. Examples of the alkyl moiety in the $C_1$-$C_6$ alkoxy, $C_2$-$C_7$ acyloxy and $C_2$-$C_7$ alkoxycarbonyl groups are as exemplified above for the alkyl group. Examples of the alkyl moiety in the $C_1$-$C_4$ alkylsulfonyloxy group are those of 1 to 4 carbons among the examples mentioned above for the alkyl group. The $C_2$-$C_8$ alkenyl group may be straight, branched or cyclic, and examples thereof include vinyl, 1-propenyl, and 2-propenyl. Among others, $R^1$ is preferably fluorine, chlorine, hydroxyl, amino, $C_1$-$C_3$ alkyl, $C_1$-$C_3$ alkoxy, $C_2$-$C_4$ acyloxy, —$NR^{1A}$—C(═O)—$R^{1B}$ or —$NR^{1A}$—C(═O)—O—$R^{1B}$.

$R^2$ to $R^{11}$ are each independently hydrogen or a $C_1$-$C_{24}$ monovalent hydrocarbon group which may contain a halogen atom, hydroxyl moiety, carboxyl moiety, ether bond, ester bond, thioether bond, thioester bond, thionoester bond, dithioester bond, amino moiety, nitro moiety, sulfone moiety or ferrocenyl moiety. At least two of $R^2$ to $R^5$ may bond together to form a ring, $R^2$ and $R^3$, taken together, may form ═C($R^{2A}$)($R^{3A}$), wherein $R^{2A}$ and $R^{3A}$ are each independently hydrogen or a $C_1$-$C_{16}$ monovalent hydrocarbon group, $R^{2A}$ and $R^4$ may bond together to form a ring with the carbon and nitrogen atoms to which they are attached, and the ring may contain a double bond, oxygen, sulfur or nitrogen atom.

The monovalent hydrocarbon group may be straight, branched or cyclic. Examples thereof include $C_1$-$C_{24}$ alkyl groups, $C_2$-$C_{24}$ alkenyl groups, $C_2$-$C_{24}$ alkynyl groups, $C_6$-$C_{20}$ aryl groups, $C_7$-$C_{20}$ aralkyl groups, and combinations thereof.

$R^{12}$ is a $C_2$-$C_{12}$ alkanediyl group which may contain an ether bond, ester bond, carboxyl moiety, thioester bond, thionoester bond or dithioester bond. The alkanediyl group may be straight, branched or cyclic, and examples thereof include methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, cyclopentanediyl, and cyclohexanediyl.

$X^1$ is an iodine or bromine atom, and may be the same or different when m is at least 2.

$L^1$ is a single bond or a $C_1$-$C_{20}$ divalent linking group which may contain an ether bond, carbonyl moiety, ester bond, amide bond, sultone ring, lactam ring, carbonate bond, halogen atom, hydroxyl moiety or carboxyl moiety.

The subscripts m and n each are an integer, meeting $1 \leq m \leq 5$, $0 \leq n \leq 3$, and $1 \leq m+n \leq 5$, preferably $1 \leq m \leq 3$ and $0 \leq n \leq 2$.

Examples of the anion in the ammonium salt having fonnula (1) or (2) are shown below, but not limited thereto.

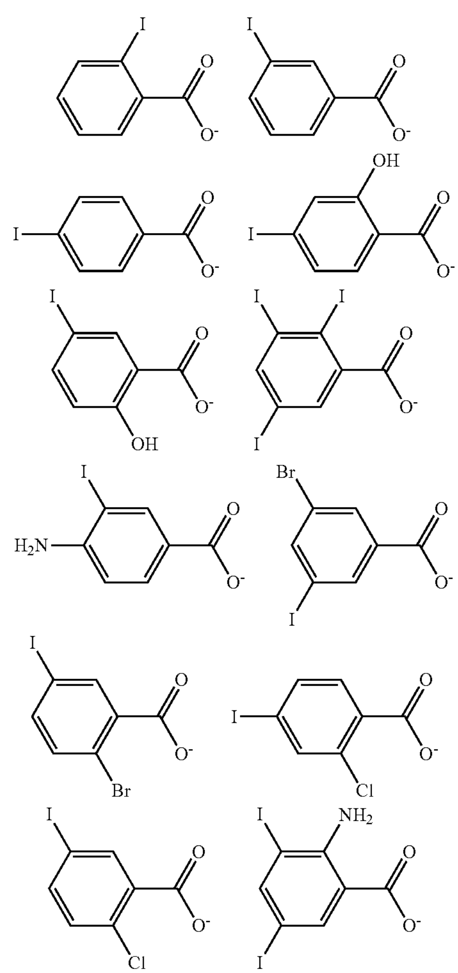

-continued
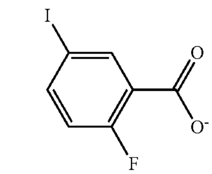
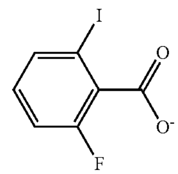
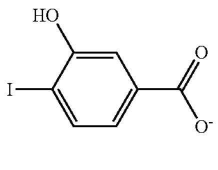
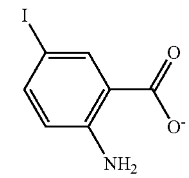
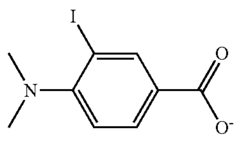
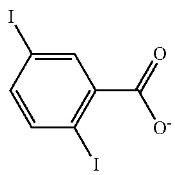
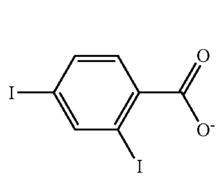
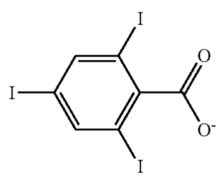
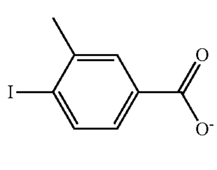
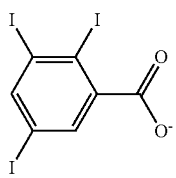
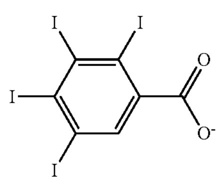
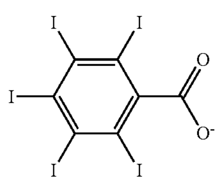
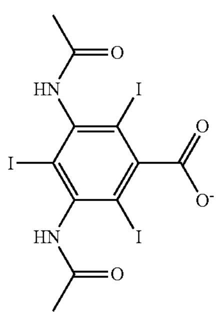
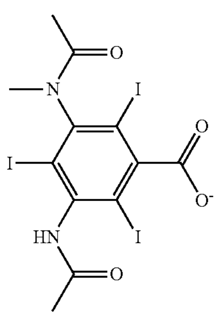
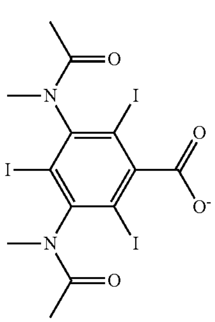
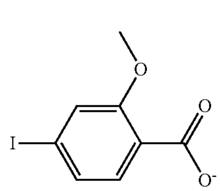
-continued
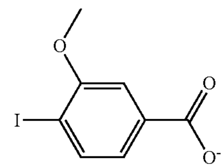
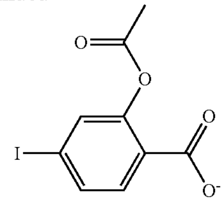
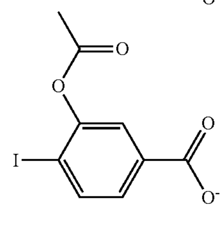
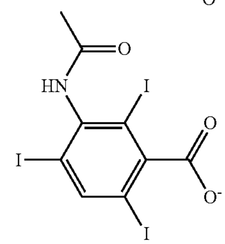
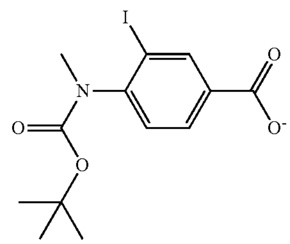
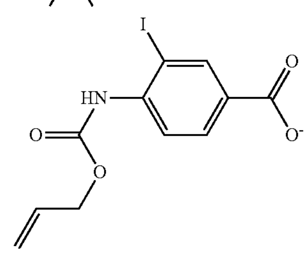
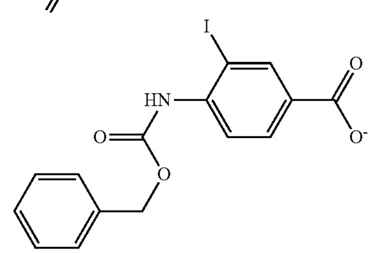
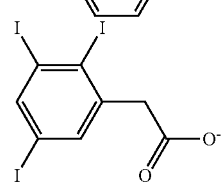
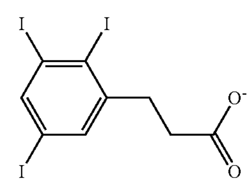
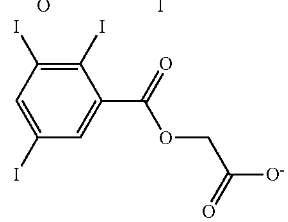
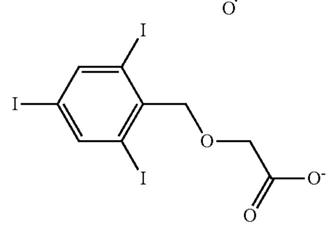

-continued
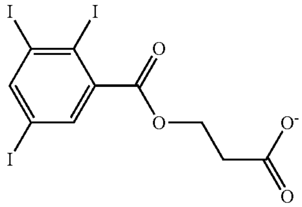
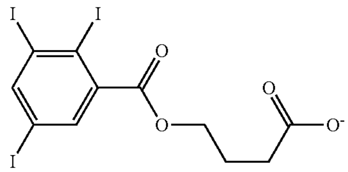
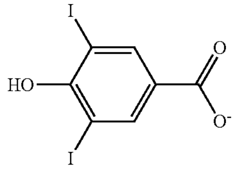
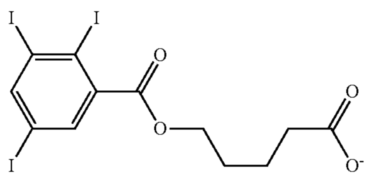
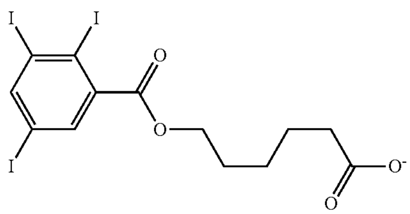
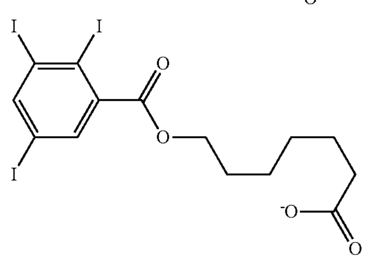
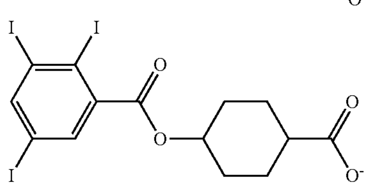
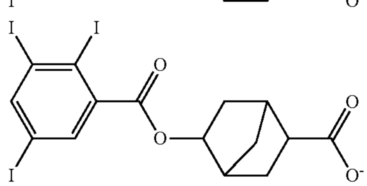
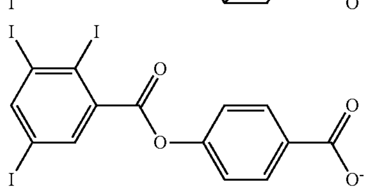
-continued
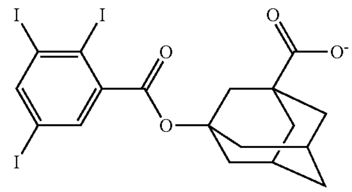
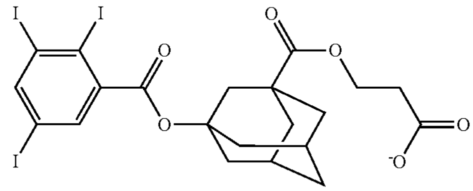
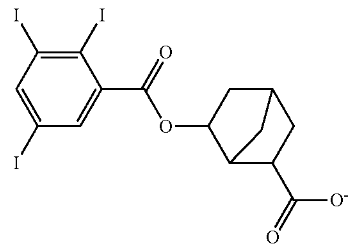
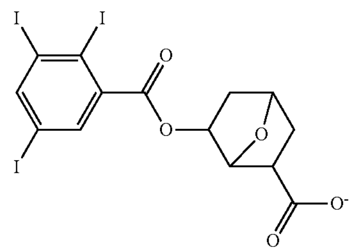
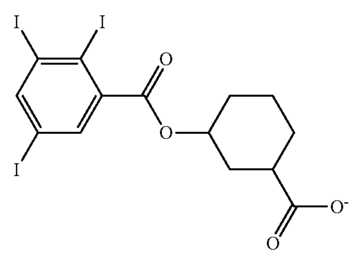
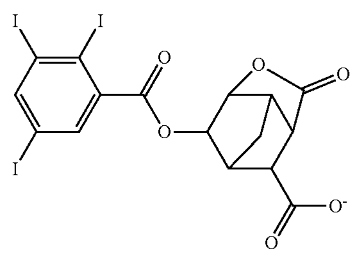
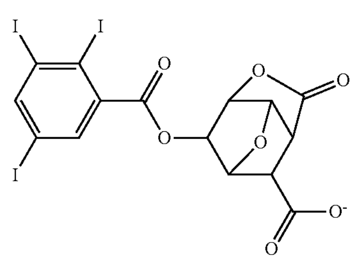

-continued
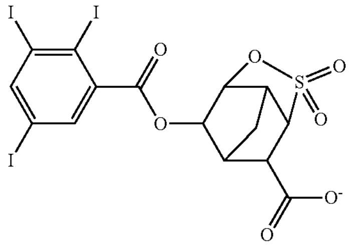
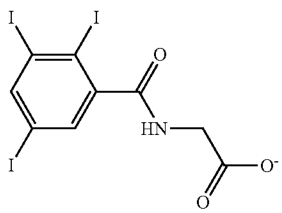
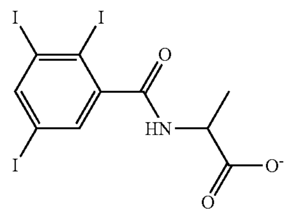
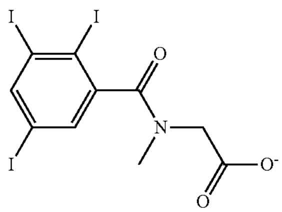
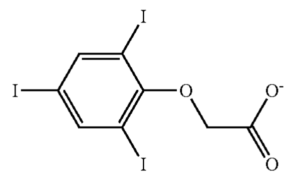
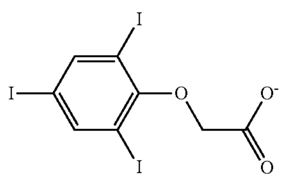
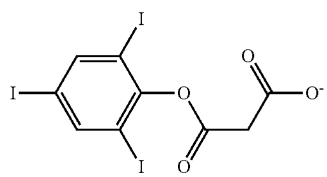
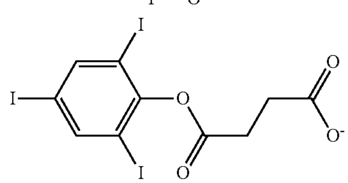
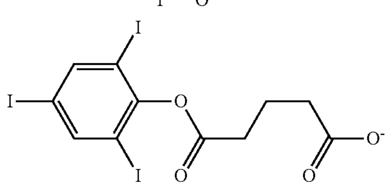
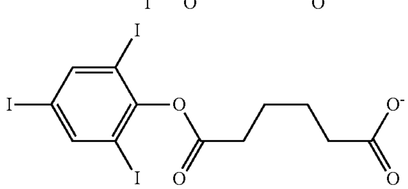
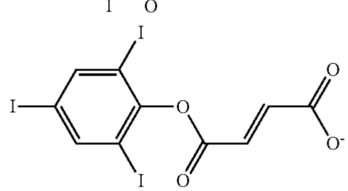
-continued
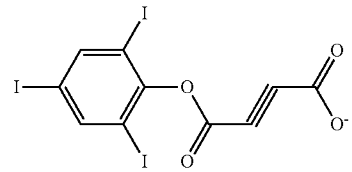
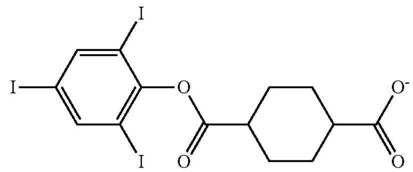
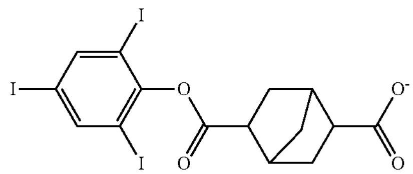
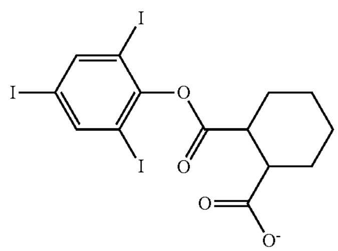
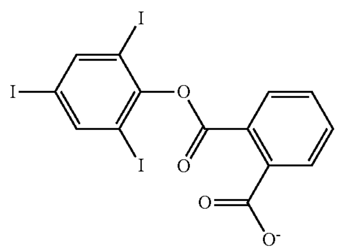
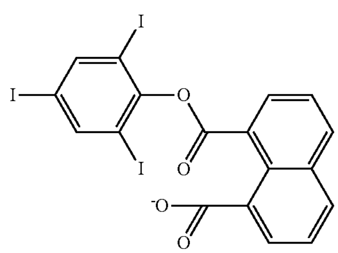
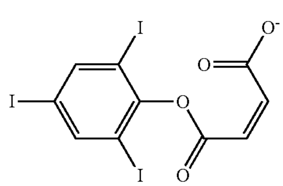
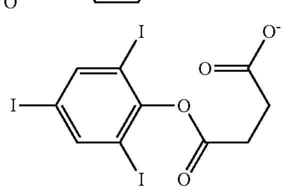
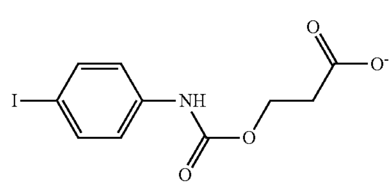

-continued
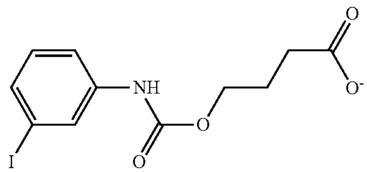
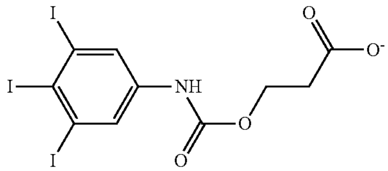
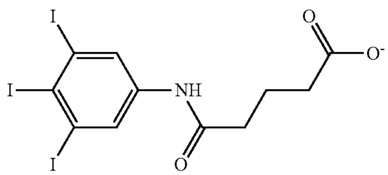
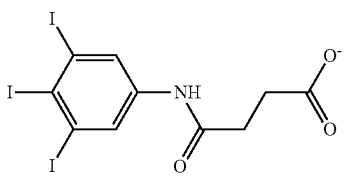
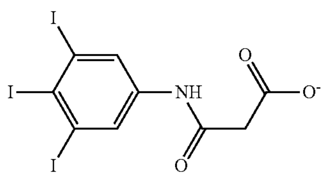
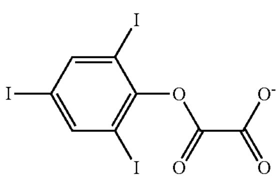
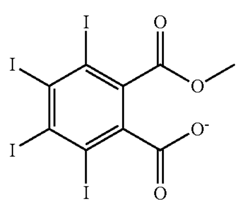
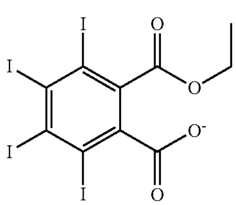
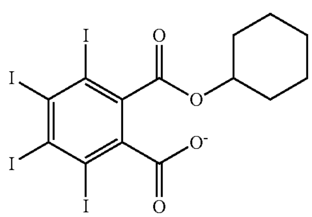
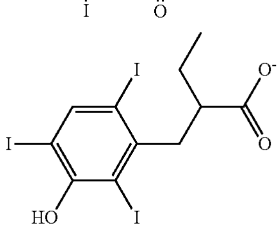
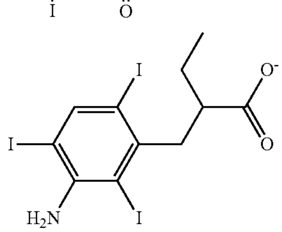
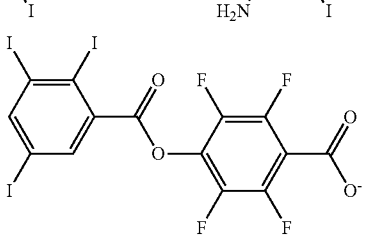
-continued
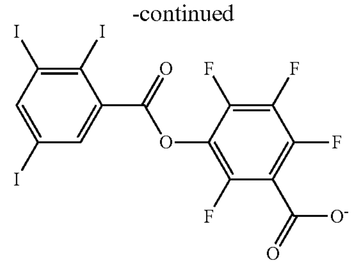
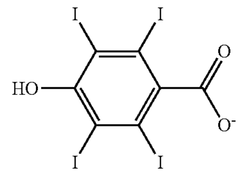
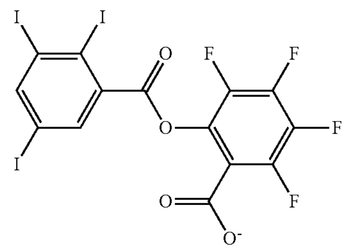
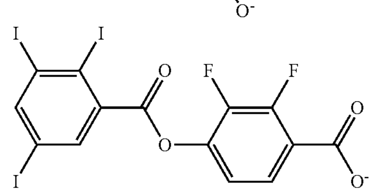
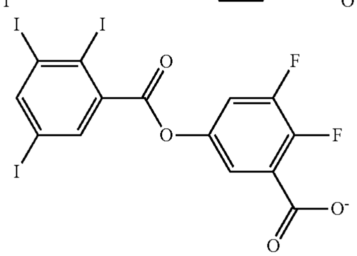
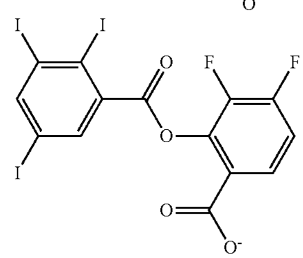
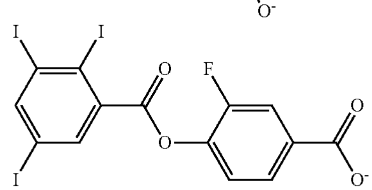
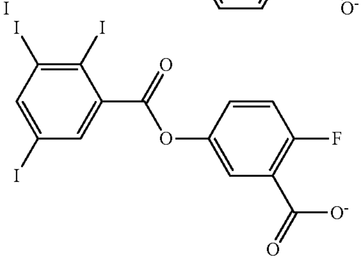

-continued
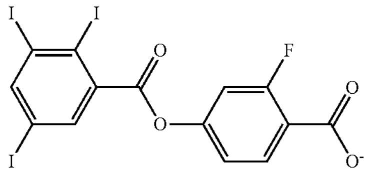
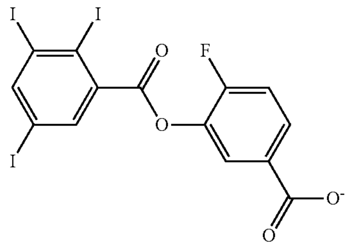
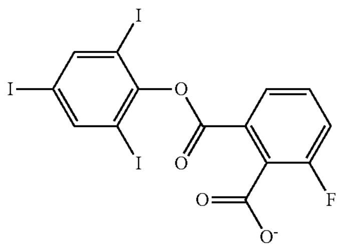
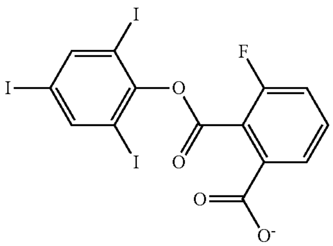
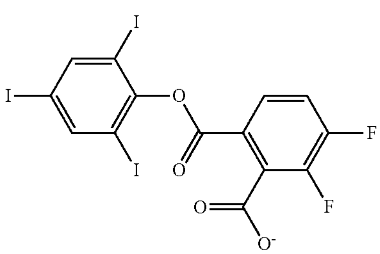
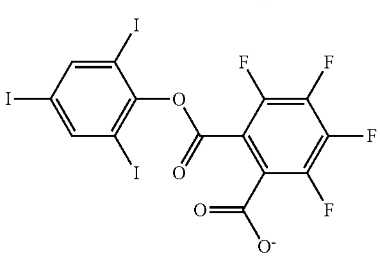
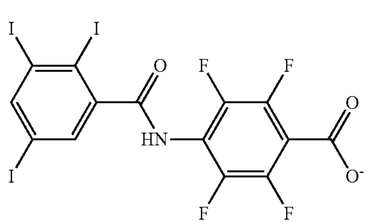
-continued
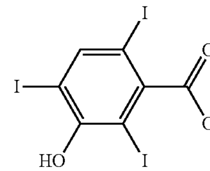
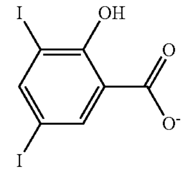
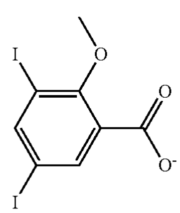
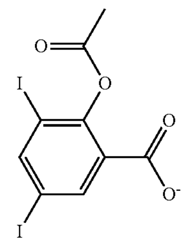
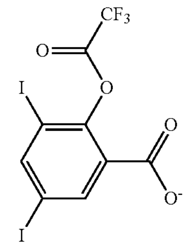
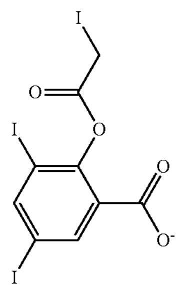
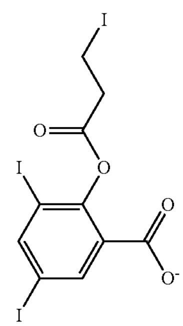
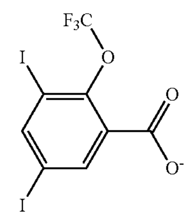
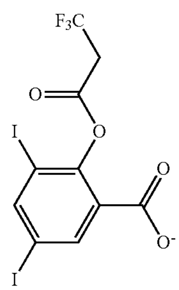
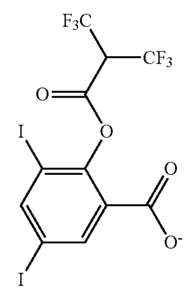
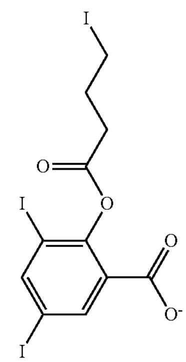
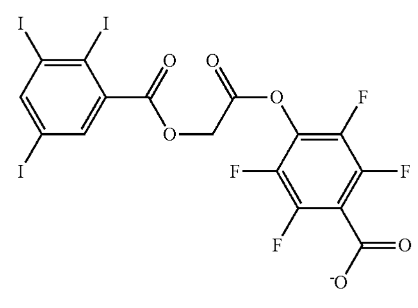
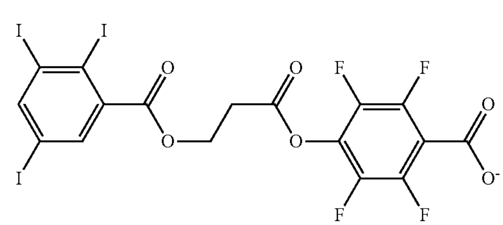

-continued
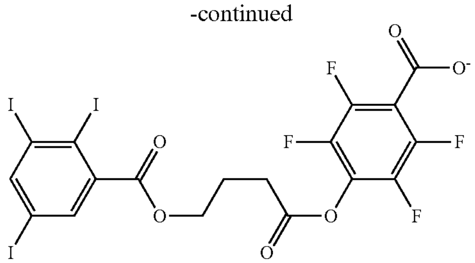
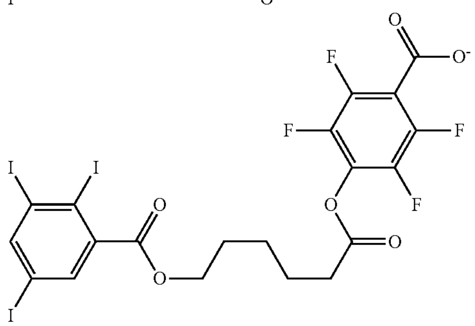
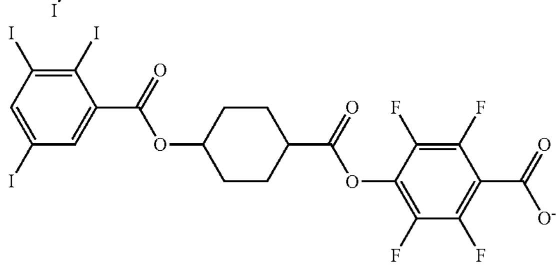
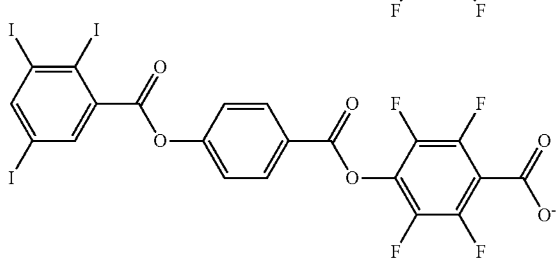
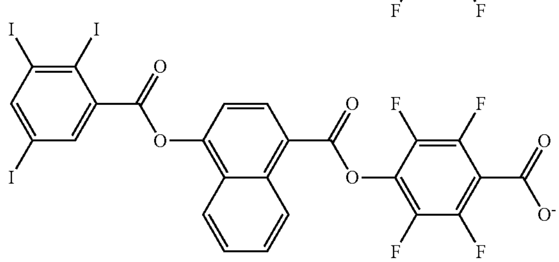
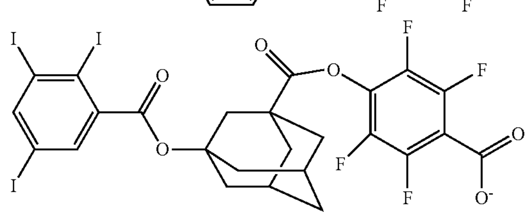
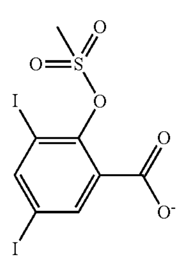
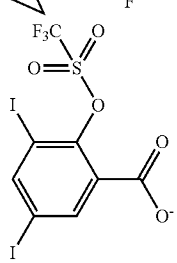
-continued
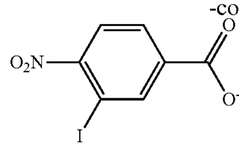
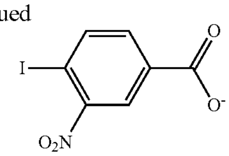
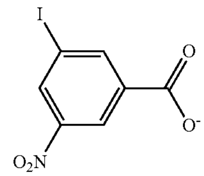
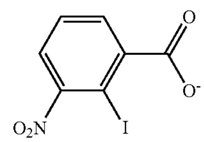
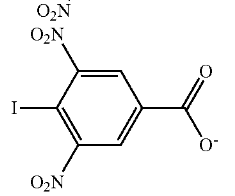
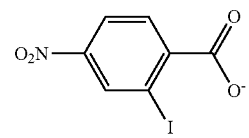
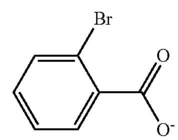
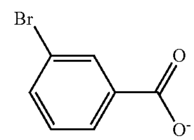
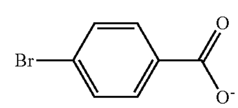
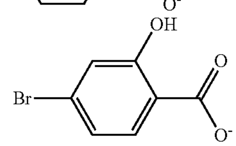
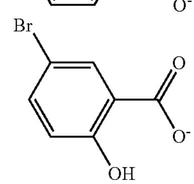
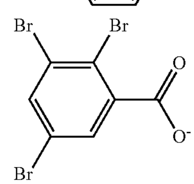
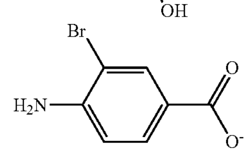
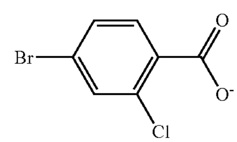
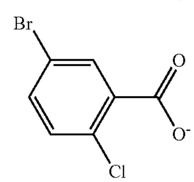
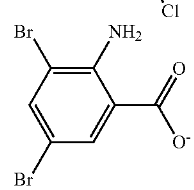
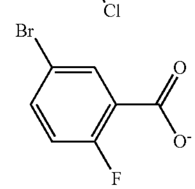
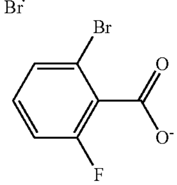
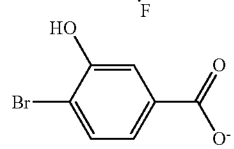
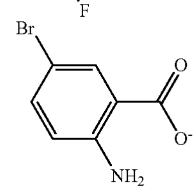
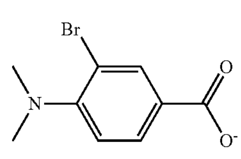
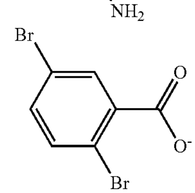

-continued
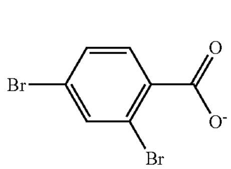
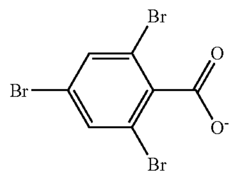
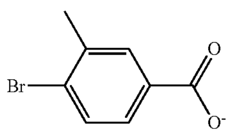
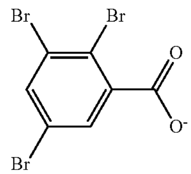
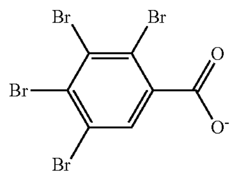
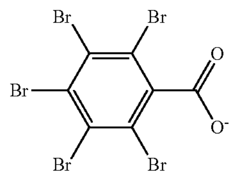
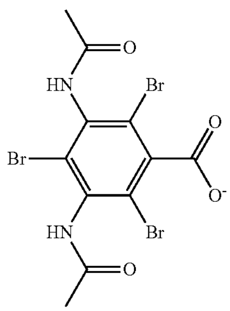
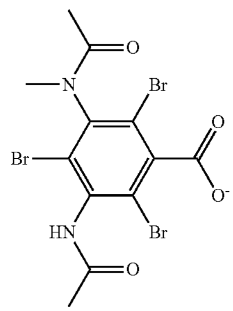
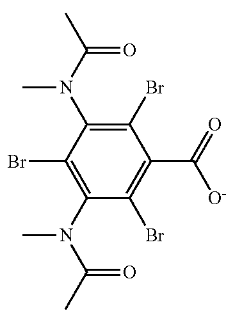
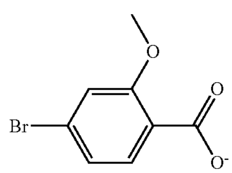
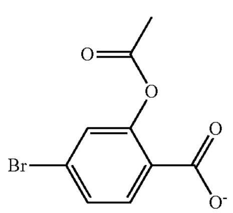
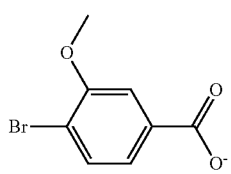
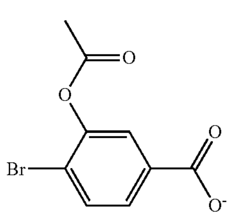
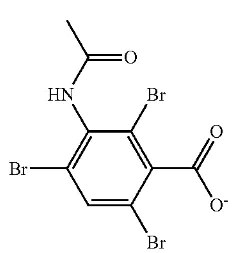
-continued
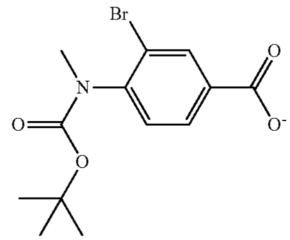
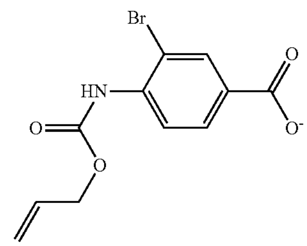
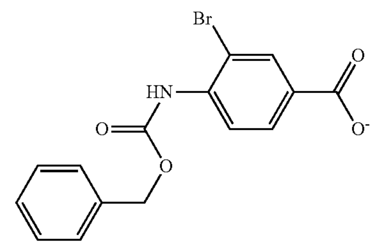
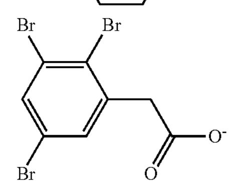
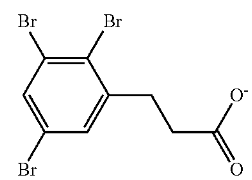
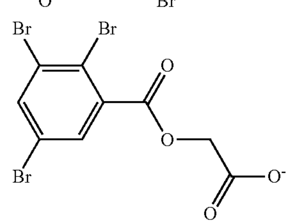
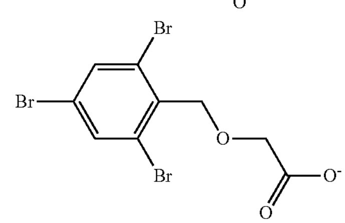
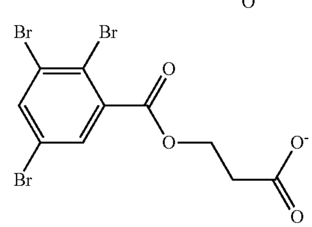
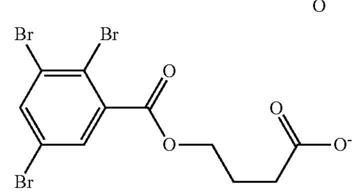

-continued
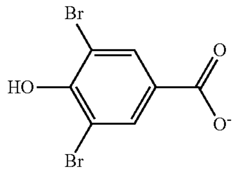
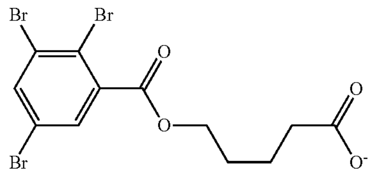
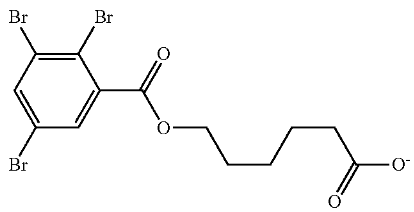
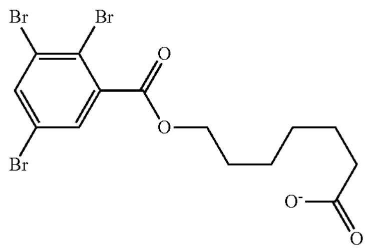
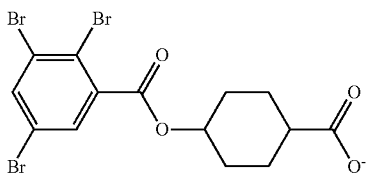
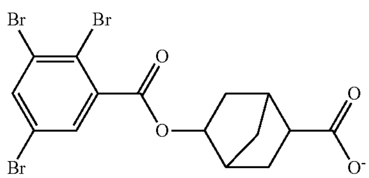
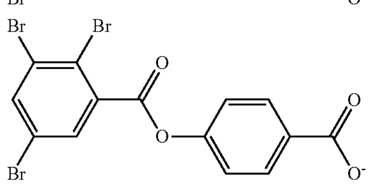
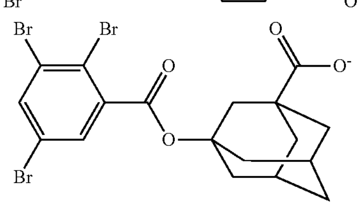
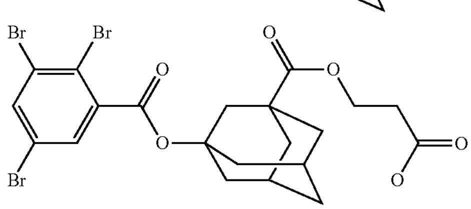
-continued
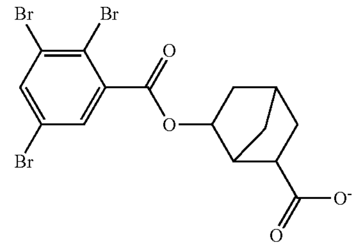
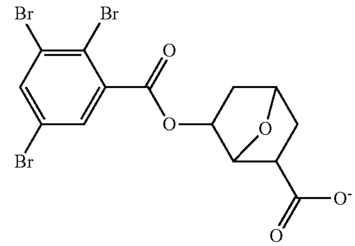
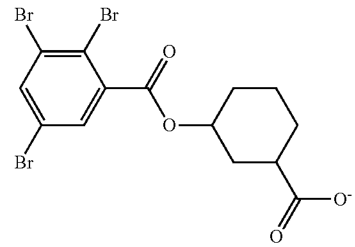
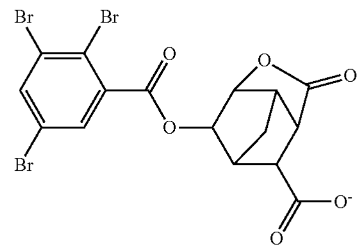
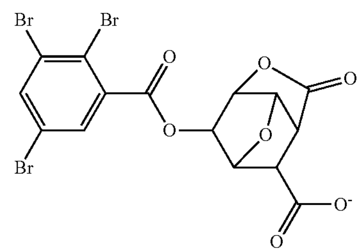
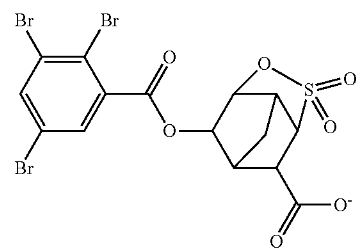
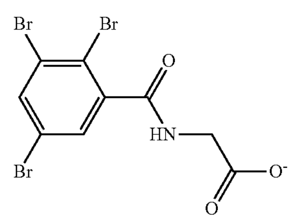
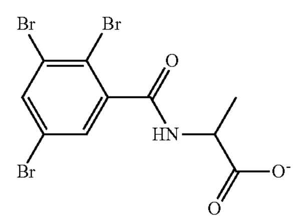

-continued
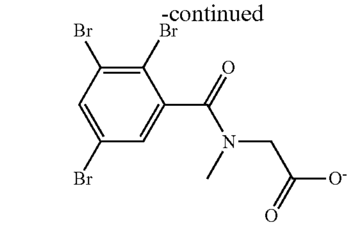
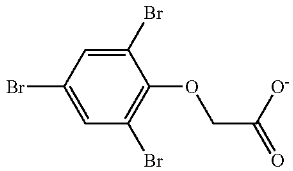
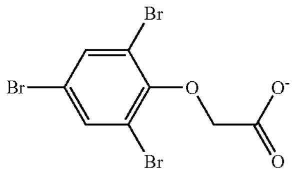
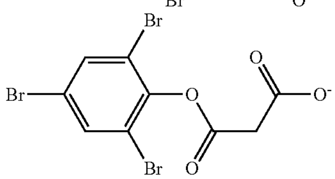
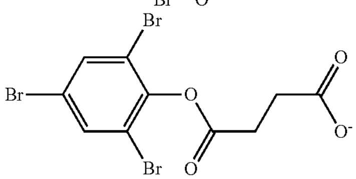
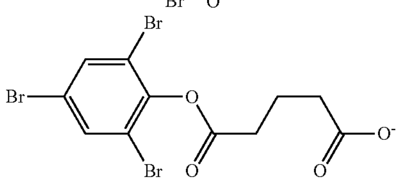
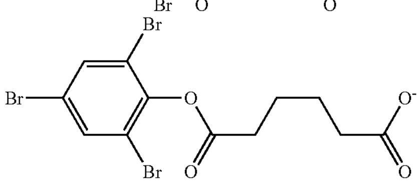
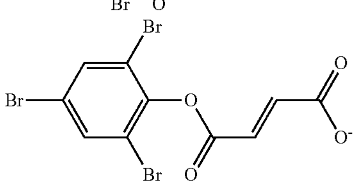
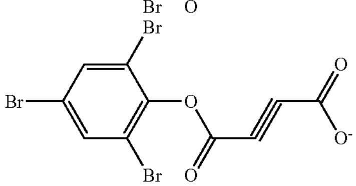
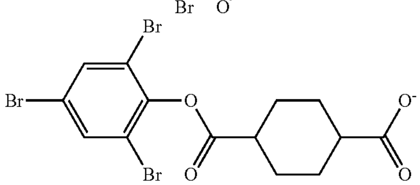
-continued
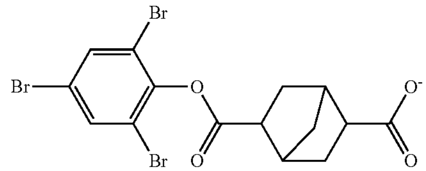
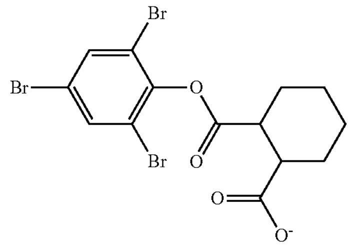
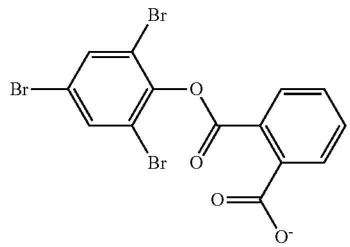
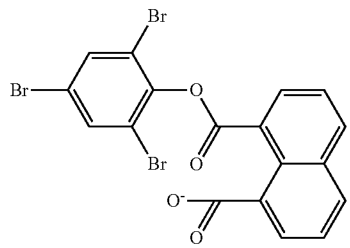
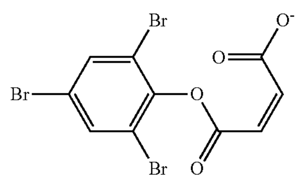
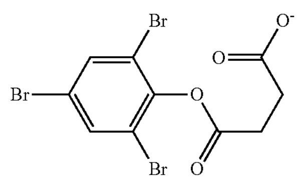
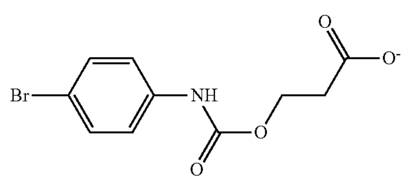
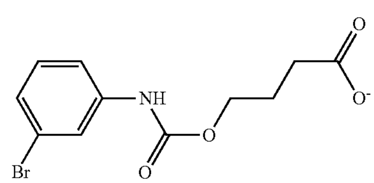

-continued
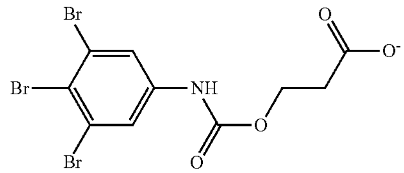
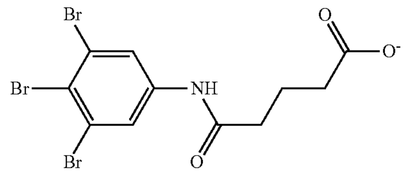
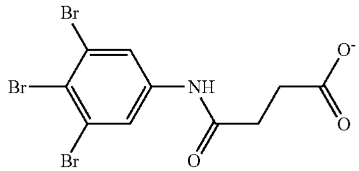
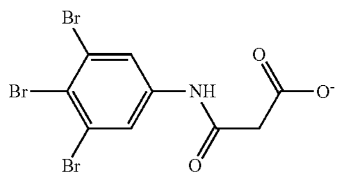
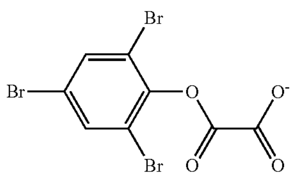
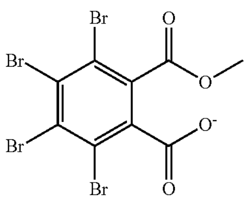
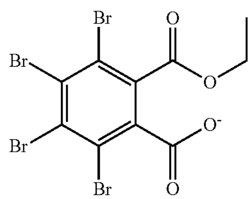
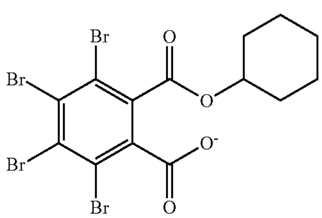
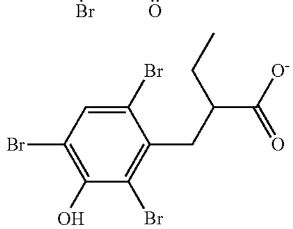
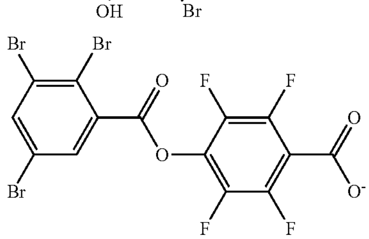
-continued
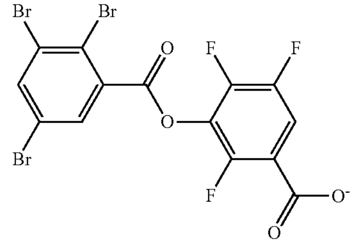
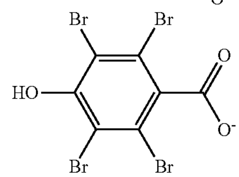
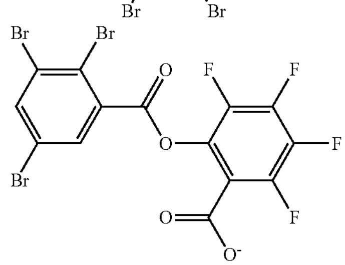
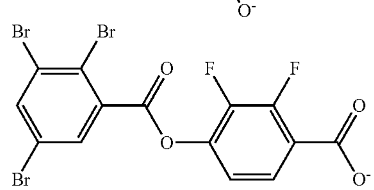
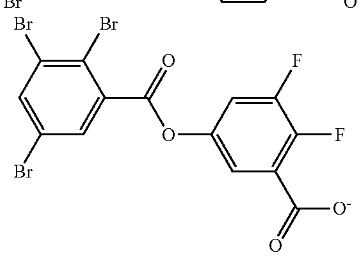
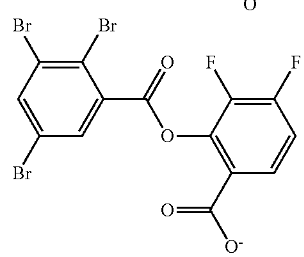
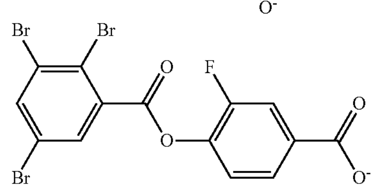
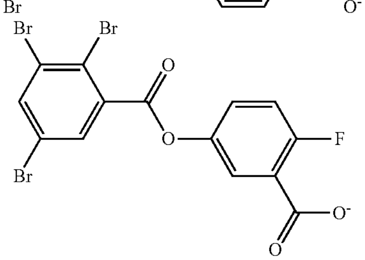

-continued
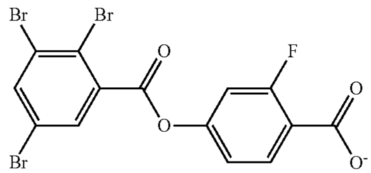
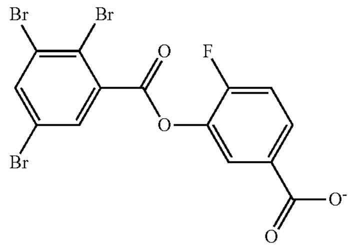
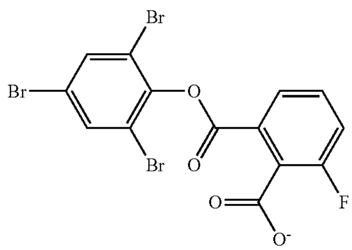
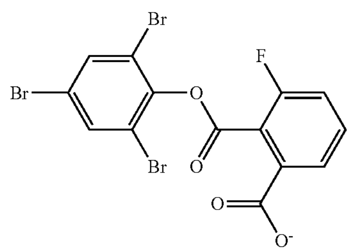
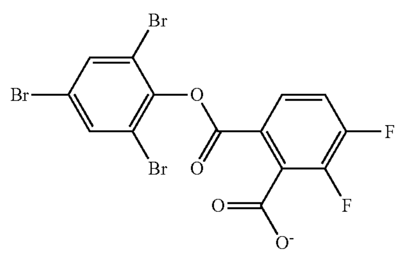
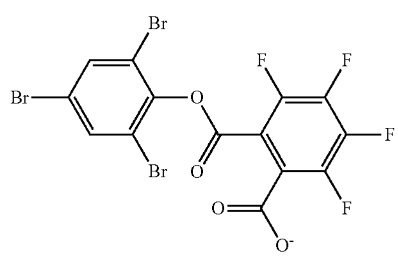
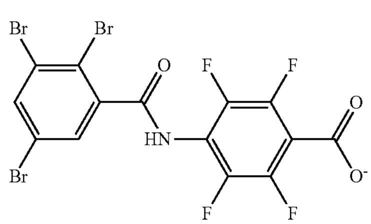
-continued
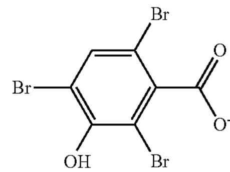
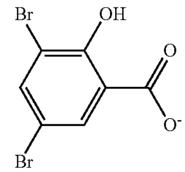
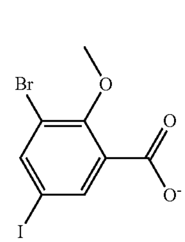
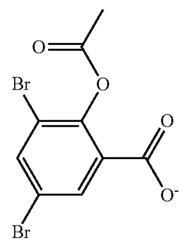
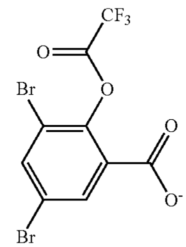
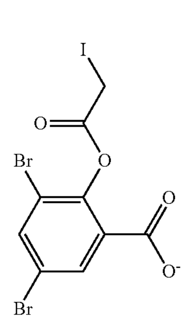
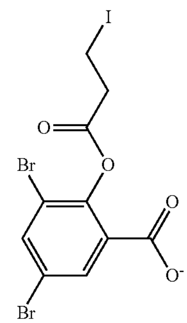
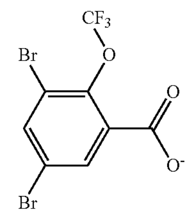
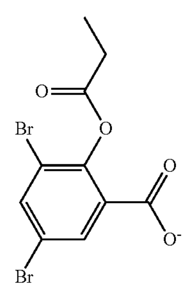
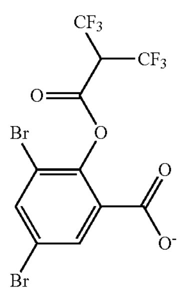
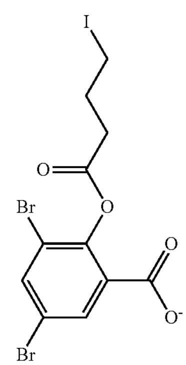
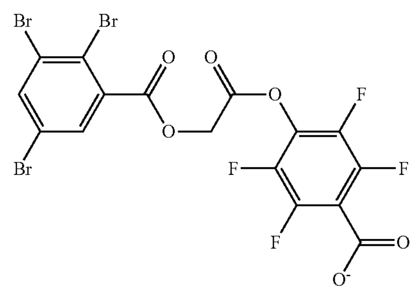
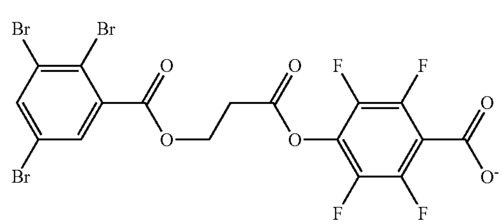

-continued
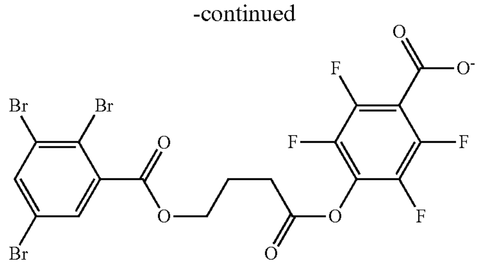
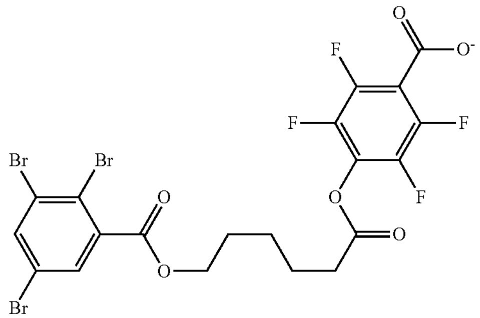
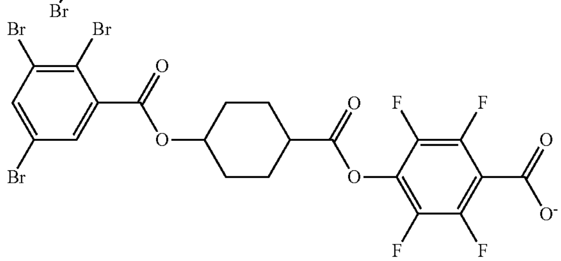
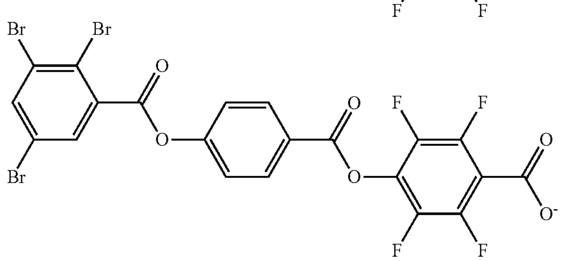
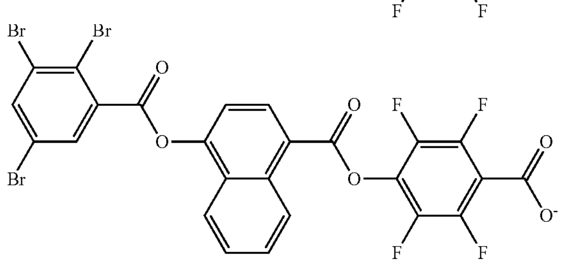
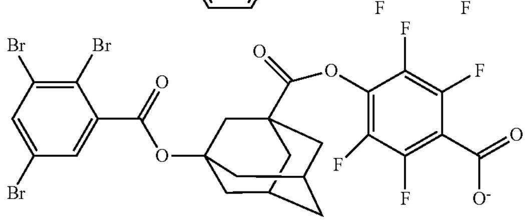
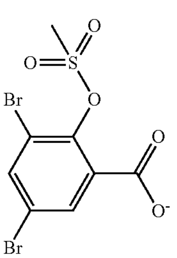
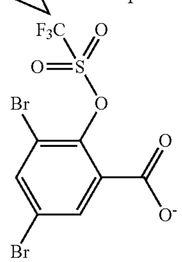
-continued
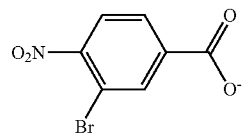
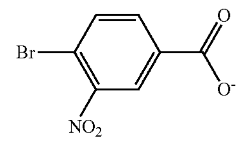
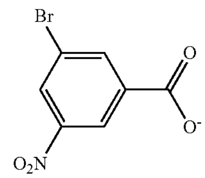
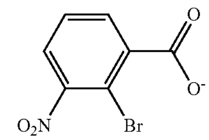
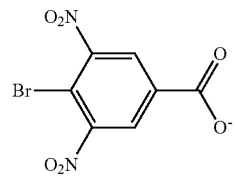
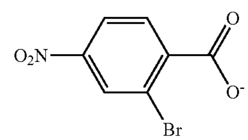
Examples of the cation in the ammonium salt having formula (1) are shown below, but not limited thereto.
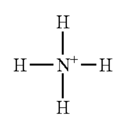
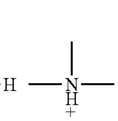
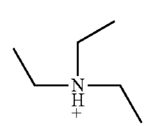
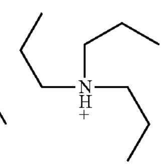
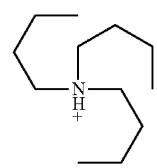
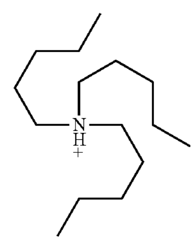
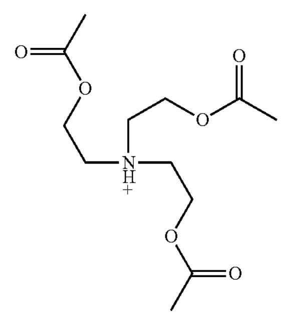
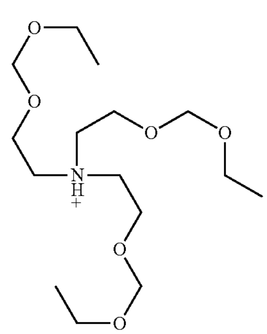
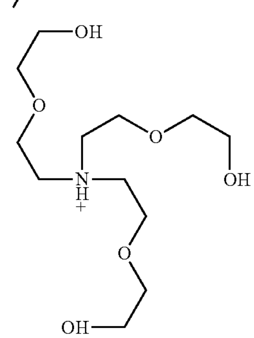

-continued
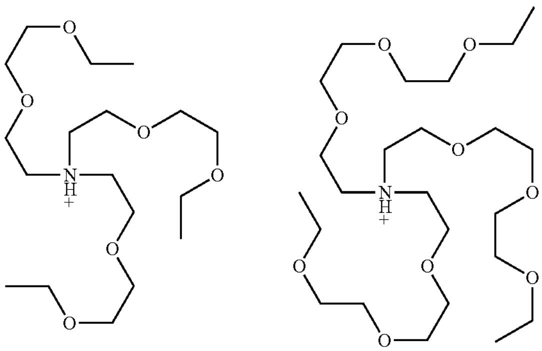
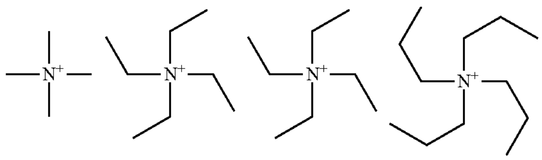
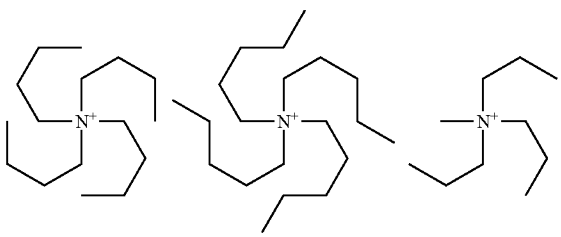
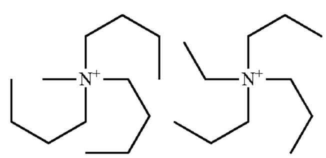
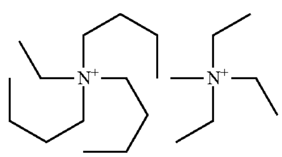
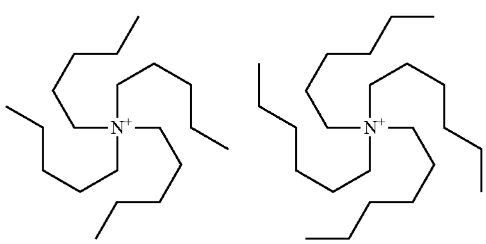
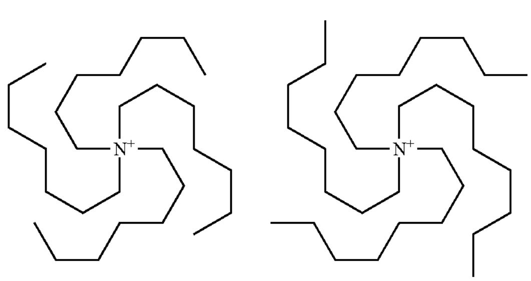
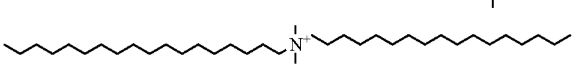
-continued
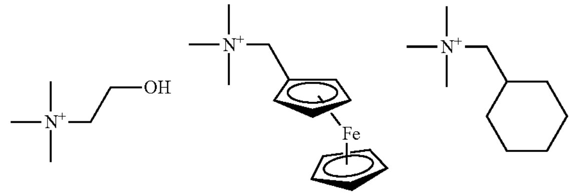
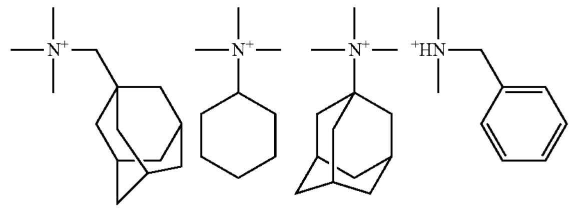
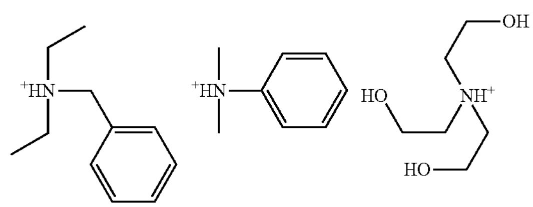
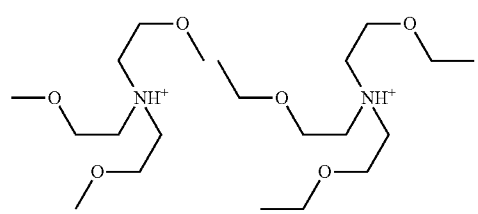
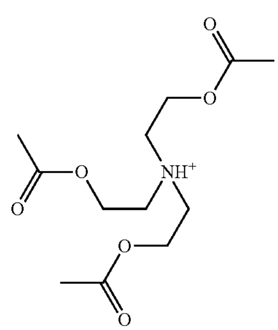
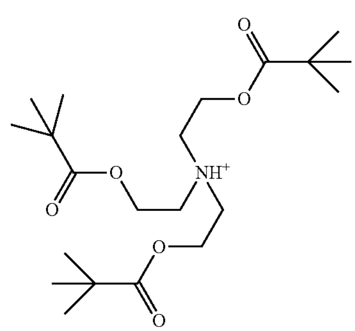

-continued
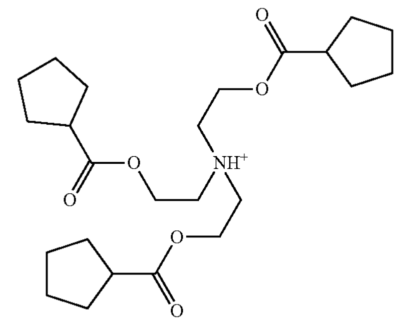
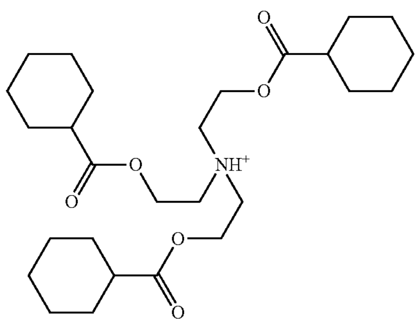
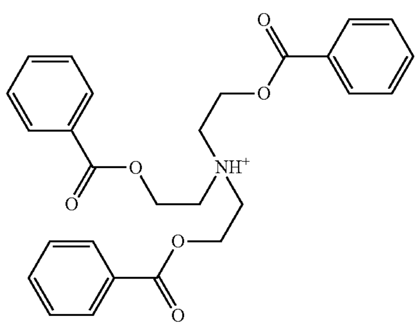
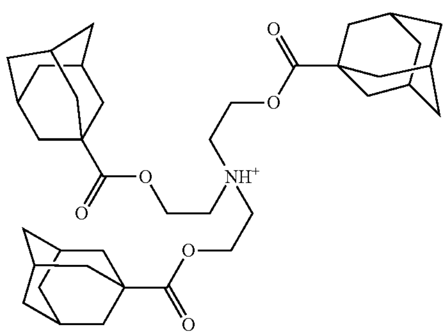
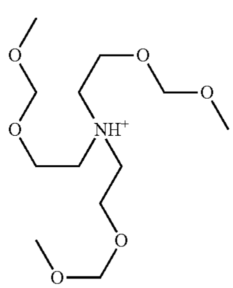
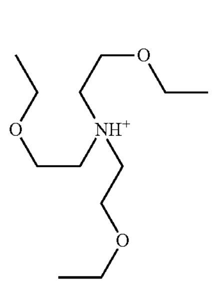
-continued
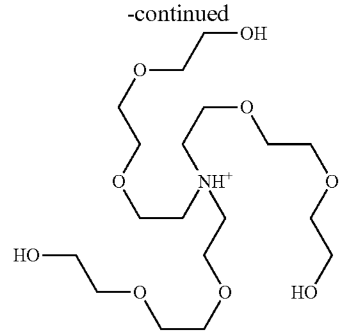
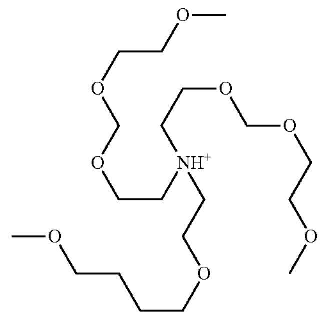
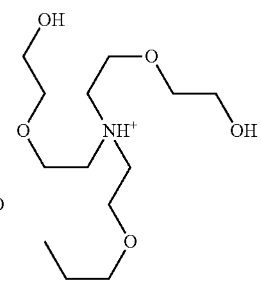
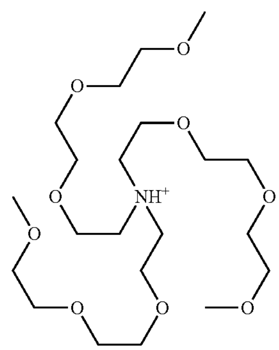
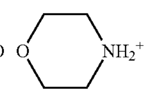
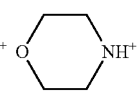
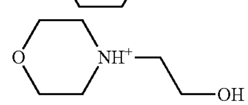
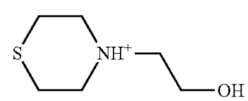
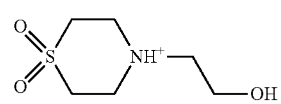
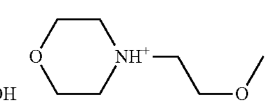
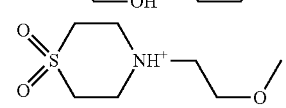
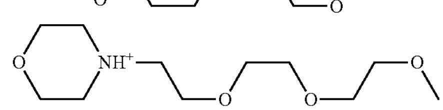
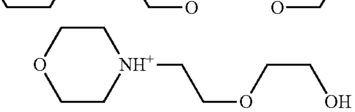
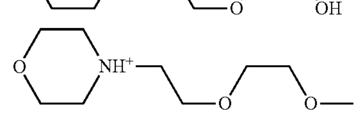
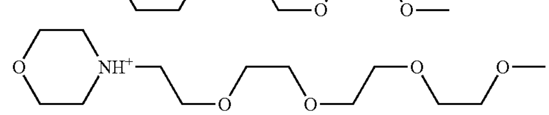
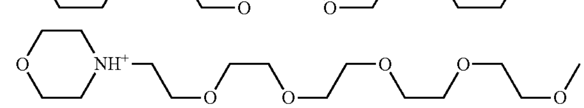

-continued
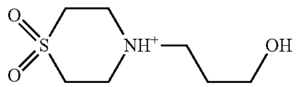
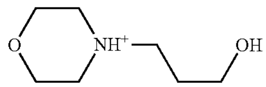
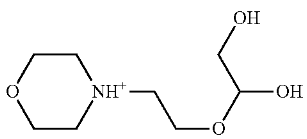
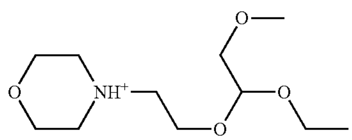
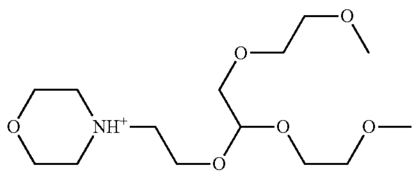
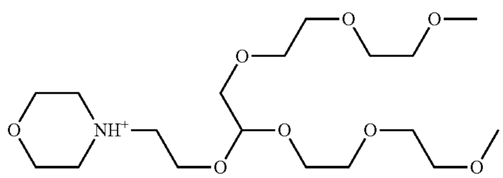
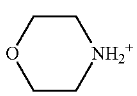
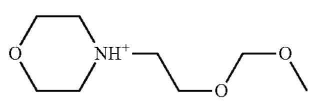
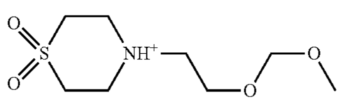
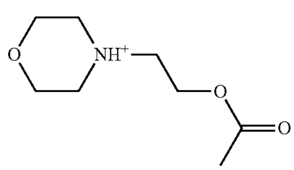
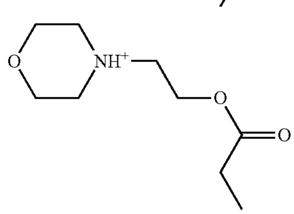
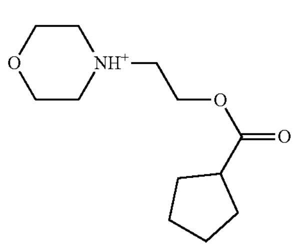
-continued
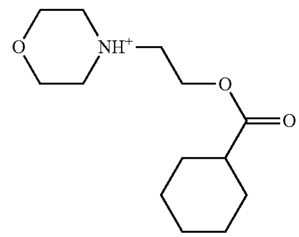
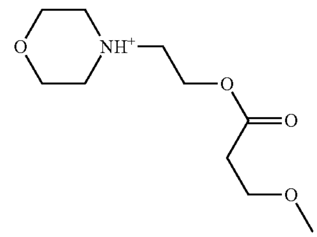
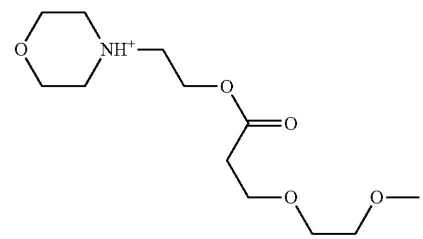
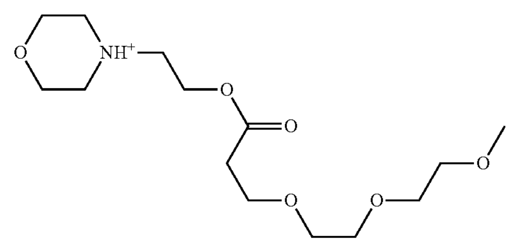
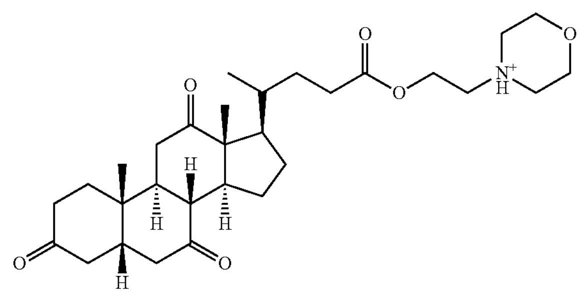
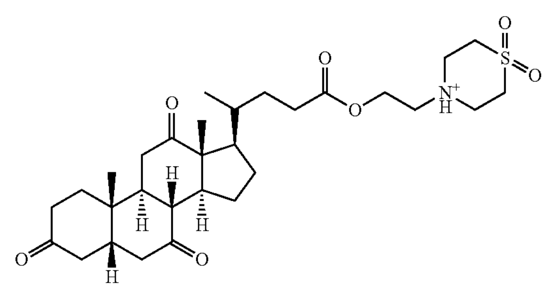

-continued
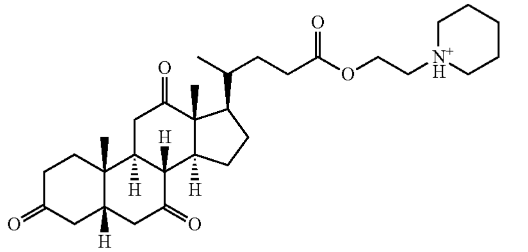
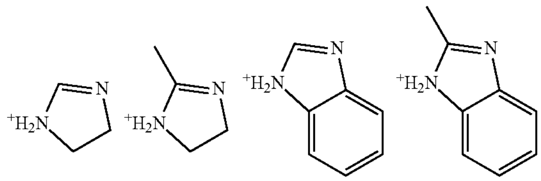
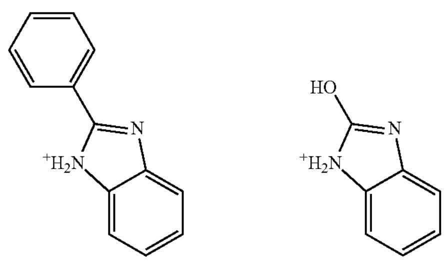
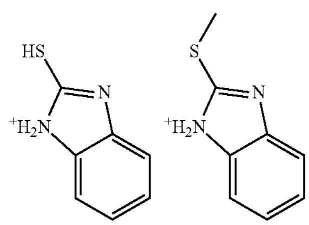
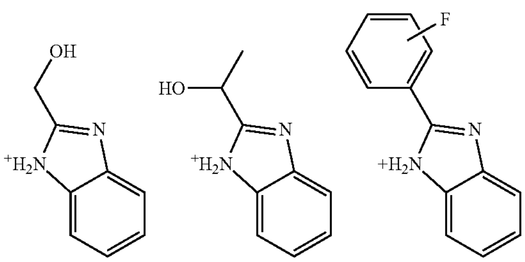
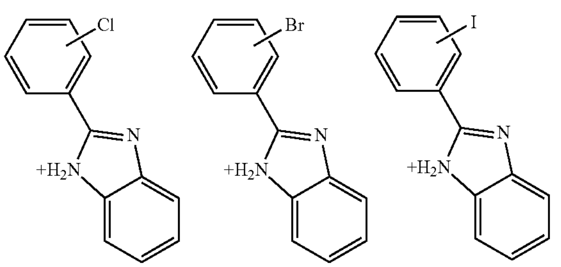
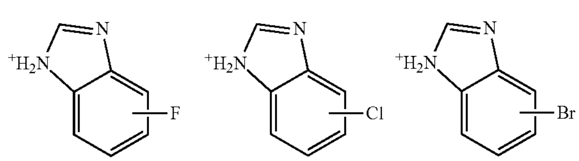
-continued
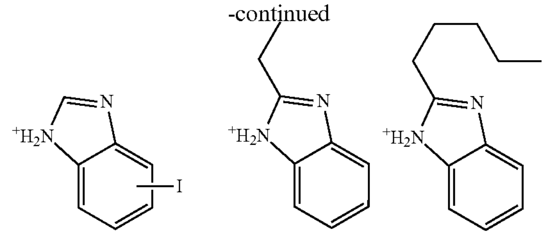
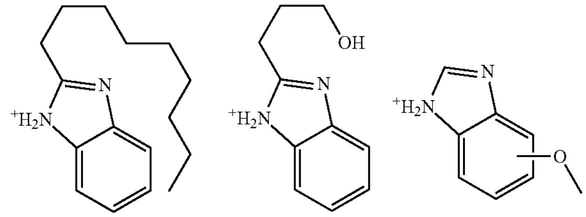
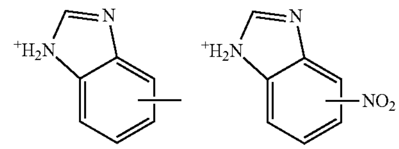
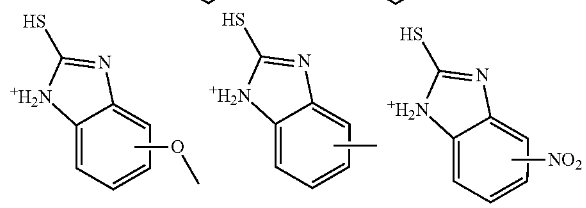
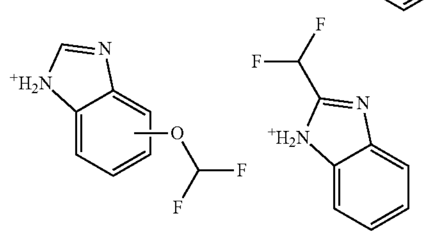
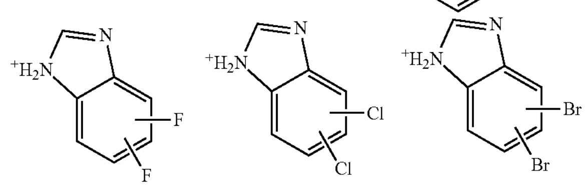
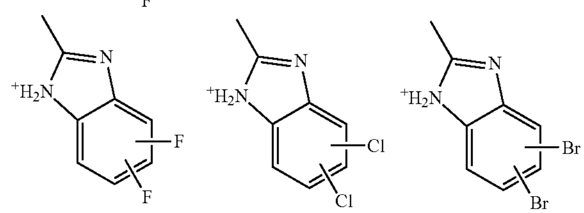
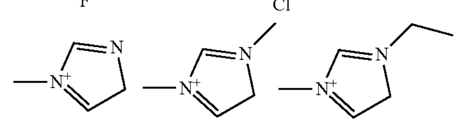
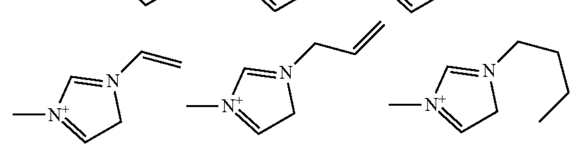
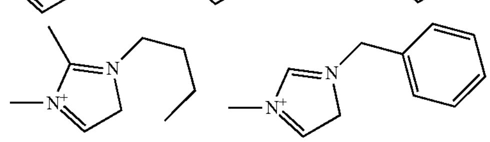

-continued
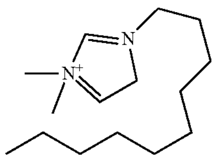
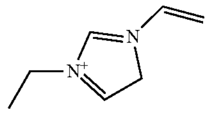
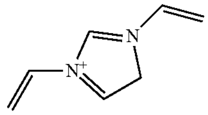
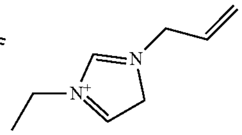
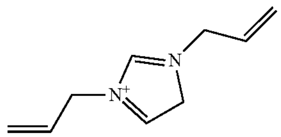
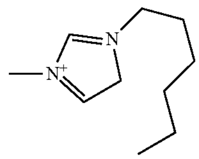
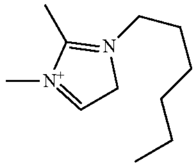
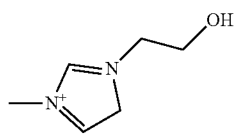
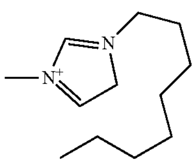
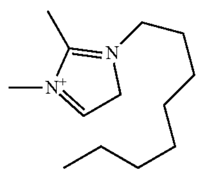
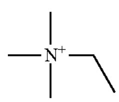
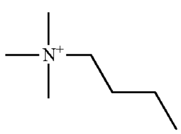
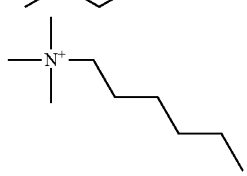
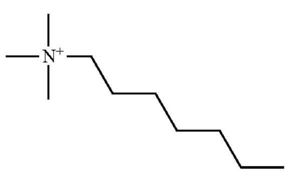
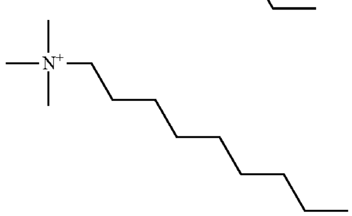
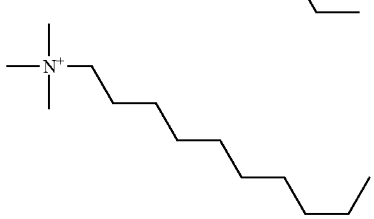
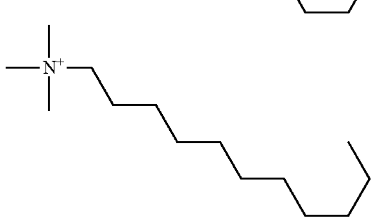
-continued
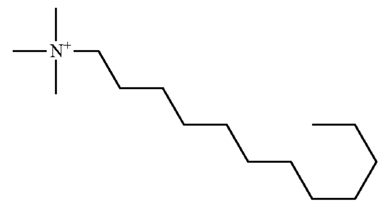
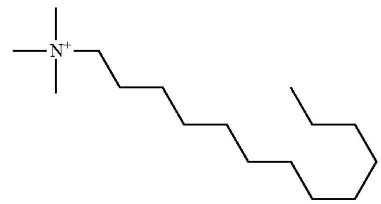
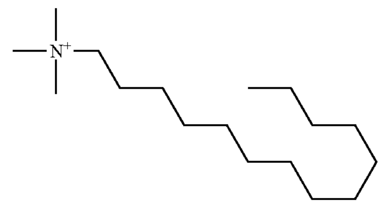
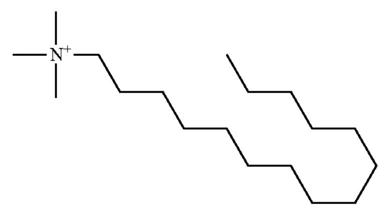
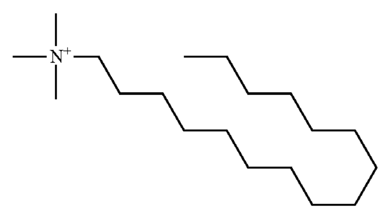
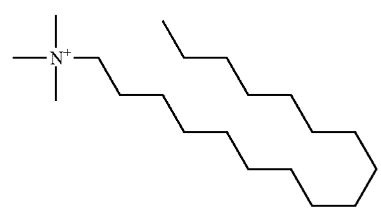
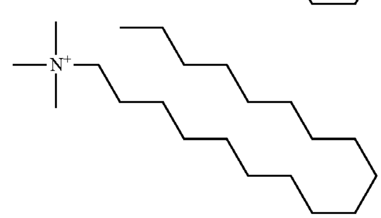
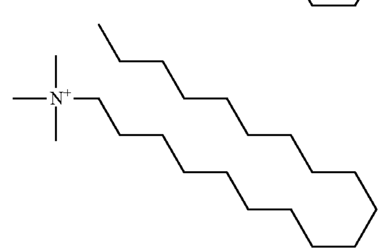

-continued
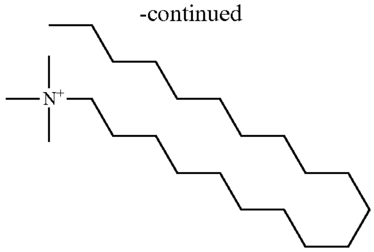
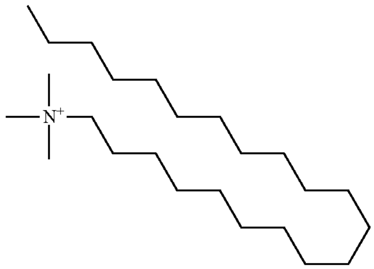
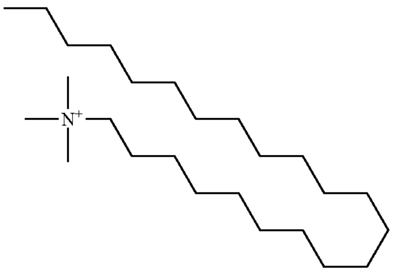
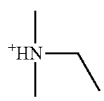
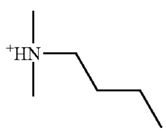
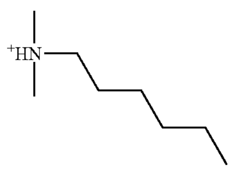
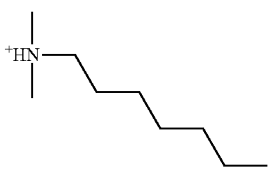
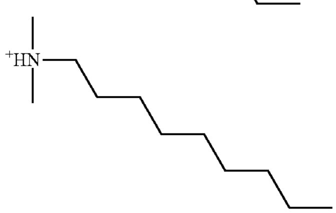
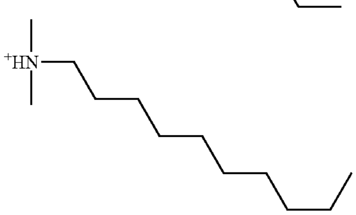
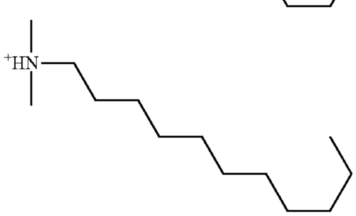
-continued
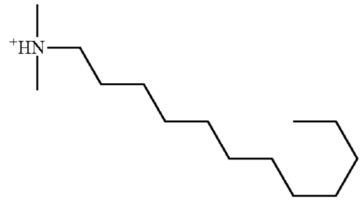
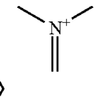
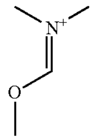
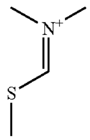
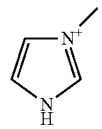
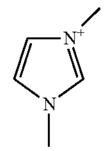
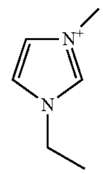
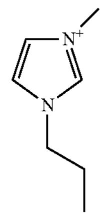
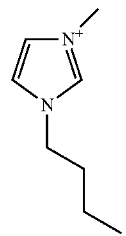
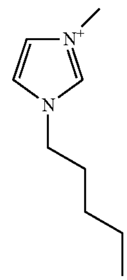
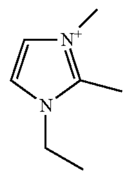
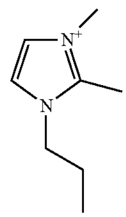
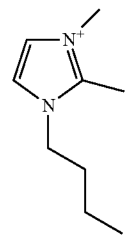
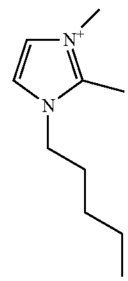
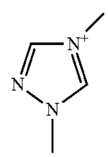
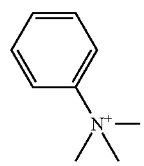
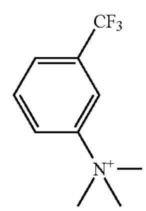
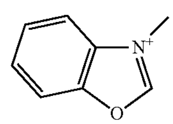
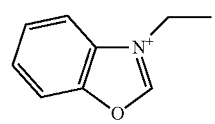
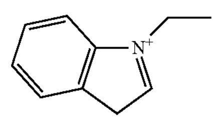
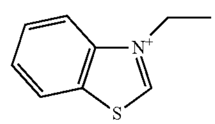
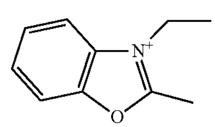
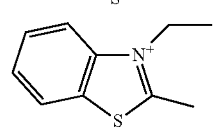
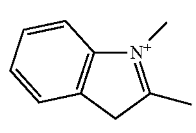
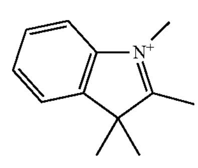

-continued
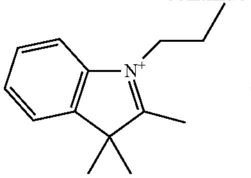
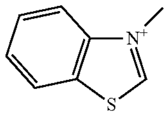
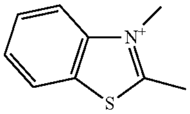
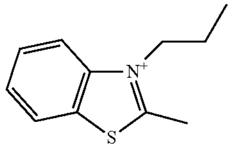
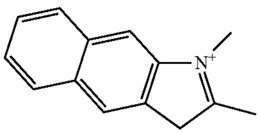
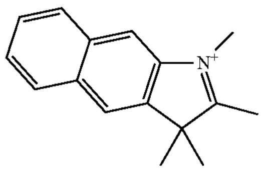
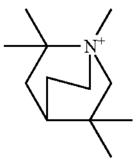
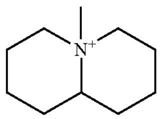
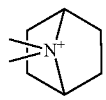
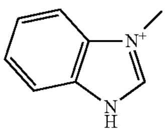
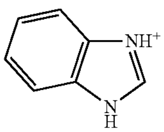
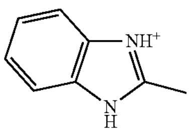
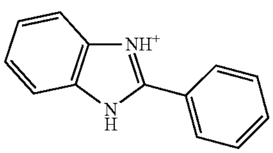
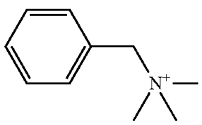
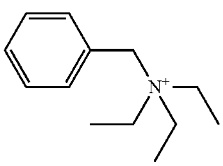
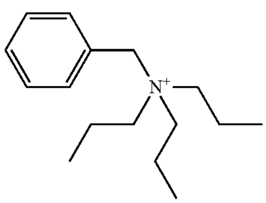
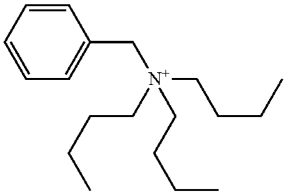
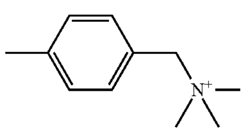
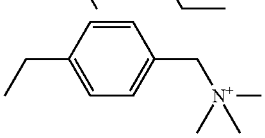
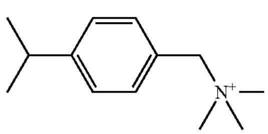
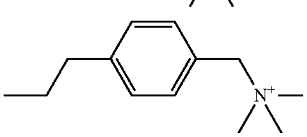
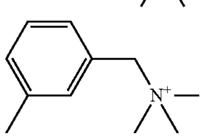
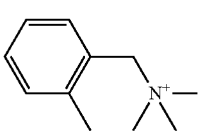
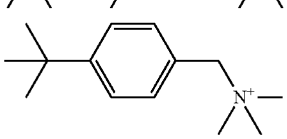
-continued
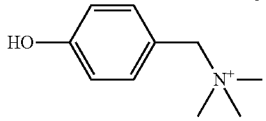
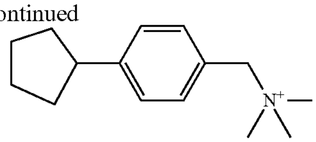
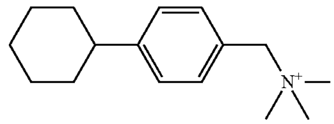
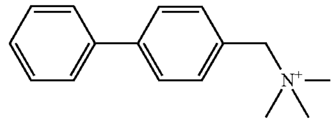
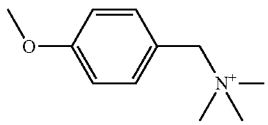
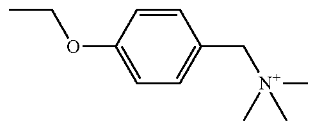
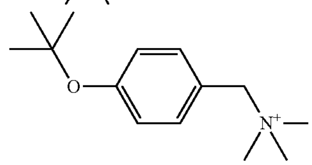
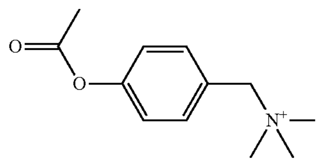
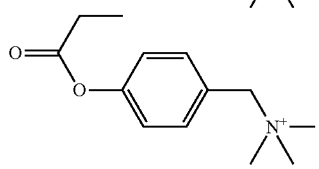
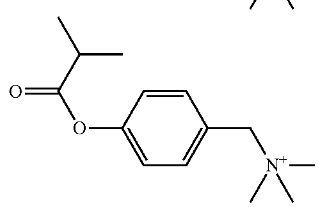
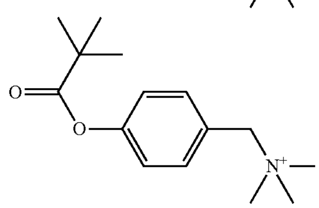
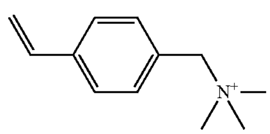
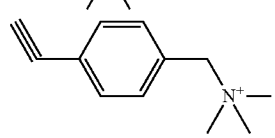
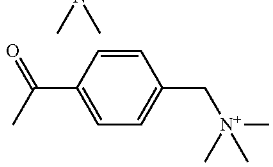
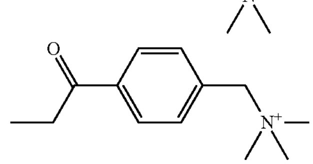

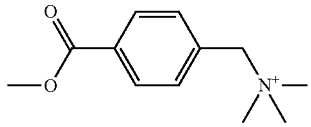
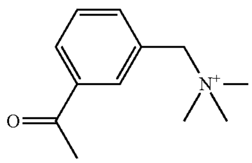
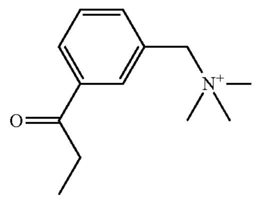
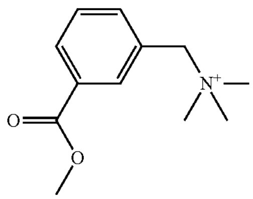
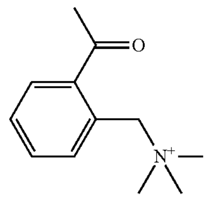
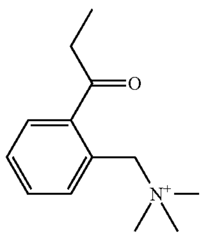
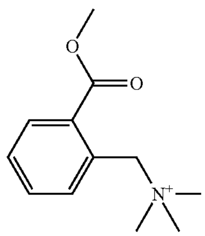
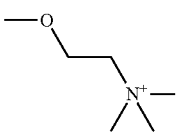
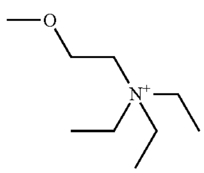
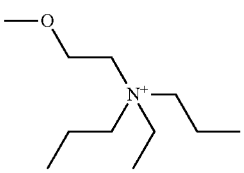
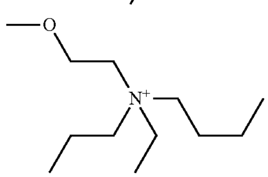
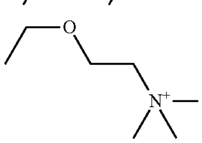
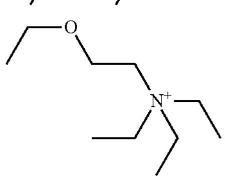
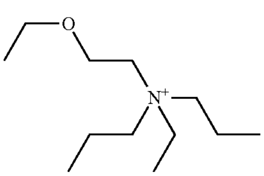
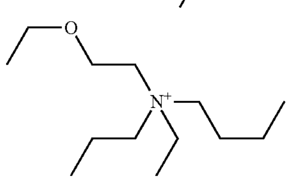
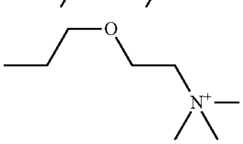
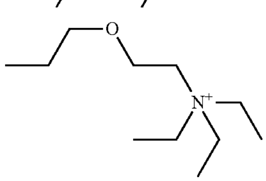
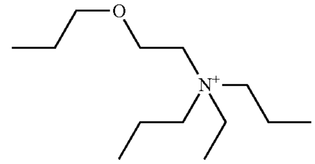
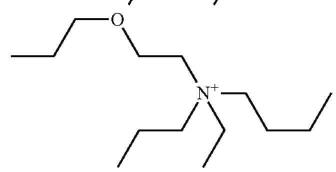
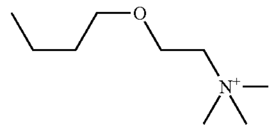
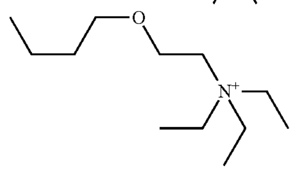
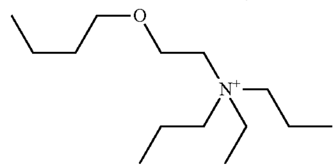
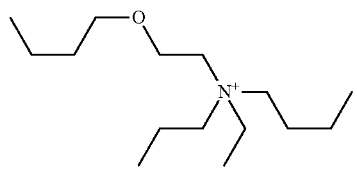
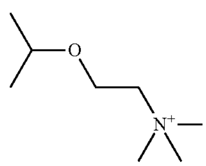
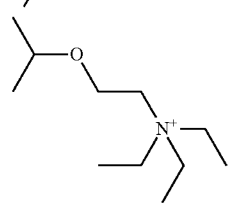
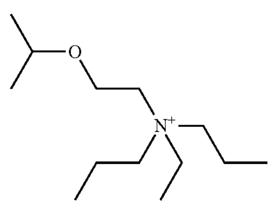
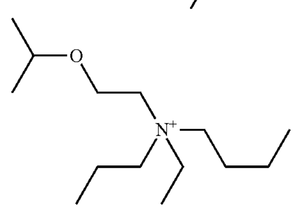
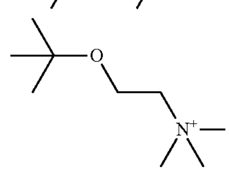
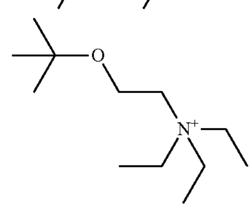
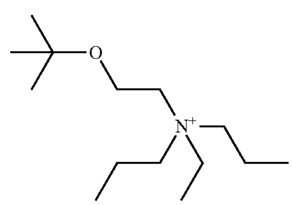

-continued
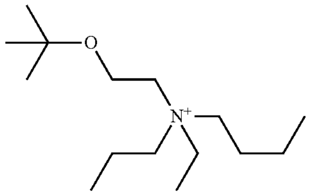
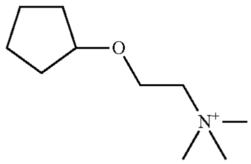
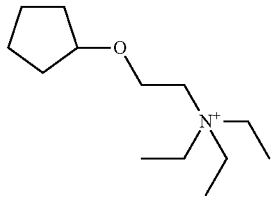
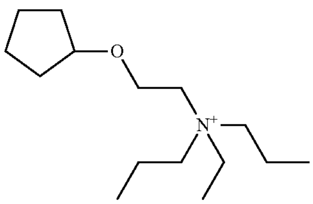
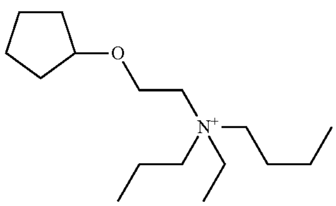
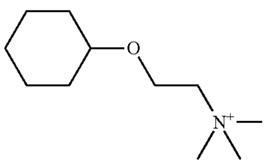
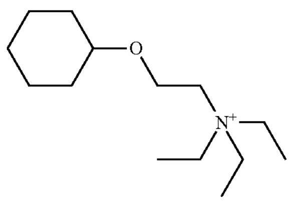
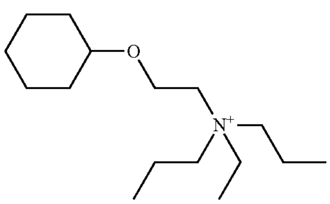
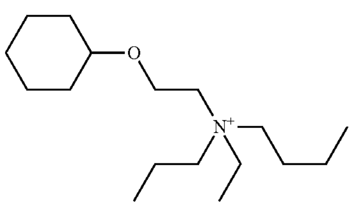
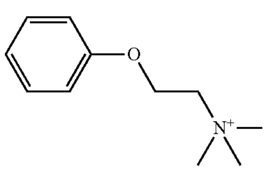
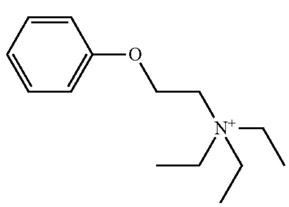
-continued
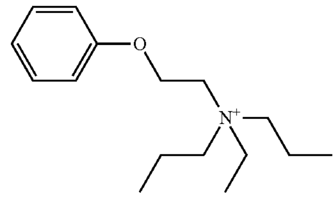
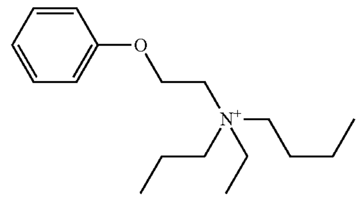
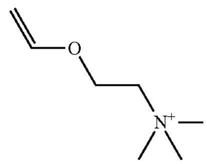
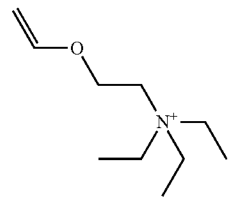
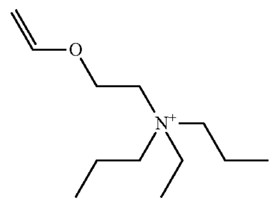
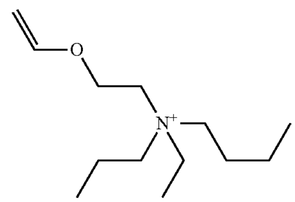
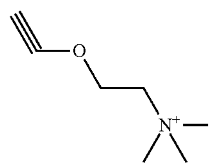
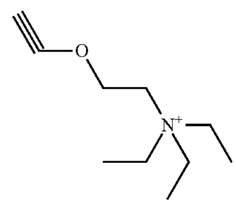
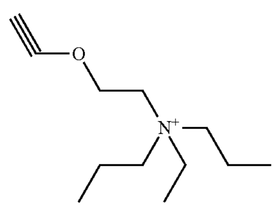
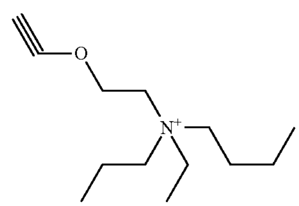
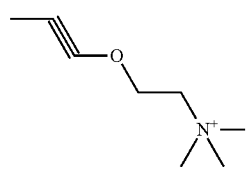
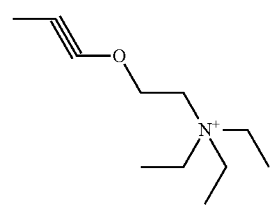
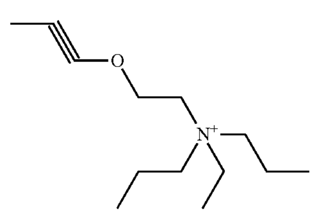

-continued
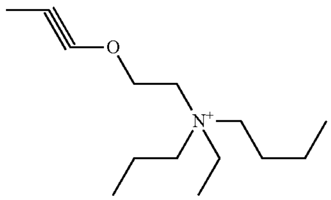
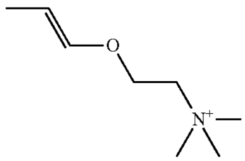
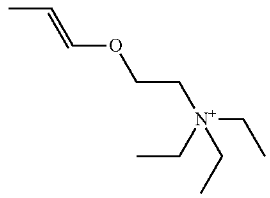
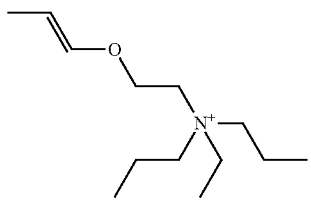
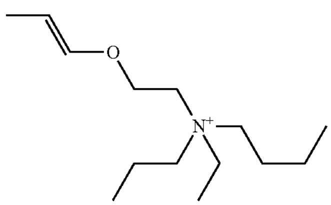
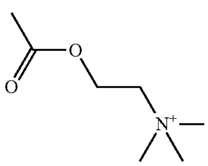
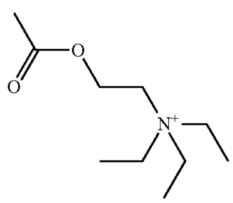
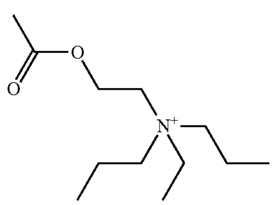
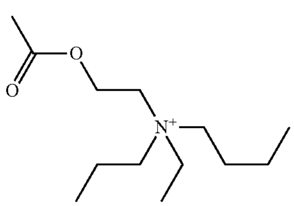
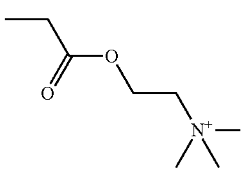
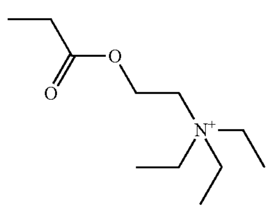
-continued
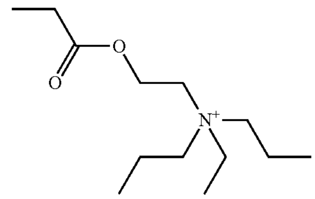
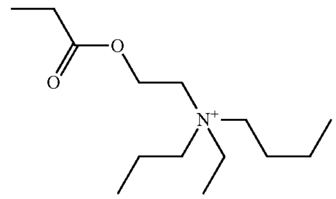
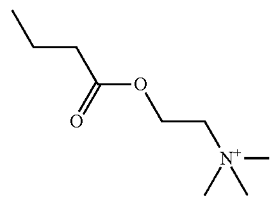
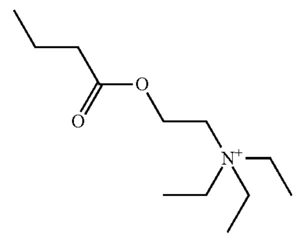
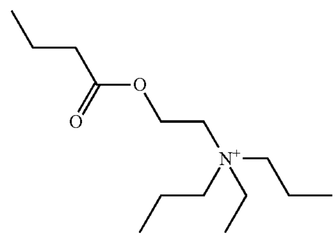
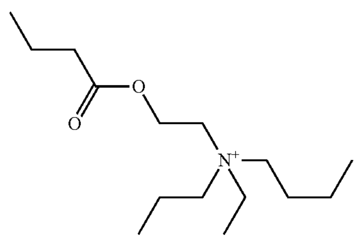
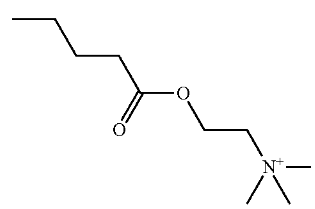
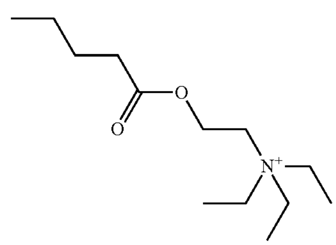

-continued
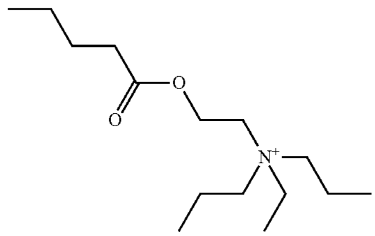
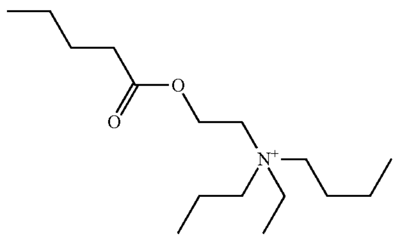
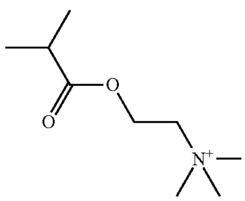
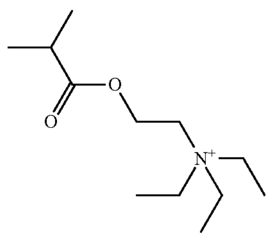
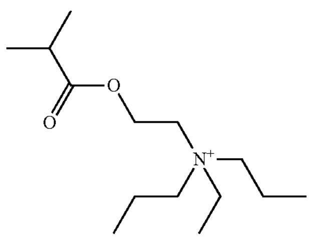
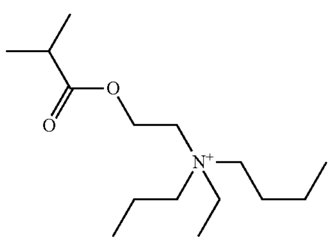
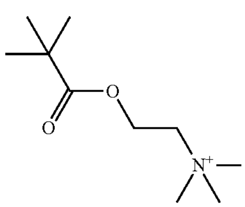
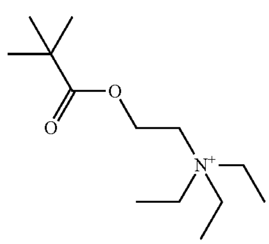
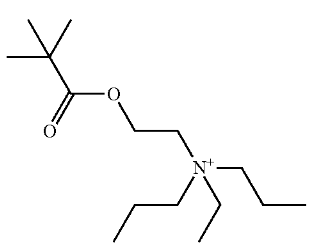
-continued
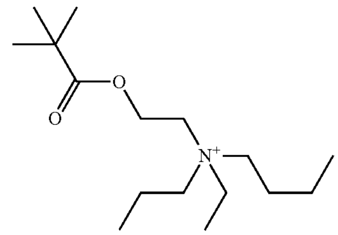
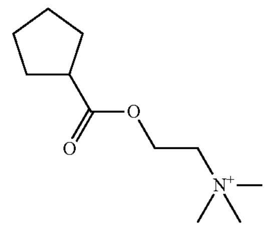
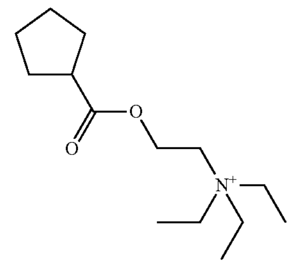
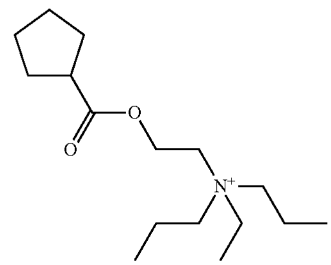
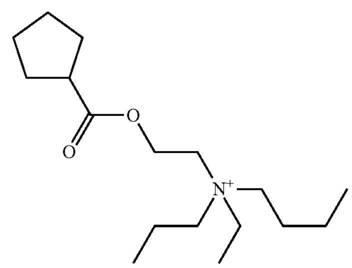
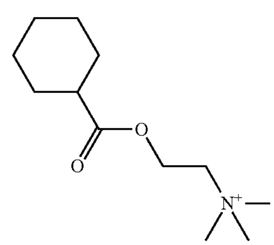
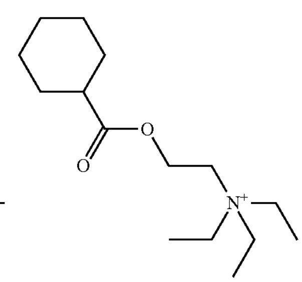
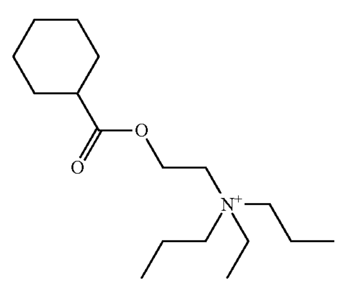

-continued
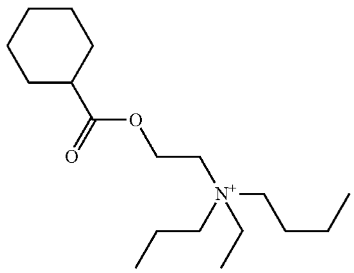
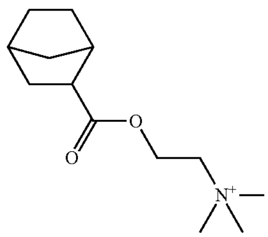
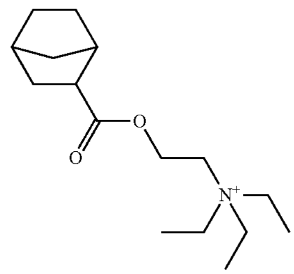
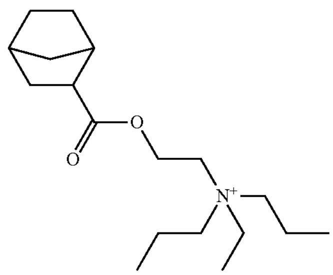
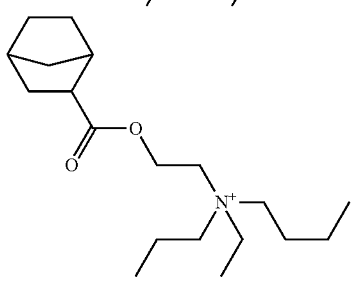
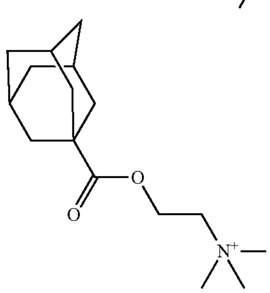
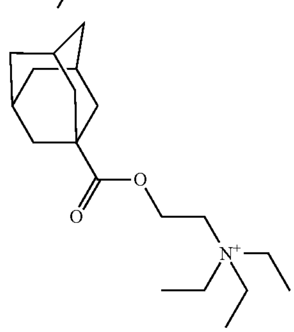
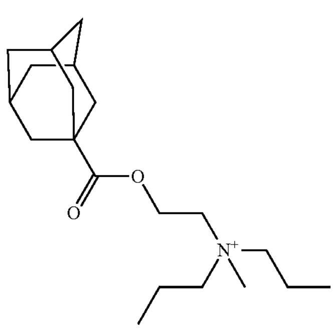
-continued
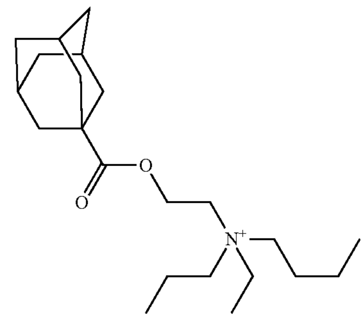
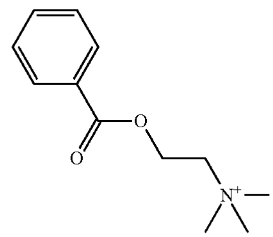
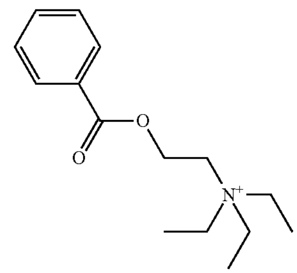
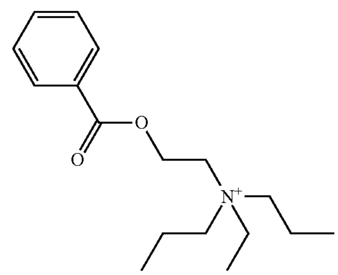
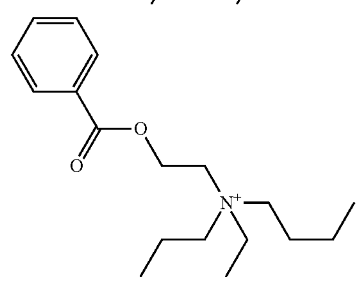
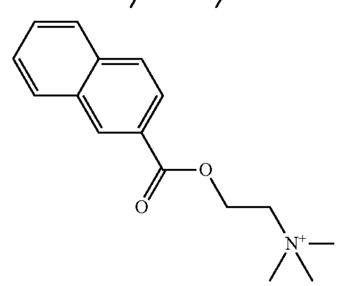
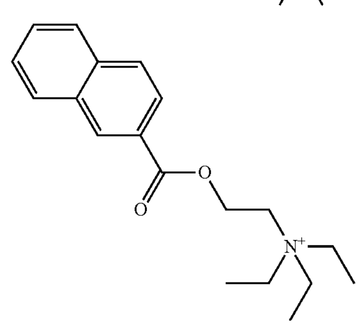

-continued
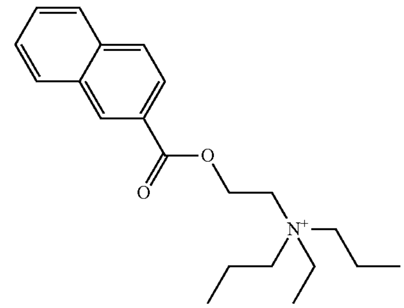
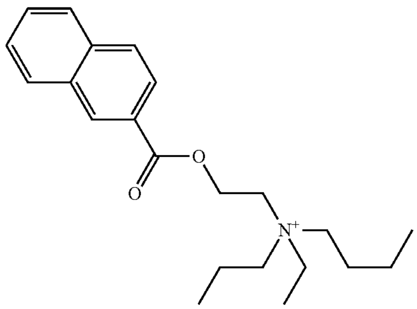
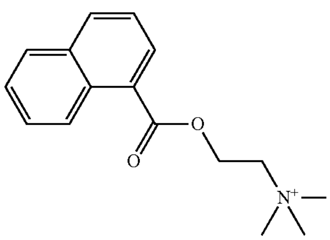
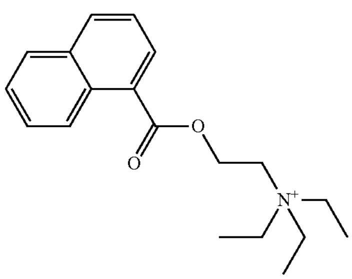
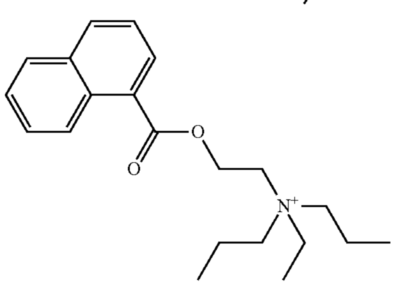
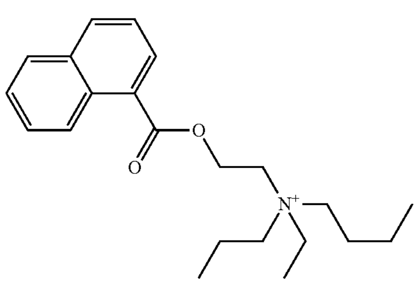
-continued
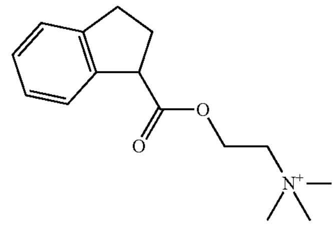
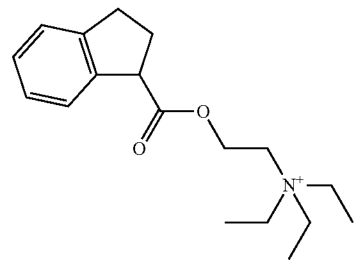
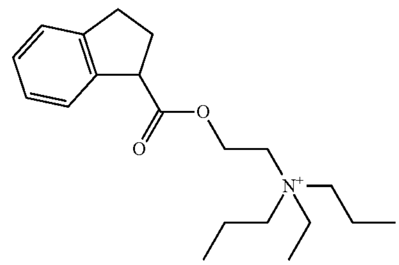
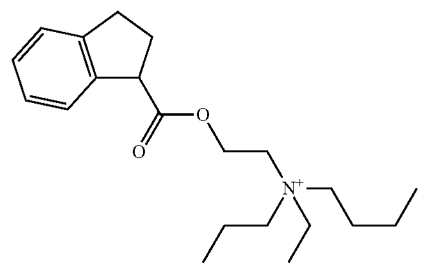
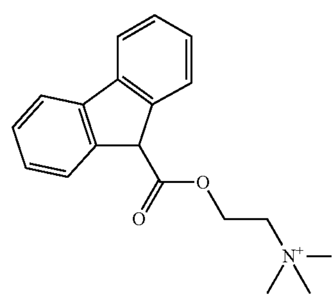
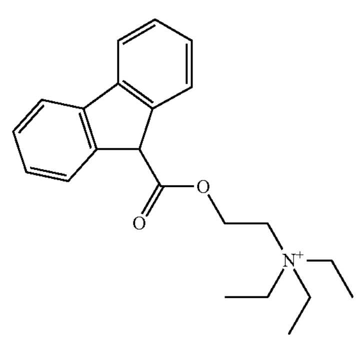

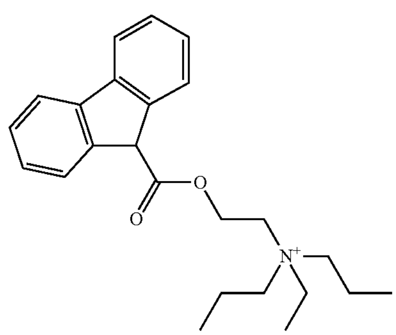
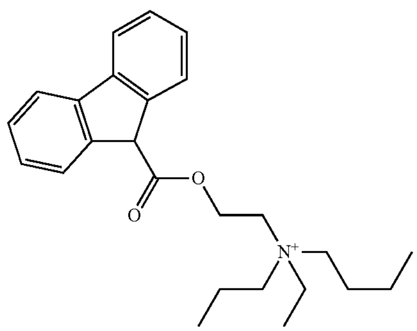
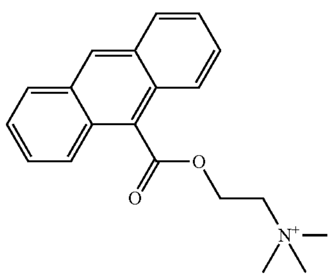
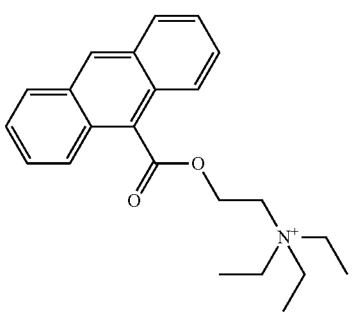
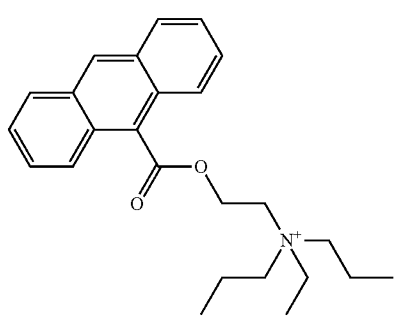
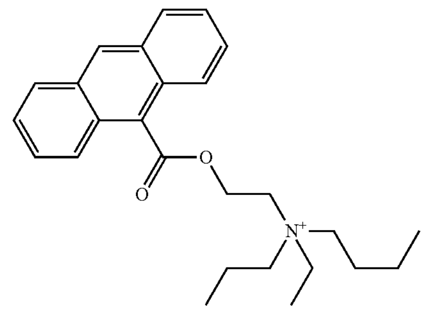
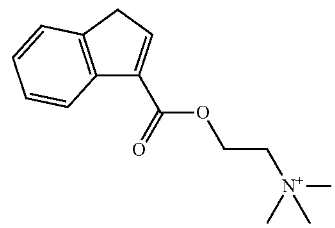
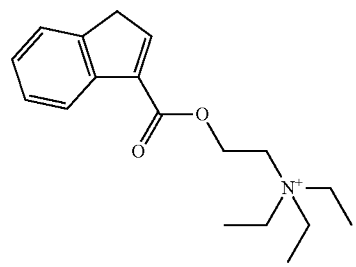
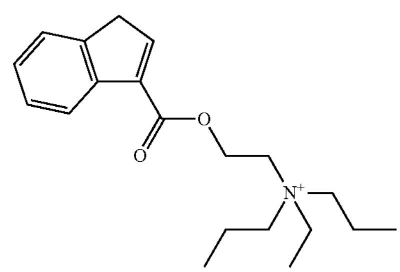
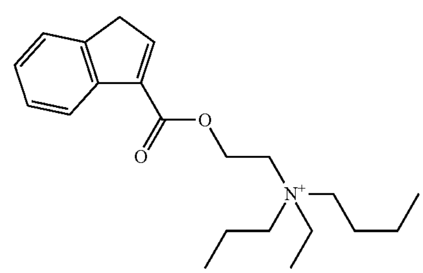
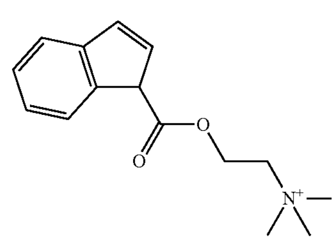

-continued
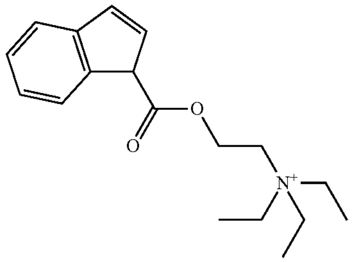
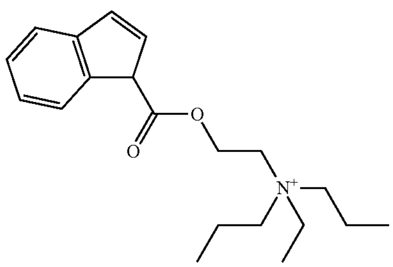
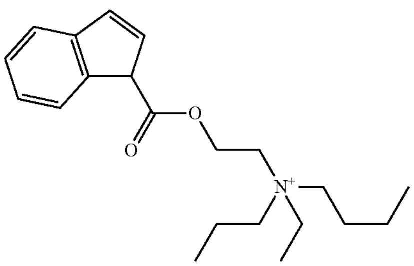
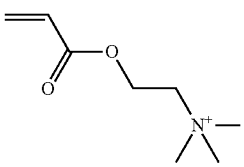
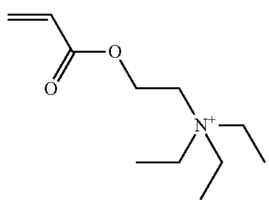
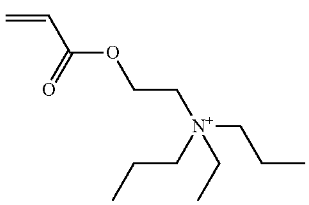
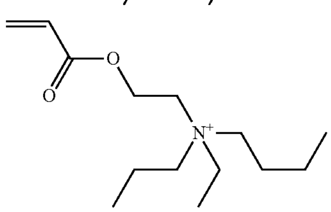
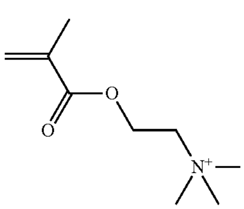
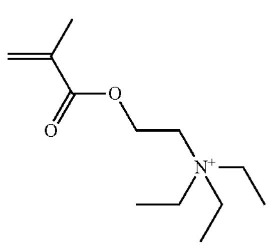
-continued
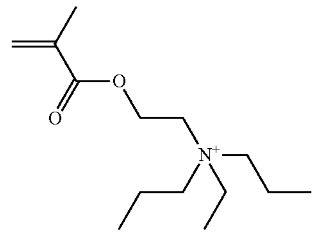
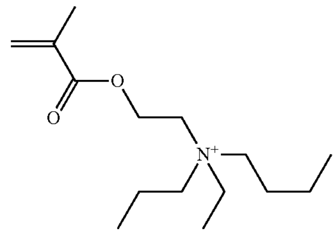
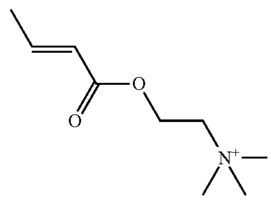
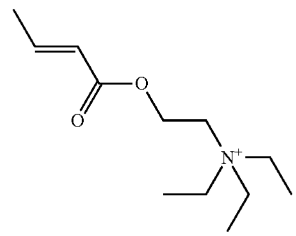
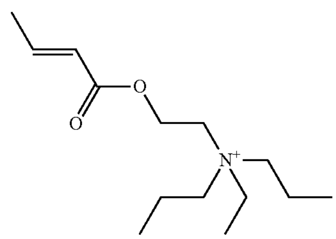
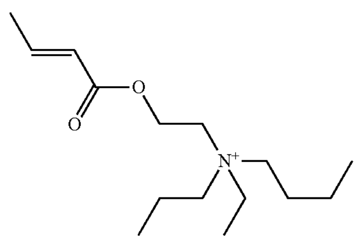
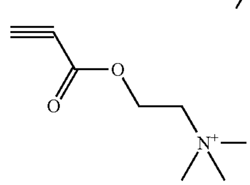
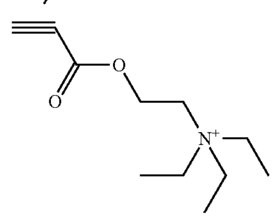
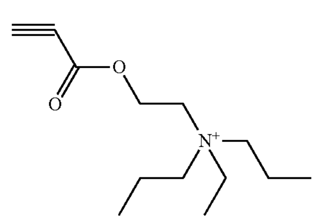

-continued
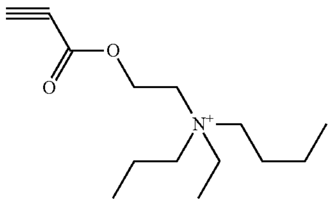
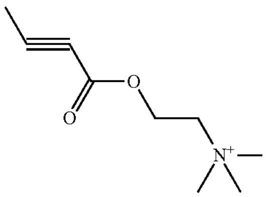
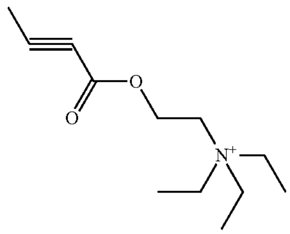
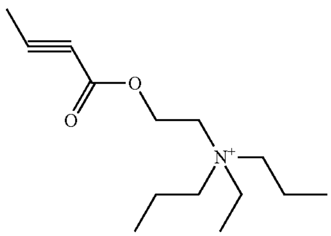
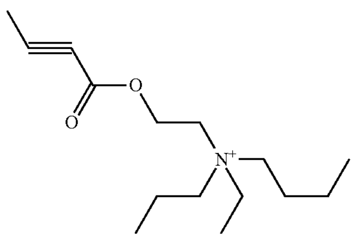
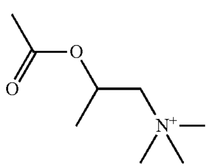
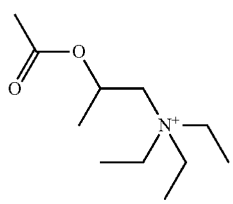
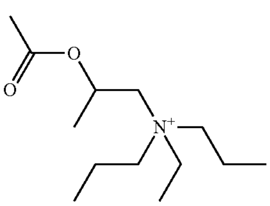
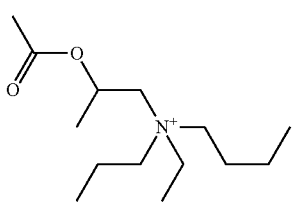
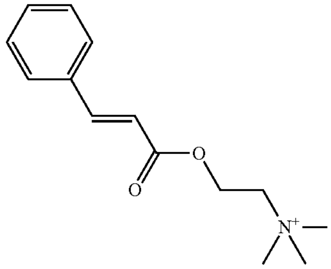
-continued
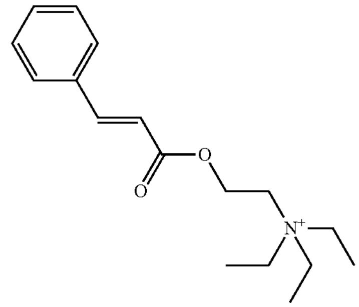
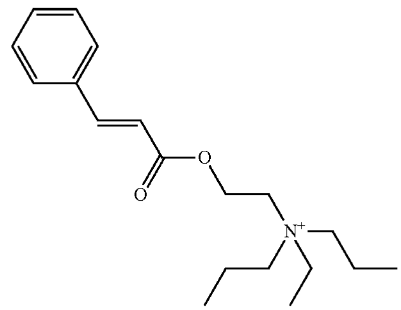
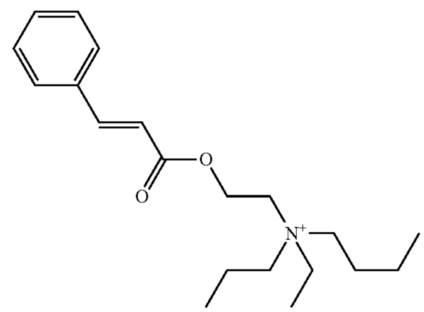
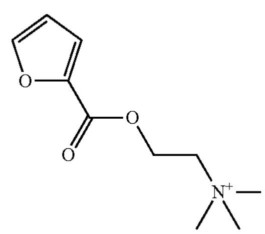
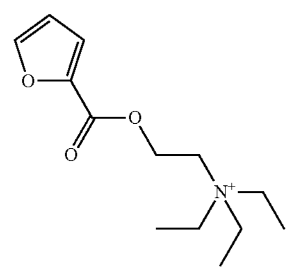
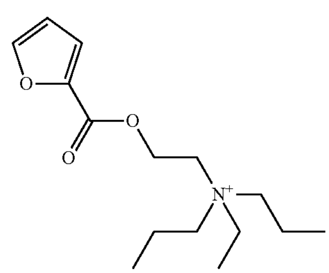
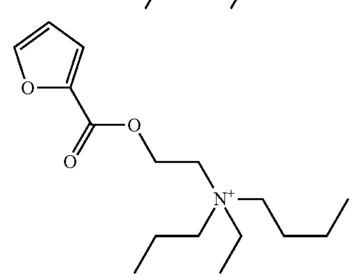

-continued
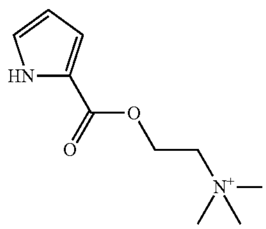
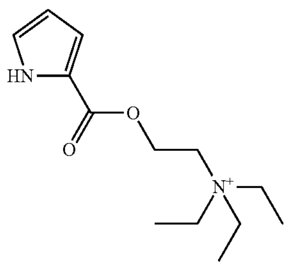
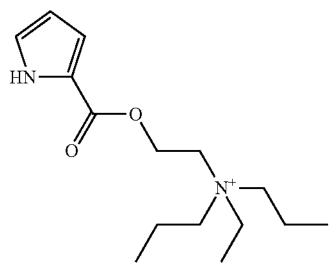
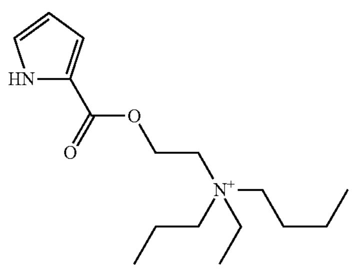
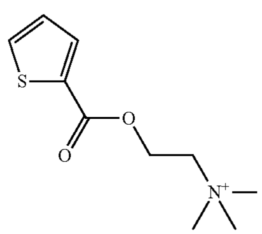
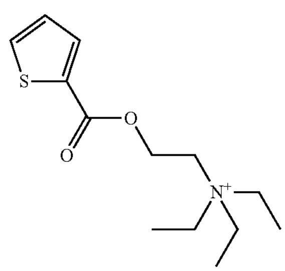
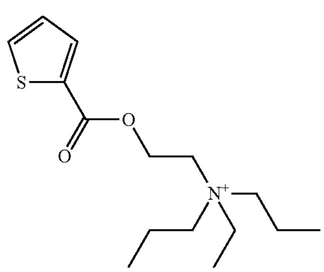
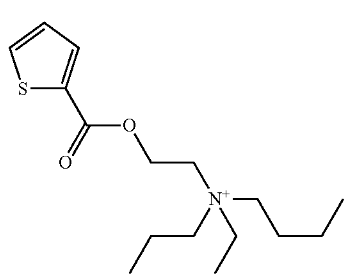
-continued
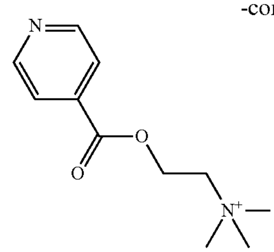
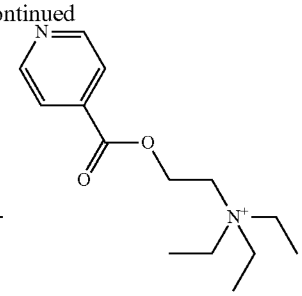
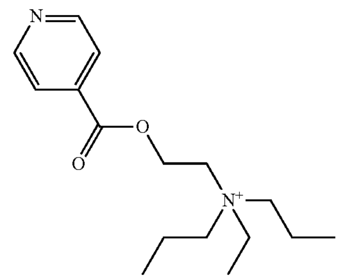
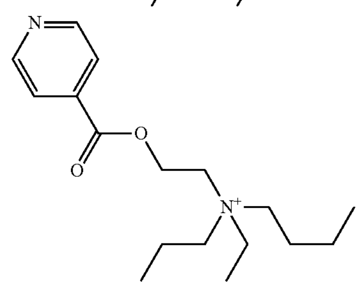
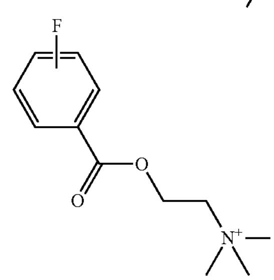
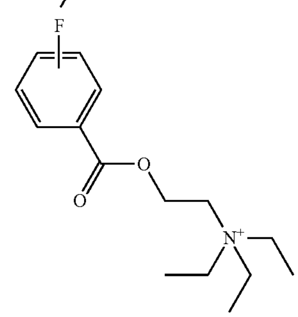
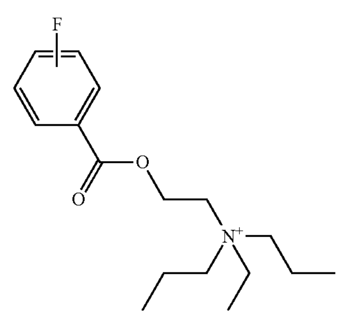
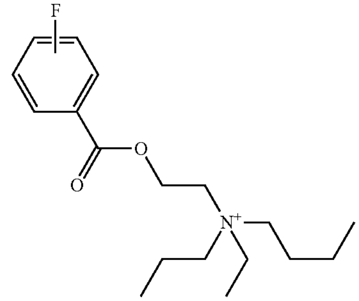

-continued
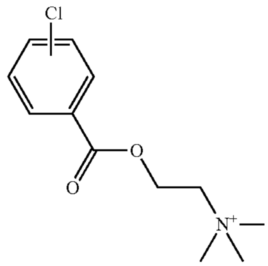
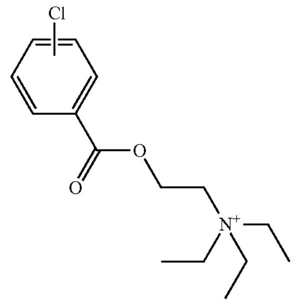
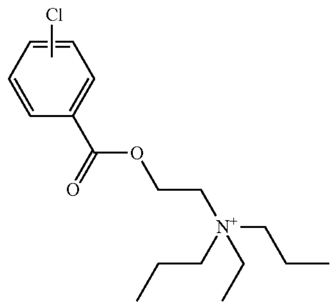
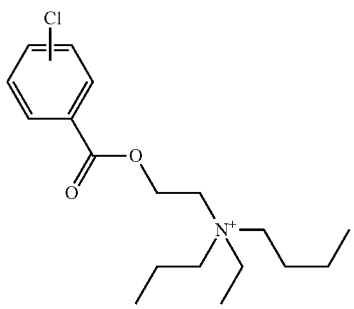
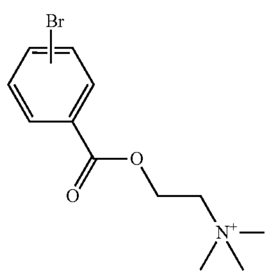
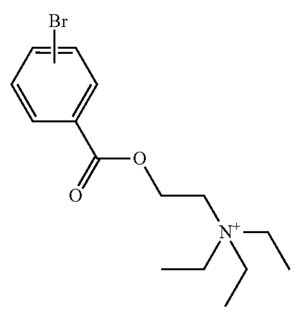
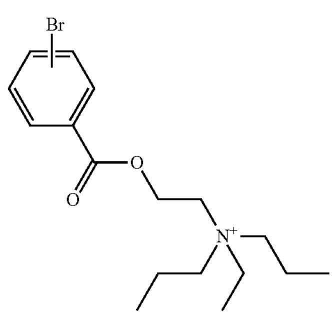
-continued
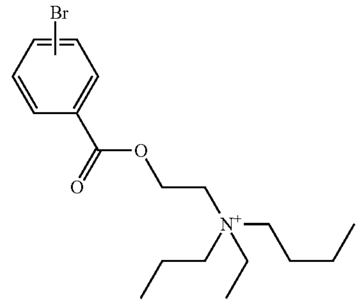
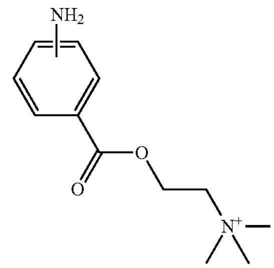
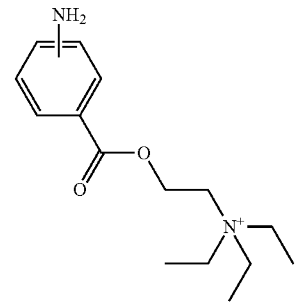
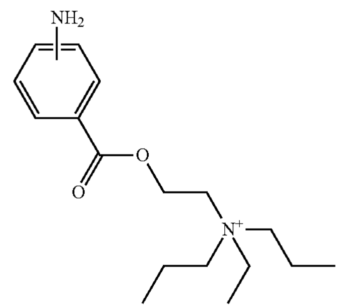
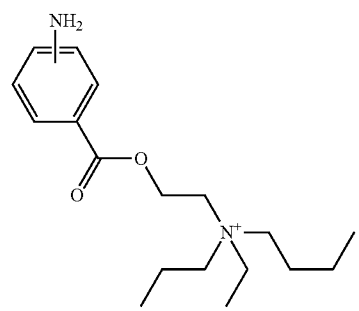
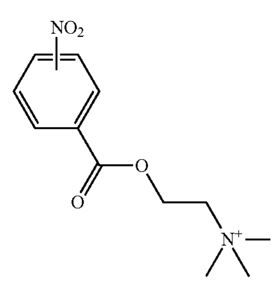
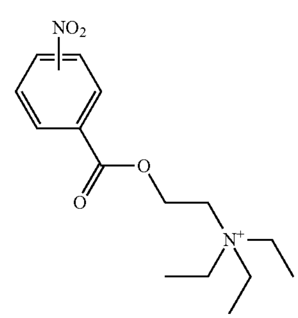

-continued
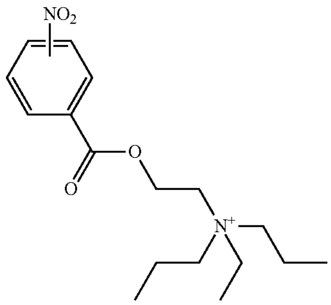
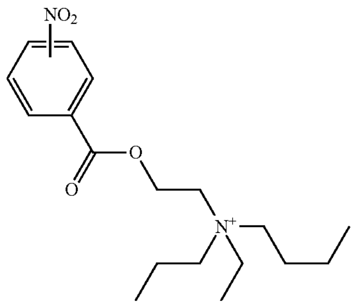
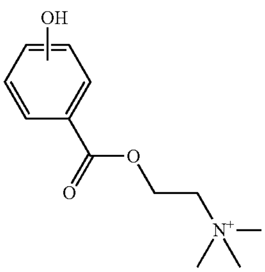
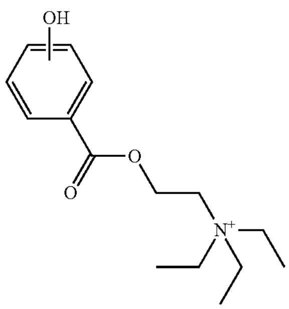
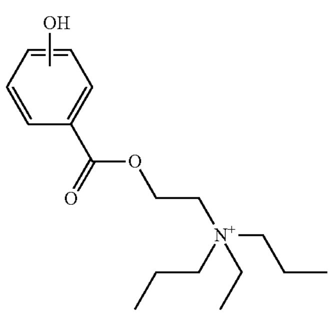
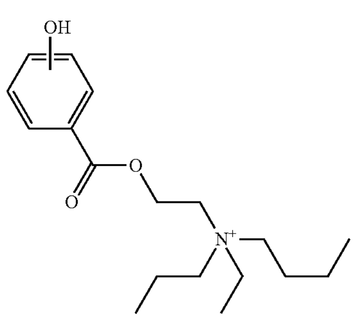
-continued
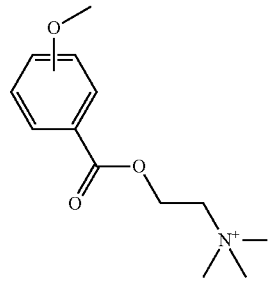
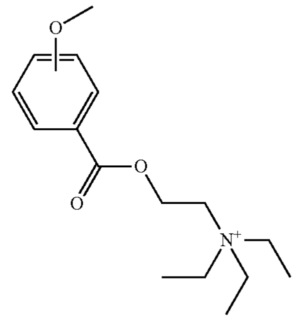
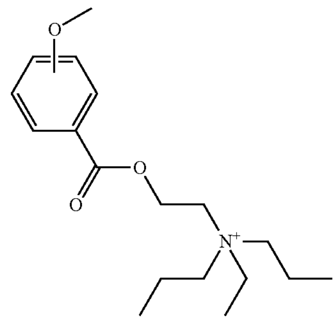
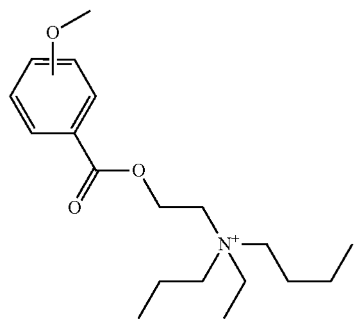
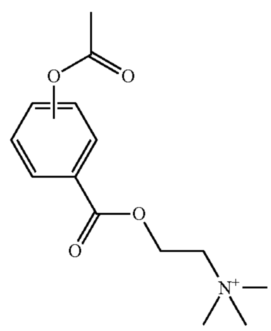
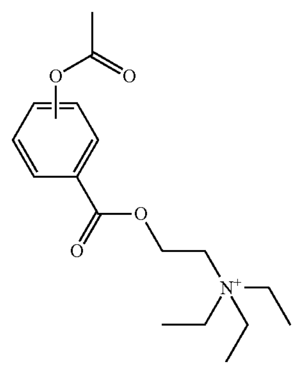
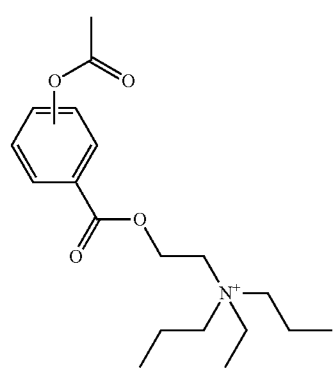

-continued
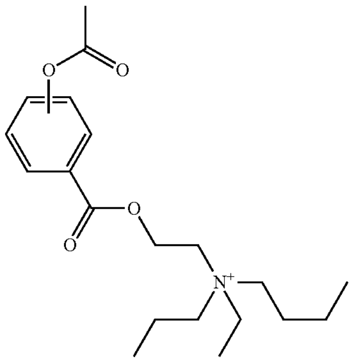
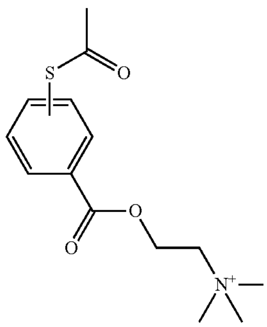
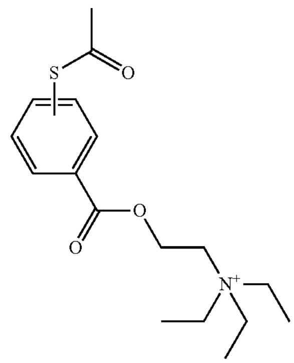
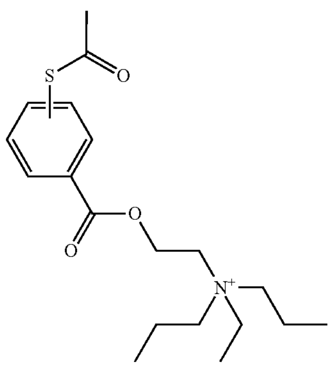
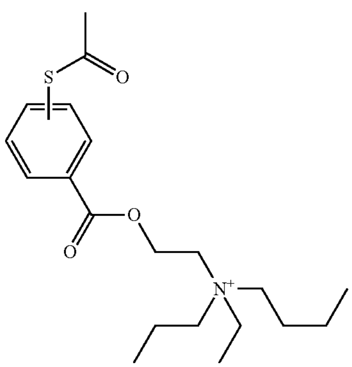
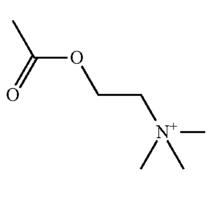
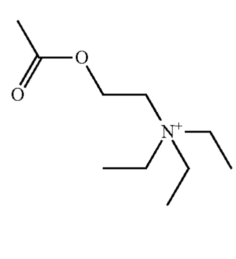
-continued
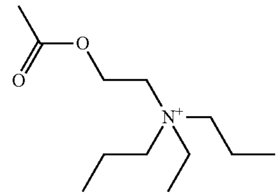
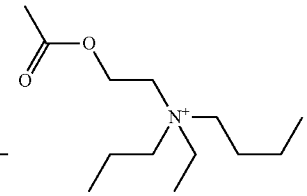
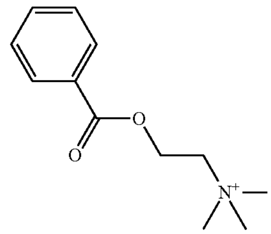
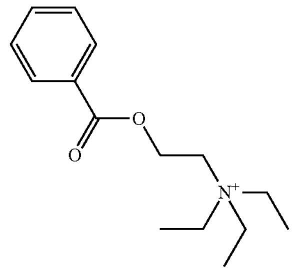
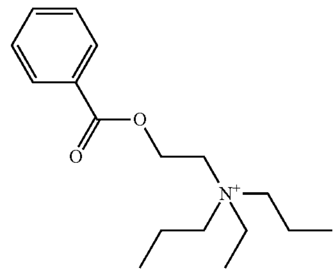
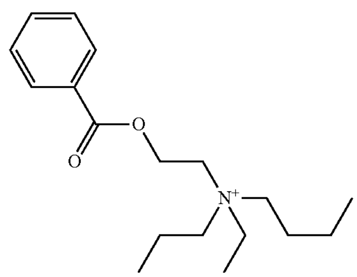
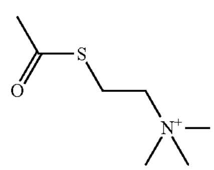
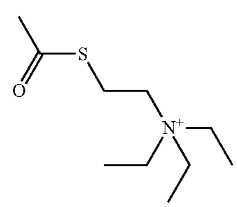
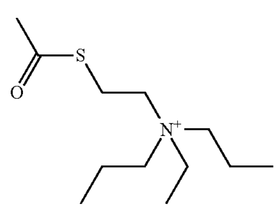
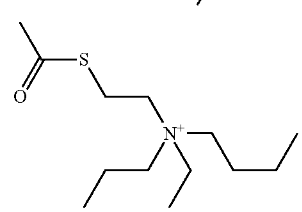
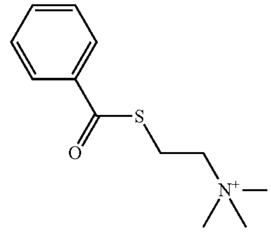
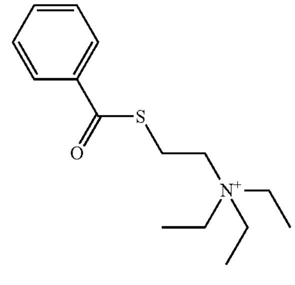

-continued
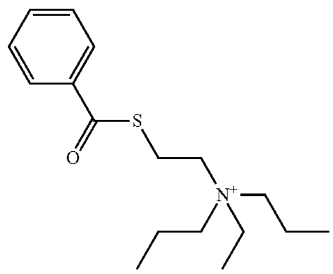
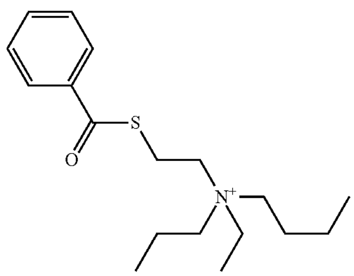
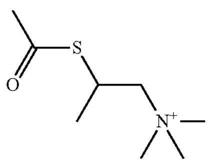
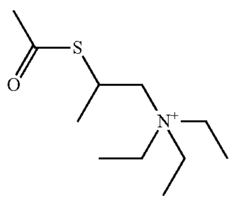
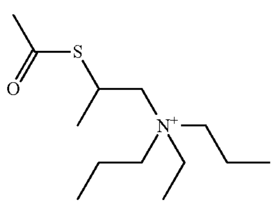
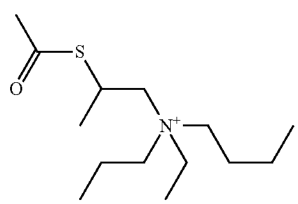
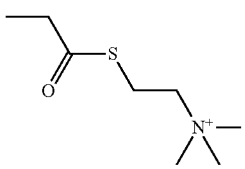
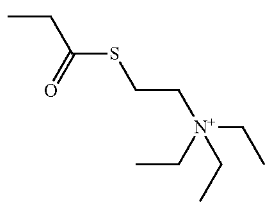
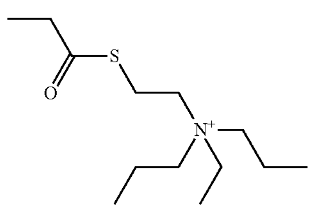
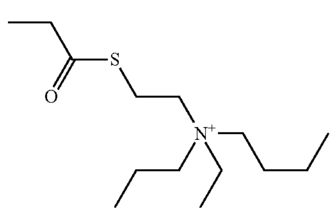
-continued
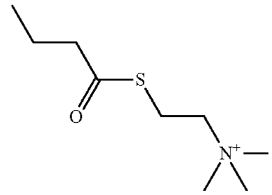
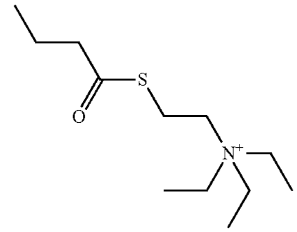
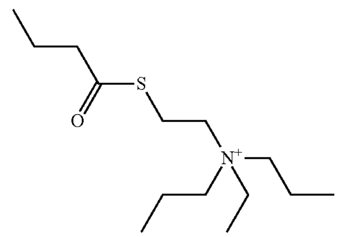
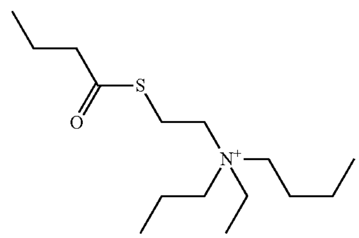
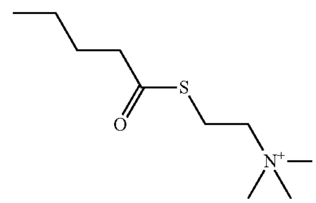
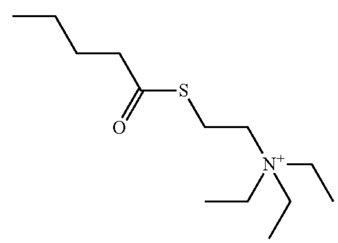
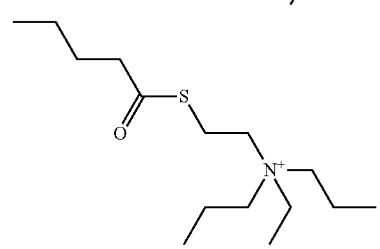
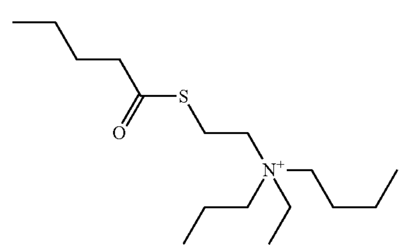

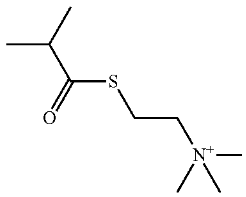
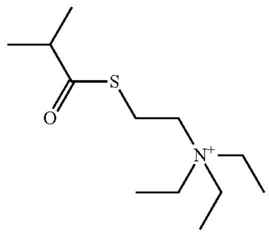
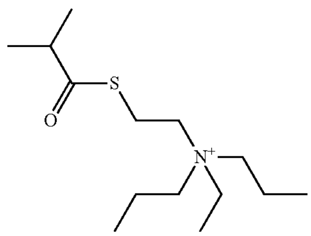
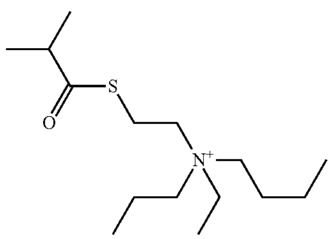
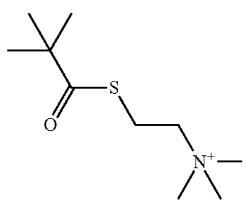
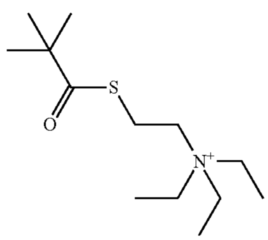
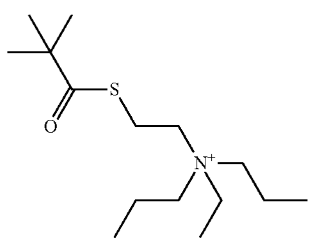
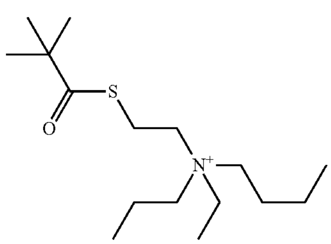
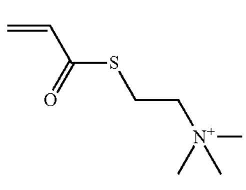
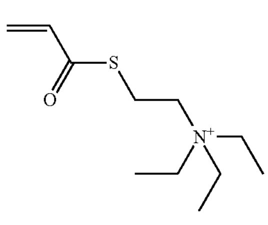
-continued
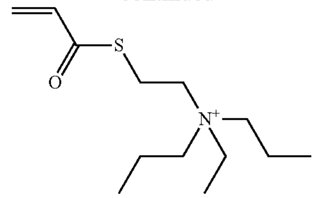
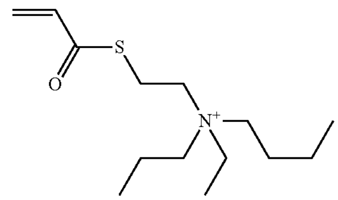
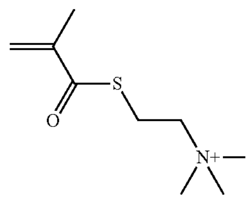
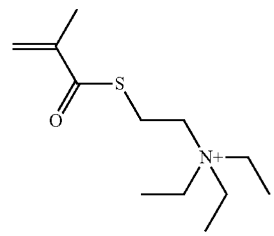
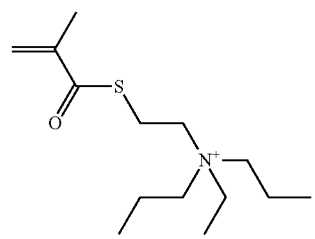
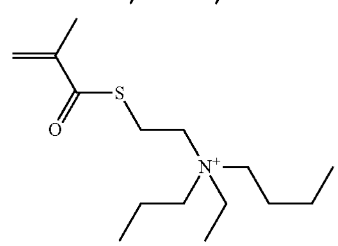
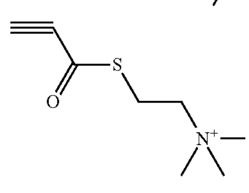
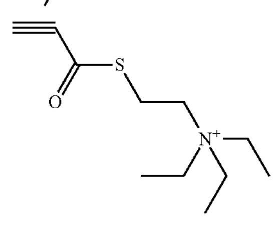
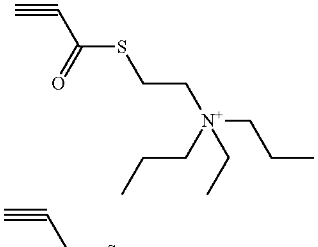
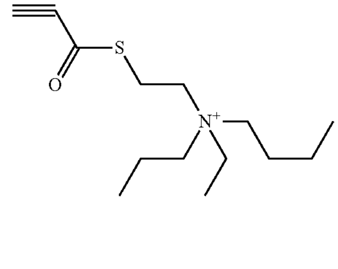

-continued
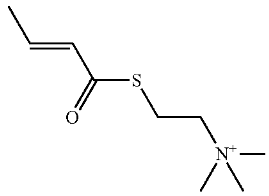
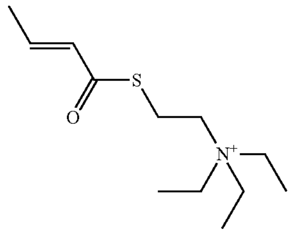
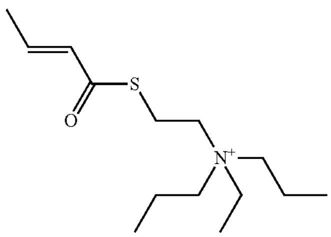
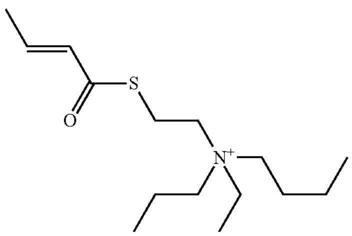
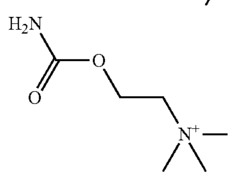
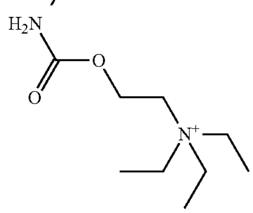
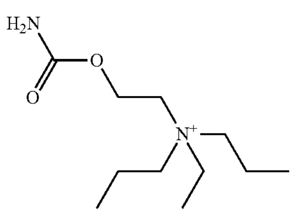
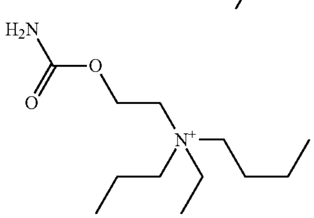
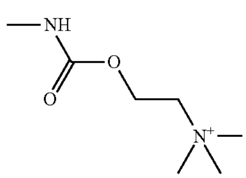
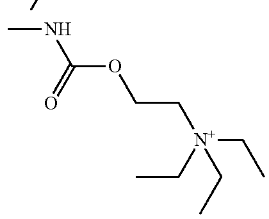
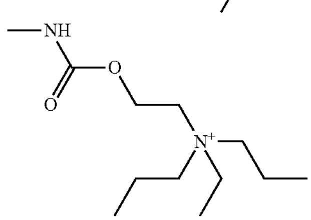
-continued
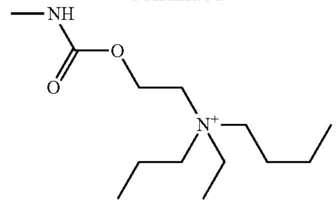
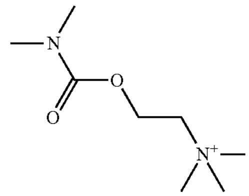
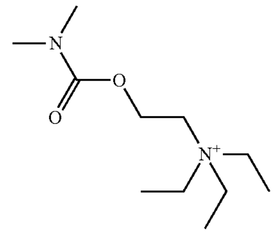
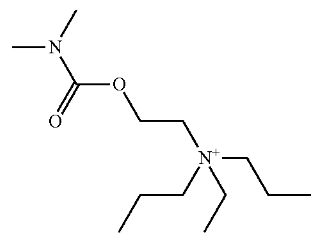
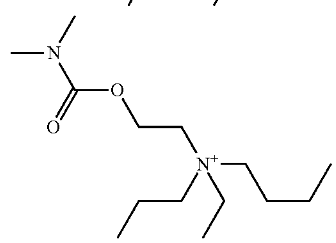
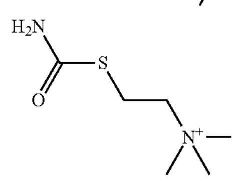
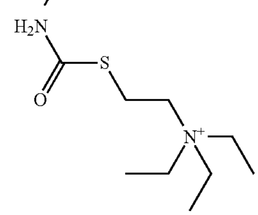
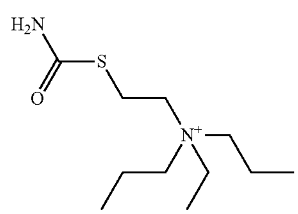
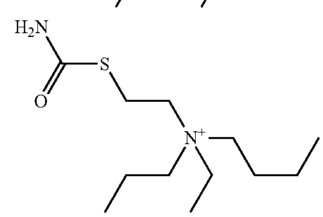
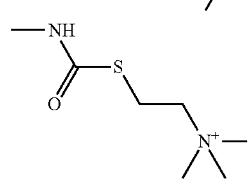
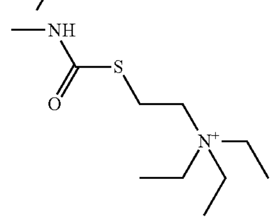

-continued
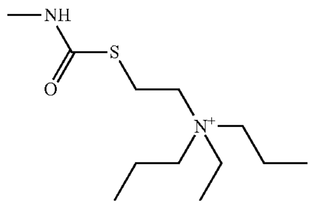
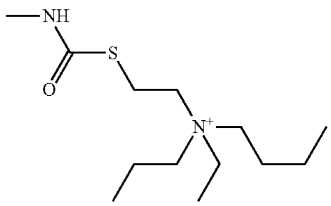
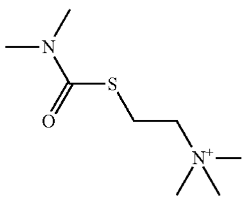
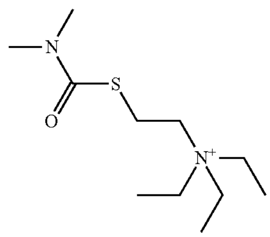
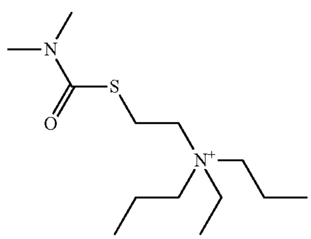
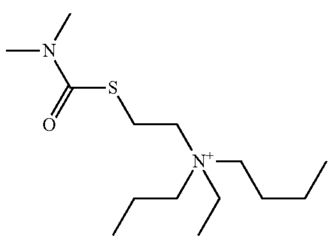
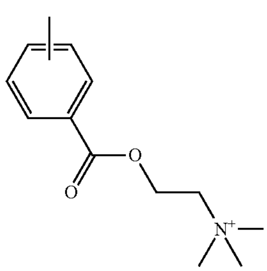
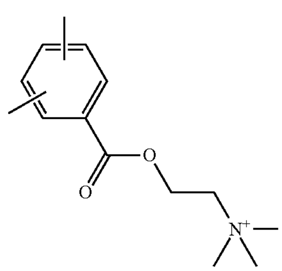
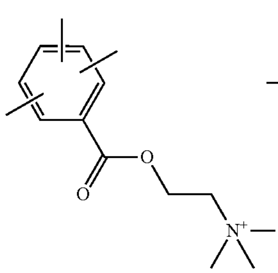
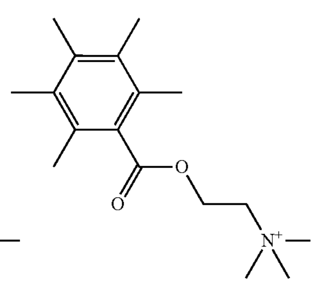
-continued
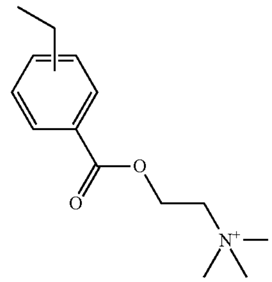
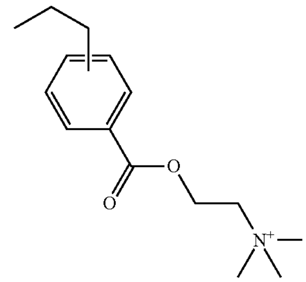
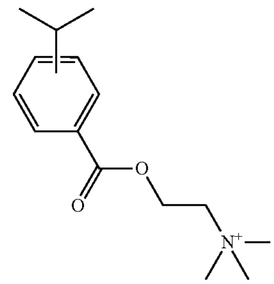
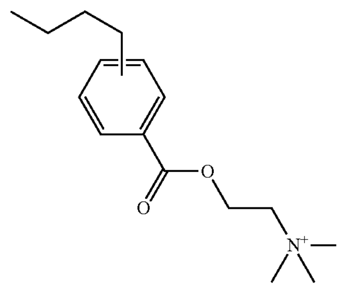
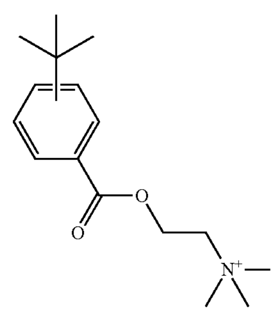
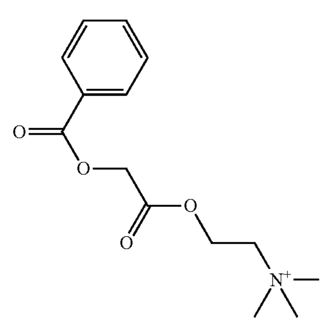

-continued
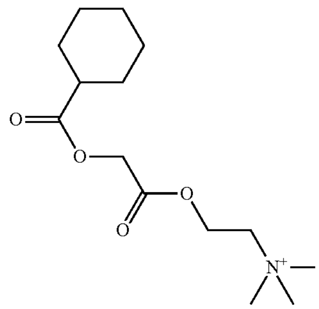
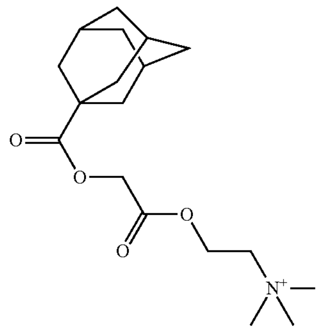
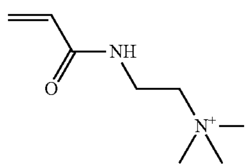
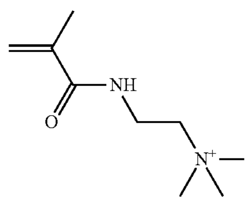
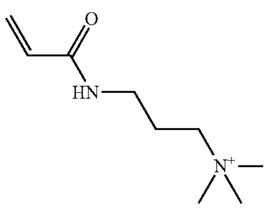
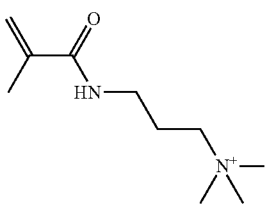
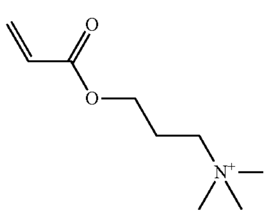
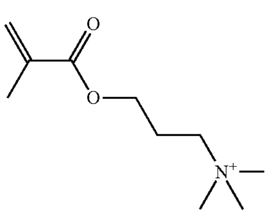
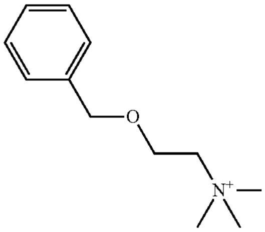
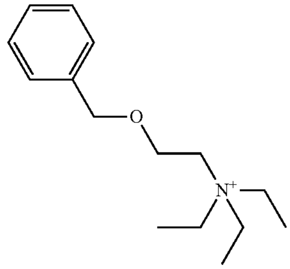
-continued
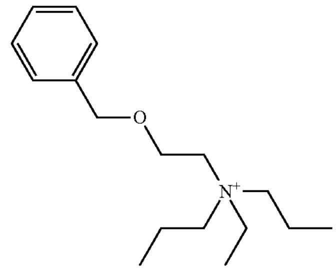
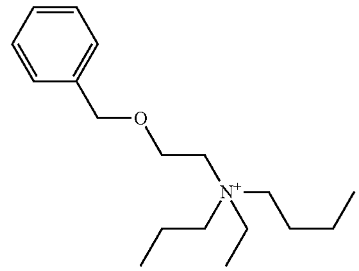
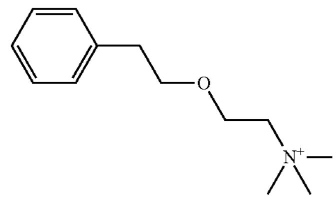
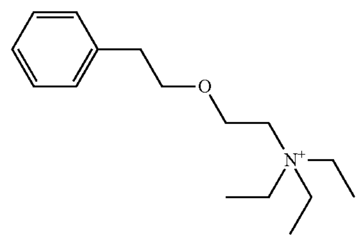
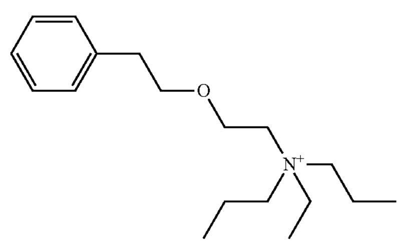
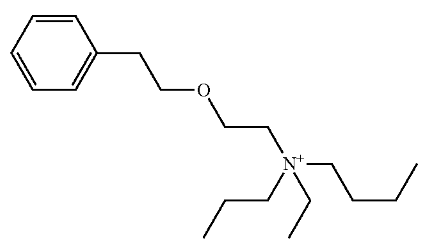
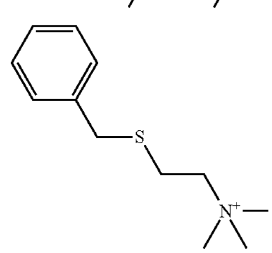

-continued
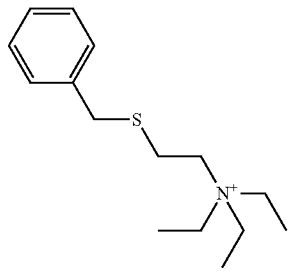
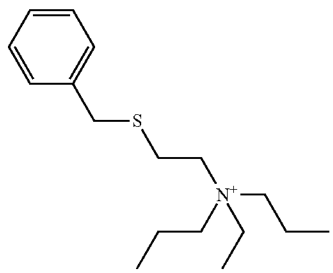
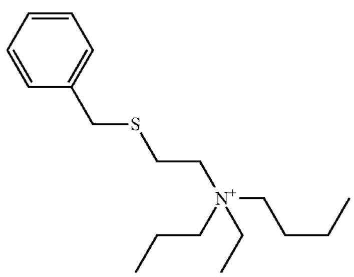
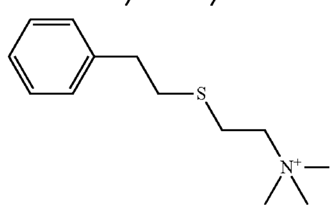
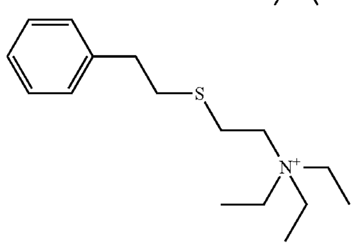
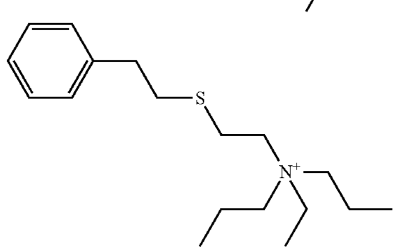
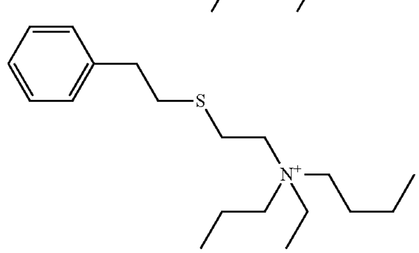
-continued
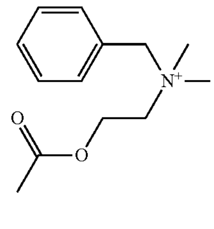
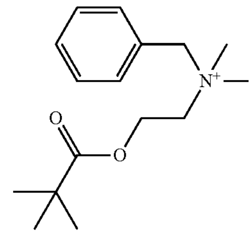
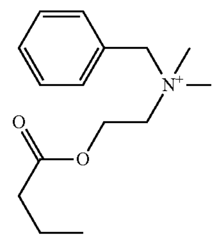
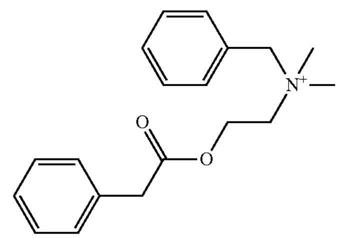
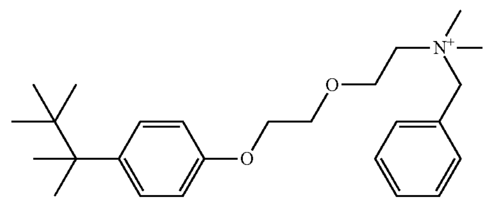
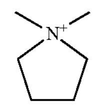
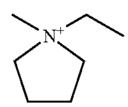
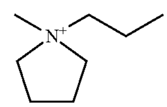
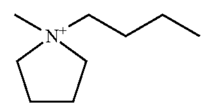
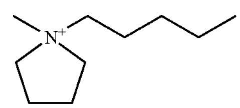
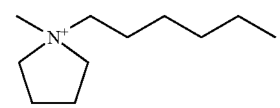
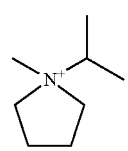
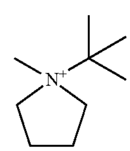
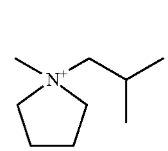
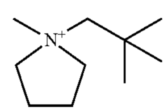
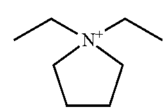
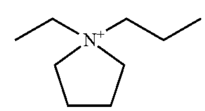
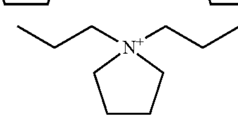
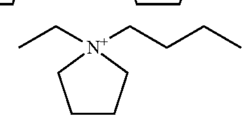
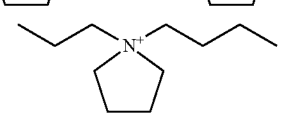
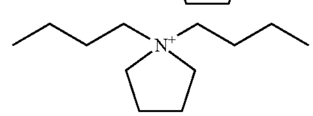
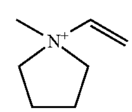
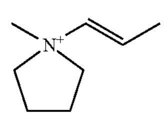
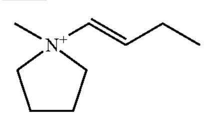
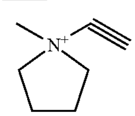
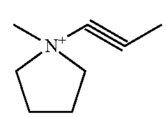
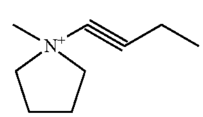
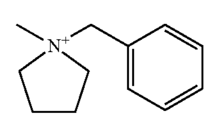

-continued
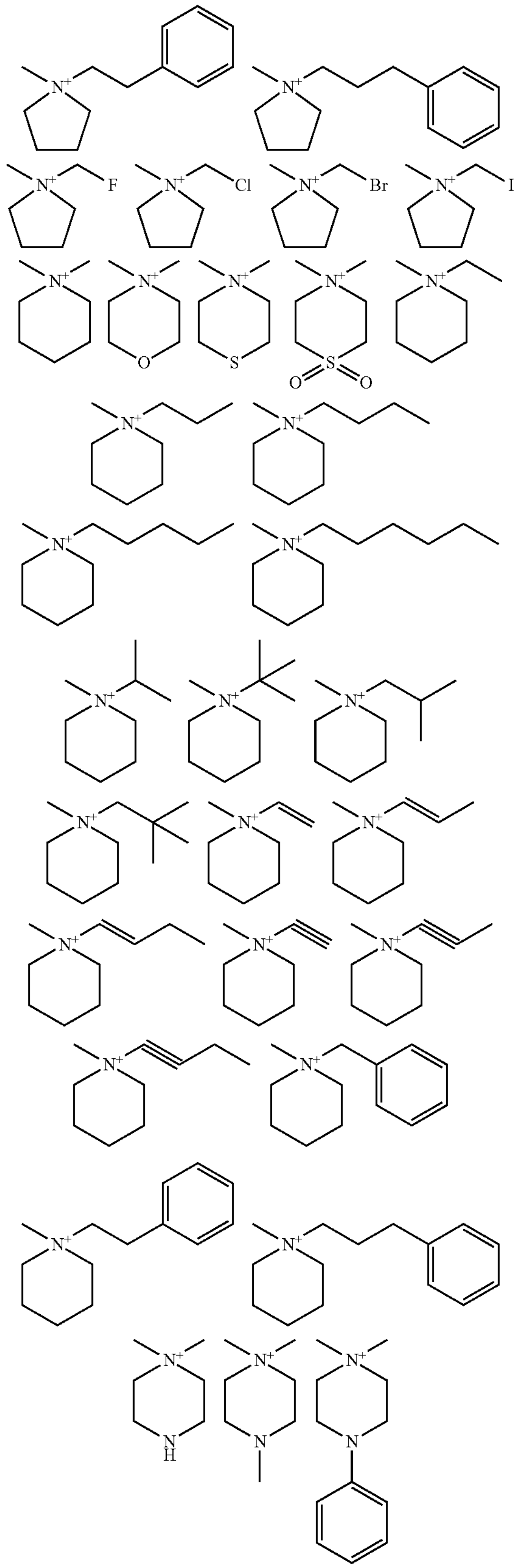
Examples of the cation in the ammonium salt having formula (2) are shown below, but not limited thereto.
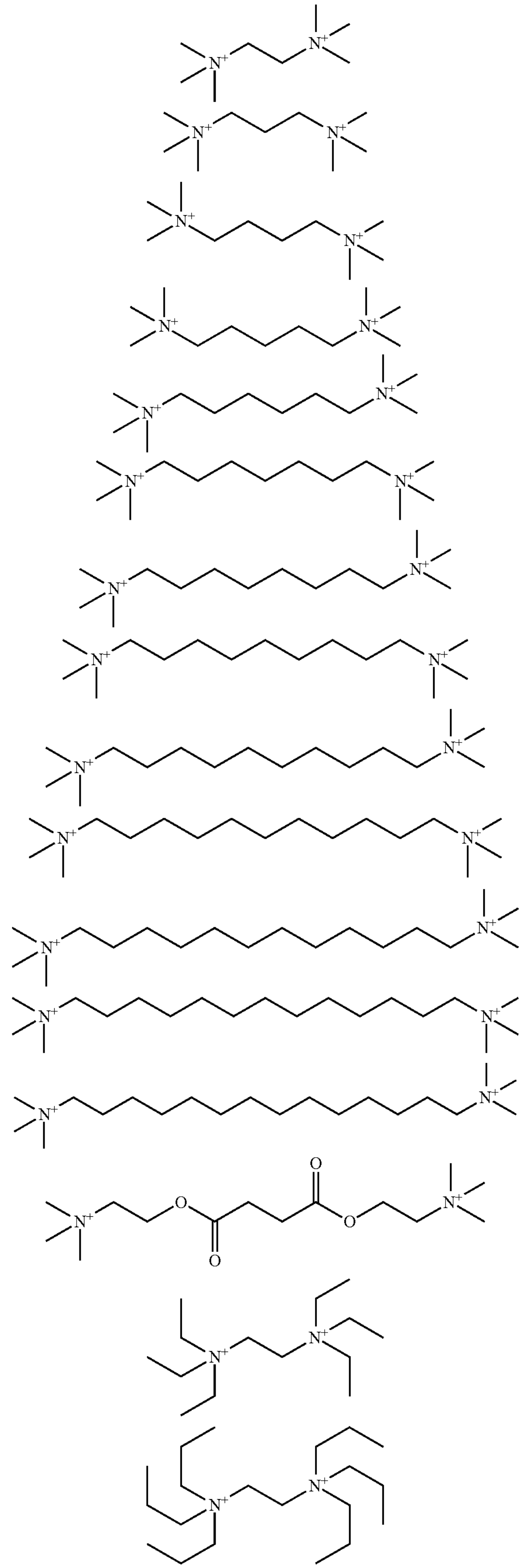

-continued

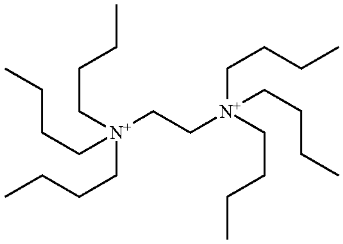

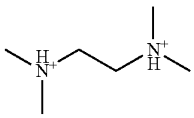

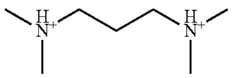

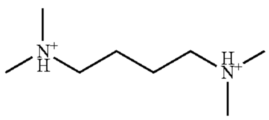

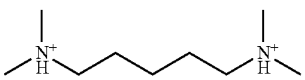

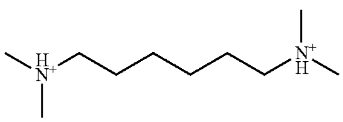

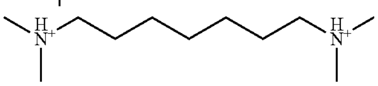

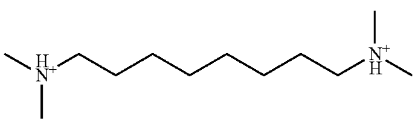

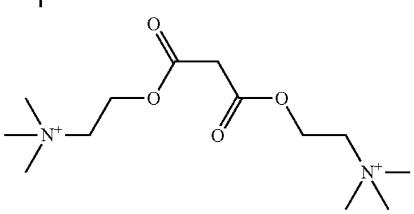

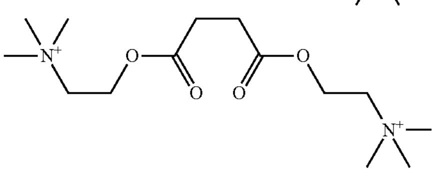

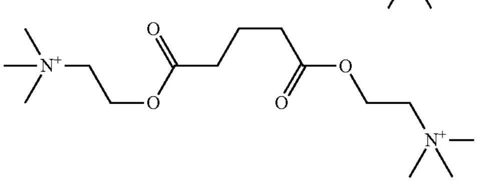

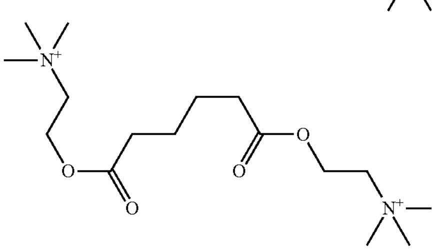

-continued

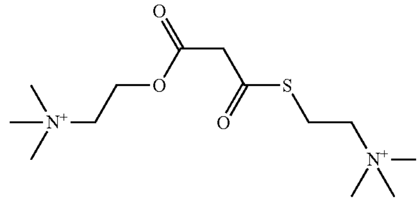

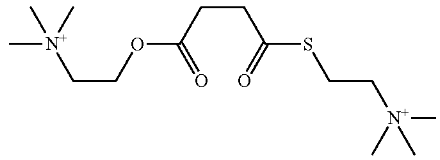

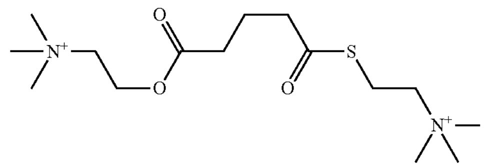

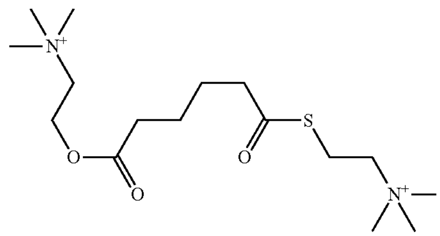

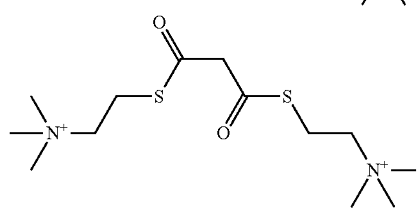

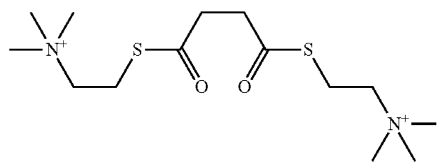

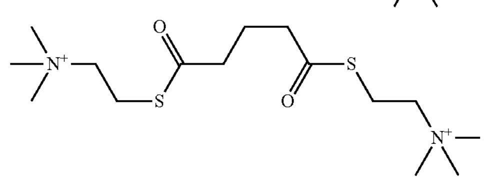

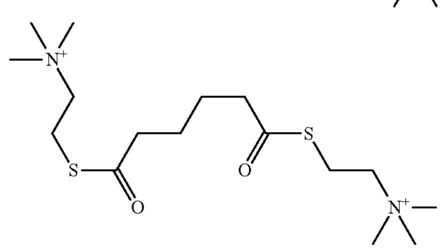

Since the ammonium salt contains iodine or bromine in the molecule, it has substantial EUV absorption. Upon EUV exposure, it generates secondary electrons, followed by energy transfer to an acid generator, leading to sensitization. This establishes a high sensitivity and low acid diffusion, succeeding in improving both LWR or CDU and sensitivity.

The ammonium salt may be synthesized, for example, by neutralization reaction of an ammonium hydroxide or amine compound with an iodized or brominated carboxylic acid.

As the cation of the ammonium salt, a quaternary ammonium cation is preferred because the most acid diffusion suppressing effect is exerted. When a primary, secondary or tertiary ammonium cation is used, the acid diffusion suppressing effect may be enhanced by changing the substituent bonded to the nitrogen atom in the ammonium cation to a bulky structure, for example, an optionally substituted $C_3$-$C_{24}$ monovalent hydrocarbon group or a structure having two substituent groups bonded together to form a ring with the nitrogen atom to which they are attached.

While the resist composition of the invention may be prepared by dissolving the ammonium salt and other resist components in an organic solvent in any arbitrary order or at the same time, the resist composition containing the desired ammonium salt may also be prepared by adding an amine compound capable of providing the cation of the desired ammonium salt and an iodized or brominated carboxylic acid capable of providing the anion of the desired ammonium salt to a solution containing other resist components, and effecting neutralization reaction in the solution. In this case, the amine compound and the iodized or brominated carboxylic acid are preferably combined in such amounts that a molar ratio of amine compound/carboxylic acid may range from 0.8 to 1.2 (i.e., 0.8≤amine compound/carboxylic acid≤1.2), more preferably from 0.9 to 1.1, even more preferably from 0.95 to 1.05.

Alternatively, the resist composition containing the desired ammonium salt may be prepared by adding a sulfonium salt having the anion of the desired ammonium salt and an ammonium salt consisting of the cation of the desired ammonium salt and a fluorosulfonic acid anion to a solution containing other resist components, and effecting cation exchange between the salts in the solution. The fluorosulfonic acid ammonium salt may be either of addition type or of polymer bound type (i.e., bound to the polymer main chain). In this case, the sulfonium salt and the fluorosulfonic acid ammonium salt are preferably combined in such amounts that a molar ratio of sulfonium salt/ammonium salt may range from 0.8 to 1.2 (i.e., 0.8≤sulfonium salt/ammonium salt≤1.2), more preferably from 0.9 to 1.1, even more preferably from 0.95 to 1.05.

From the standpoints of sensitivity and acid diffusion suppressing effect, the ammonium salt is preferably present in the resist composition in an amount of 0.001 to 50 parts, more preferably 0.01 to 20 parts by weight per 100 parts by weight of the base polymer to be described below.

The quencher may contain a quencher other than the ammonium salt. The other quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl group, ether bond, ester bond, lactone ring, cyano group, or sulfonic acid ester bond as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Quenchers of polymer type as described in U.S. Pat. No. 7,598,016 (JP-A 2008-239918) are also useful as the other quencher. The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

Also, an ammonium salt, sulfonium salt or iodonium salt may be added as the other quencher. Suitable ammonium salts, sulfonium salts and iodonium salts added as the other quencher are salts with carboxylic acid, sulfonic acid, sulfonimide and saccharin. The carboxylic acid used herein may or may not be fluorinated at α-position.

The other quencher is preferably added in an amount of 0 to 5 parts, more preferably 0 to 4 parts by weight per 100 parts by weight of the base polymer.

Acid Generator

The chemically amplified resist composition contains an acid generator. The acid generator used herein may be either an acid generator of addition type which is different from the ammonium salt and components to be described later, or an acid generator of polymer bound type which also functions as a base polymer, that is, an acid generator-and-base polymer component.

The acid generator of addition type is typically a compound (PAG) capable of generating an acid upon exposure to actinic ray or radiation. Although the PAG used herein may be any compound capable of generating an acid upon exposure to high-energy radiation, those compounds capable of generating sulfonic acid, sulfonimide or sulfonmethide are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG, compounds having the formula (3) are also preferably used.

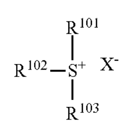

(3)

In formula (3), $R^{101}$, $R^{102}$ and $R^{103}$ are each independently a $C_1$-$C_{20}$ monovalent hydrocarbon group which may contain a heteroatom, any two of $R^{101}$, $R^{102}$ and $R^{103}$ may bond together to form a ring with the sulfur atom to which they are attached. The monovalent hydrocarbon group may be straight, branched or cyclic, and examples thereof include $C_1$-$C_{12}$ alkyl groups, $C_6$-$C_{12}$ aryl groups, and $C_7$-$C_{20}$ aralkyl groups. Also included are substituted forms of the foregoing groups in which some or all of the hydrogen atoms are substituted by $C_1$-$C_{10}$ alkyl, halogen, trifluoromethyl, cyano, nitro, hydroxyl, mercapto, $C_1$-$C_{10}$ alkoxy, $C_2$-$C_{10}$ alkoxycarbonyl, or $C_2$-$C_{10}$ acyloxy moieties, or some carbon is substituted by a carbonyl moiety, ether bond or ester bond.

Examples of the cation in the sulfonium salt having formula (3) are shown below, but not limited thereto.

-continued
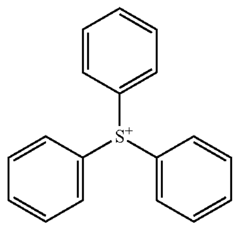
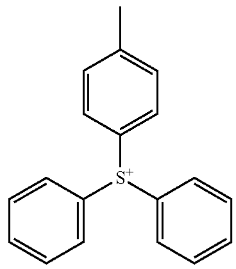
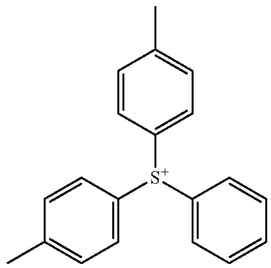
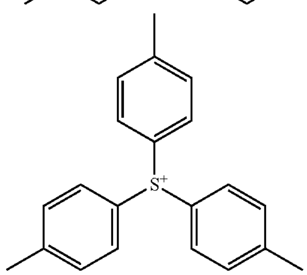
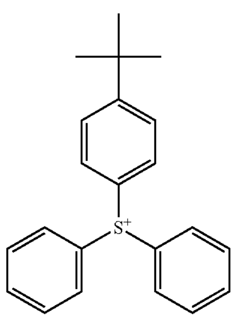
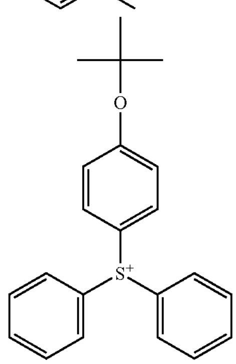
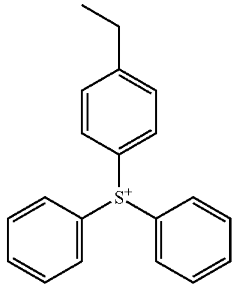
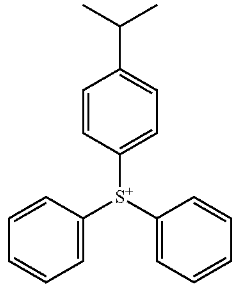
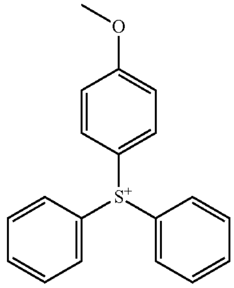
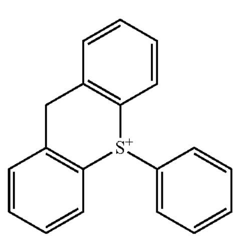
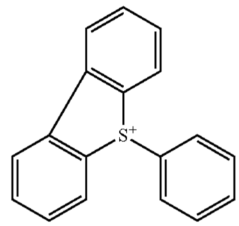
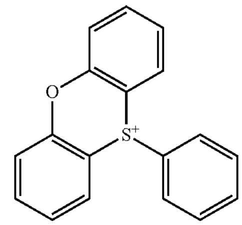
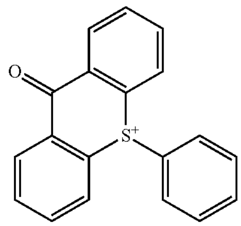
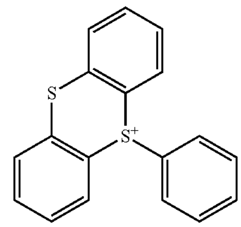
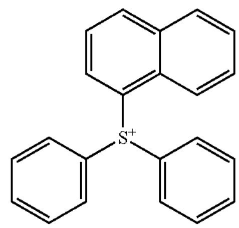
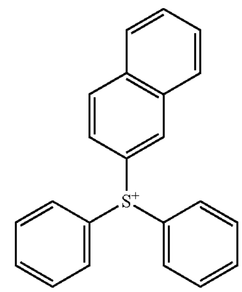
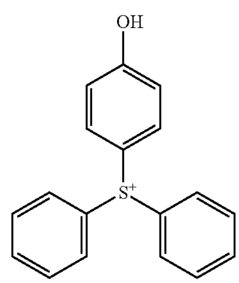
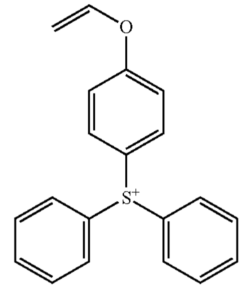
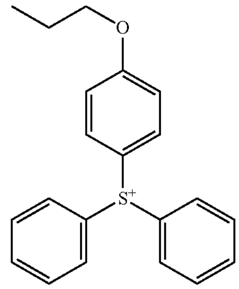
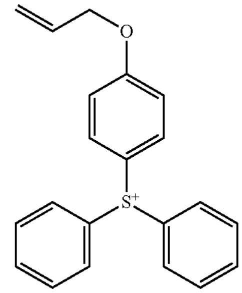
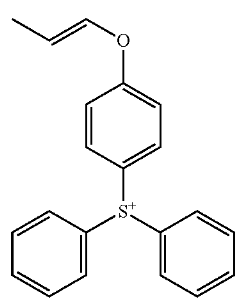
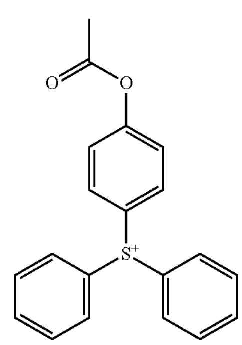

-continued
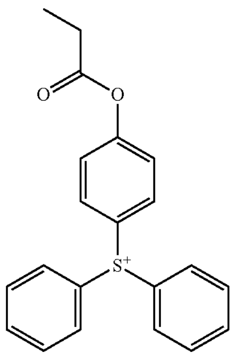
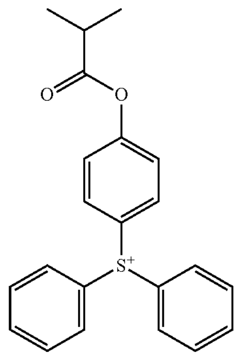
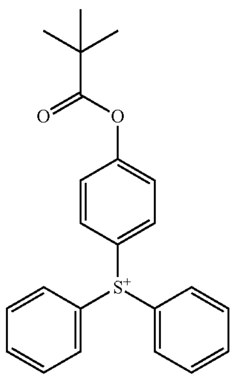
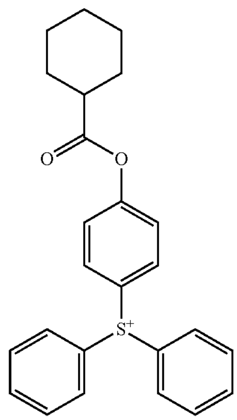
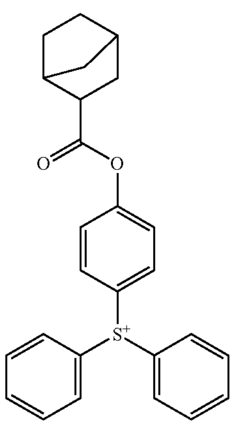
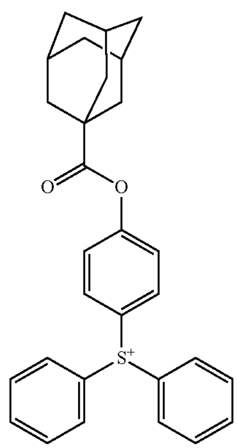
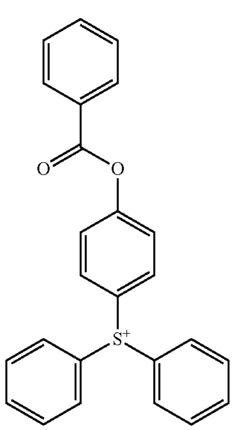
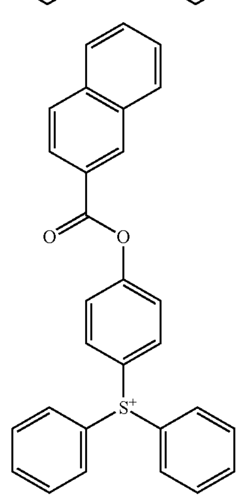
-continued
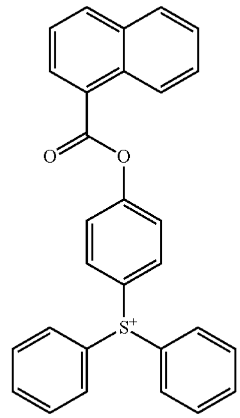
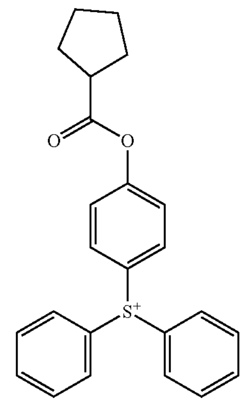
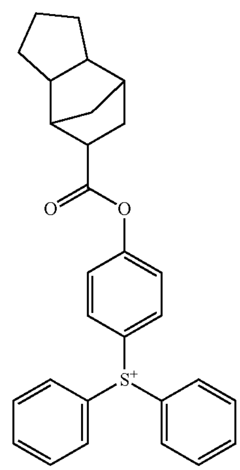
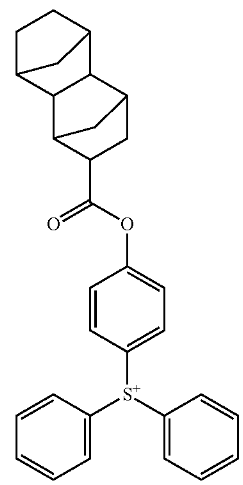
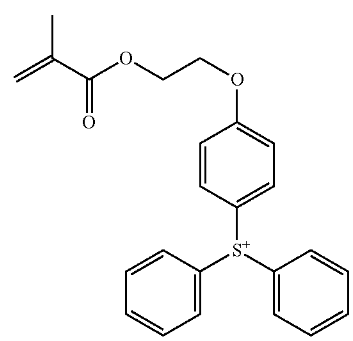
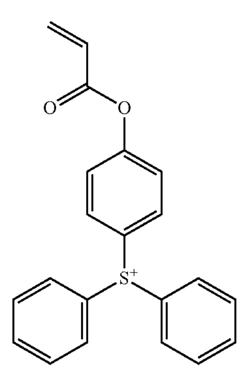
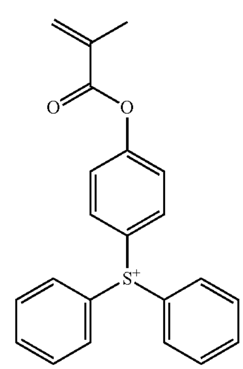

-continued
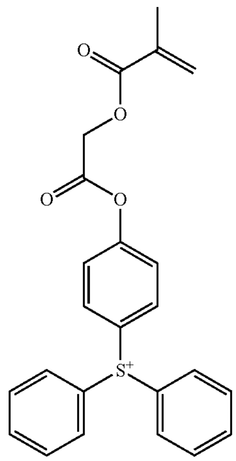
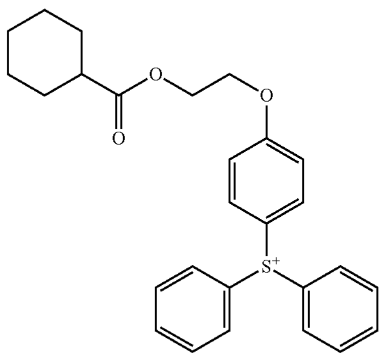
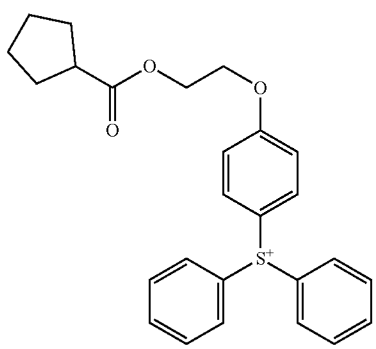
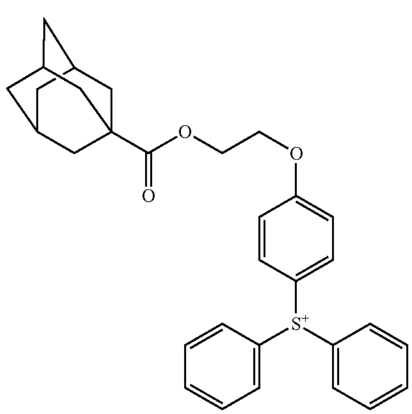
-continued
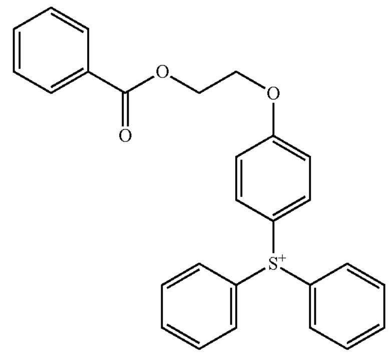
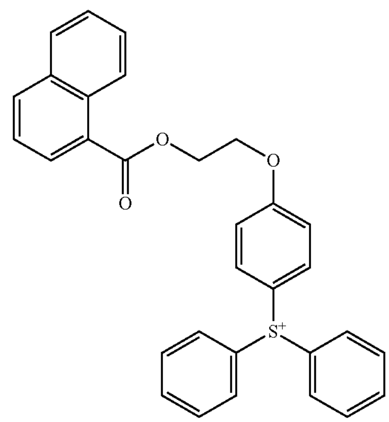
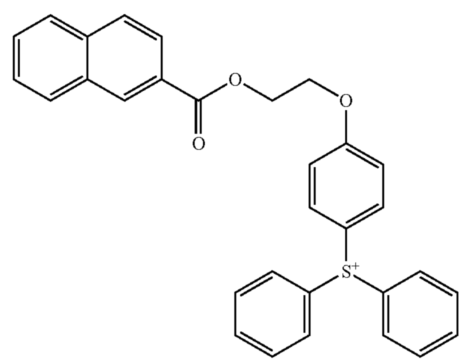
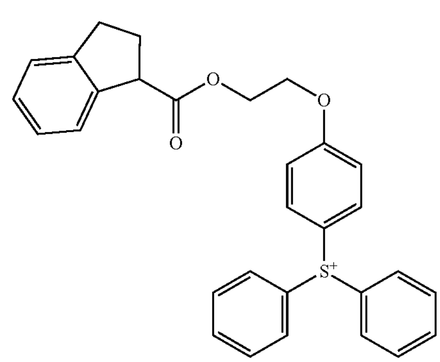

-continued
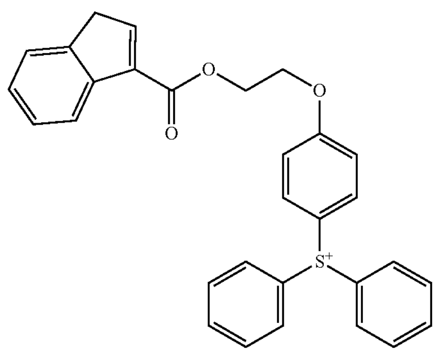
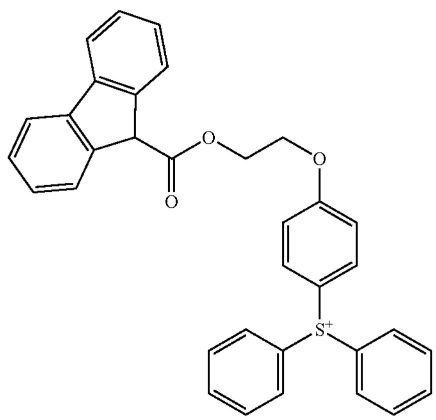
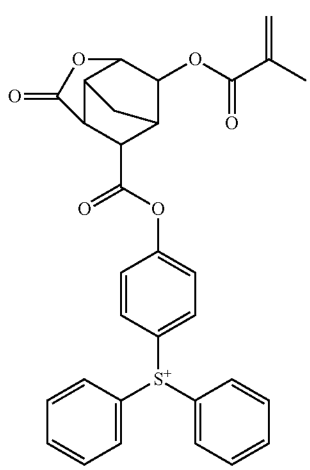
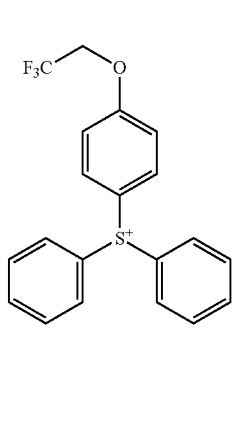
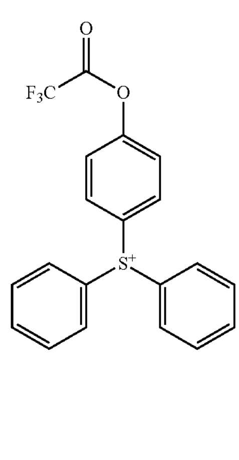
-continued
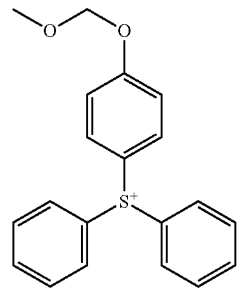
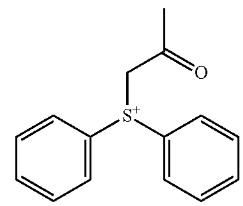
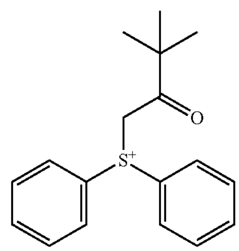
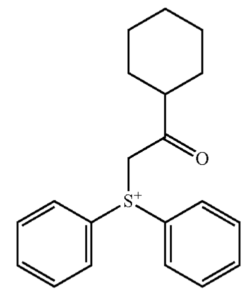
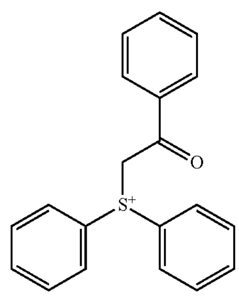
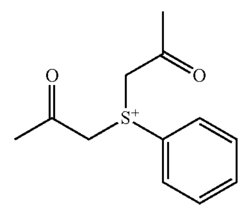
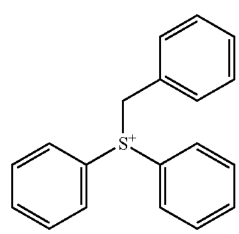
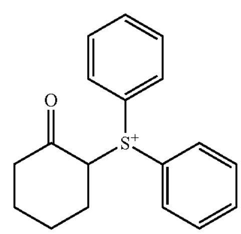
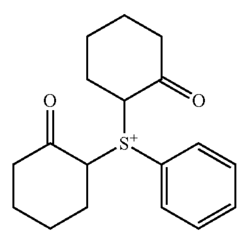
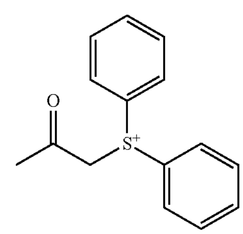
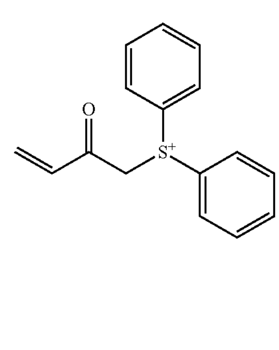

-continued
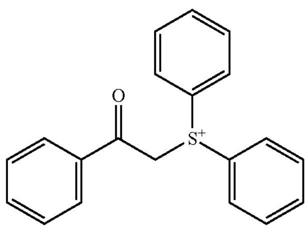
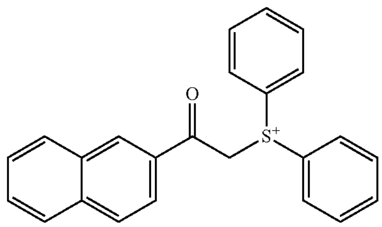
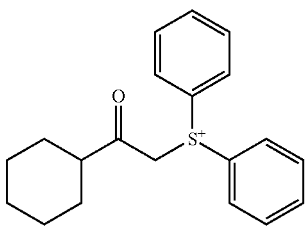
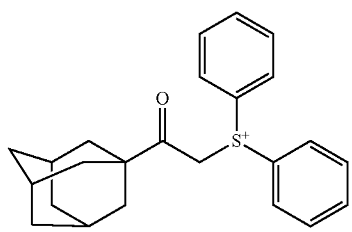
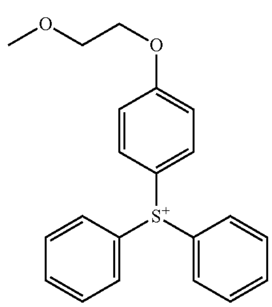
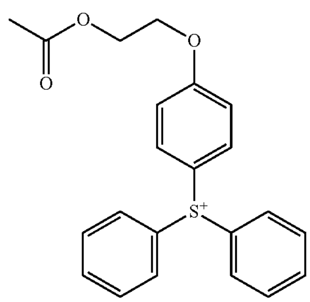
-continued
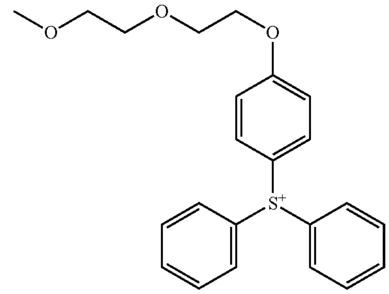
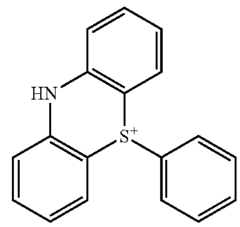
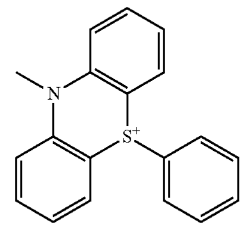
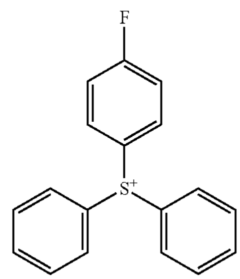
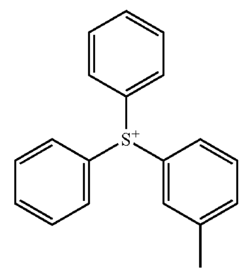
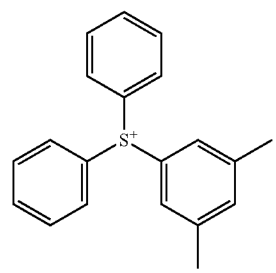
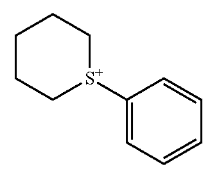
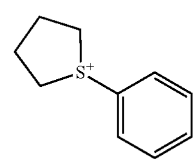
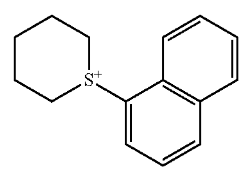
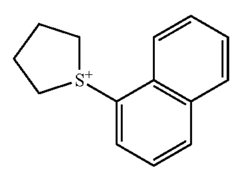
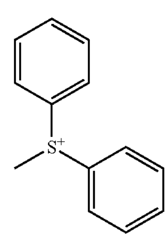
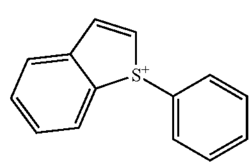
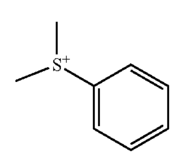

-continued
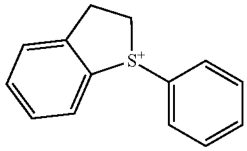
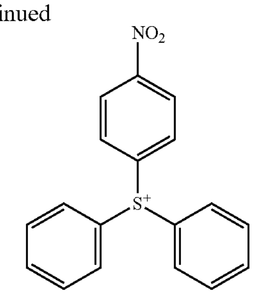
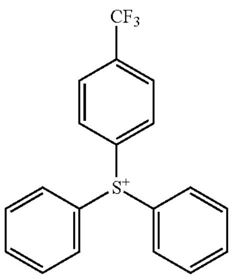
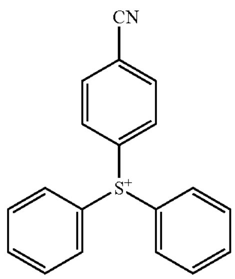
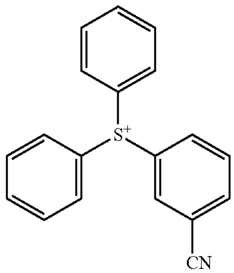
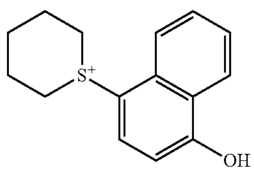
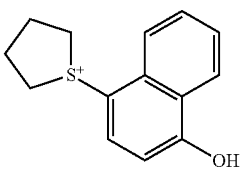
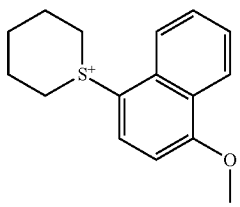
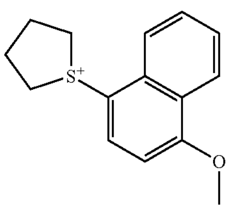
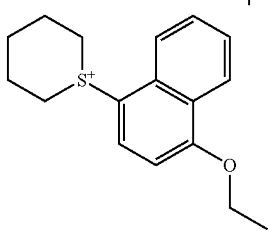
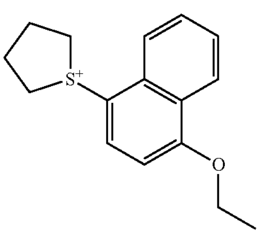
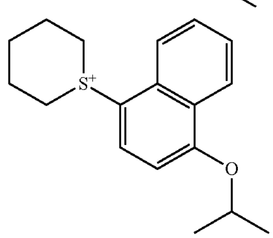
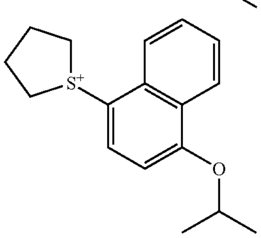
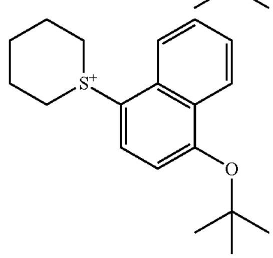
-continued
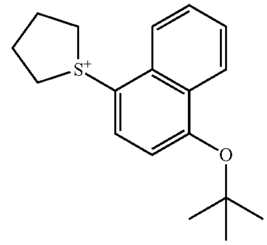
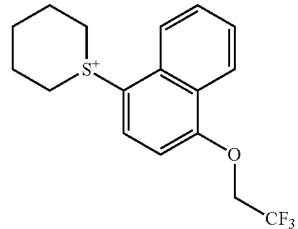
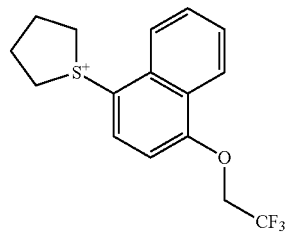
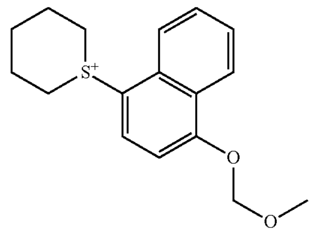
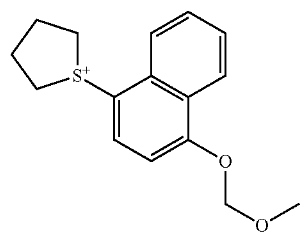
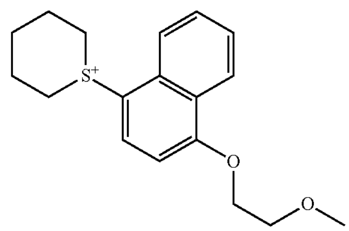
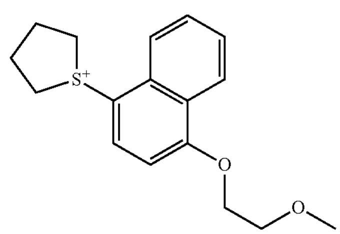
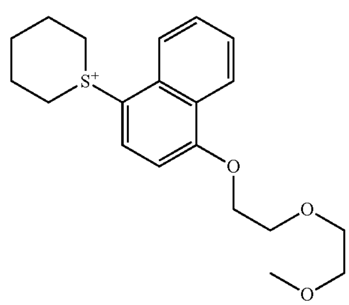

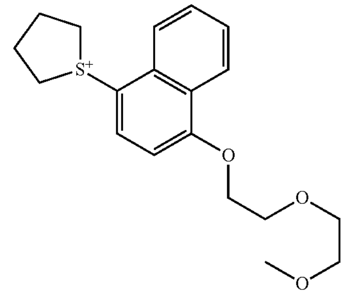
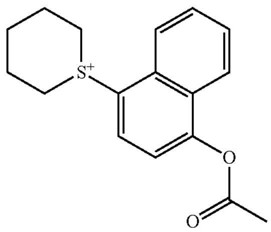
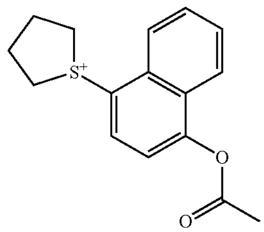
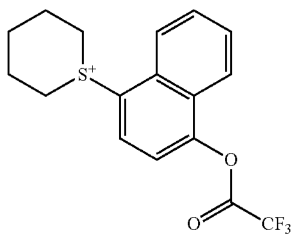
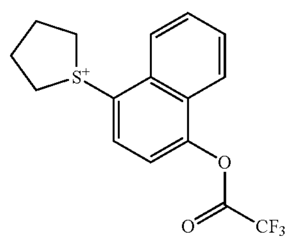
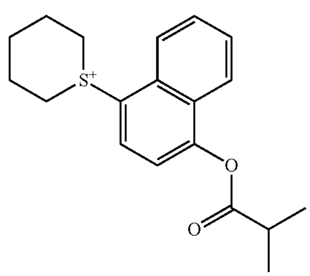
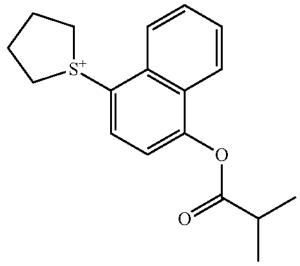
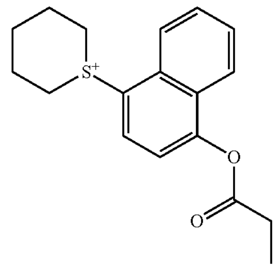
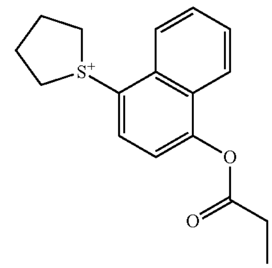
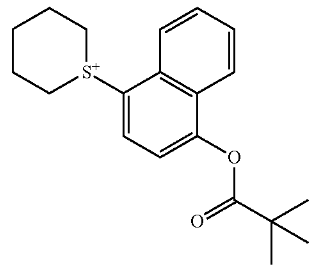
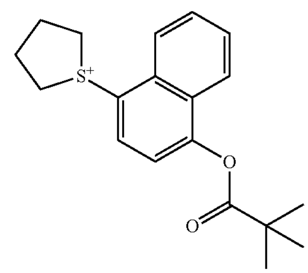
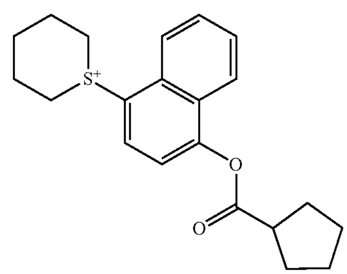
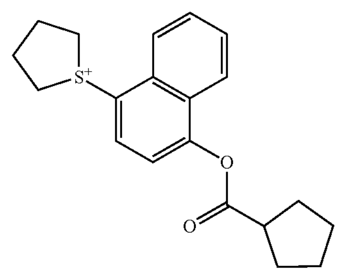
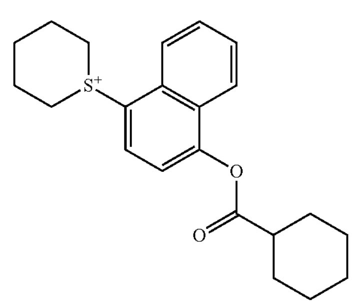

-continued
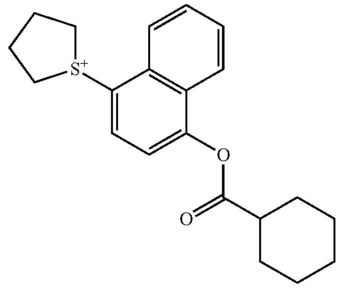
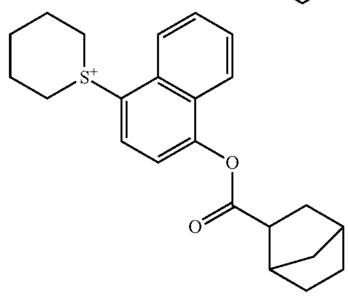
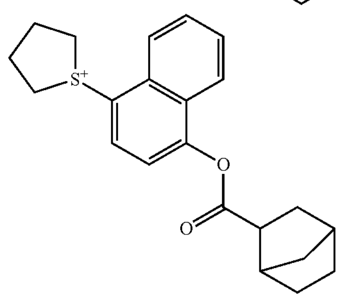
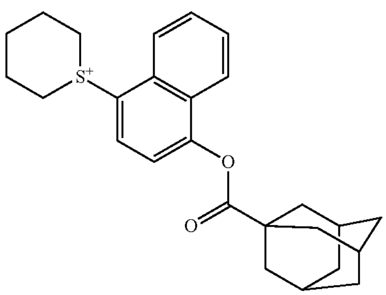
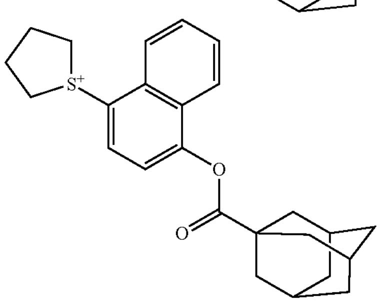
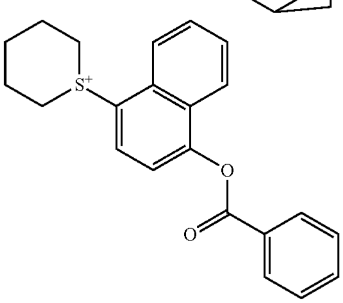
-continued
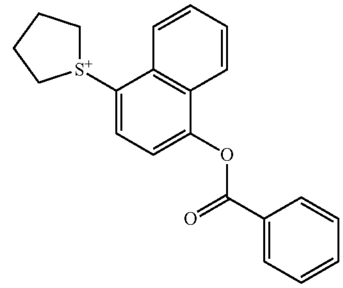
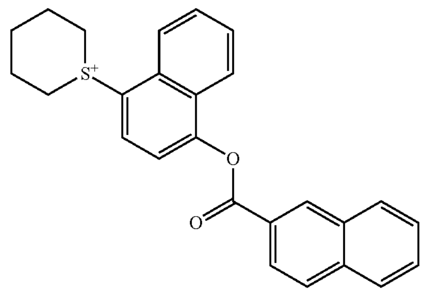
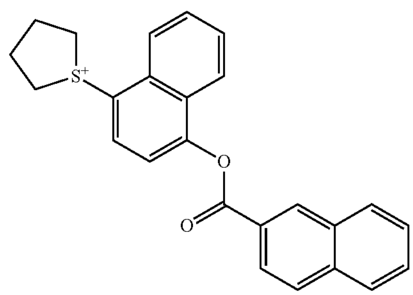
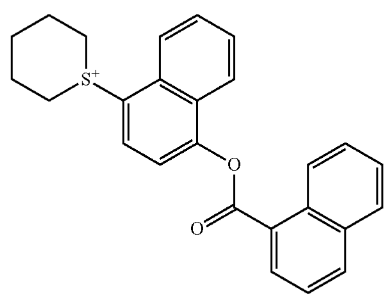
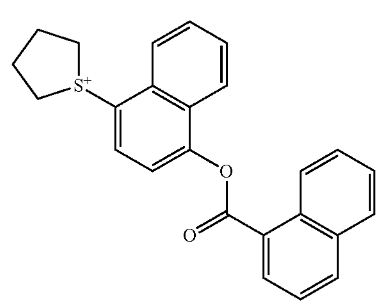

-continued
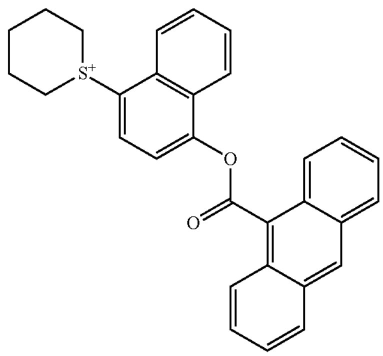
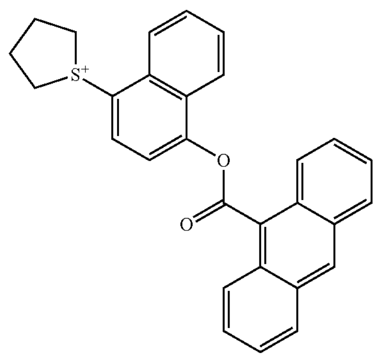
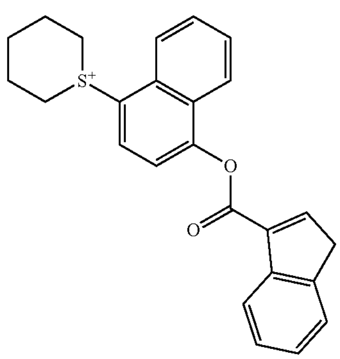
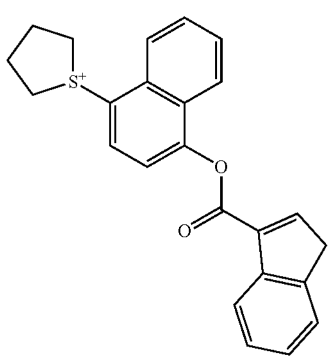
-continued
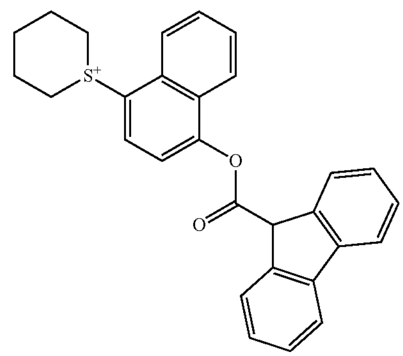
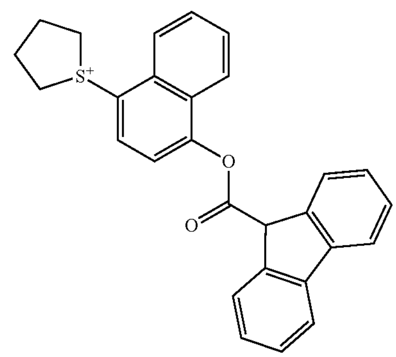
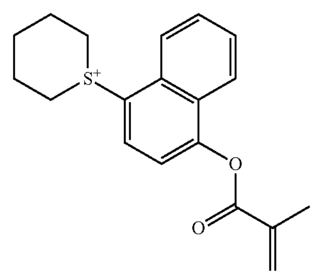
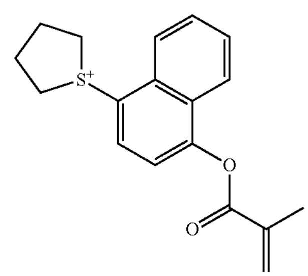
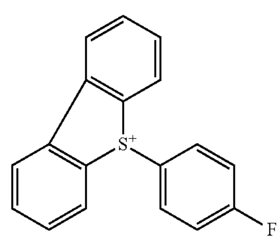
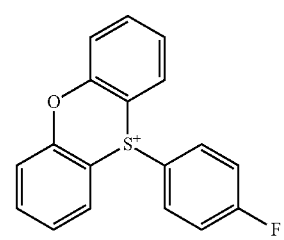
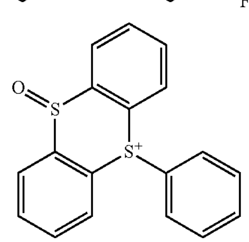
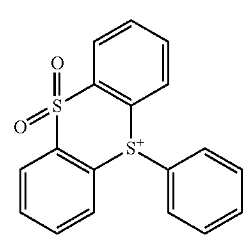

-continued
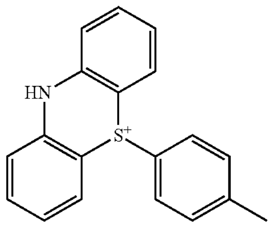
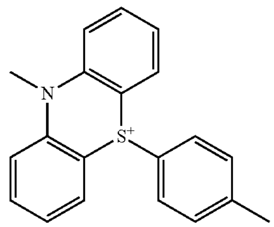
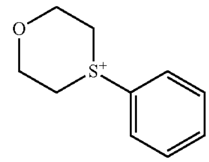
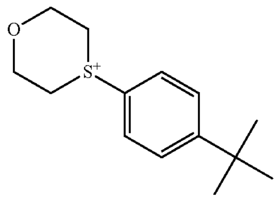
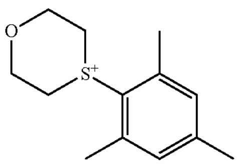
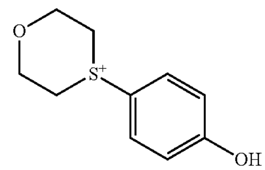
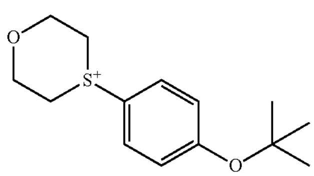
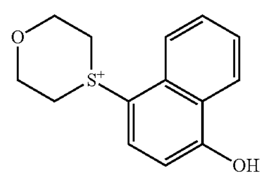
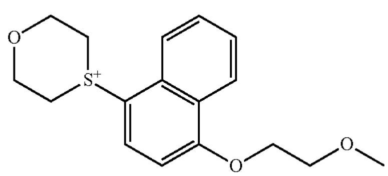
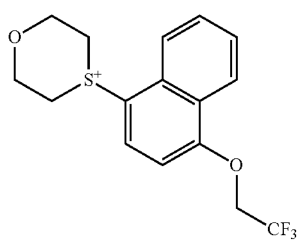
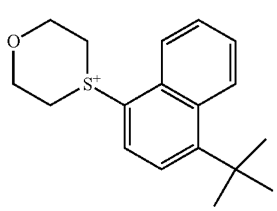
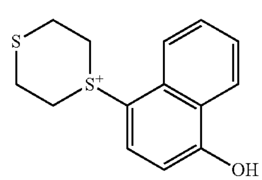
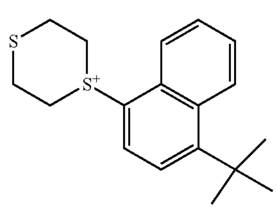
-continued
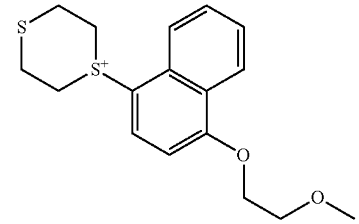
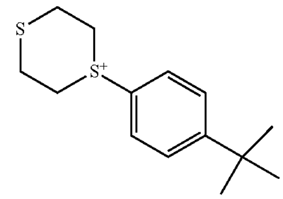
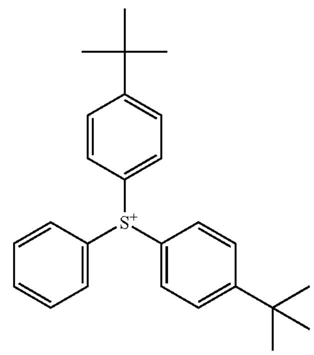
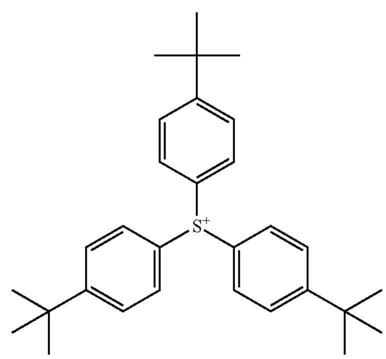
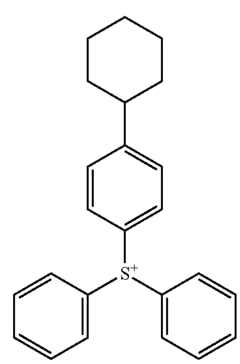

-continued
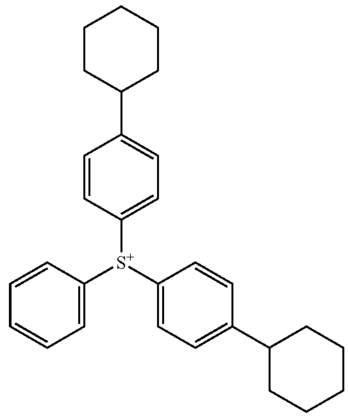
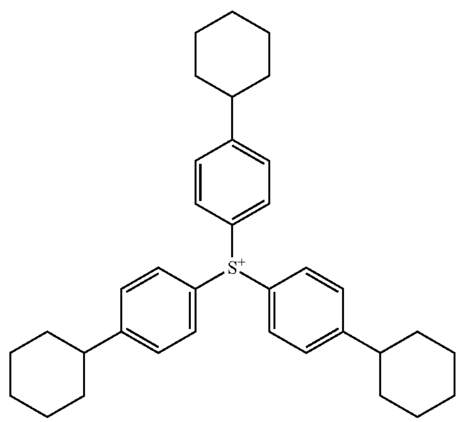
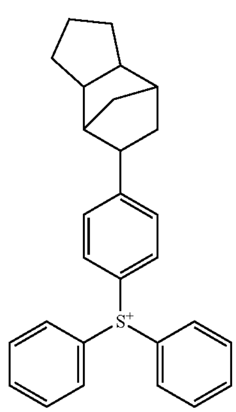
-continued
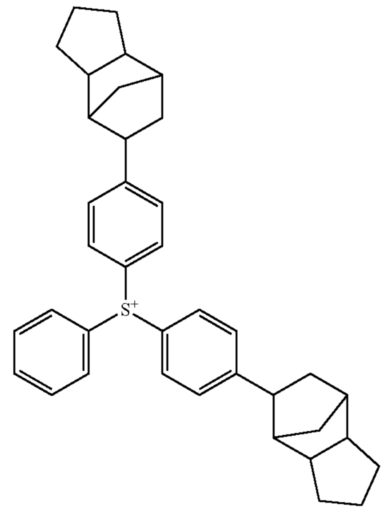
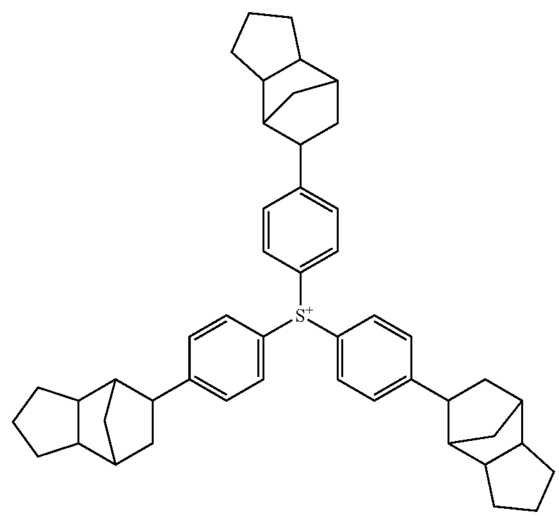
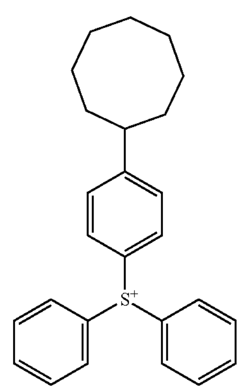

-continued
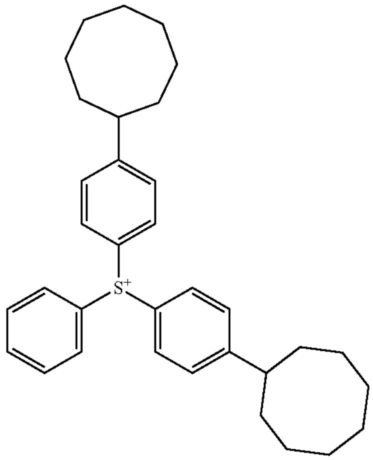
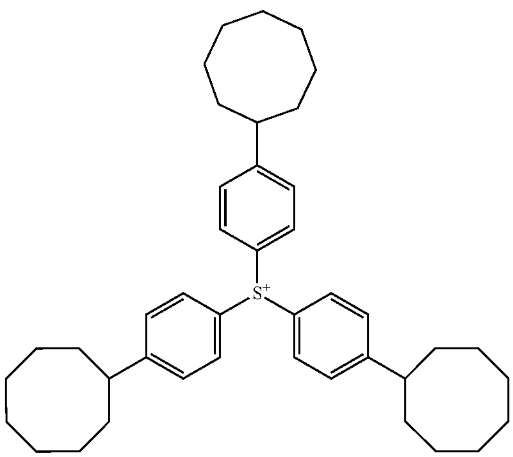
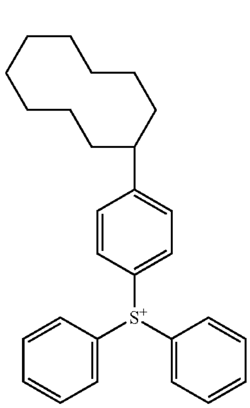
-continued
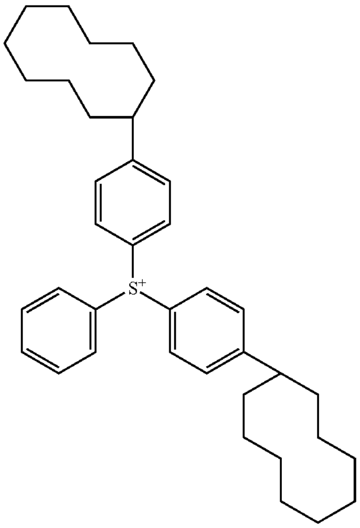
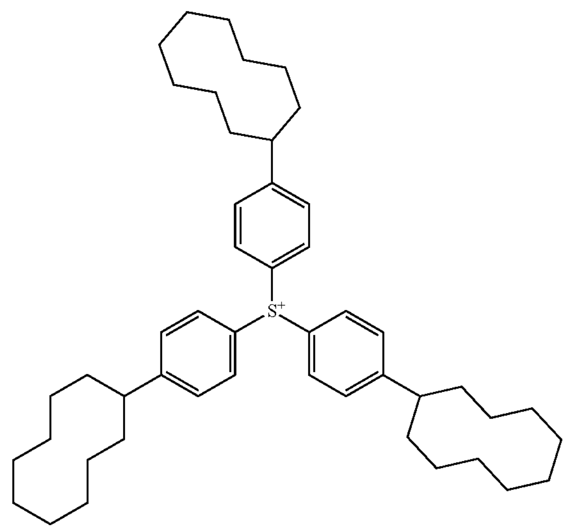
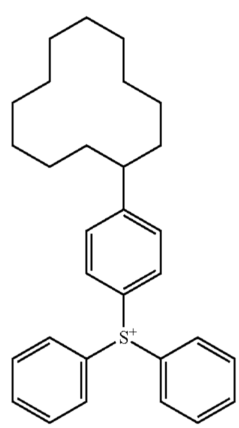

-continued
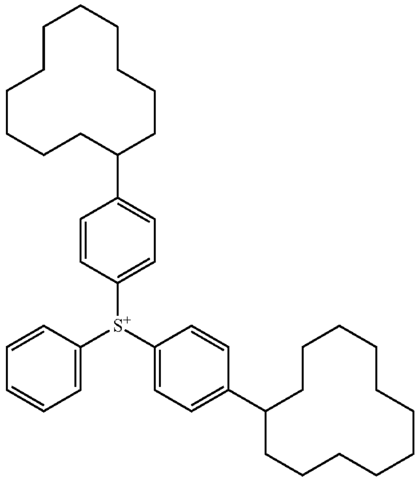
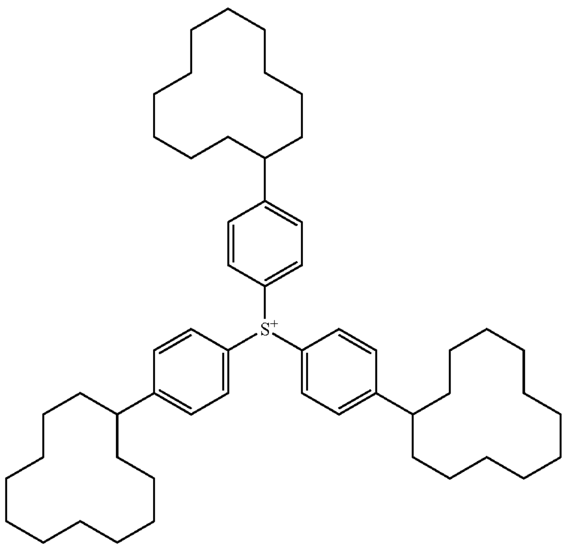
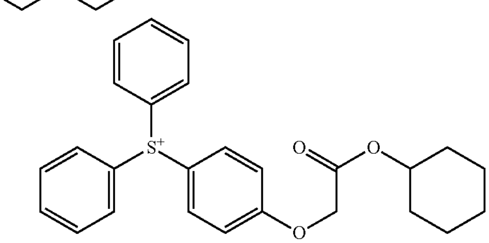
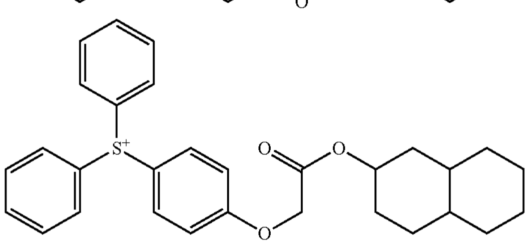
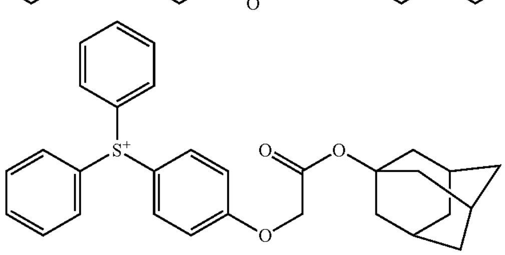
-continued
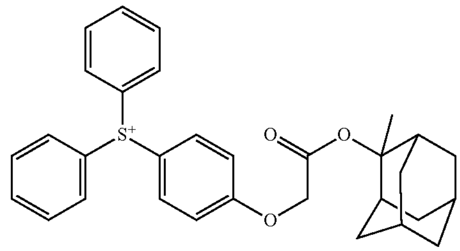
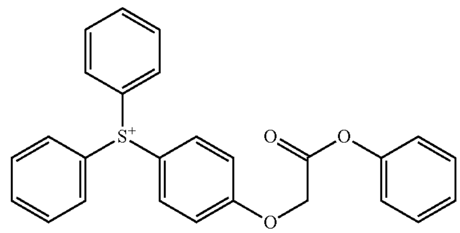
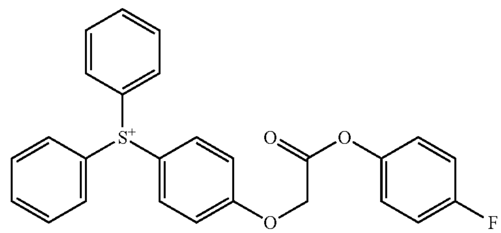
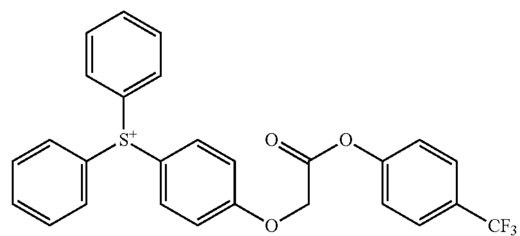
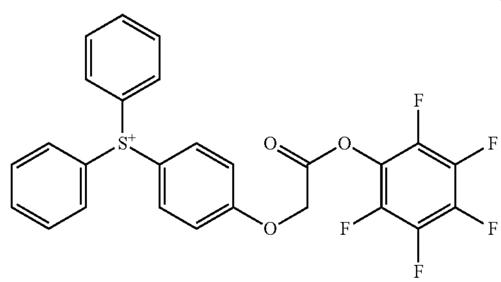
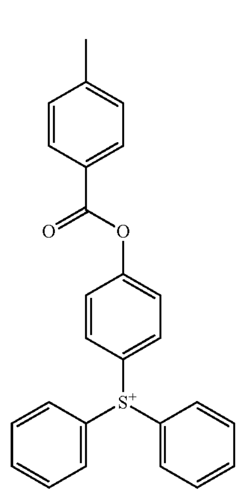
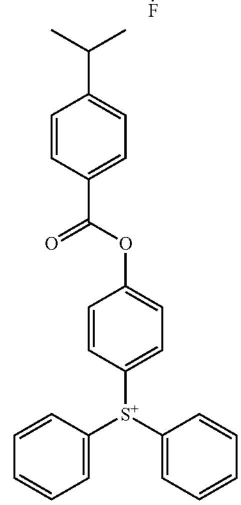

-continued
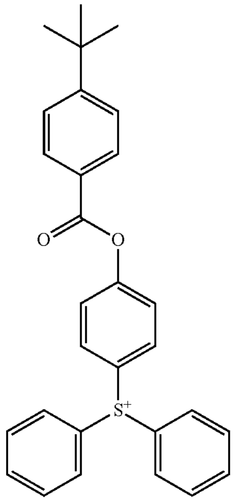
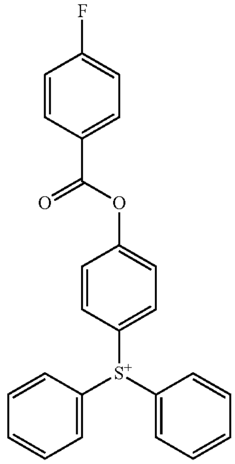
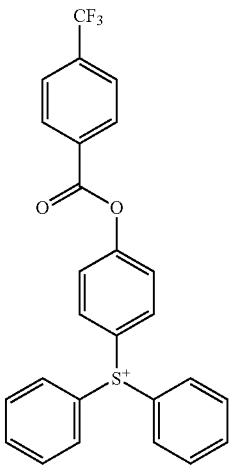
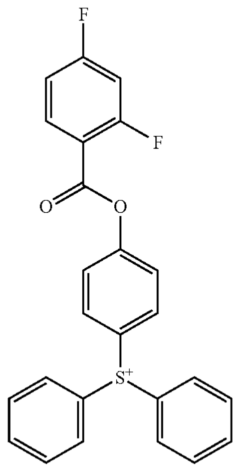
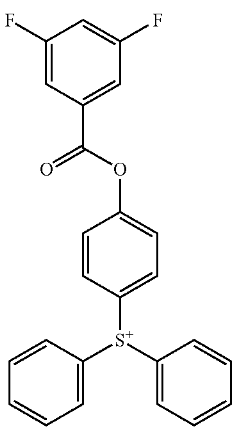
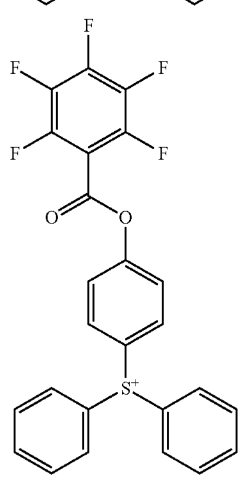
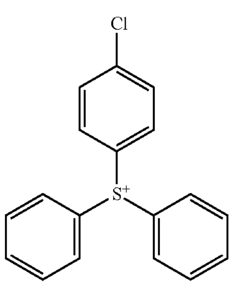
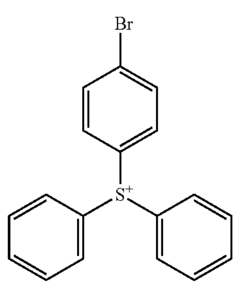
-continued
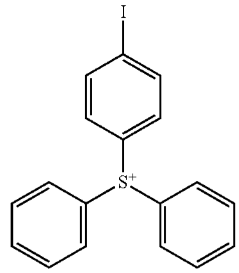
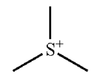
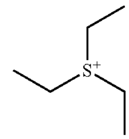
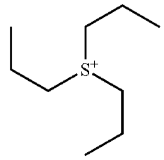
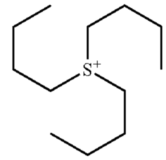
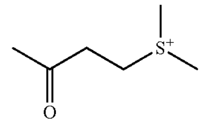
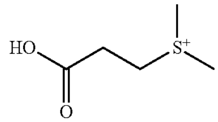
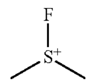
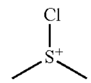
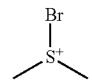
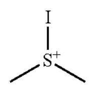
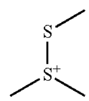
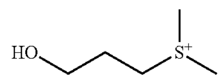
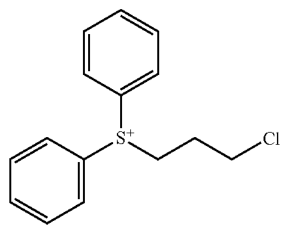
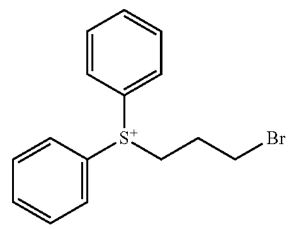
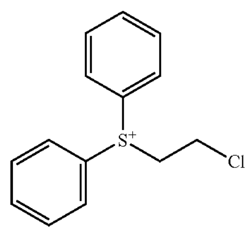
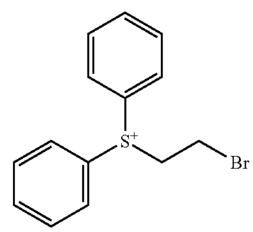
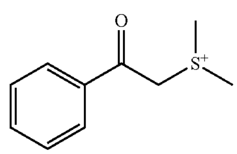
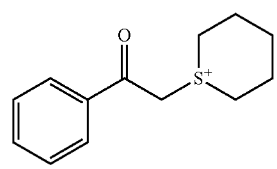
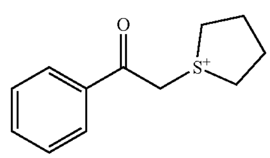
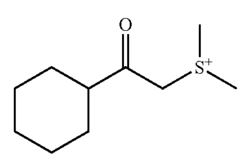
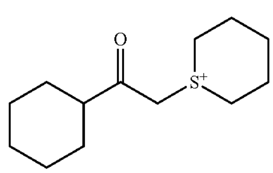
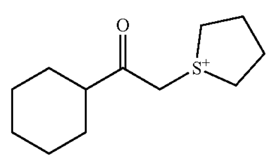

-continued

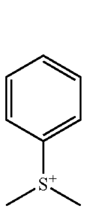
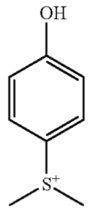
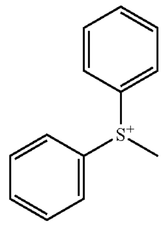
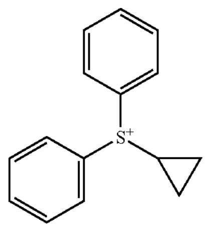
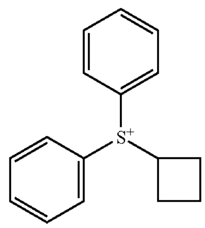
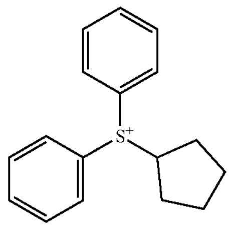
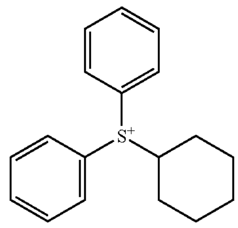
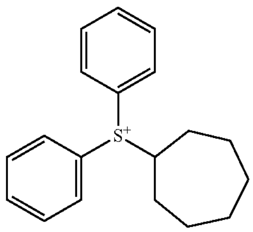
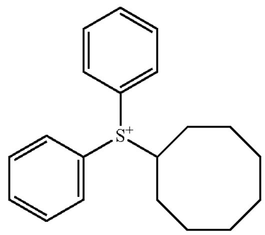
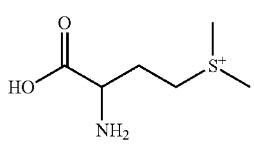
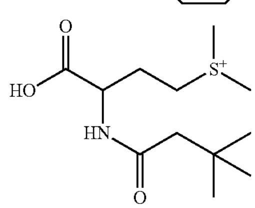

In formula (3), $X^-$ is an anion selected from the formulae (3A) to (3D).

$$R^{fa}-CF_2-SO_3^- \quad (3A)$$

(3B)

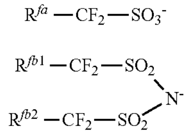

(3C)

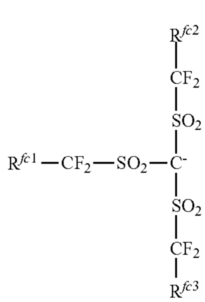

-continued (3D)

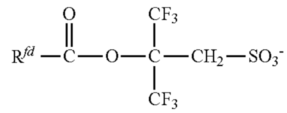

In formula (3A), $R^{fa}$ is fluorine or a $C_1$-$C_{40}$ straight, branched or cyclic monovalent hydrocarbon group which may contain a heteroatom.

Of the anions of formula (3A), a structure having formula (3A') is preferred.

(3A')

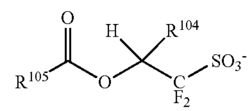

In formula (3A'), $R^{104}$ is hydrogen or trifluoromethyl, preferably trifluoromethyl. $R^{105}$ is a $C_1$-$C_{38}$ straight, branched or cyclic monovalent hydrocarbon group which may contain a heteroatom. Suitable heteroatoms include oxygen, nitrogen, sulfur and halogen, with oxygen being preferred. Of the monovalent hydrocarbon groups, those of 6 to 30 carbon atoms are preferred because a high resolution is available in fine pattern formation. Suitable monovalent hydrocarbon groups include methyl, ethyl, propyl, isopropyl, butyl, isobutyl, s-butyl, t-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-damantyl, 2-adamantyl, 1-adamantylmethyl, norbornyl, norbornylmethyl, tricyclodecanyl, tetracyclododecanyl, tetracyclododecanylmethyl, dicyclohexylmethyl, icosanyl, allyl, benzyl, diphenylmethyl, tetrahydrofuryl, methoxymethyl, ethoxymethyl, methylthiomethyl, acetamidomethyl, trifluoroethyl, (2-methoxyethoxy)methyl, acetoxymethyl, 2-arboxy-yclohexyl, 2-oxopropyl, 4-oxo-1-adamantyl, and 3-oxocyclohexyl. Also included are the foregoing groups in which some hydrogen is replaced by a radical containing a heteroatom such as oxygen, sulfur, nitrogen or halogen, or in which some carbon is replaced by a radical containing a heteroatom such as oxygen, sulfur or nitrogen, so that the group may contain a hydroxyl, cyano, carbonyl, ether, ester, sulfonic acid ester, carbonate, lactone ring, sultone ring, carboxylic acid anhydride or haloalkyl radical.

With respect to the synthesis of the sulfonium salt having an anion of formula (3A'), reference is made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (3A) are shown below, but not limited thereto.

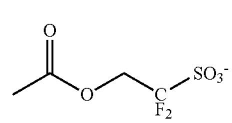
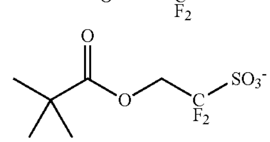

-continued
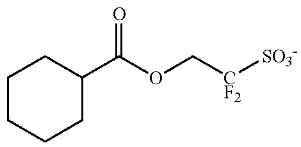
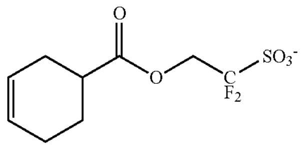
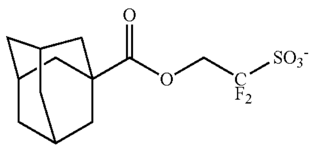
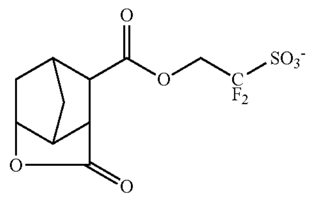
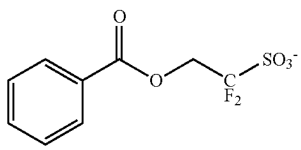
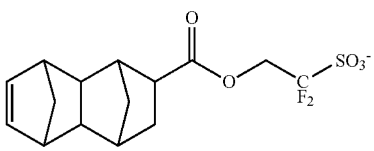
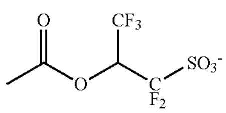
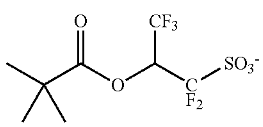
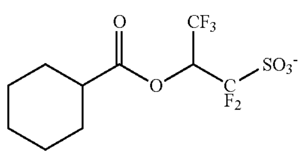
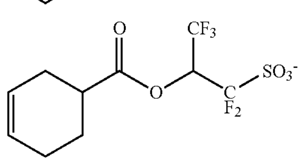
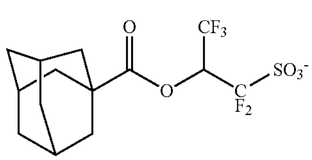
-continued
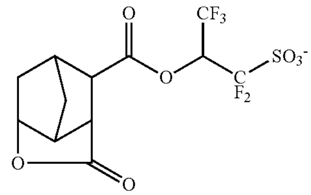
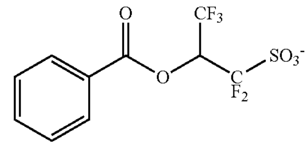
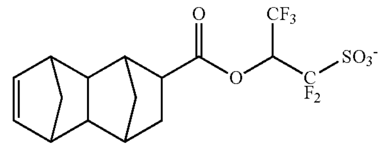
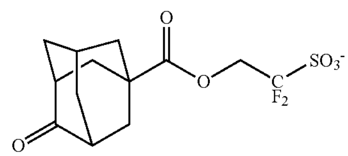
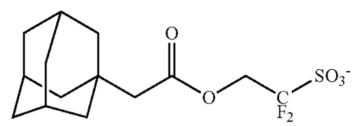
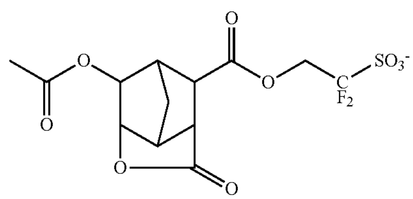
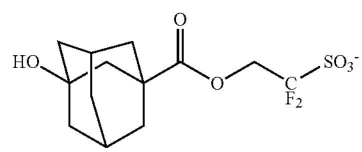
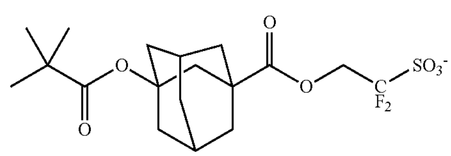
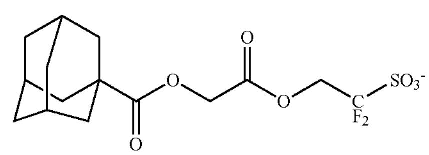
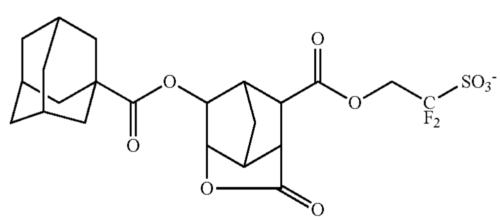

-continued

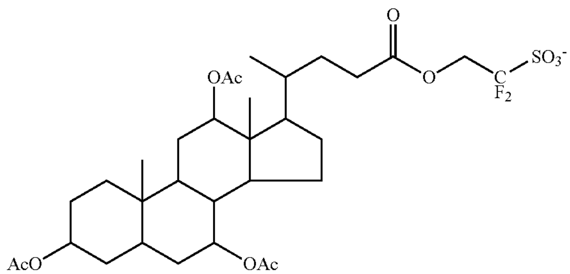

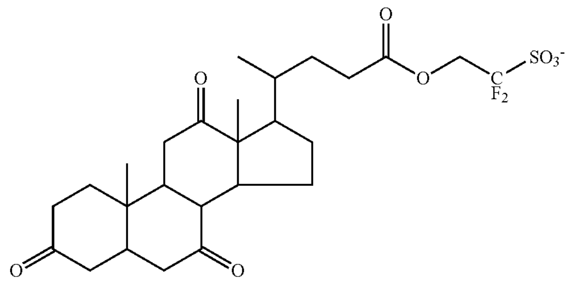

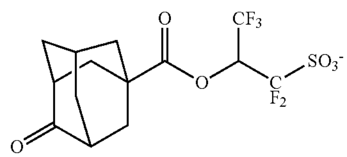

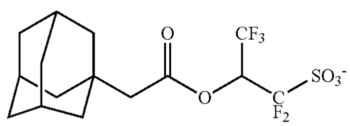

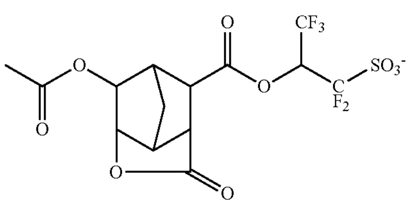

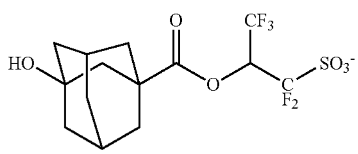

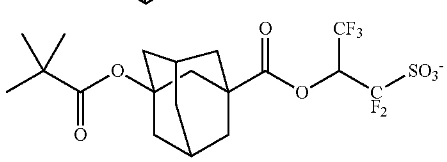

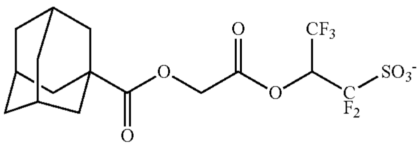

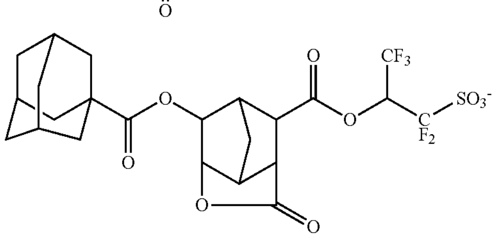

-continued

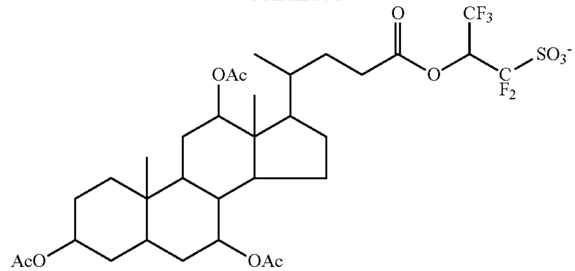

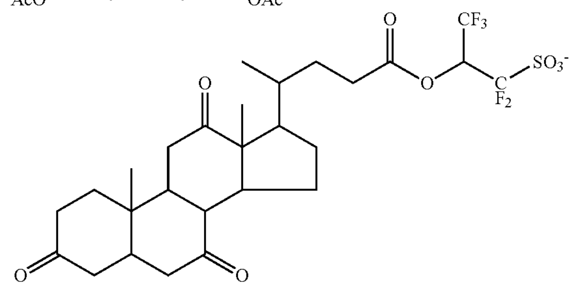

In formula (3B), $R^{fb1}$ and $R^{fb2}$ are each independently fluorine or a $C_1$-$C_{40}$ straight, branched or cyclic monovalent hydrocarbon group which may contain a heteroatom.

Suitable monovalent hydrocarbon groups are as exemplified above for $R^{105}$. Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage (—$CF_2$—$SO_2$—N—$SO_2$—$CF_2$—) to which they are attached, and preferably the pair is a fluorinated ethylene or fluorinated propylene group to form a ring structure.

In formula (3C), $R^{fc1}$, $R^{fc2}$ and $R^{fc3}$ are each independently fluorine or a $C_1$-$C_{40}$ straight, branched or cyclic monovalent hydrocarbon group which may contain a heteroatom. Suitable monovalent hydrocarbon groups are as exemplified above for $R^{105}$. Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage (—$CF_2$—$SO_2$—$C^-$—$SO_2$—$CF_2$—) to which they are attached, and preferably the pair is a fluorinated ethylene or fluorinated propylene group to form a ring structure.

In formula (3D), $R^{fd}$ is a $C_1$-$C_{40}$ straight, branched or cyclic monovalent hydrocarbon group which may contain a heteroatom. Suitable monovalent hydrocarbon groups are as exemplified above for $R^{105}$.

With respect to the synthesis of the sulfonium salt having an anion of formula (3D), reference is made to JP-A 2010-215608 and JP-A 2014-133723.

Examples of the anion having formula (3D) are shown below, but not limited thereto.

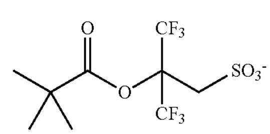

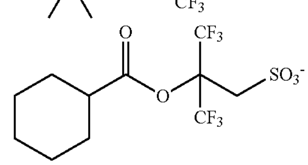

-continued

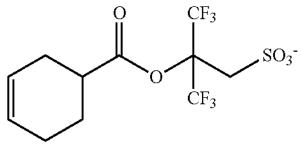

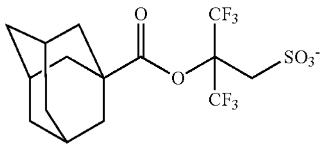

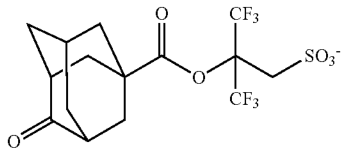

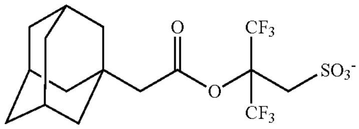

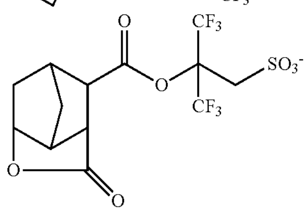

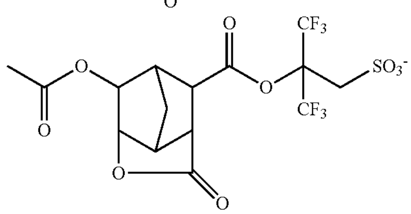

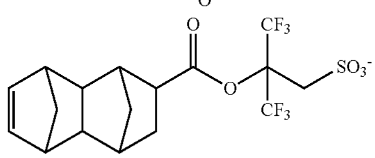

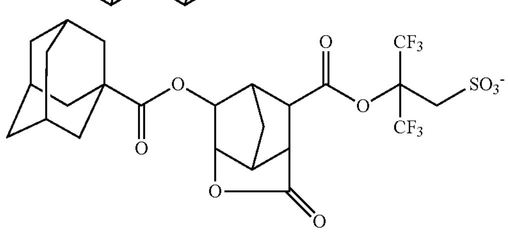

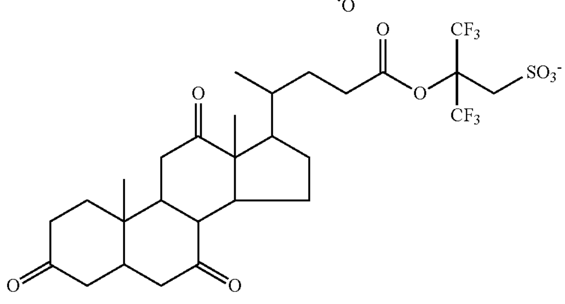

The compound having the anion of formula (3D) has a sufficient acid strength to cleave acid labile groups in the base polymer because it is free of fluorine at α-position of sulfo group, but has two trifluoromethyl groups at β-position. Thus the compound is a useful PAG.

Also compounds having the formula (4) are useful as the PAG.

(4)

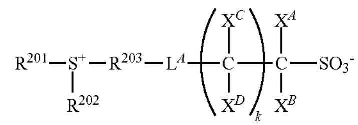

In formula (4), $R^{201}$ and $R^{202}$ are each independently a $C_1$-$C_{30}$ straight, branched or cyclic monovalent hydrocarbon group which may contain a heteroatom. $R^{203}$ is a $C_1$-$C_{30}$ straight, branched or cyclic divalent hydrocarbon group which may contain a heteroatom.

Any two of $R^{201}$, $R^{202}$ and $R^{203}$ may bond together to form a ring with the sulfur atom to which they are attached. $L^A$ is a single bond, ether bond or a straight, branched or cyclic $C_1$-$C_{20}$ divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

Suitable monovalent hydrocarbon groups include methyl, ethyl, propyl, isopropyl, n-butyl, s-butyl, t-butyl, n-pentyl, t-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, adamantyl, phenyl, naphthyl and anthracenyl. Also included are the foregoing groups in which some hydrogen is replaced by a radical containing a heteroatom such as oxygen, sulfur, nitrogen or halogen, or in which some carbon is replaced by a radical containing a heteroatom such as oxygen, sulfur or nitrogen, so that the group may contain a hydroxyl, cyano, carbonyl, ether, ester, sulfonic acid ester, carbonate, lactone ring, sultone ring, carboxylic acid anhydride or haloalkyl radical.

Suitable divalent hydrocarbon groups include linear alkane diyl groups such as methylene, ethylene, propane-1,3-diyl; butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl; saturated cyclic divalent hydrocarbon groups such as cyclopentanediyl, cyclohexanediyl, norboranediyl, and adamantanediyl; and unsaturated cyclic divalent hydrocarbon groups such as phenylene and naphthylene. Also included are the foregoing groups in which some hydrogen is replaced by an alkyl group such as methyl, ethyl, propyl, n-butyl or t-butyl, or in which some hydrogen is replaced by a radical containing a heteroatom such as oxygen, sulfur, nitrogen or halogen, or in which some carbon is replaced by a radical containing a heteroatom such as oxygen, sulfur or nitrogen, so that the group may contain a hydroxyl, cyano, carbonyl, ether, ester, sulfonic acid ester, carbonate, lactone ring, sultone ring, carboxylic acid anhydride or haloalkyl radical. Suitable heteroatoms include oxygen, nitrogen, sulfur and halogen, with oxygen being preferred.

Of the PAGs having formula (4), those having formula (4') are preferred.

(4')

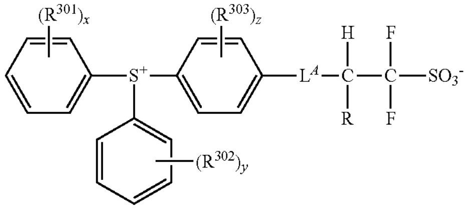

In formula (4'), $L^A$ is as defined above. R is hydrogen or trifluoromethyl, preferably trifluoromethyl. $R^{301}$, $R^{302}$ and $R^{303}$ are each independently hydrogen or a $C_1$-$C_{20}$ straight, branched or cyclic monovalent hydrocarbon group which may contain a heteroatom. Suitable monovalent hydrocarbon groups are as exemplified above for $R^{105}$. The subscripts x and y each are an integer of 0 to 5, and z is an integer of 0 to 4.

Examples of the PAG having formula (4) are shown below, but not limited thereto. Herein R is as defined above.

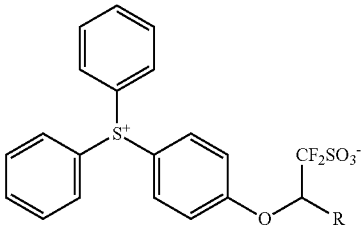

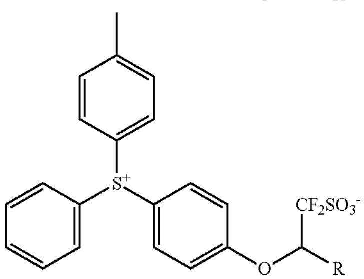

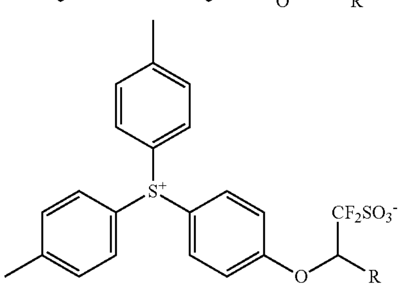

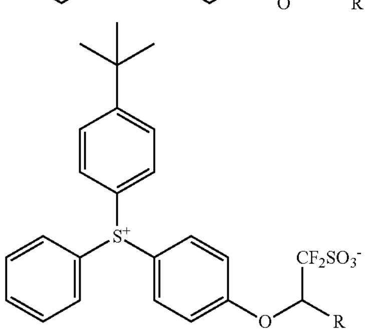

-continued

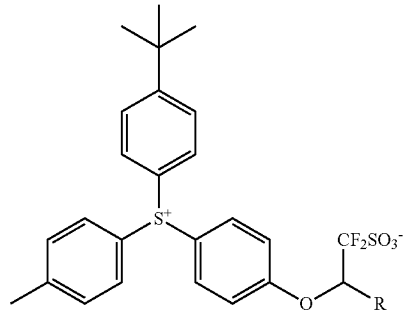

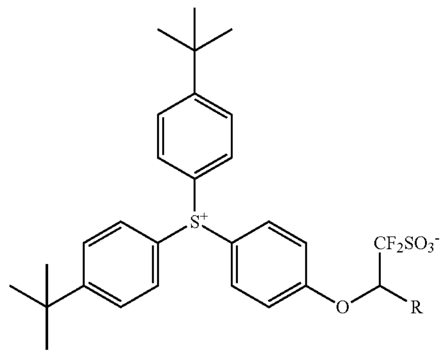

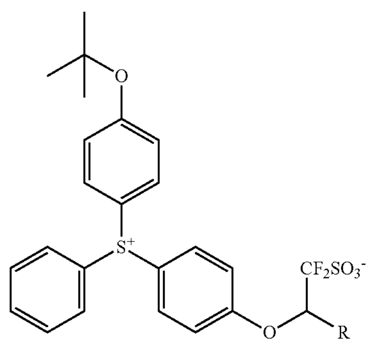

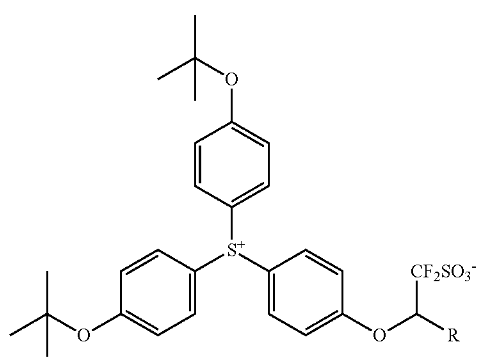

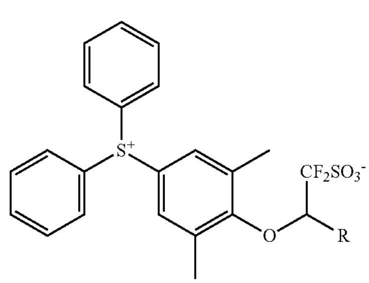

-continued
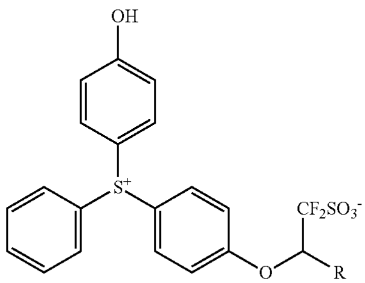
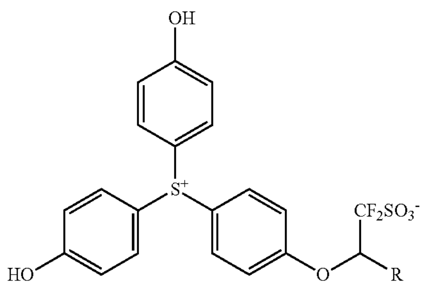
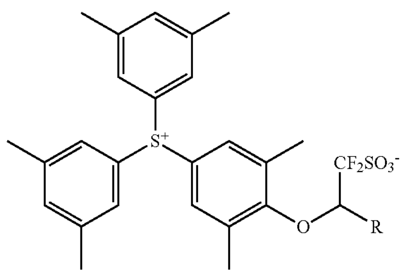
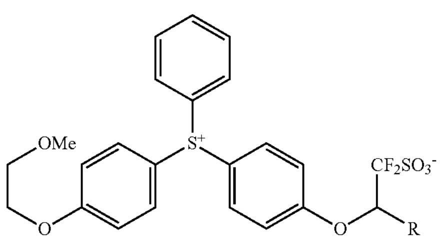
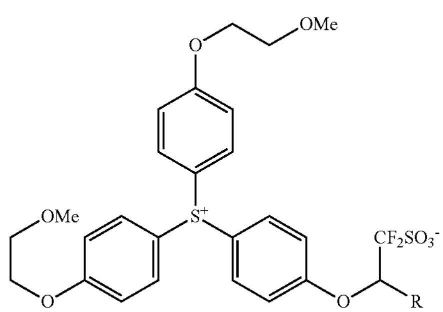
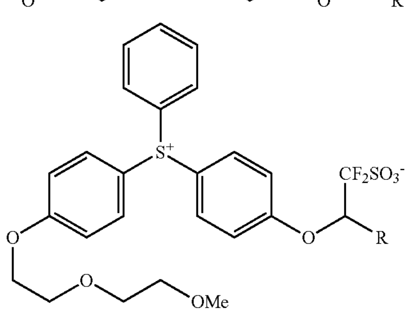
-continued
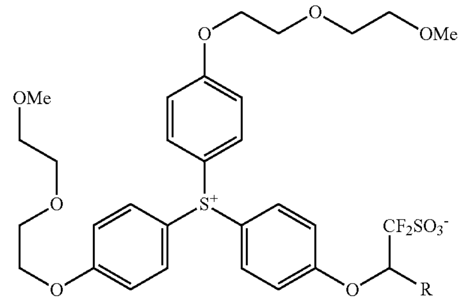
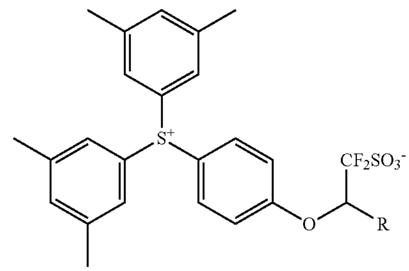
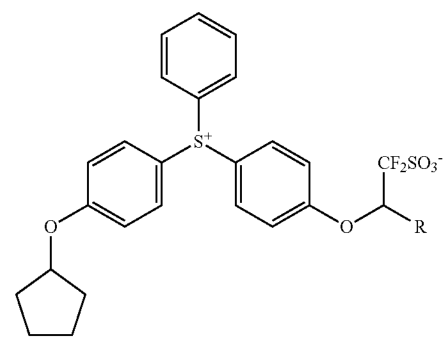
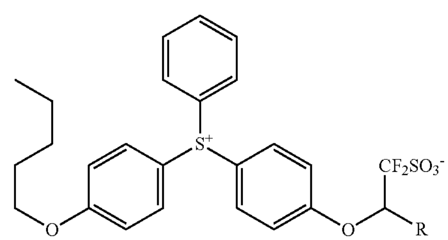
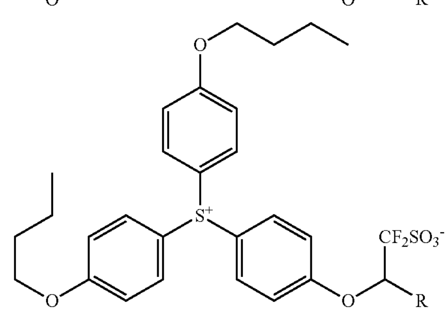
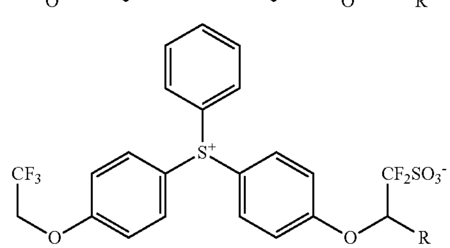

-continued
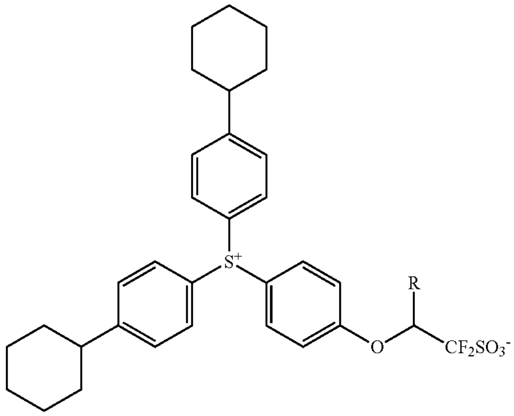
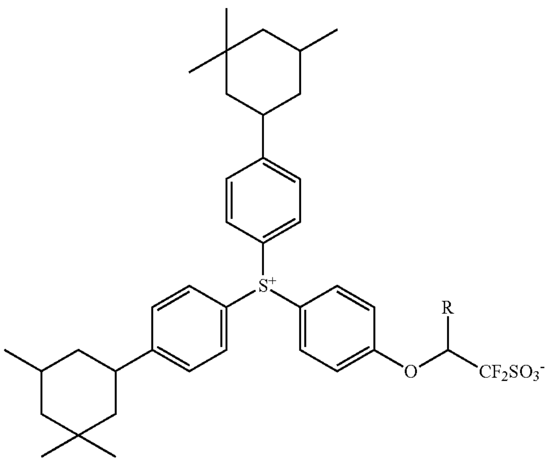
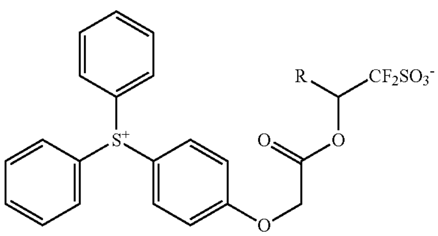
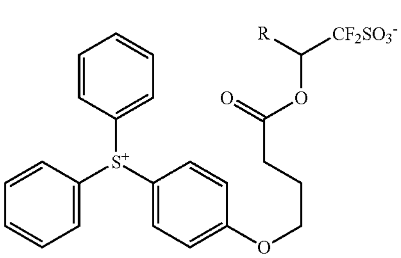
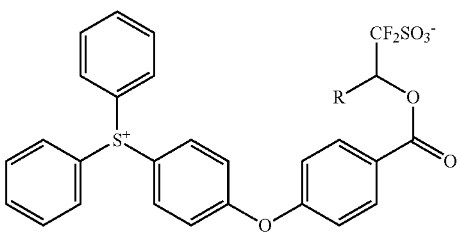
-continued
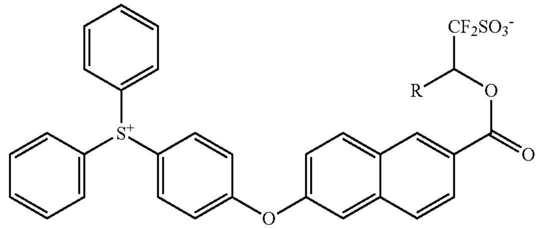
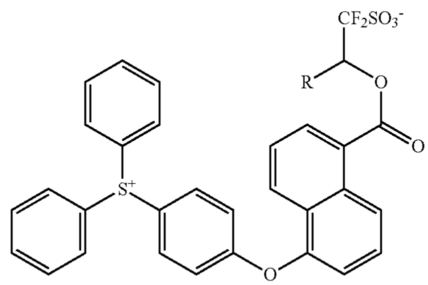
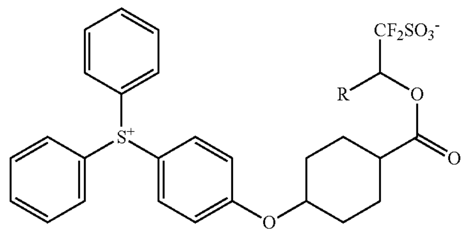
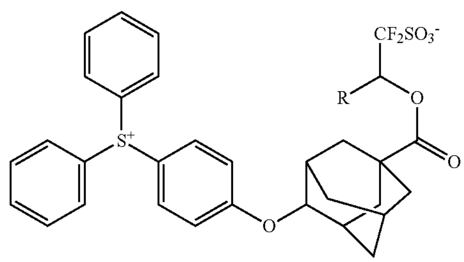
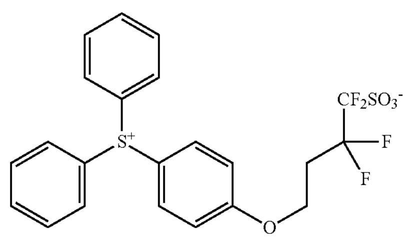
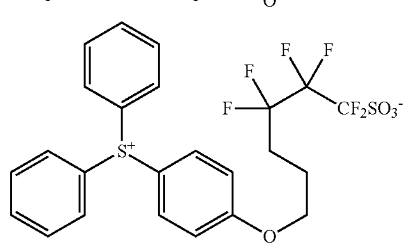
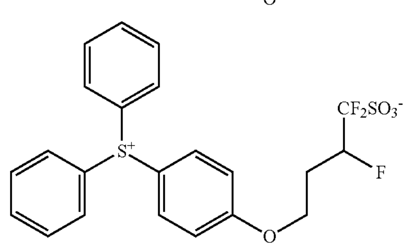

-continued

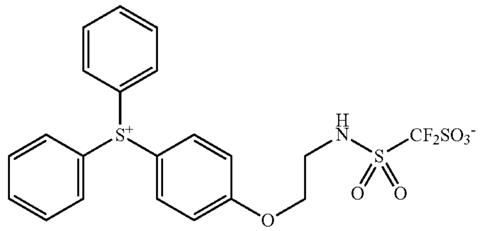

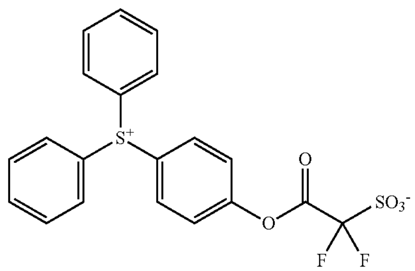

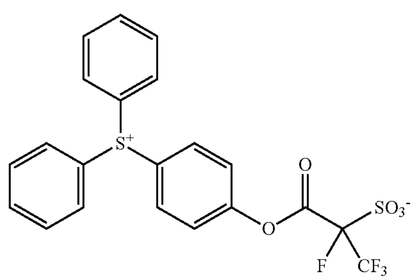

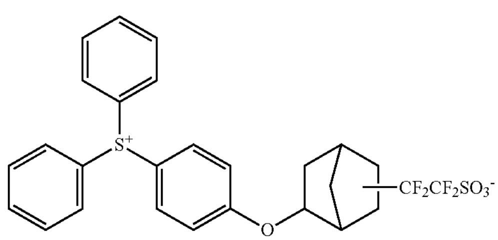

Of the foregoing PAGs, those compounds having an anion of formula (3A') or (3D) are especially preferred because of reduced acid diffusion and high solubility in resist solvent, and those compounds having an anion of formula (4') are especially preferred because of minimized acid diffusion.

Also a sulfonium or iodonium salt having an iodized or brominated aromatic ring-bearing anion may be used as the PAG. Suitable are sulfonium and iodonium salts having the formulae (5-1) and (5-2).

(5-1)

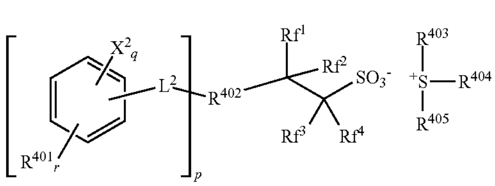

-continued (5-2)

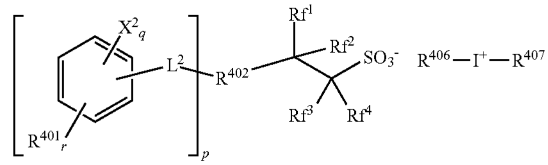

In formulae (5-1) and (5-2), $X^2$ is iodine or bromine, and may be the same or different when q is 2 or more.

$L^2$ is a single bond, ether bond, ester bond; or a $C_1$-$C_6$ alkanediyl group which may contain an ether bond or ester bond. The alkanediyl group may be straight, branched or cyclic.

$R^{401}$ is a hydroxyl group, carboxyl group, fluorine, chlorine, bromine, amino group, or a $C_1$-$C_{20}$ alkyl, $C_1$-$C_{20}$ alkoxy, $C_2$-$C_{20}$ alkoxycarbonyl, $C_2$-$C_{20}$ acyloxy or $C_1$-$C_{20}$ alkylsulfonyloxy group, which may contain fluorine, chlorine, bromine, hydroxyl, amino or $C_1$-$C_{10}$ alkoxy moiety, or —$NR^{401A}$—C(═O)—$R^{401B}$ or —$NR^{401A}$—C(═O)—O—$R^{401B}$, wherein $R^{401A}$ is hydrogen, or a $C_1$-$C_6$ alkyl group which may contain halogen, hydroxyl, $C_1$-$C_6$ alkoxy, $C_2$-$C_6$ acyl or $C_2$-$C_6$ acyloxy moiety, $R^{401B}$ is a $C_1$-$C_{16}$ alkyl, $C_2$-$C_{16}$ alkenyl or $C_6$-$C_{12}$ aryl group, which may contain halogen, hydroxyl, $C_1$-$C_6$ alkoxy, $C_2$-$C_6$ acyl or $C_2$-$C_6$ acyloxy moiety. The foregoing alkyl, alkoxy, alkoxycarbonyl, acyloxy, acyl and alkenyl groups may be straight, branched or cyclic. When r is 2 or more, groups $R^{401}$ may be the same or different. Of these, $R^{401}$ is preferably hydroxyl, —$NR^{4011A}$—C(═O)—$R^{401B}$, $NR^{401A}$—C(═O)—O—$R^{401B}$, fluorine, chlorine, bromine, methyl or methoxy.

$R^{402}$ is a single bond or a $C_1$-$C_{20}$ divalent linking group when p=1, or a $C_1$-$C_{20}$ tri- or tetravalent linking group when p=2 or 3, the linking group optionally containing an oxygen, sulfur or nitrogen atom.

$Rf^1$ to $R^f$ are each independently hydrogen, fluorine or trifluoromethyl, at least one of $Rf^1$ to $Rf^4$ is fluorine or trifluoromethyl, or $Rf^1$ and $Rf^2$, taken together, may form a carbonyl group. Preferably, both $Rf^3$ and $Rf^4$ are fluorine.

$R^{403}$, $R^{404}$, $R^{405}$, $R^{406}$ and $R^{407}$ are each independently a $C_1$-$C_{20}$ monovalent hydrocarbon group which may contain a heteroatom. Any two of $R^{403}$, $R^{404}$ and $R^{405}$ may bond together to form a ring with the sulfur atom to which they are attached. The monovalent hydrocarbon group may be straight, branched or cyclic, and examples thereof include $C_1$-$C_{12}$ alkyl, $C_2$-$C_{12}$ alkenyl, $C_2$-$C_{12}$ alkynyl, $C_6$-$C_{20}$ aryl, and $C_7$-$C_{12}$ aralkyl groups. In these groups, some or all of the hydrogen atoms may be substituted by hydroxyl, carboxyl, halogen, cyano, amide, nitro, mercapto, sultone, sulfone, or sulfonium salt-containing moieties, and some carbon may be replaced by an ether bond, ester bond, carbonyl moiety, carbonate moiety or sulfonic acid ester bond.

In formulae (3-1) and (3-2), p is an integer of 1 to 3, q is an integer of 1 to 5, and r is an integer of 0 to 3, and $1 \le q+r \le 5$. Preferably, q is an integer of 1 to 3, more preferably 2 or 3, and r is an integer of 0 to 2.

Examples of the cation in the sulfonium salt having formula (5-1) include those exemplified above as the cation in the sulfonium salt having formula (3). Examples of the cation in the iodonium salt having formula (5-2) are shown below, but not limited thereto.

-continued
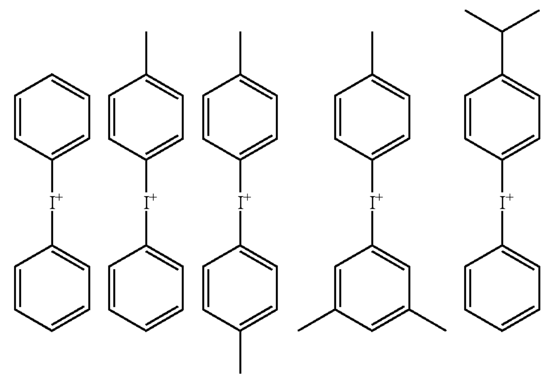
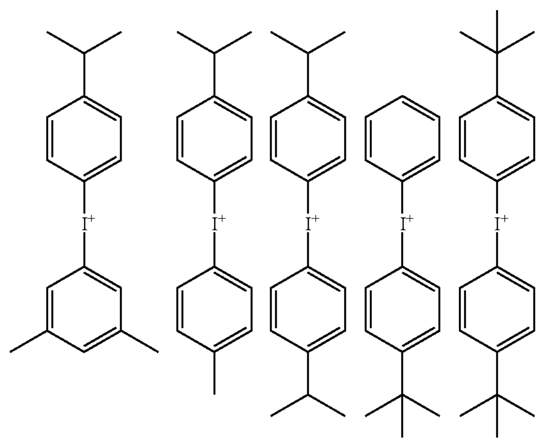
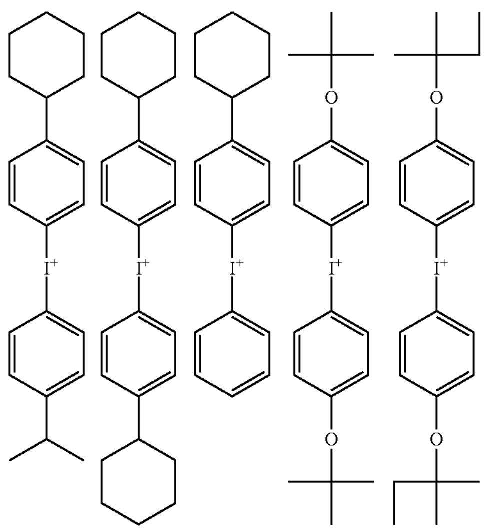
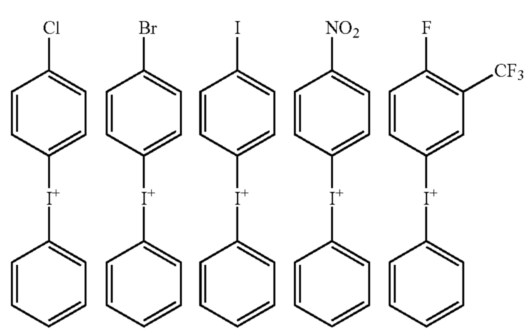
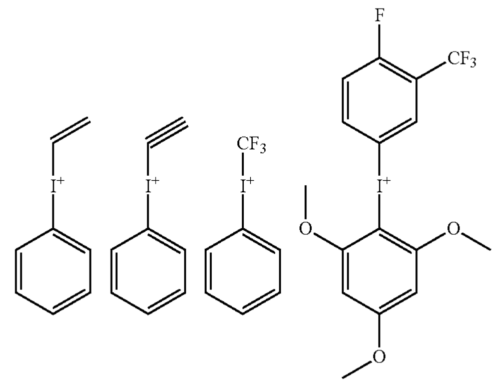
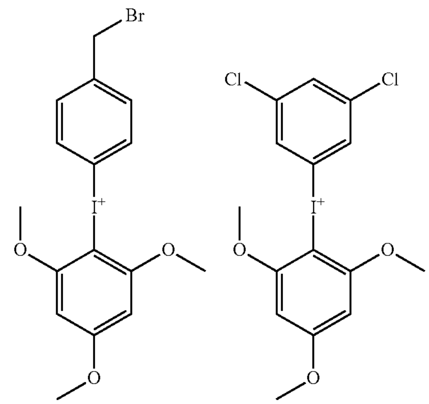
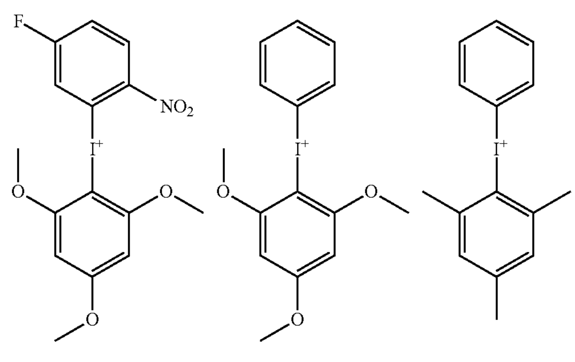
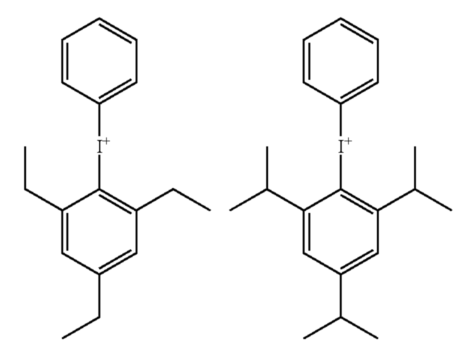

-continued
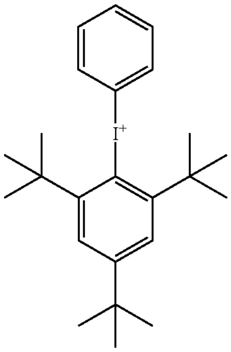
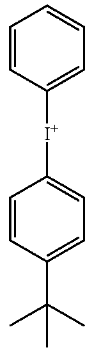
Examples of the anion in the onium salts having formulae (5-1) and (5-2) are shown below, but not limited thereto. Herein $X^1$ is as defined above.
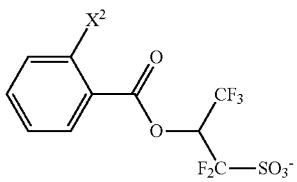
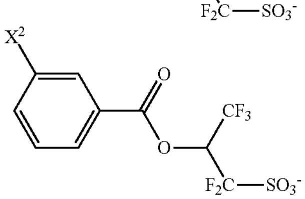
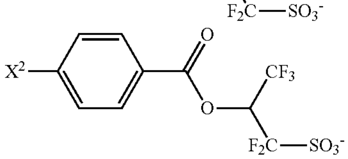
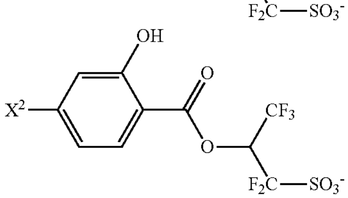
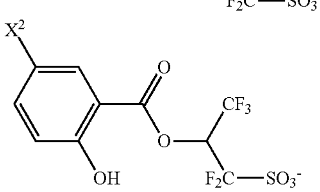
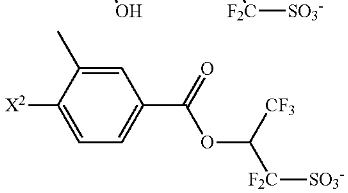
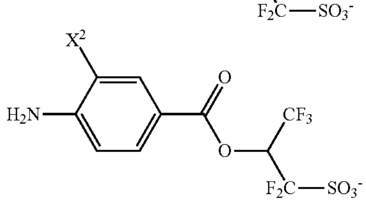
-continued
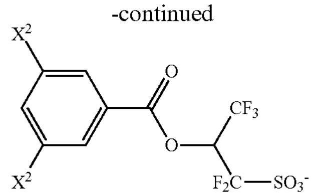
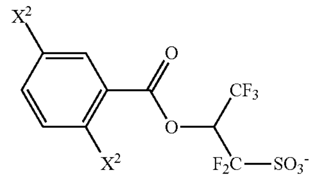
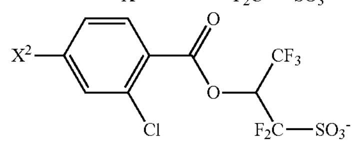
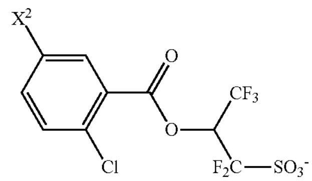
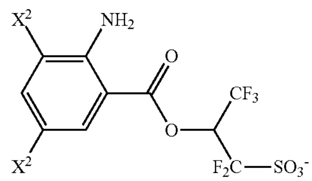
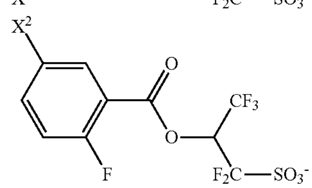
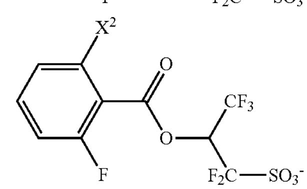
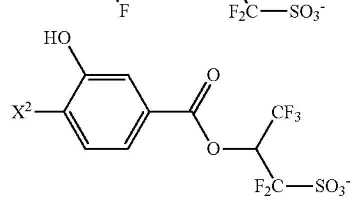
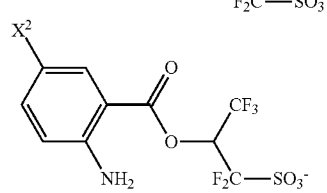
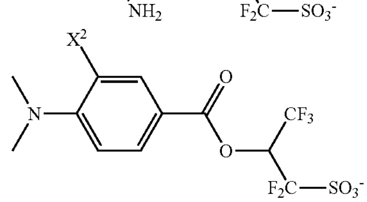

-continued
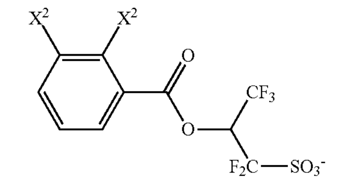
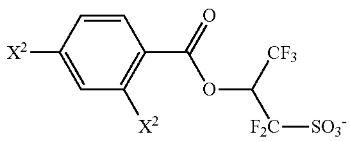
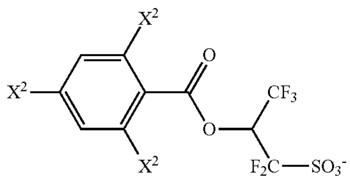
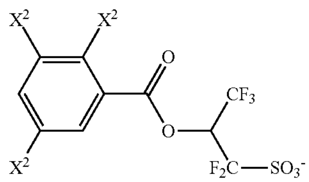
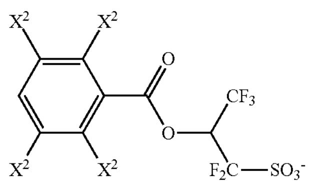
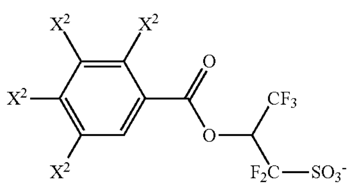
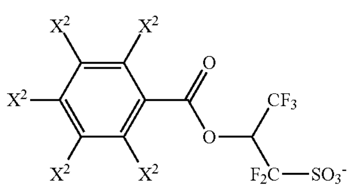
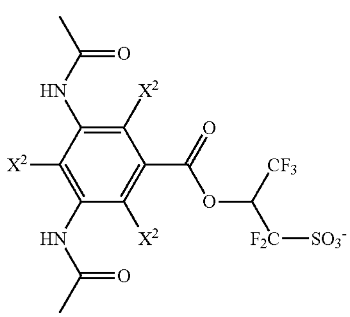
-continued
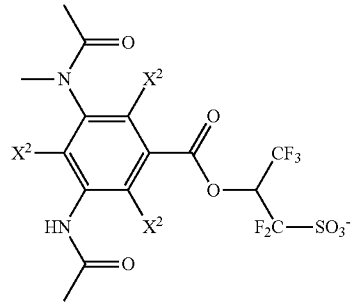
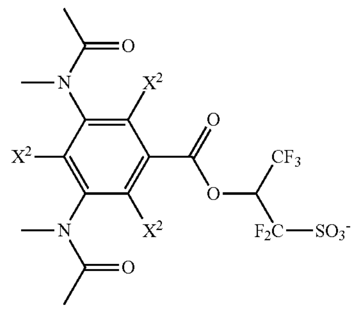
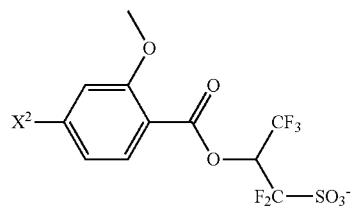
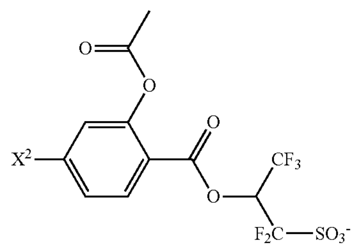
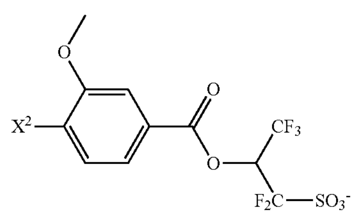
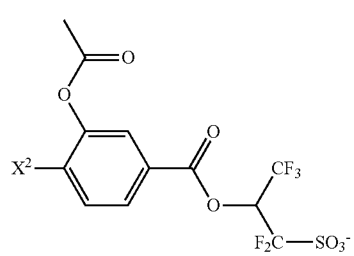

-continued
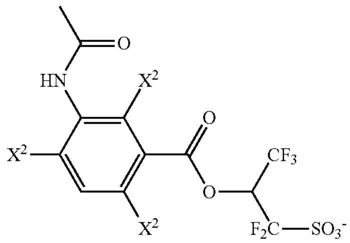
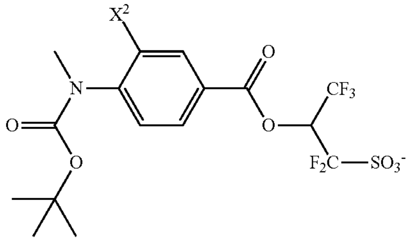
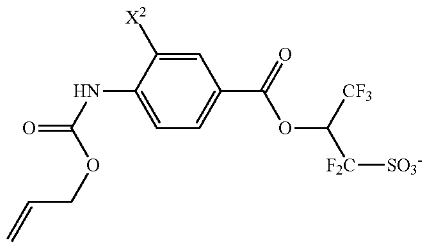
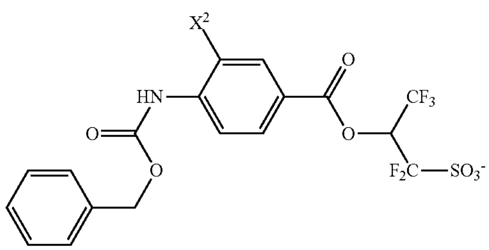
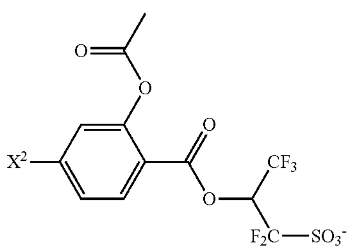
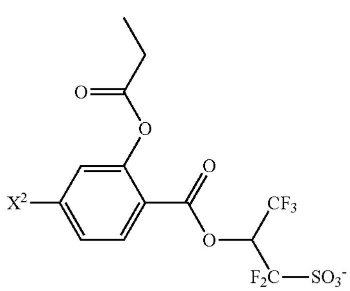
-continued
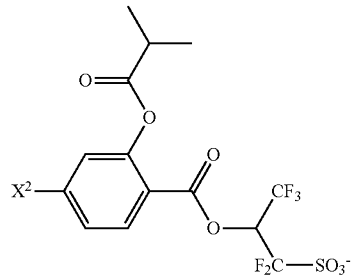
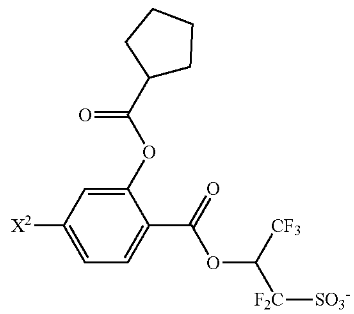
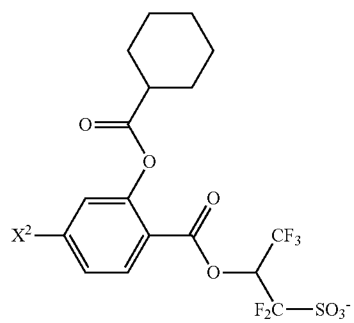
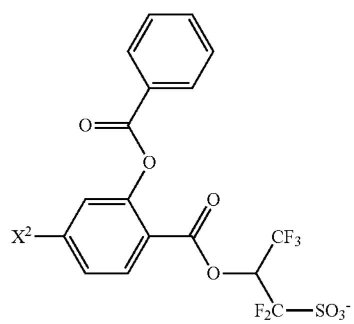
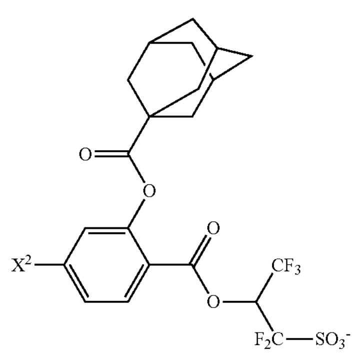

-continued
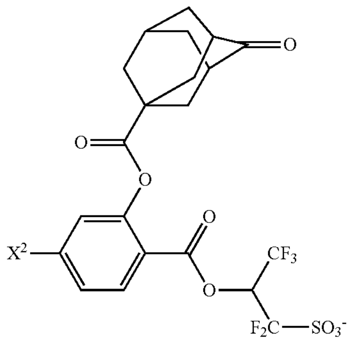
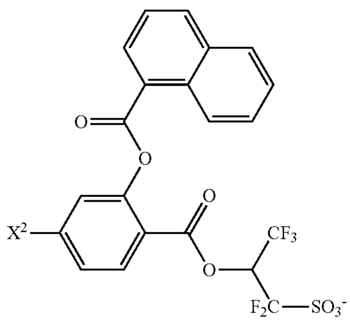
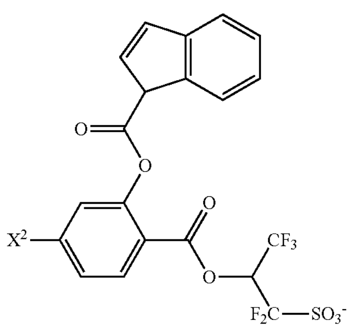
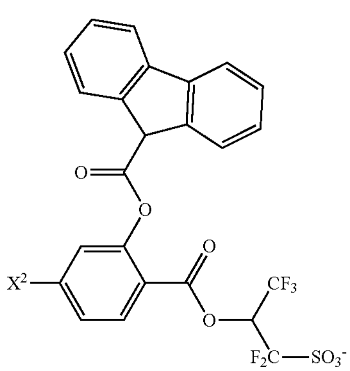
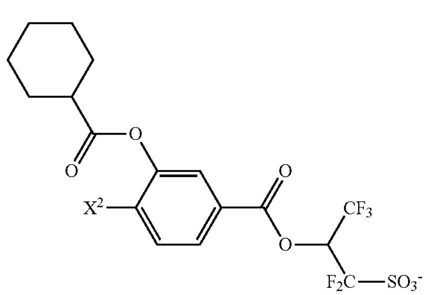
-continued
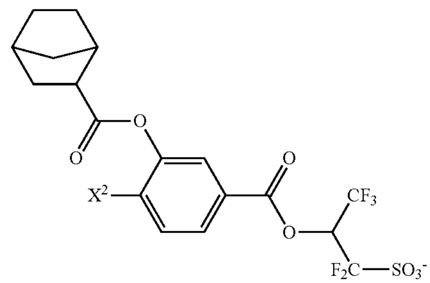
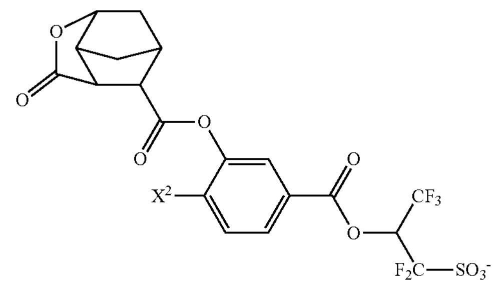
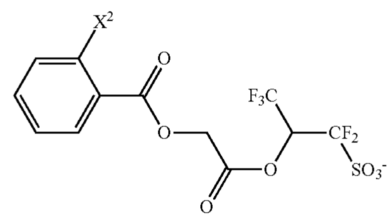
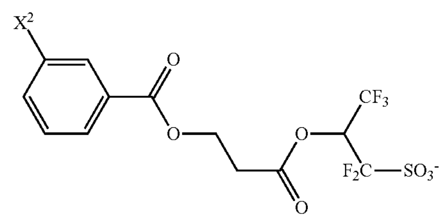
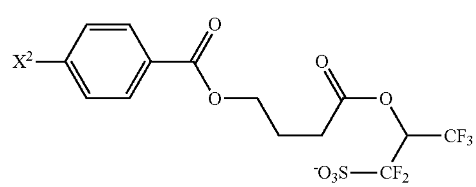
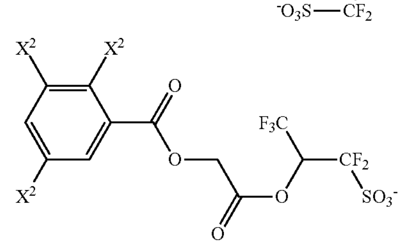
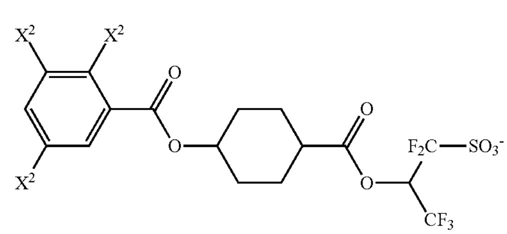

-continued
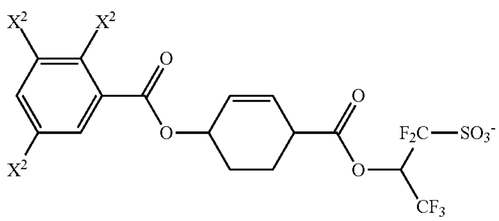
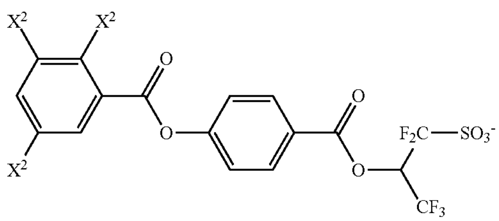
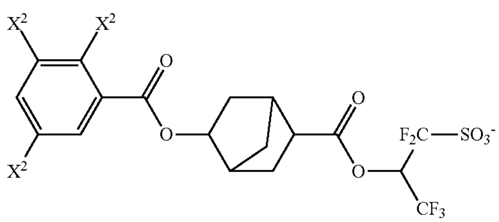
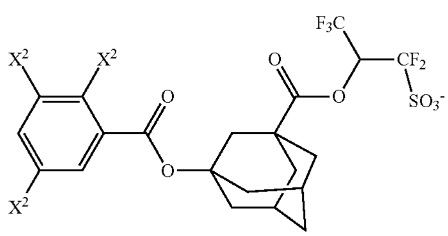
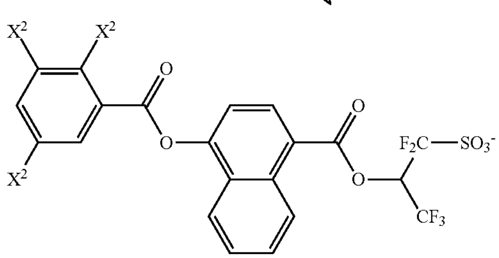
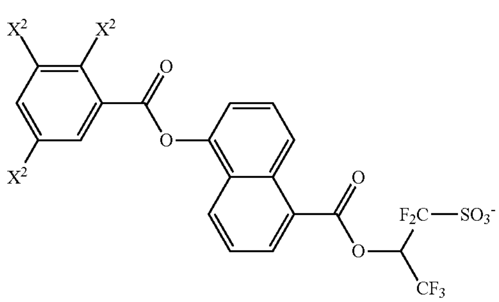
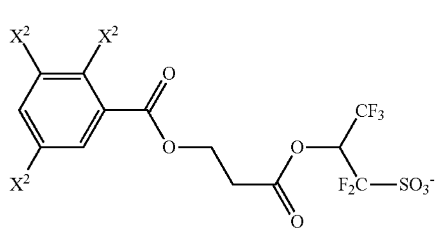
-continued
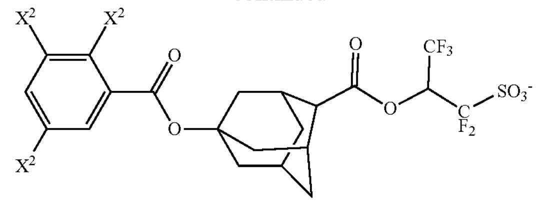
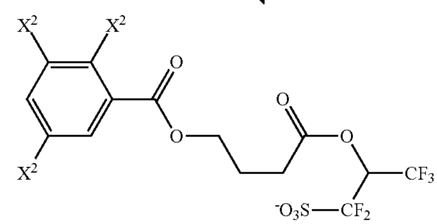
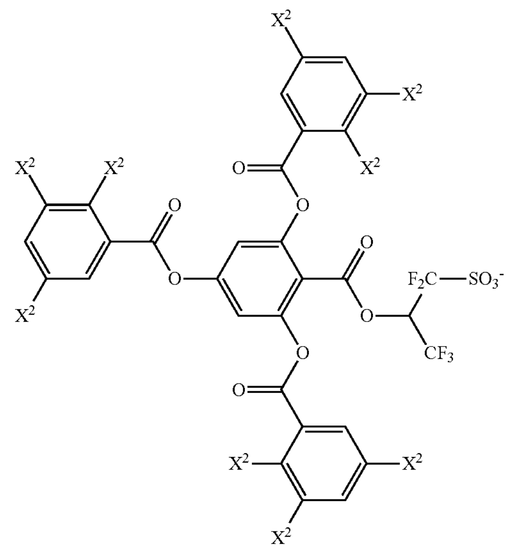
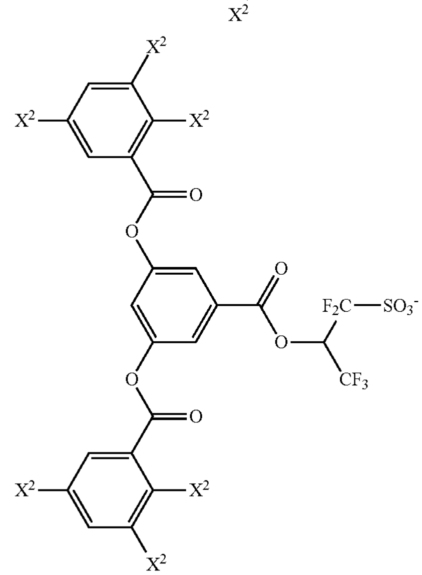
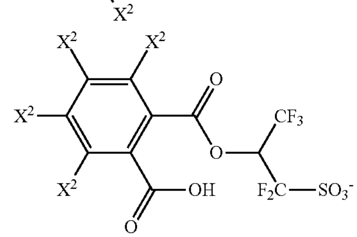

-continued
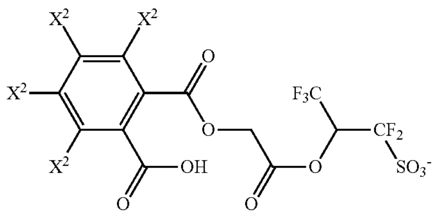
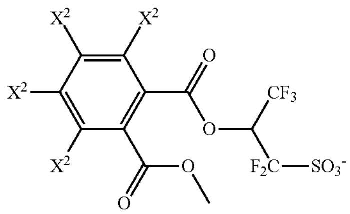
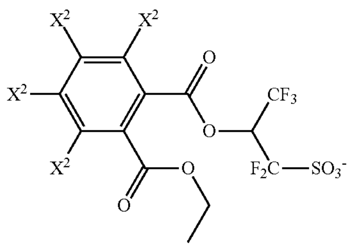
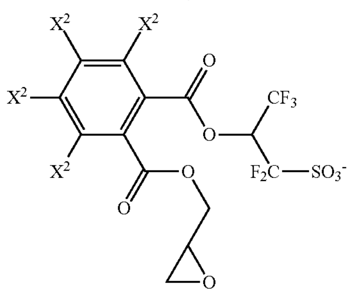
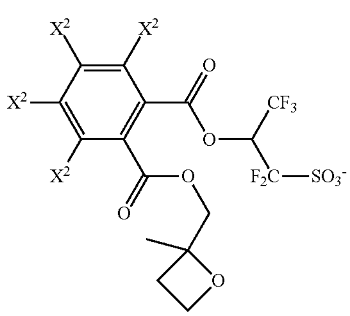
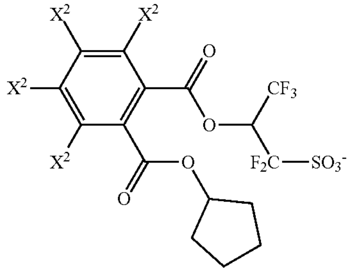
-continued
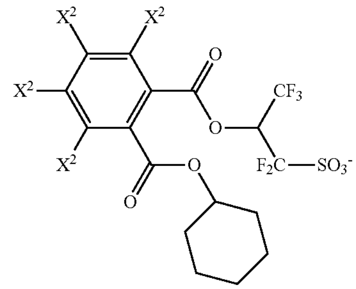
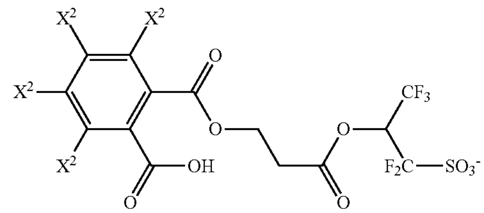
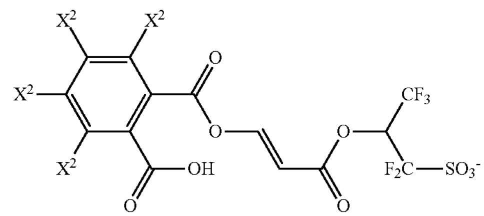
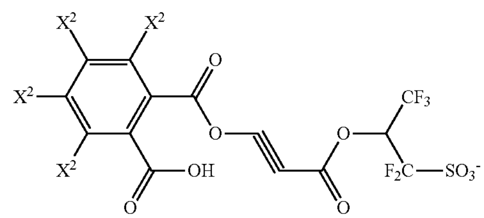
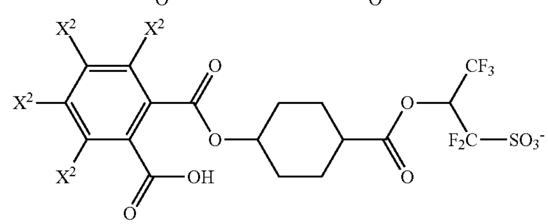
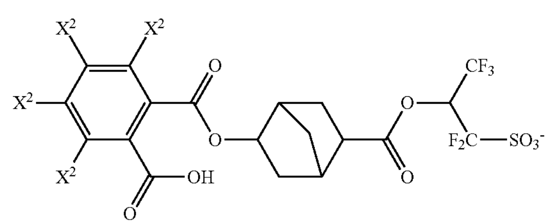
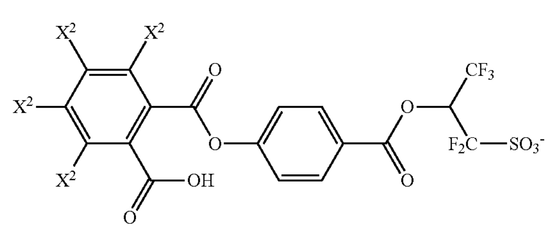

-continued
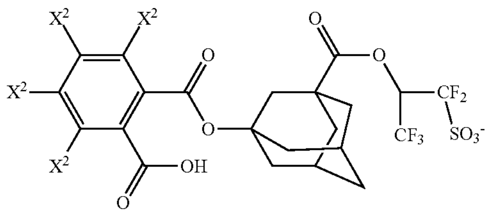
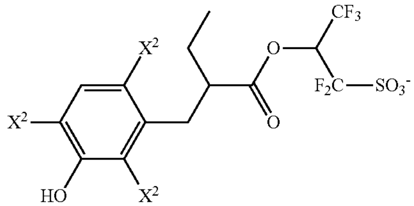
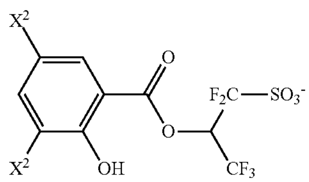
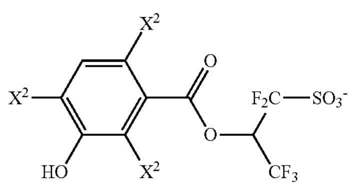
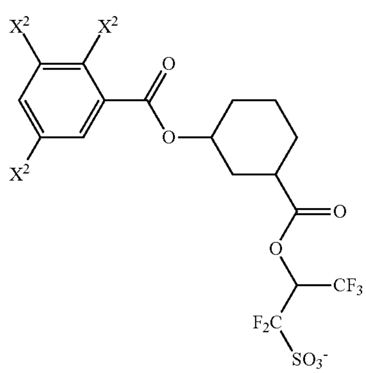
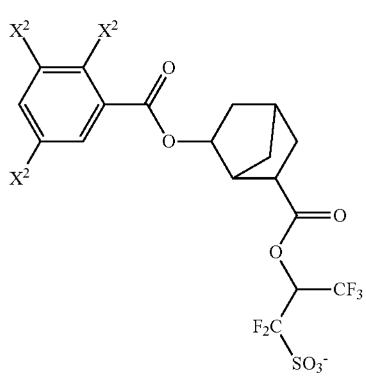
-continued
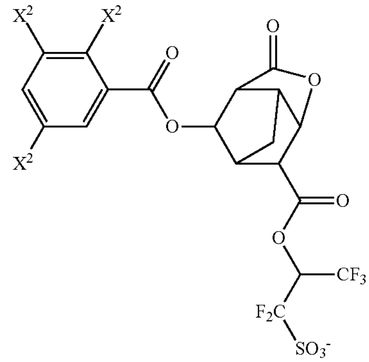
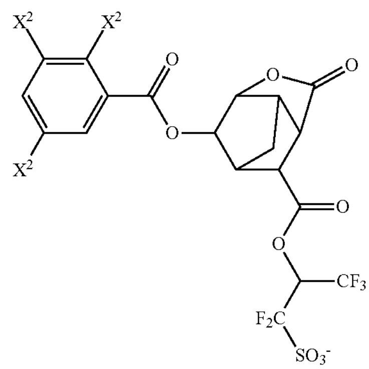
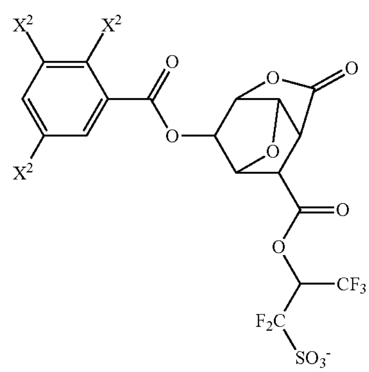
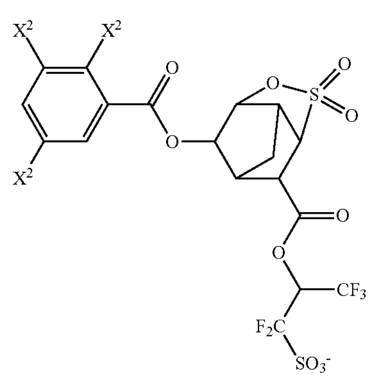

-continued
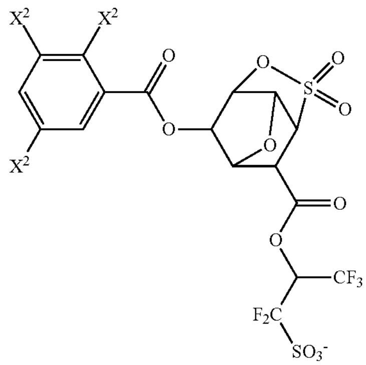
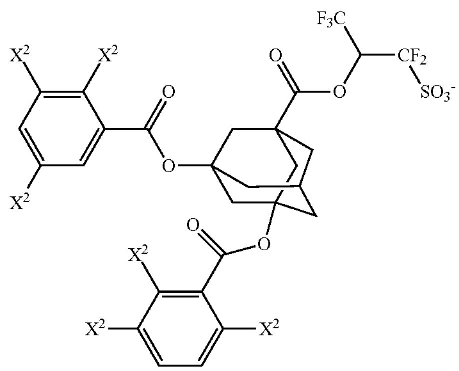
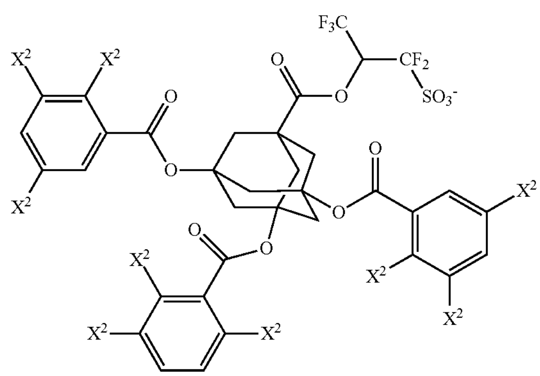
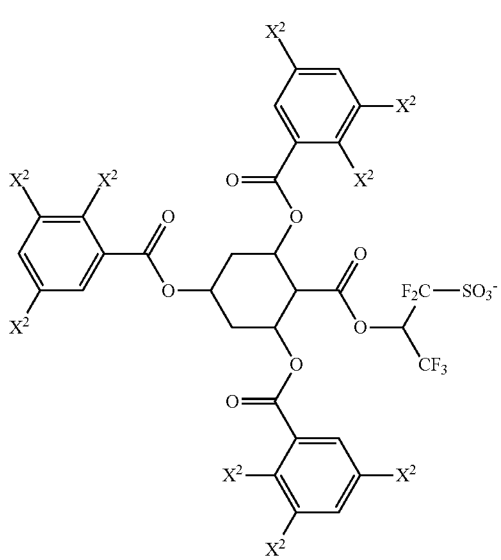
-continued
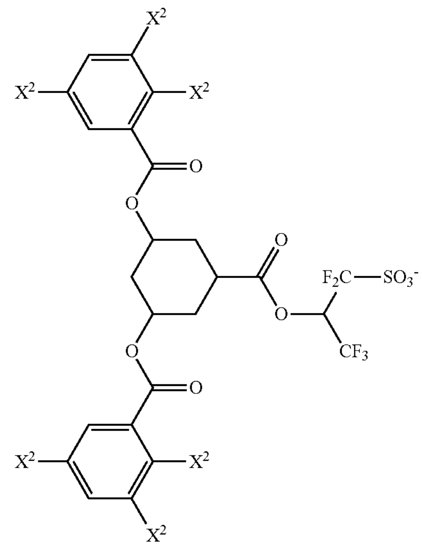
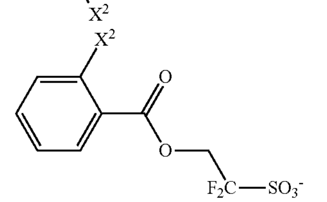
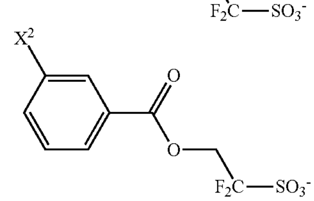
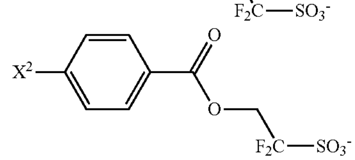
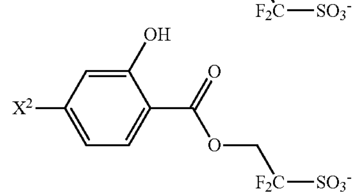
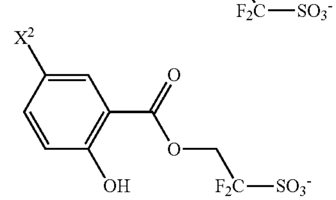
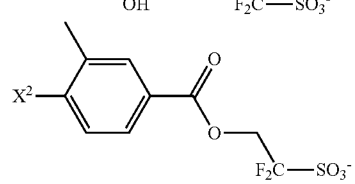
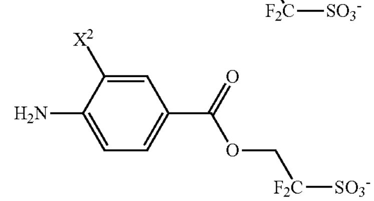

-continued
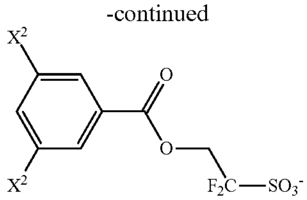
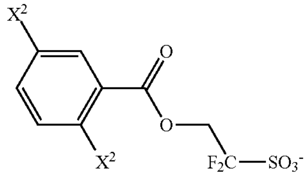
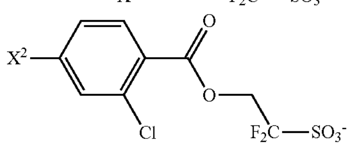
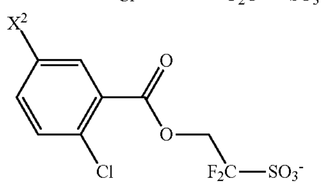
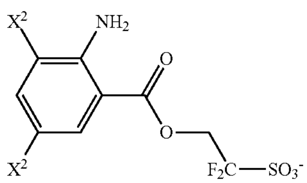
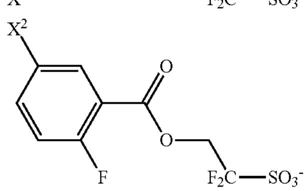
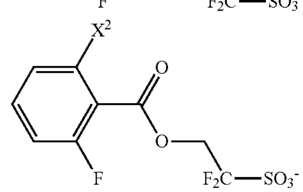
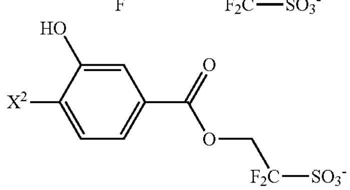
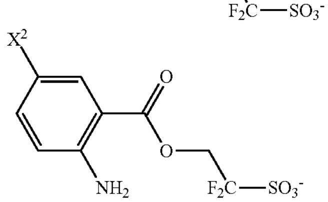
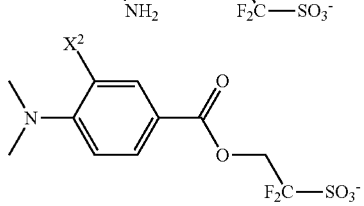
-continued
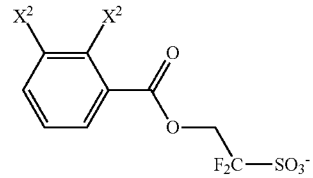
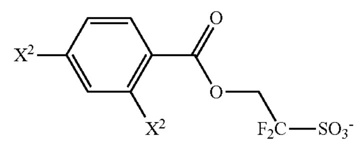
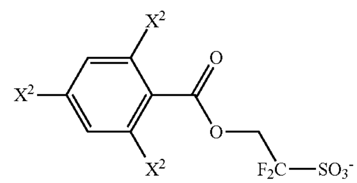
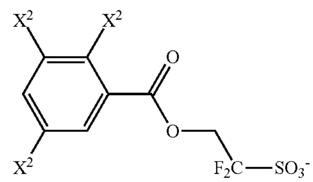
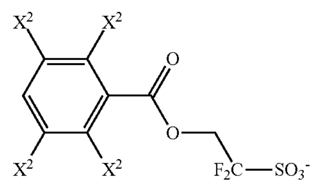
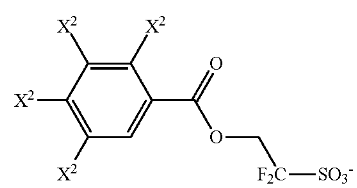
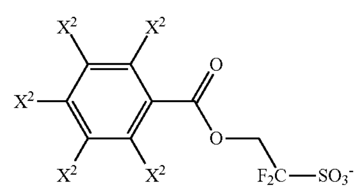
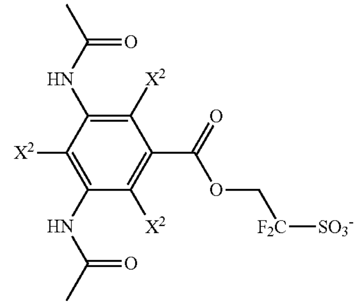

-continued
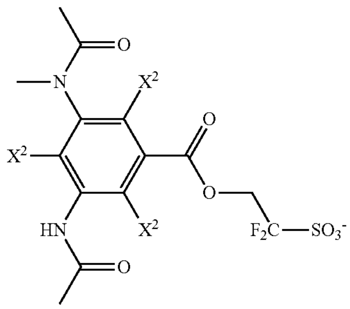
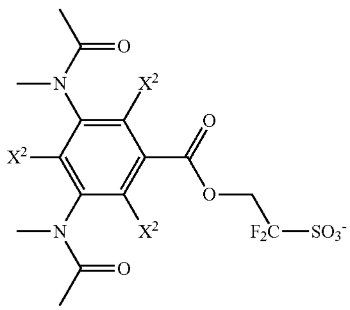
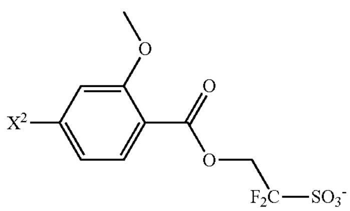
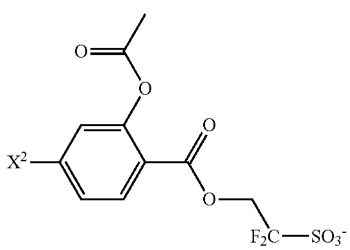
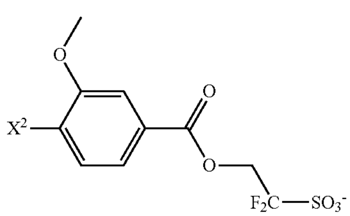
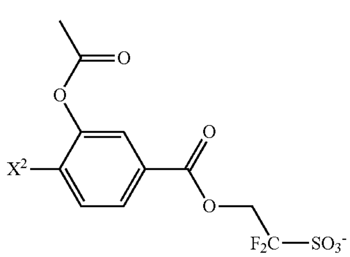
-continued
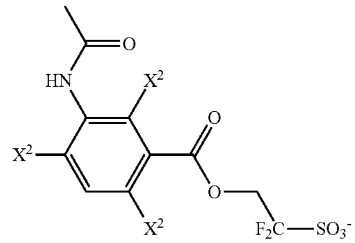
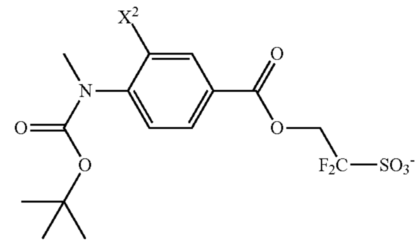
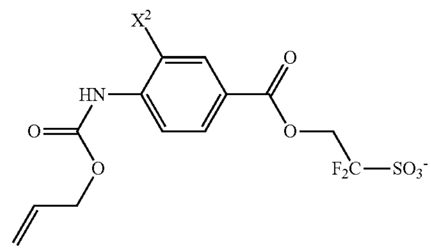
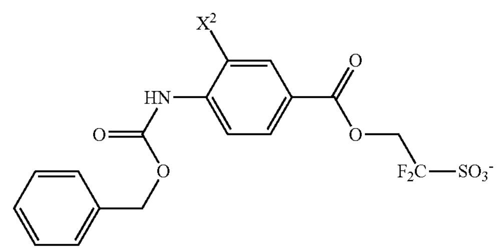
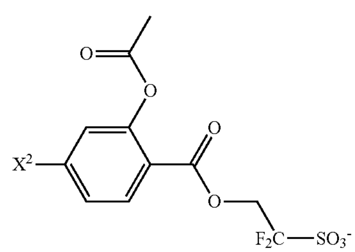
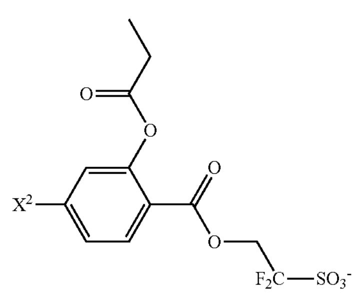

-continued
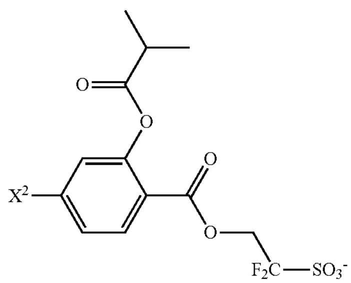
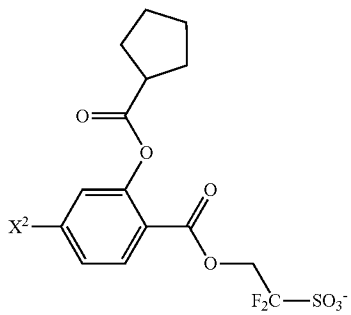
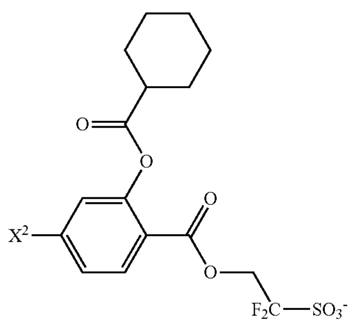
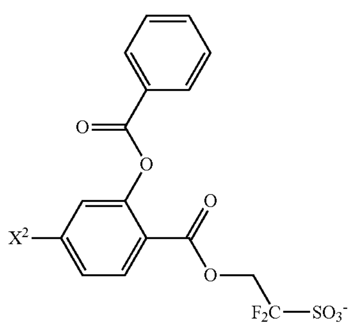
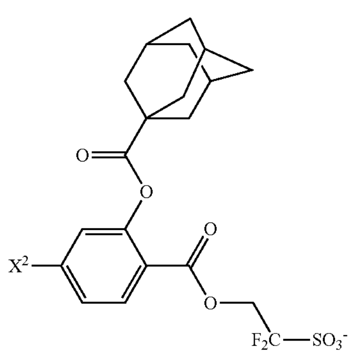
-continued
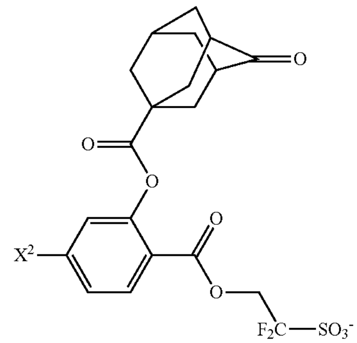
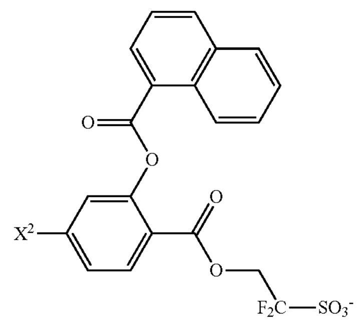
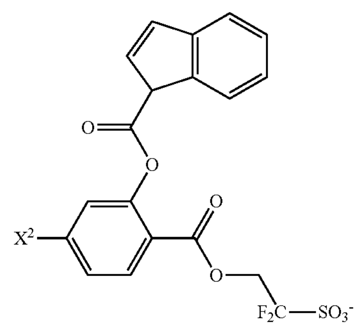
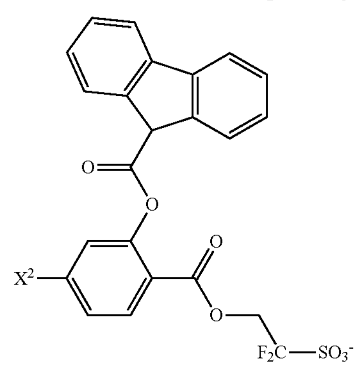
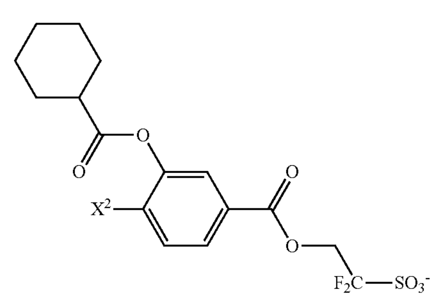

-continued
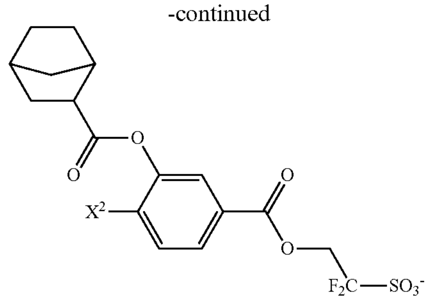
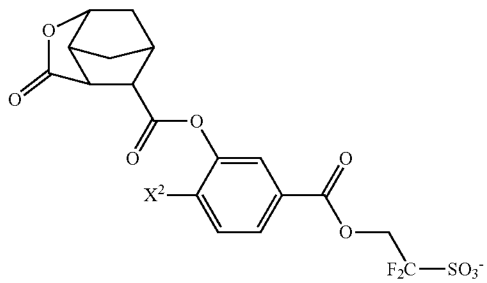
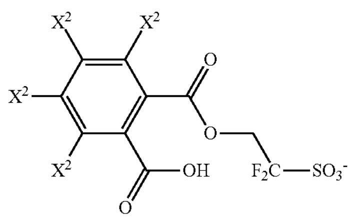
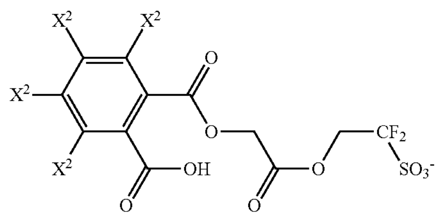
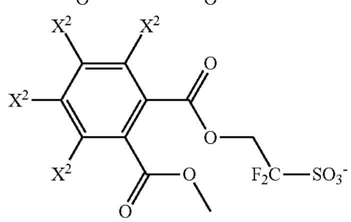
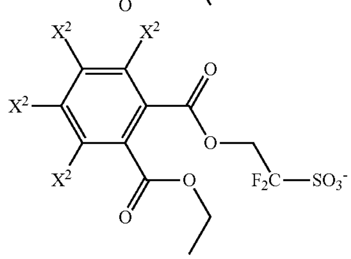
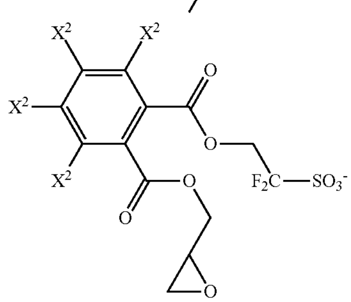
-continued
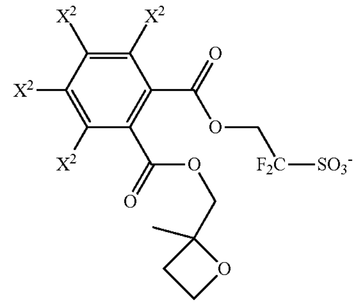
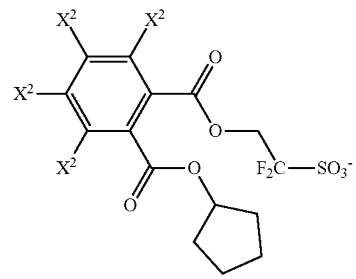
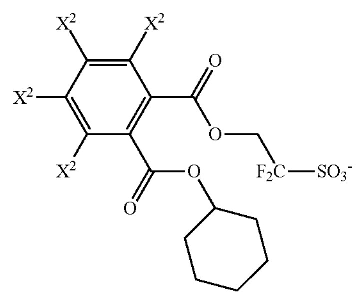
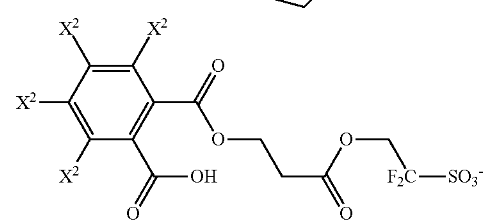
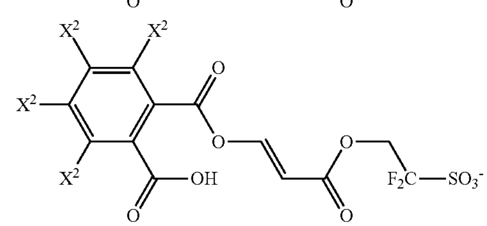
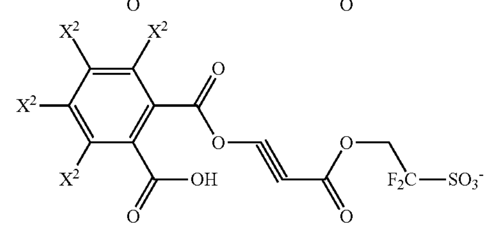
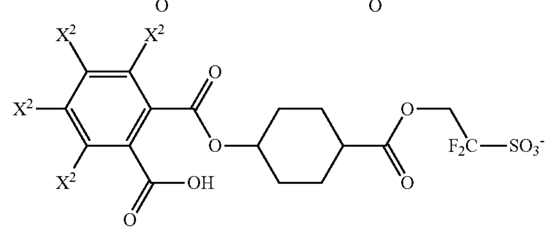

-continued
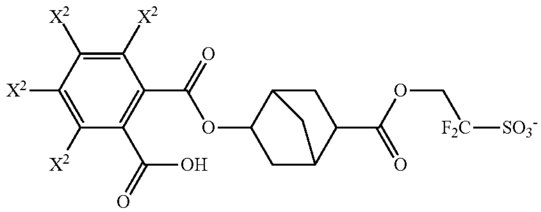
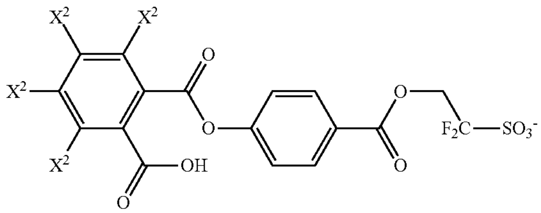
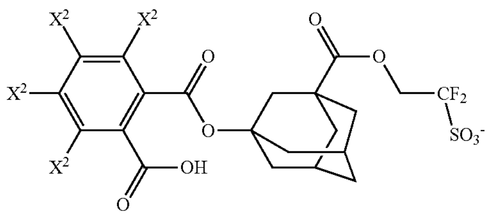
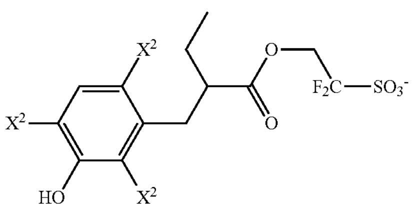
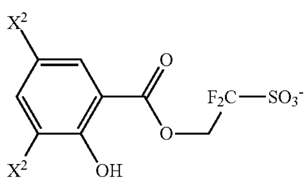
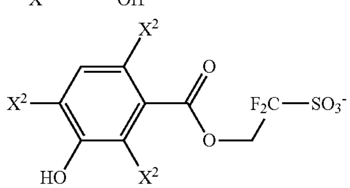
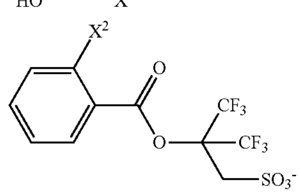
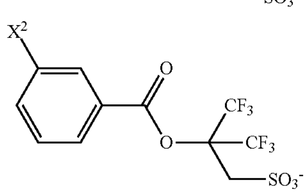
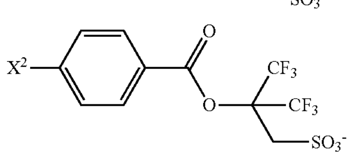
-continued
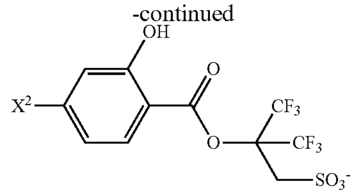
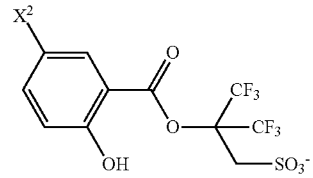
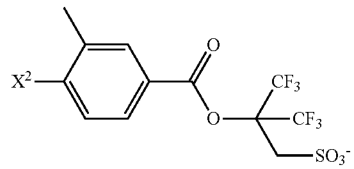
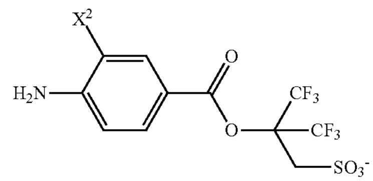
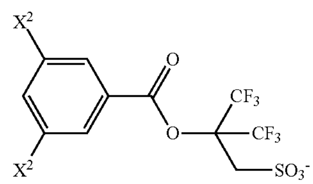
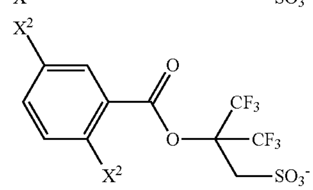
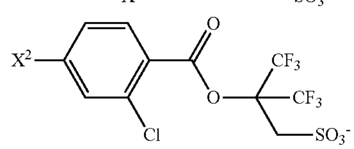
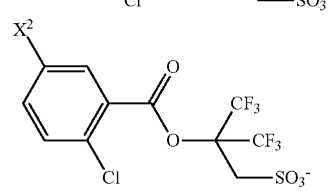
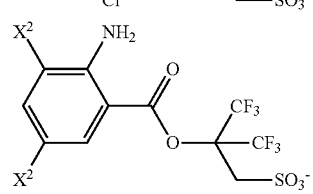
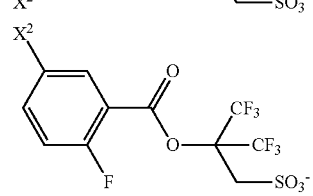

-continued
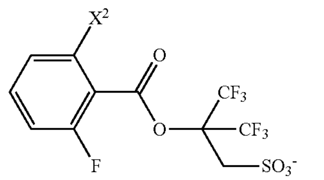
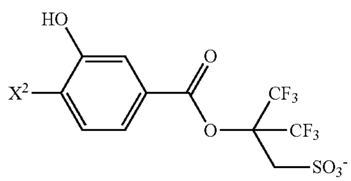
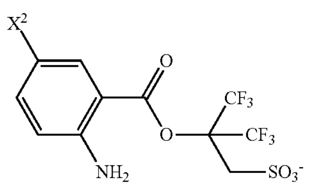
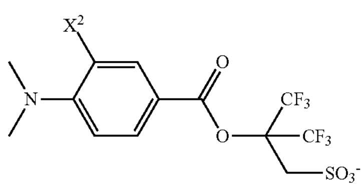
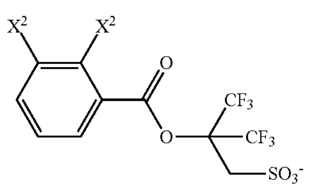
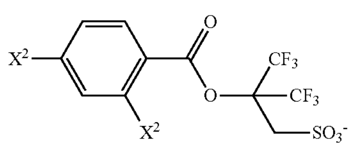
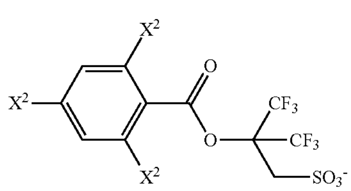
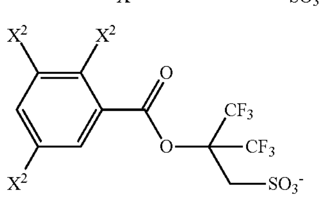
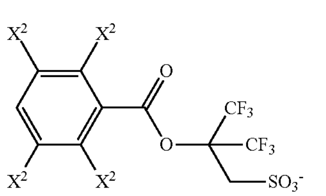
-continued
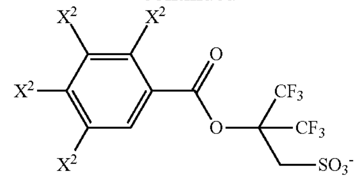
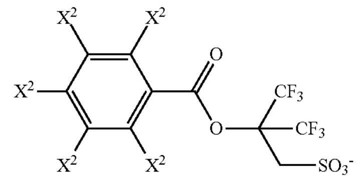
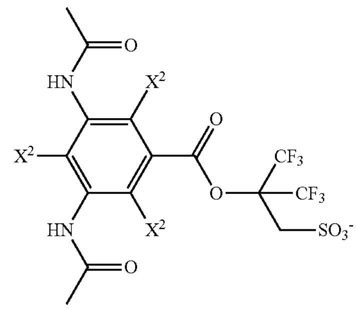
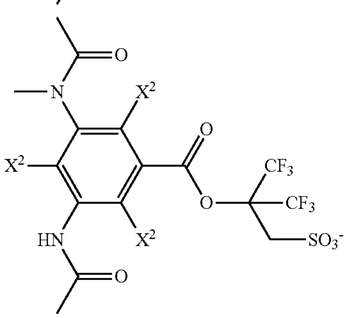
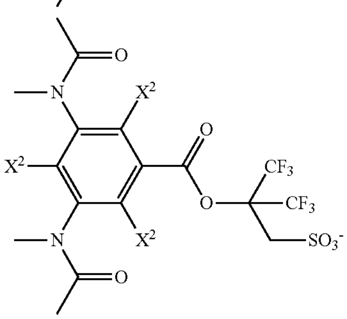
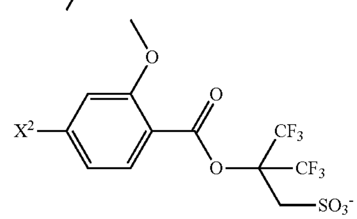
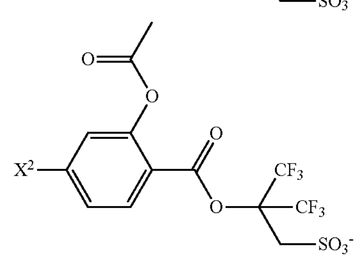

-continued
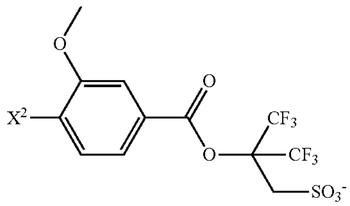
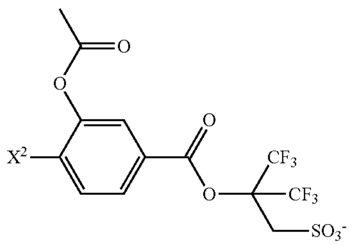
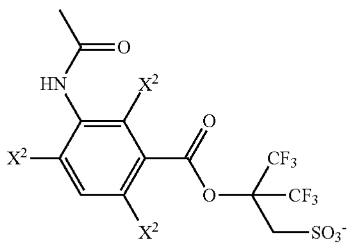
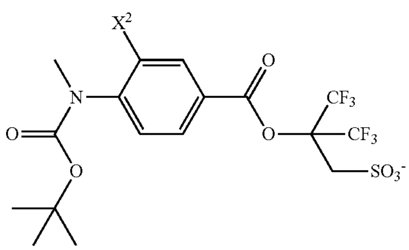
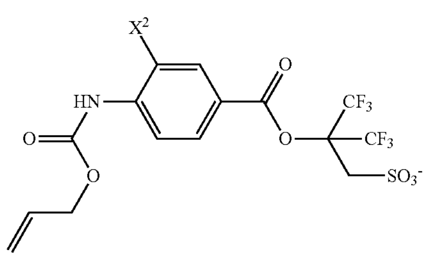
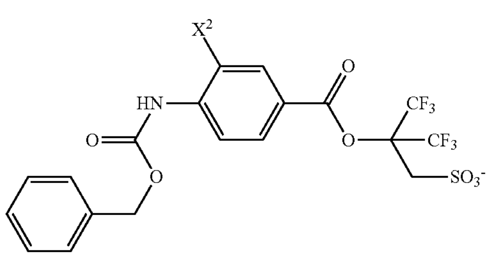
-continued
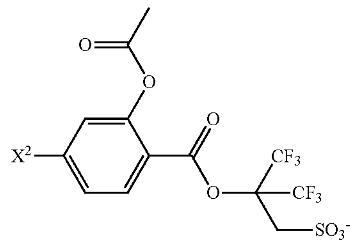
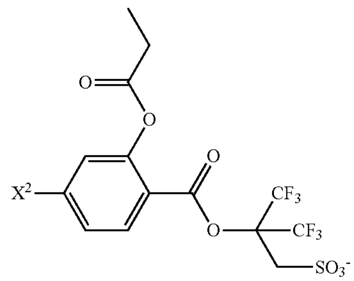
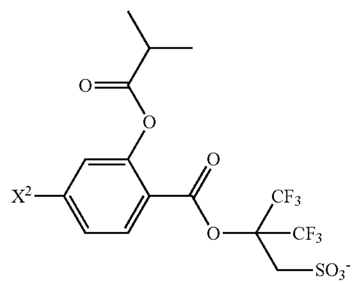
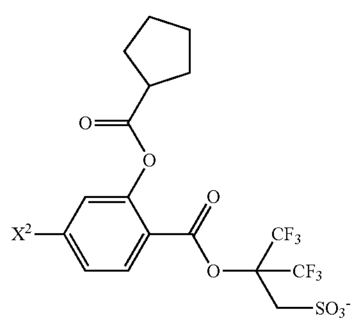
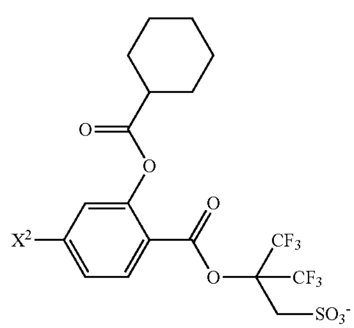

-continued
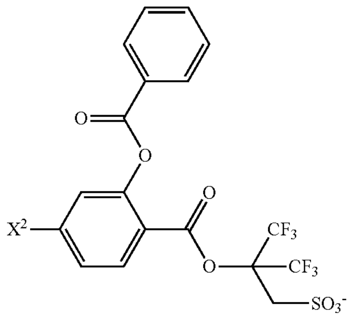
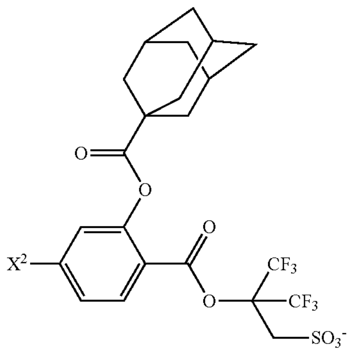
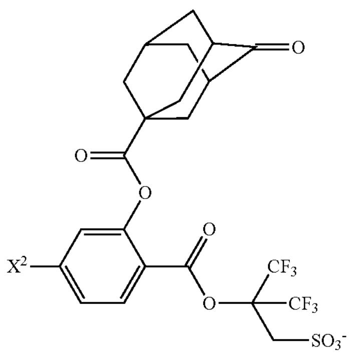
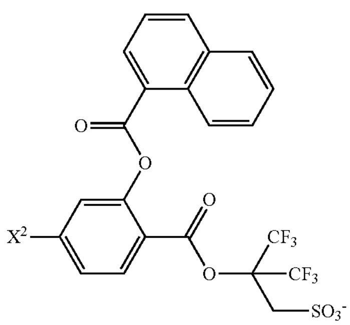
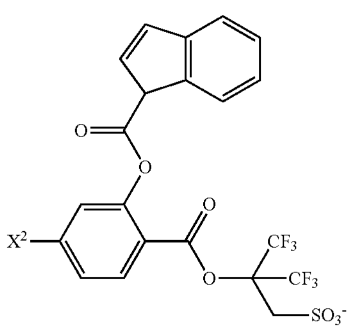
-continued
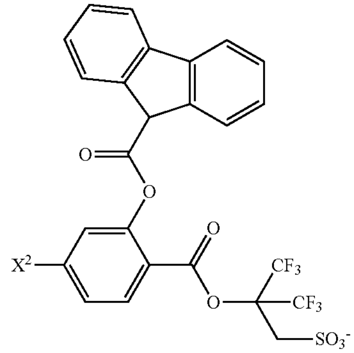
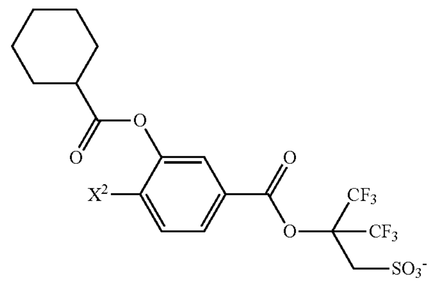
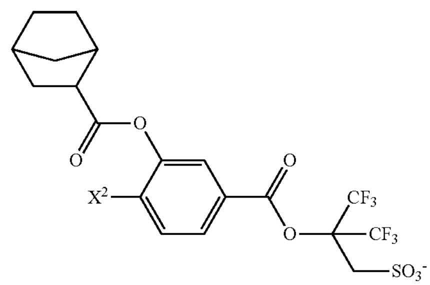
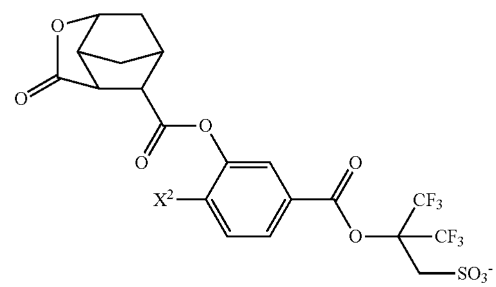
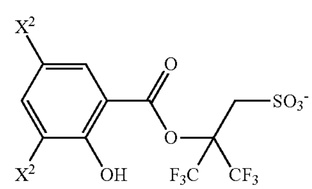
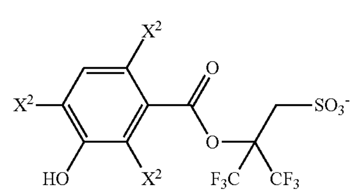

-continued
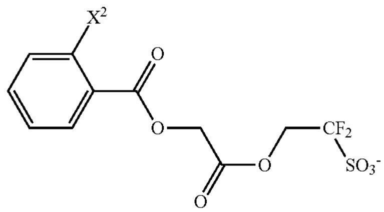
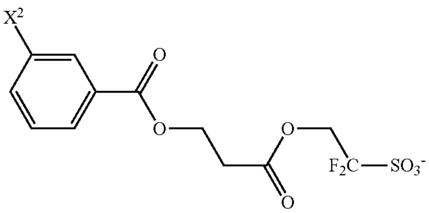
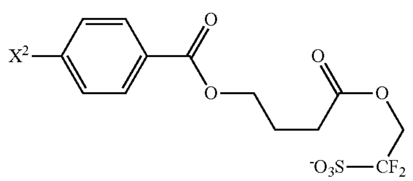
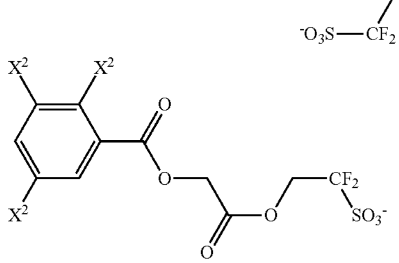
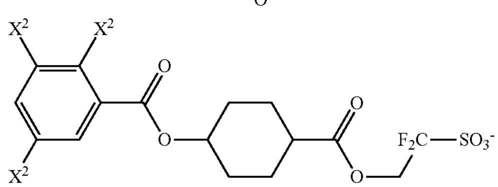
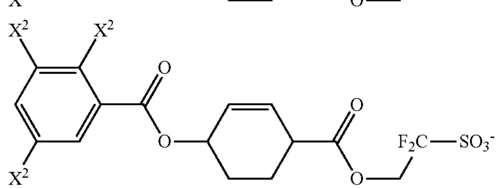
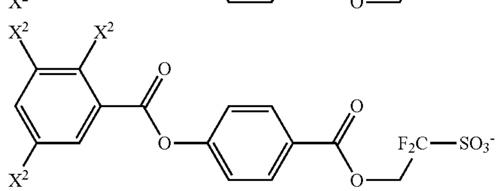
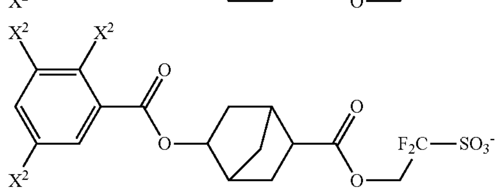
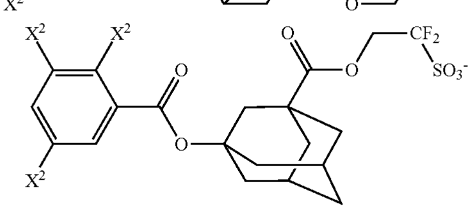
-continued
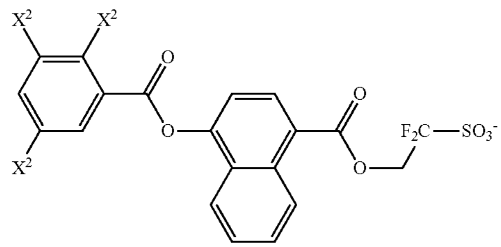
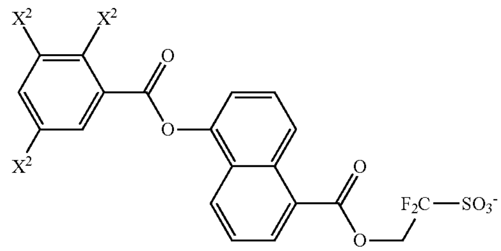
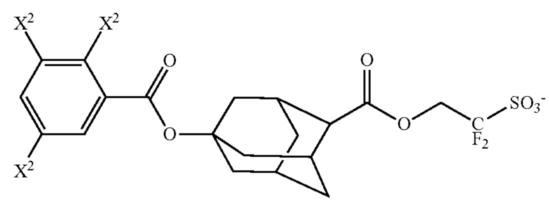
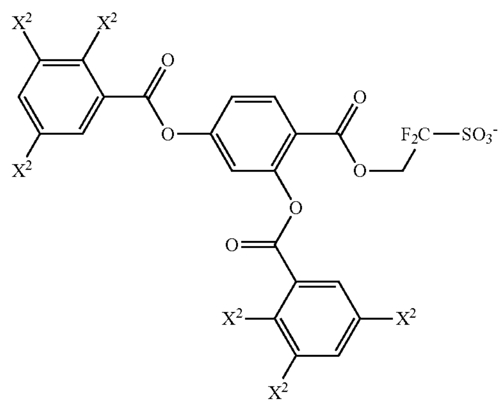
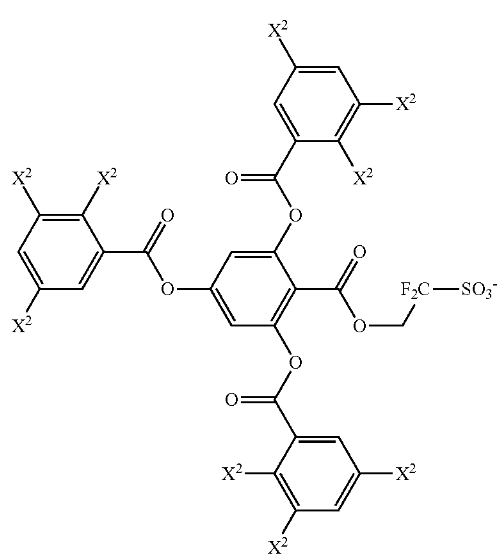

-continued
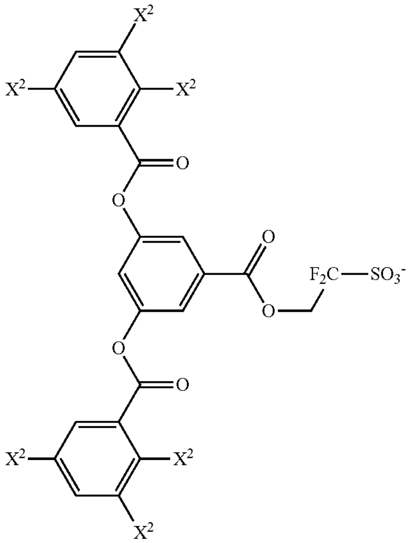
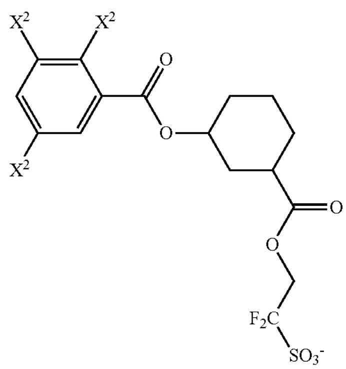
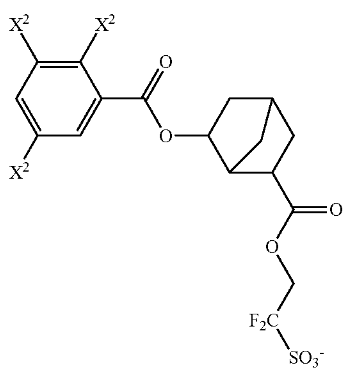
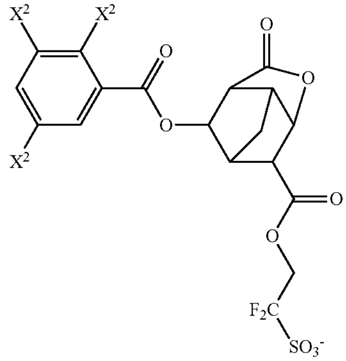
-continued
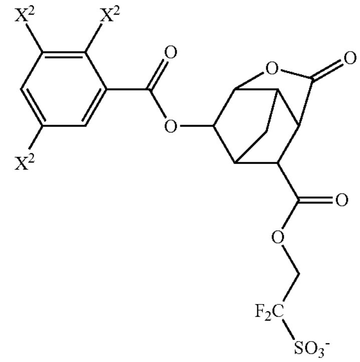
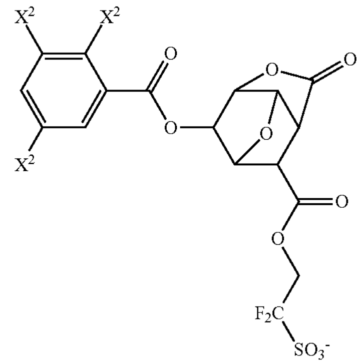
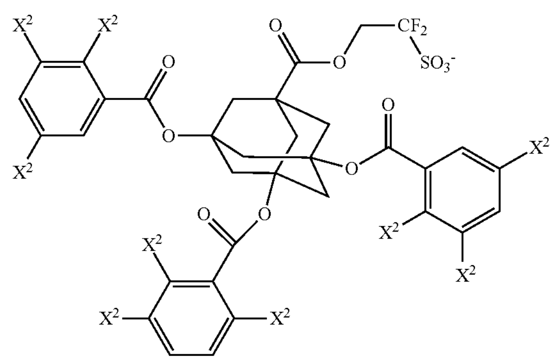
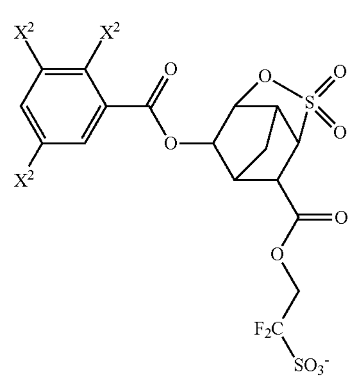

-continued
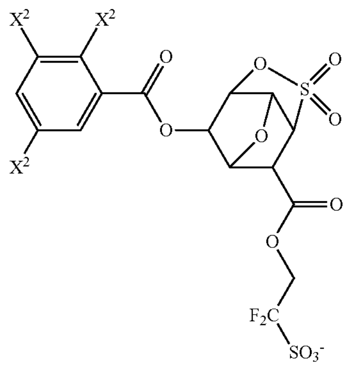
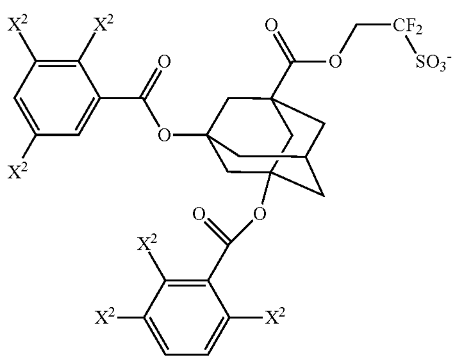
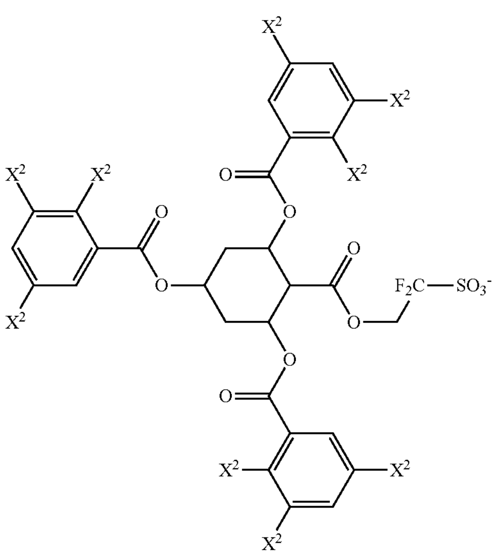
-continued
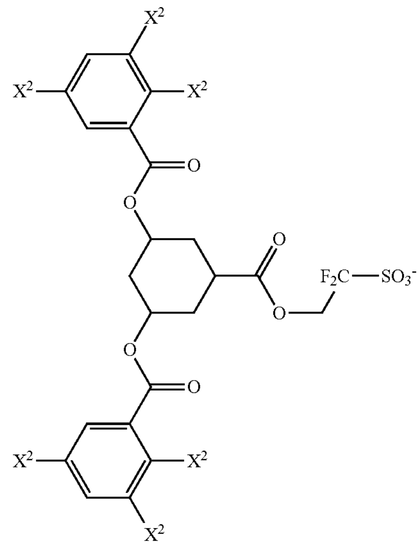
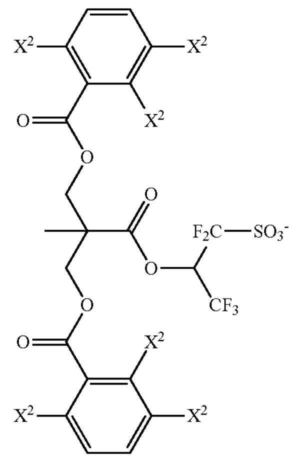
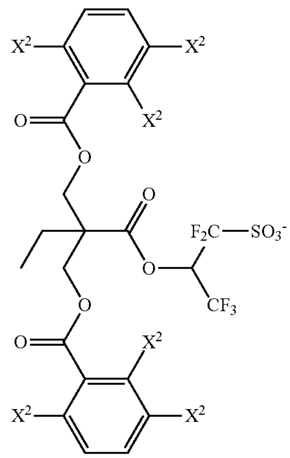
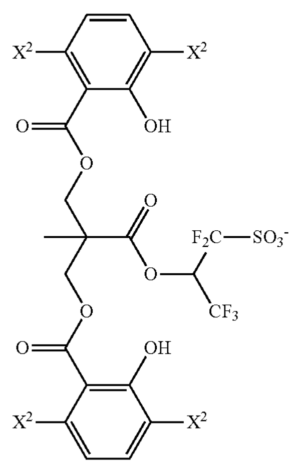
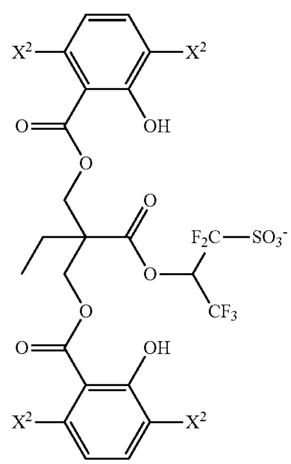
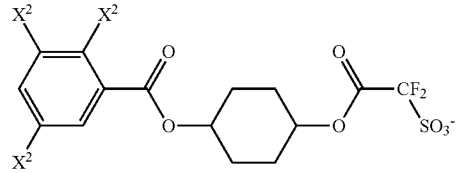

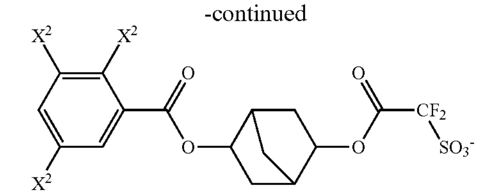
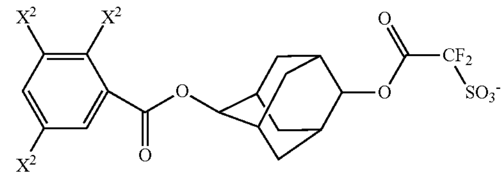
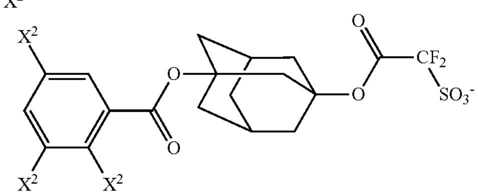
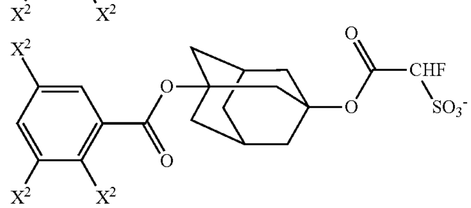
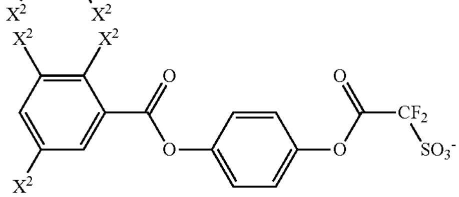
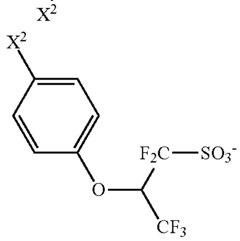
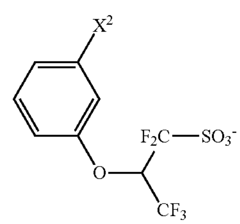
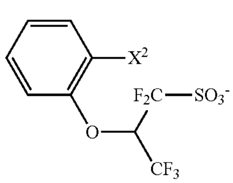
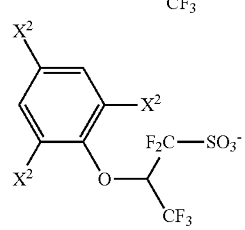
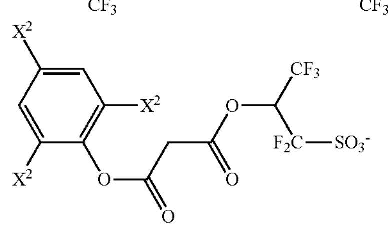
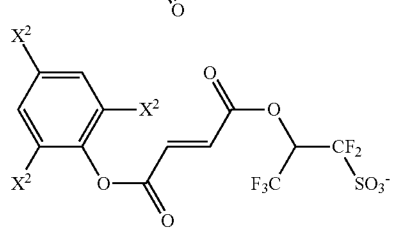
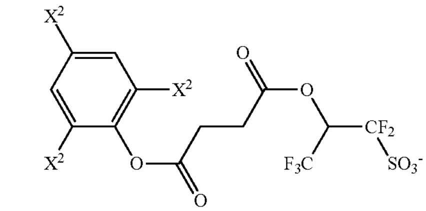
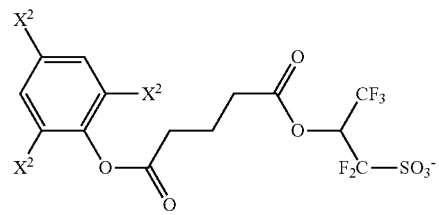
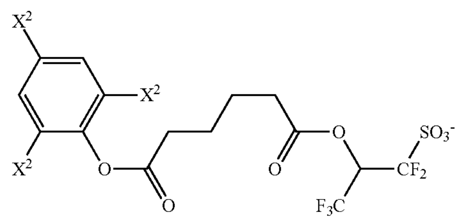
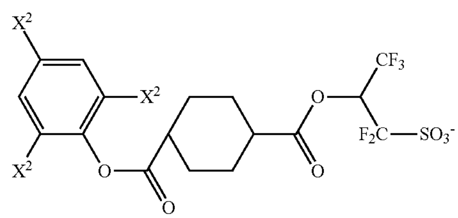
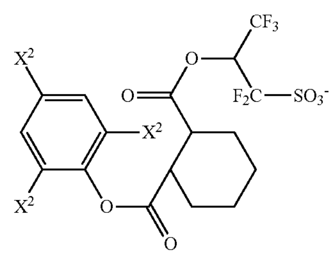
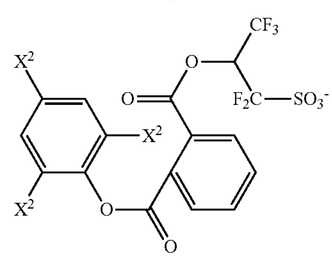
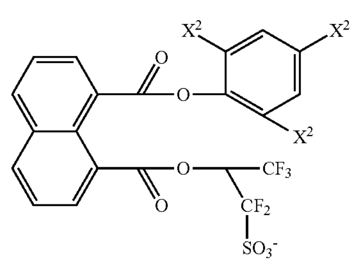

-continued
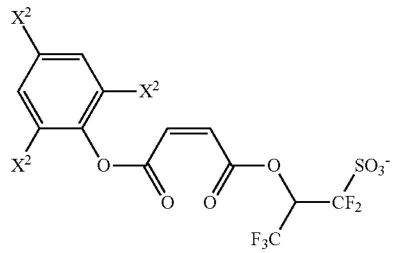
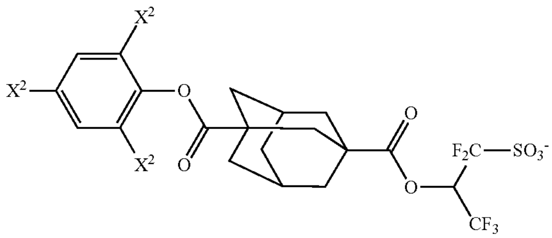
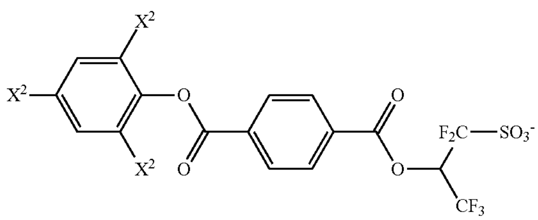
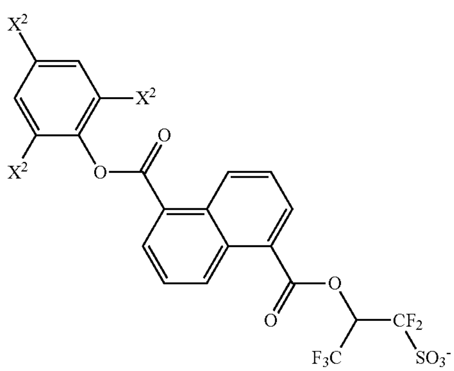
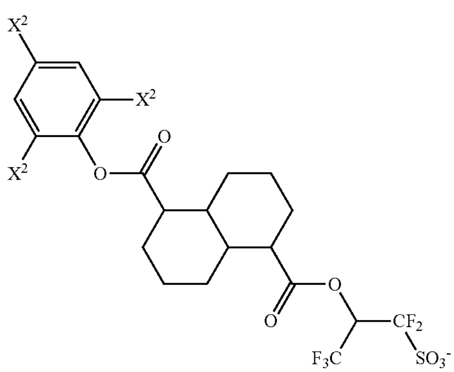
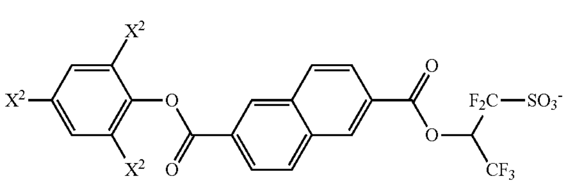
-continued
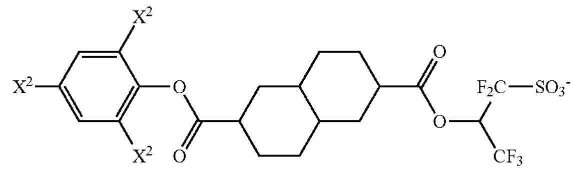
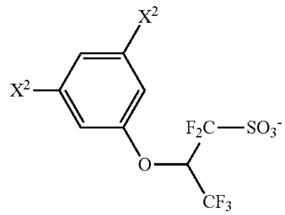
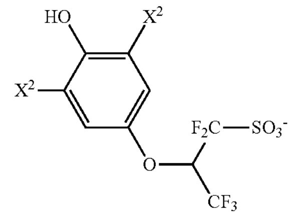
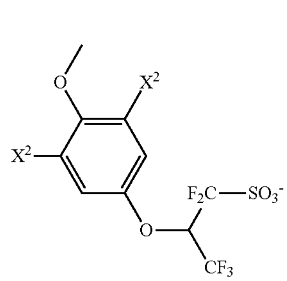
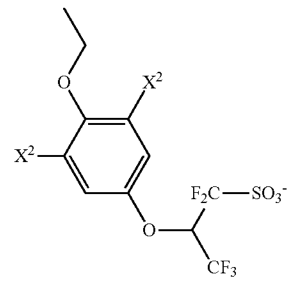
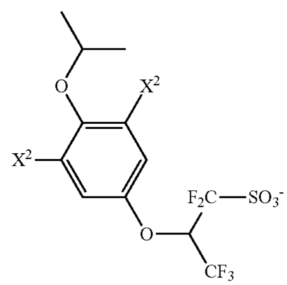
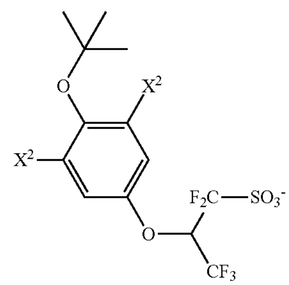
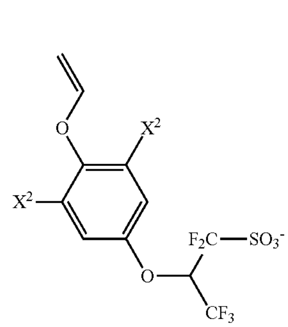
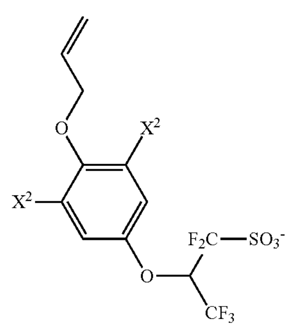
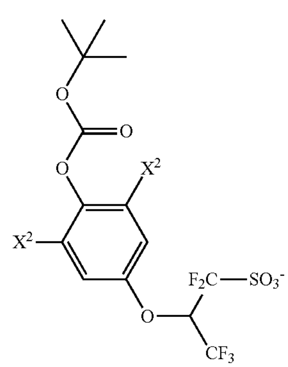
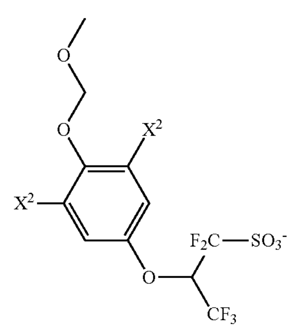

-continued
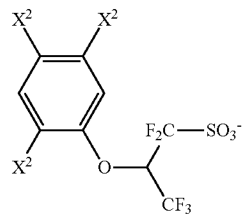
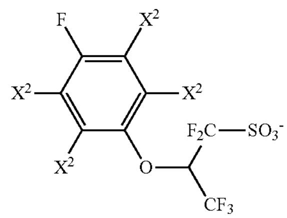
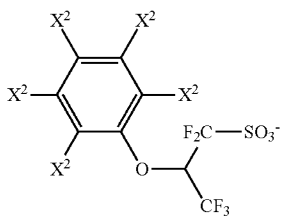
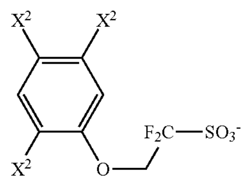
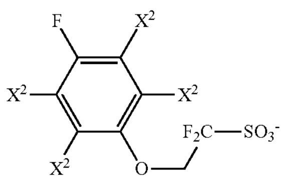
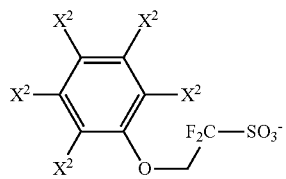
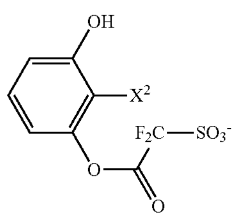
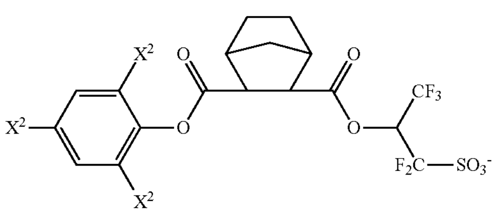
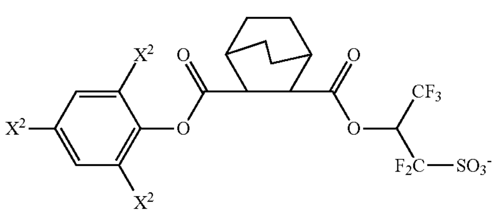
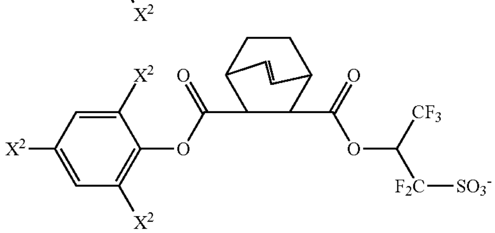
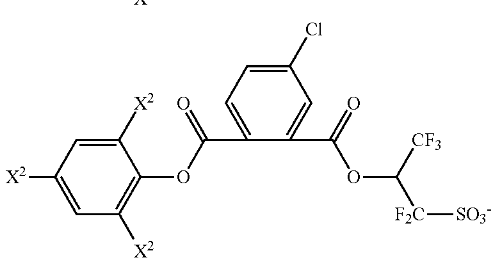
-continued
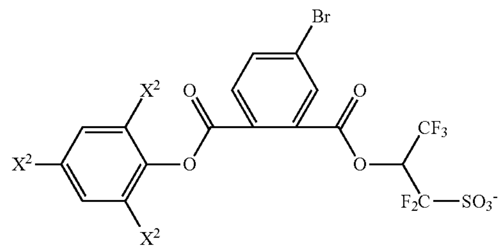
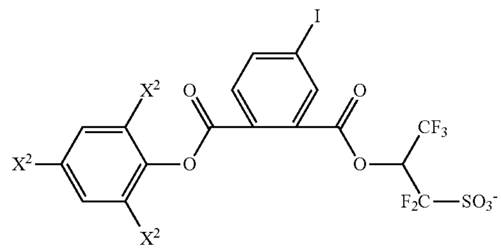
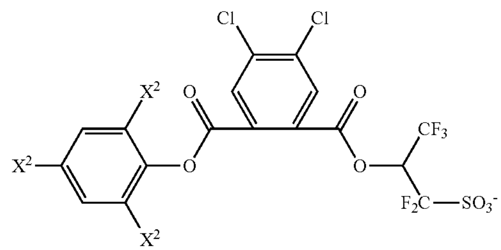
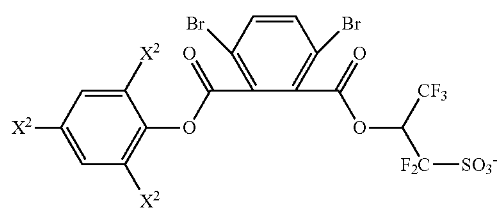
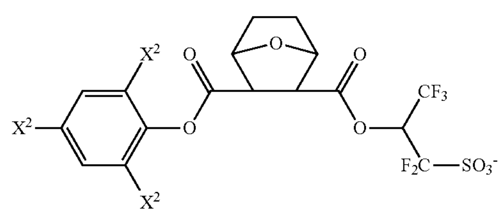
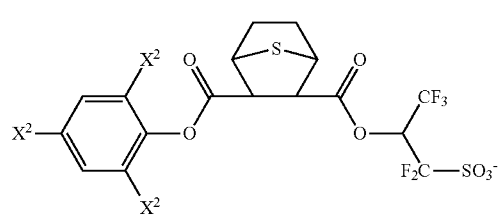
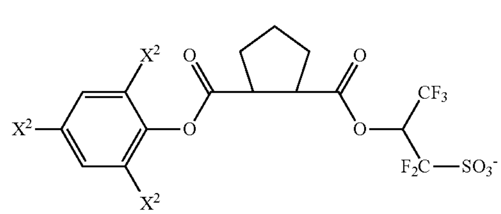

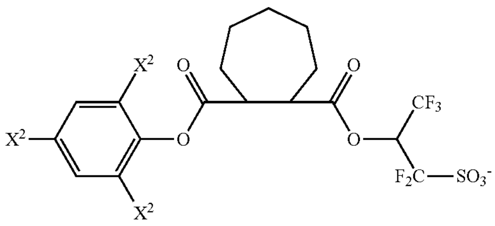
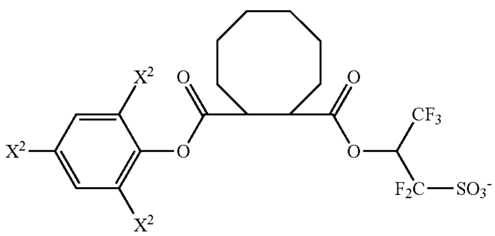
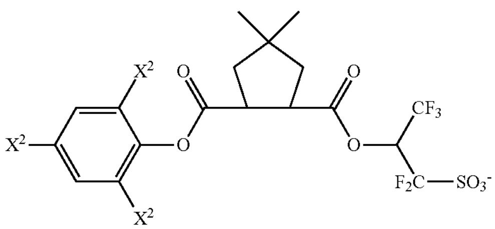
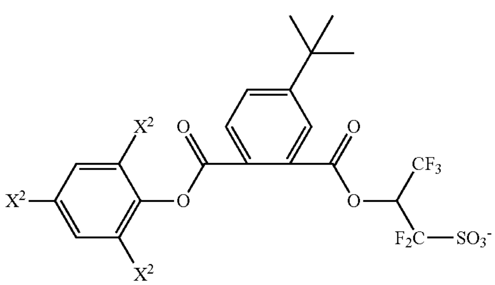
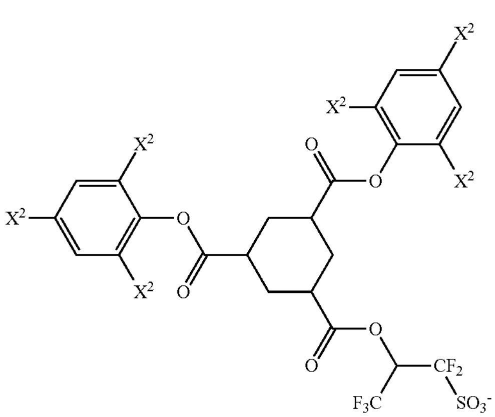
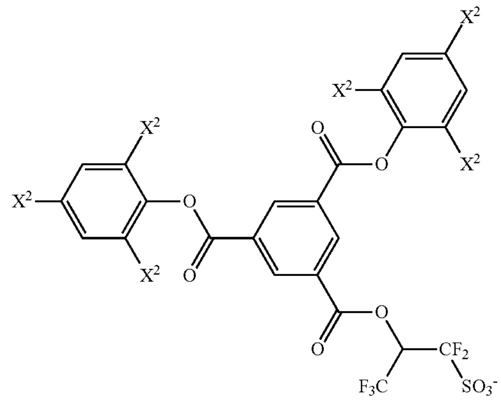
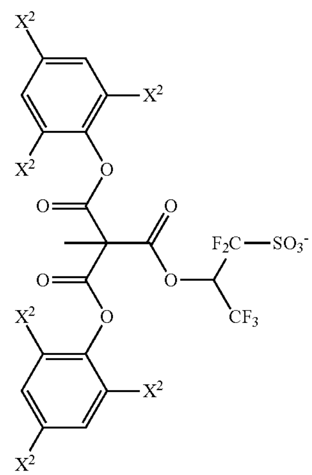
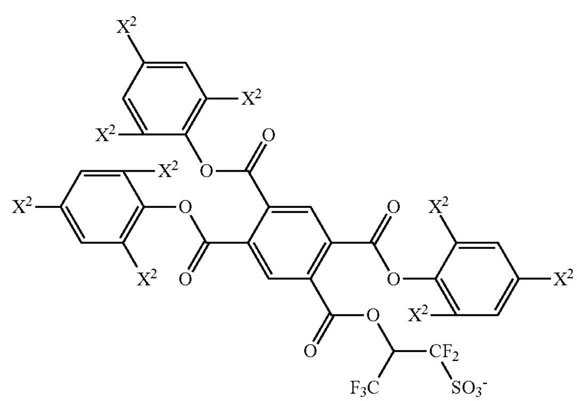
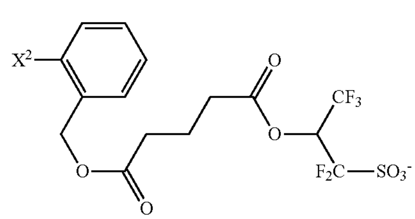

-continued
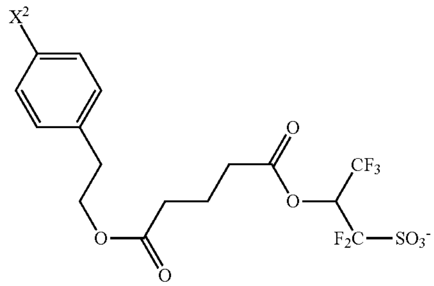
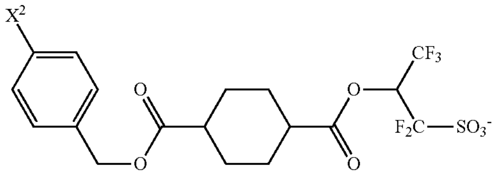
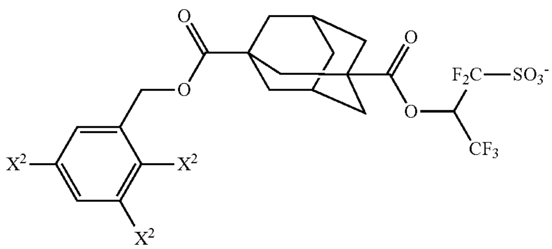
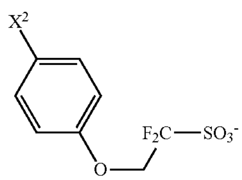
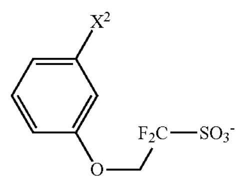
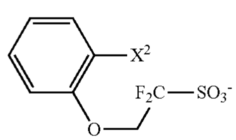
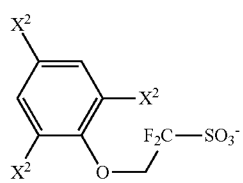
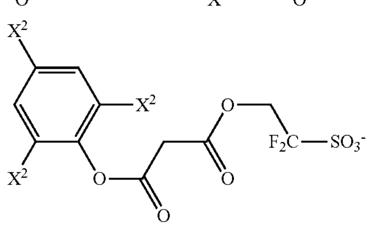
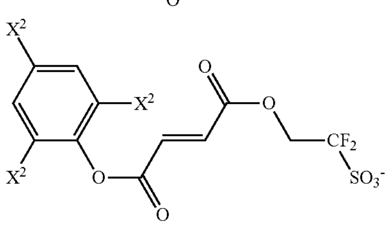
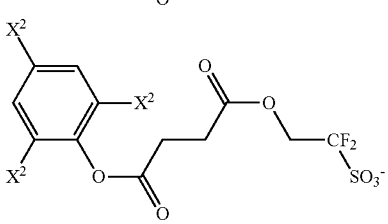
-continued
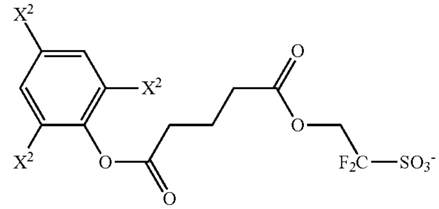
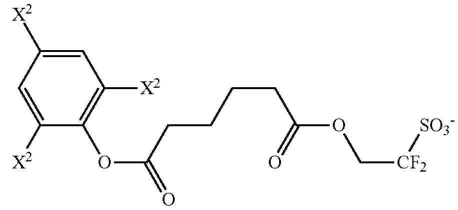
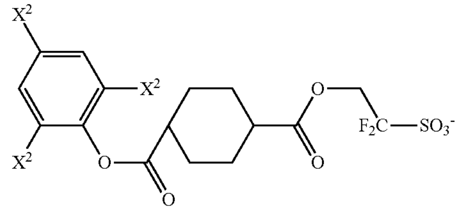
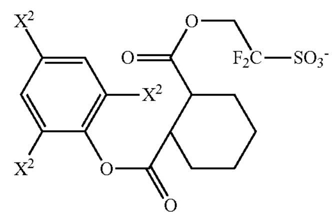
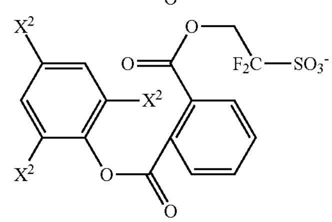
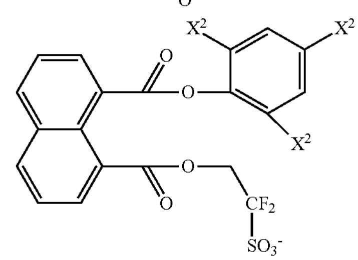
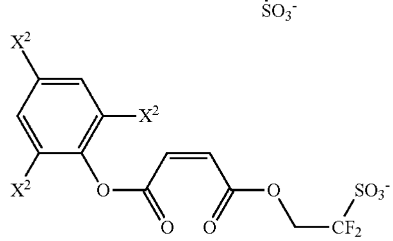
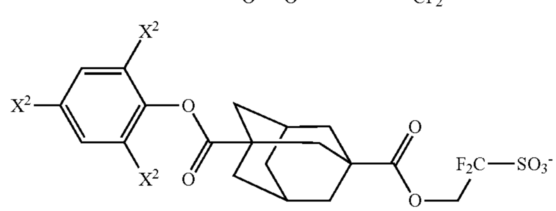

-continued
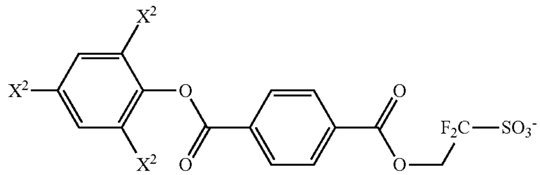
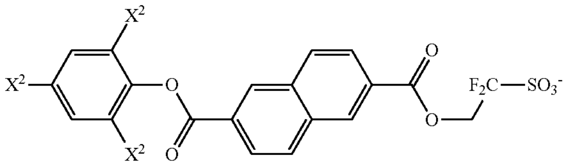
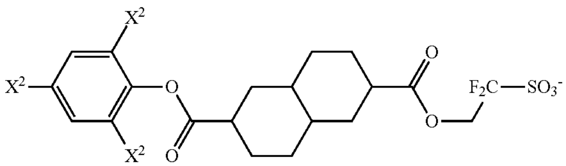
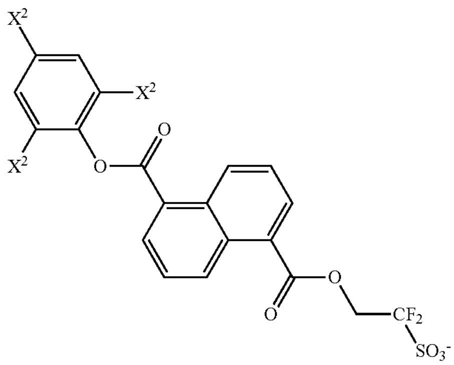
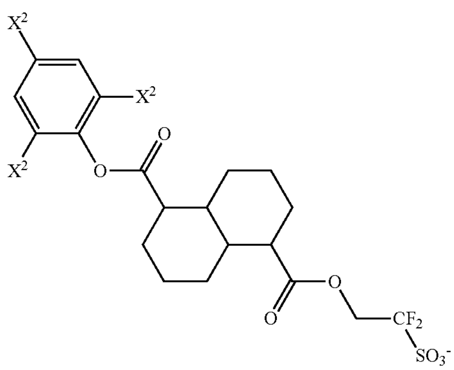
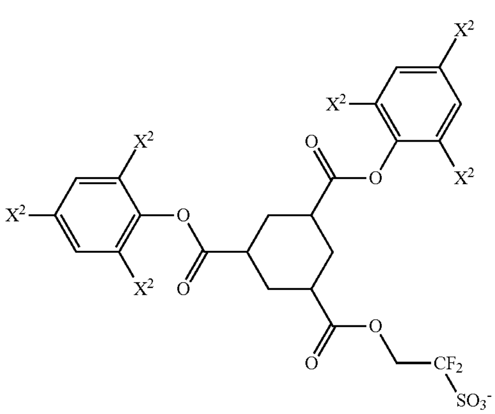
-continued
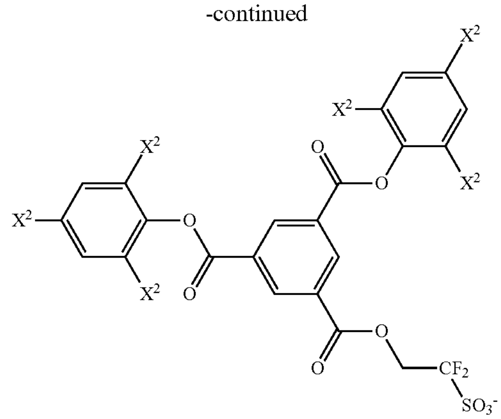
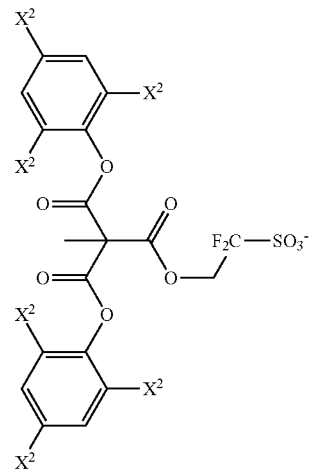
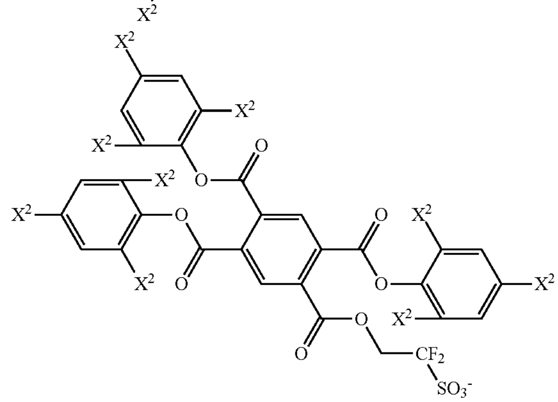
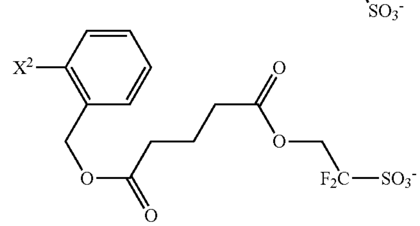
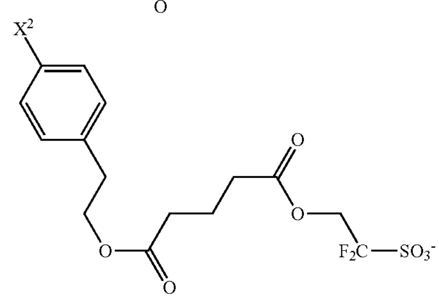

-continued
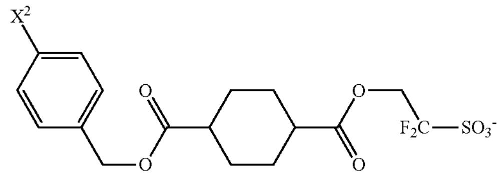
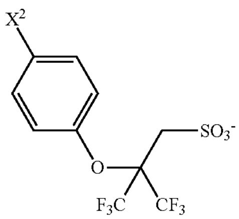
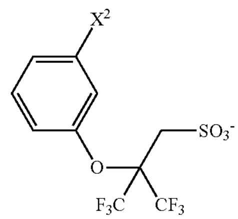
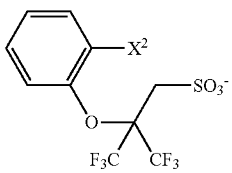
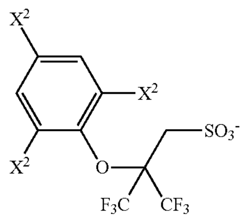
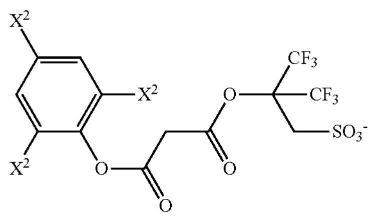
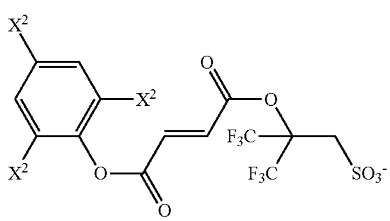
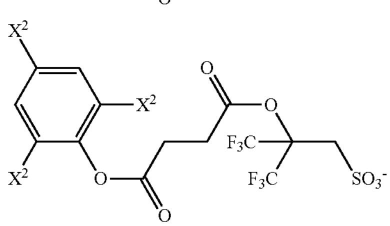
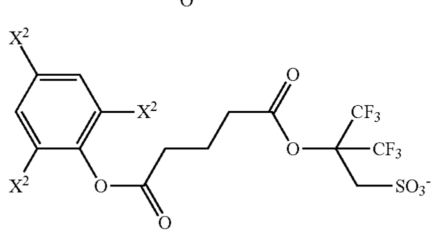
-continued
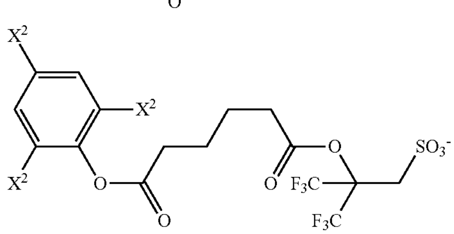
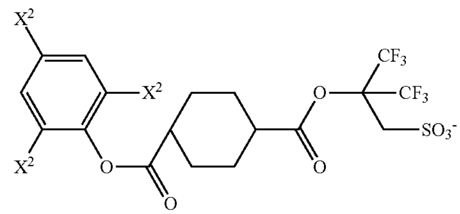
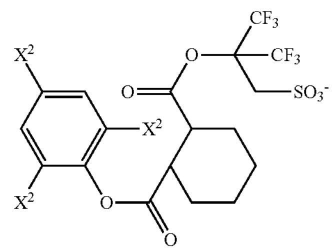
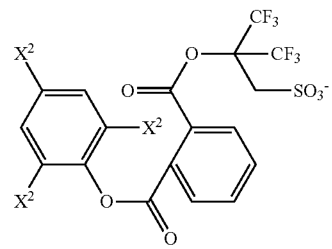
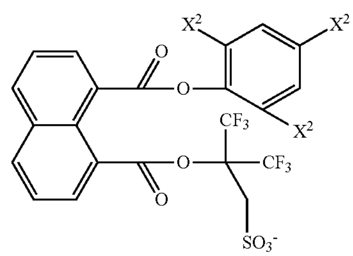
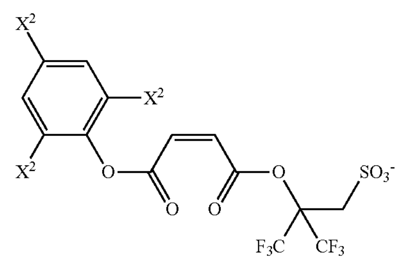
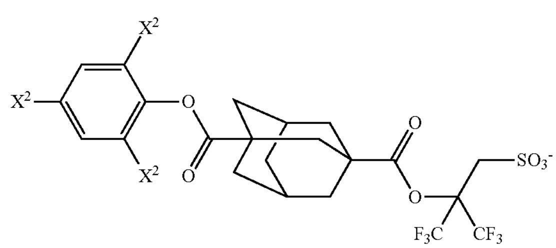

-continued
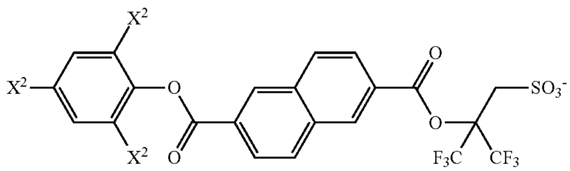
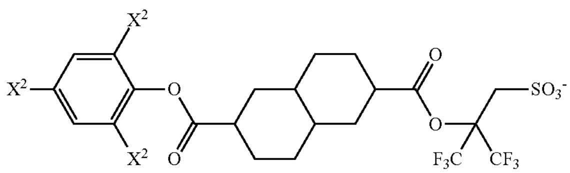
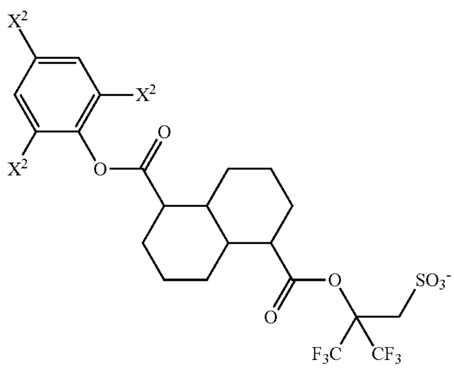
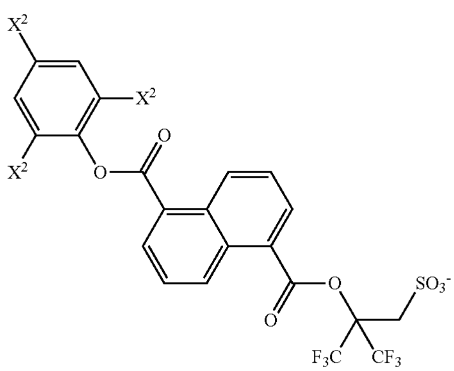
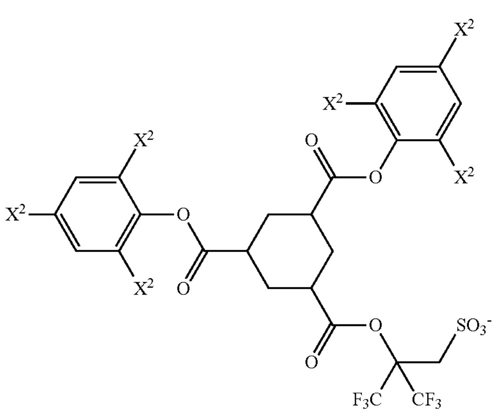
-continued
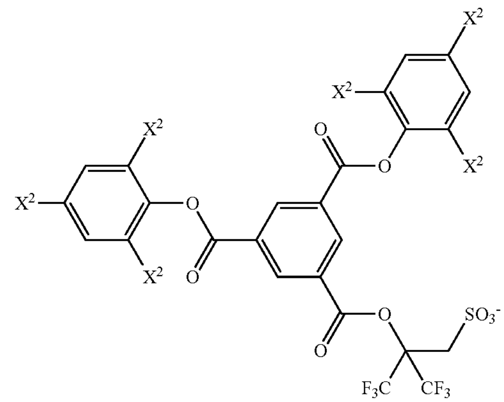
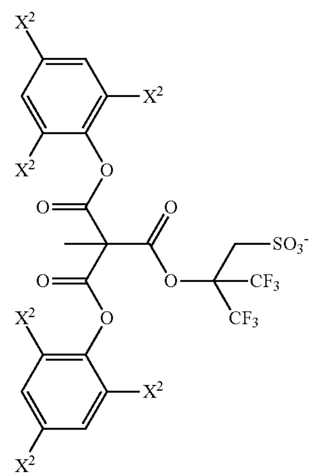
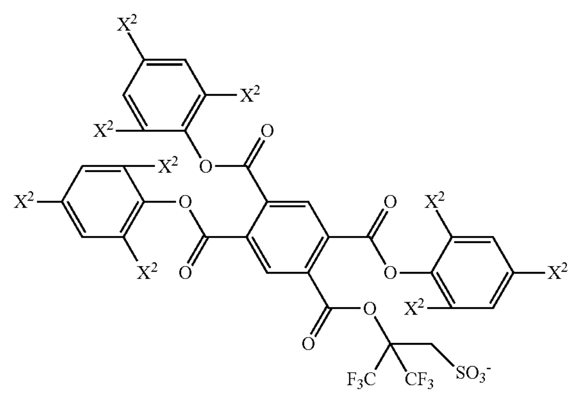
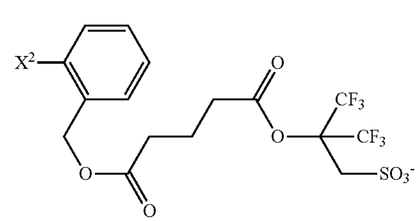

-continued

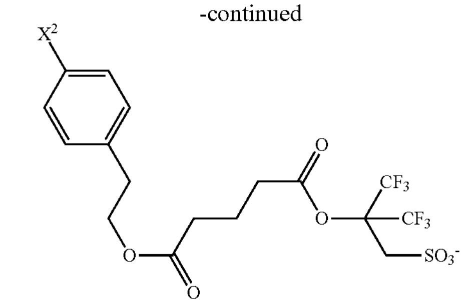

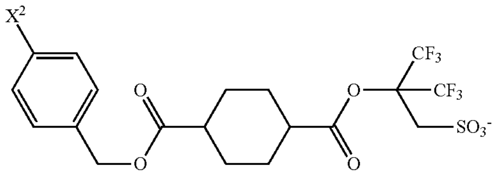

An appropriate amount of the acid generator of addition type is 0.1 to 50 parts, more preferably 1 to 40 parts by weight per 100 parts by weight of the base polymer.

In case the acid generator is an acid generator-and-base polymer, this acid generator is a polymer, preferably comprising recurring units derived from a compound capable of generating an acid in response to actinic light or radiation. In this case, the acid generator is preferably a base polymer to be described below, specifically comprising recurring units (f) as essential unit.

Base Polymer

Where the resist composition is of positive tone, the base polymer comprises recurring units containing an acid labile group, preferably recurring units having the formula (a1) or recurring units having the formula (a2). These units are simply referred to as recurring units (a1) and (a2).

(a1)

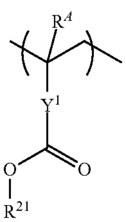

(a2)

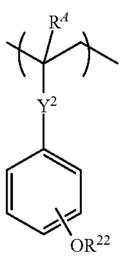

Herein $R^A$ is each independently hydrogen or methyl. $R^{21}$ and $R^{22}$ each are an acid labile group. $Y^1$ is a single bond, phenylene or naphthylene group, or $C_1$-$C_{12}$ linking group containing at least one moiety selected from ester bond and lactone ring. $Y^2$ is a single bond or ester bond. When the base polymer contains both recurring units (a1) and (a2), $R^{21}$ and $R^{22}$ may be the same or different.

Examples of the monomer from which the recurring units (a1) are derived are shown below, but not limited thereto. $R^A$ and $R^{21}$ are as defined above.

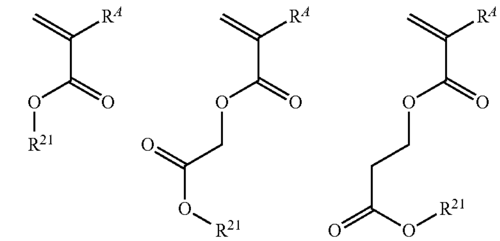

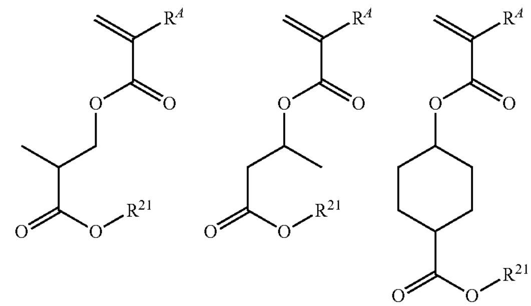

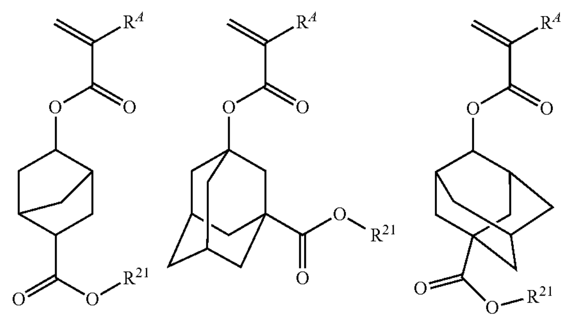

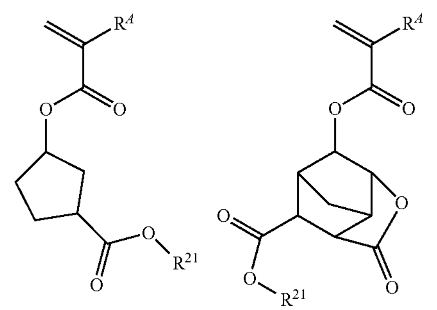

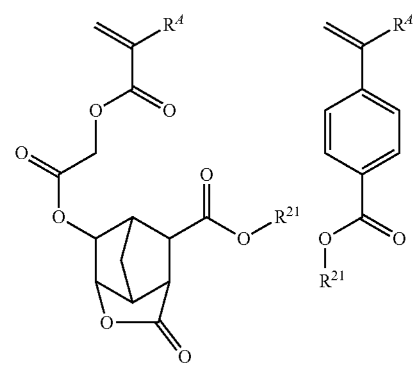

-continued

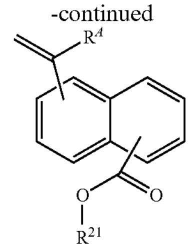

Examples of the monomer from which the recurring units (a2) are derived are shown below, but not limited thereto. $R^A$ and $R^{22}$ are as defined above.

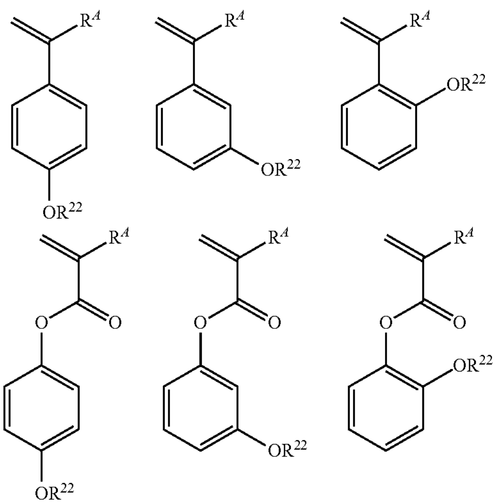

The acid labile groups represented by $R^{21}$ and $R^{22}$ in formulae (a1) and (a2) may be selected from a variety of such groups, for example, those groups descried in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

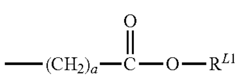

(AL-1)

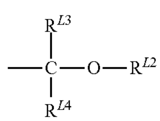

(AL-2)

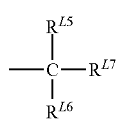

(AL-3)

In formulae (AL-1) and (AL-2), $R^{L1}$ and $R^{L2}$ are each independently a $C_1$-$C_{40}$ monovalent hydrocarbon group which may contain a heteroatom such as oxygen, sulfur, nitrogen or fluorine. The monovalent hydrocarbon groups may be straight, branched or cyclic while $C_1$-$C_{40}$ alkyl groups are preferred, and $C_1$-$C_{20}$ alkyl groups are more preferred. In formula (AL-1), "a" is an integer of 0 to 10, preferably 1 to 5.

In formula (AL-2), $R^{L3}$ and $R^{L4}$ are each independently hydrogen or a $C_1$-$C_{20}$ monovalent hydrocarbon group which may contain a heteroatom such as oxygen, sulfur, nitrogen or fluorine. The monovalent hydrocarbon groups may be straight, branched or cyclic while $C_1$-$C_{20}$ alkyl groups are preferred. Any two of $R^{L2}$, $R^{L3}$ and $R^{L4}$ may bond together to form a ring, typically alicyclic, with the carbon atom or carbon and oxygen atoms to which they are attached, the ring containing 3 to 20 carbon atoms, preferably 4 to 16 carbon atoms.

In formula (AL-3), $R^{L5}$, $R^{L6}$ and $R^{L7}$ are each independently a $C_1$-$C_{20}$ monovalent hydrocarbon group which may contain a heteroatom such as oxygen, sulfur, nitrogen or fluorine. The monovalent hydrocarbon groups may be straight, branched or cyclic while $C_1$-$C_{20}$ alkyl groups are preferred. Any two of $R^{L5}$, $R^{L6}$ and $R^{L7}$ may bond together to form a ring, typically alicyclic, with the carbon atom to which they are attached, the ring containing 3 to 20 carbon atoms, preferably 4 to 16 carbon atoms.

The base polymer may further comprise recurring units (b) having a phenolic hydroxyl group as an adhesive group. Examples of suitable monomers from which recurring units (b) are derived are given below, but not limited thereto. Herein R is as defined above.

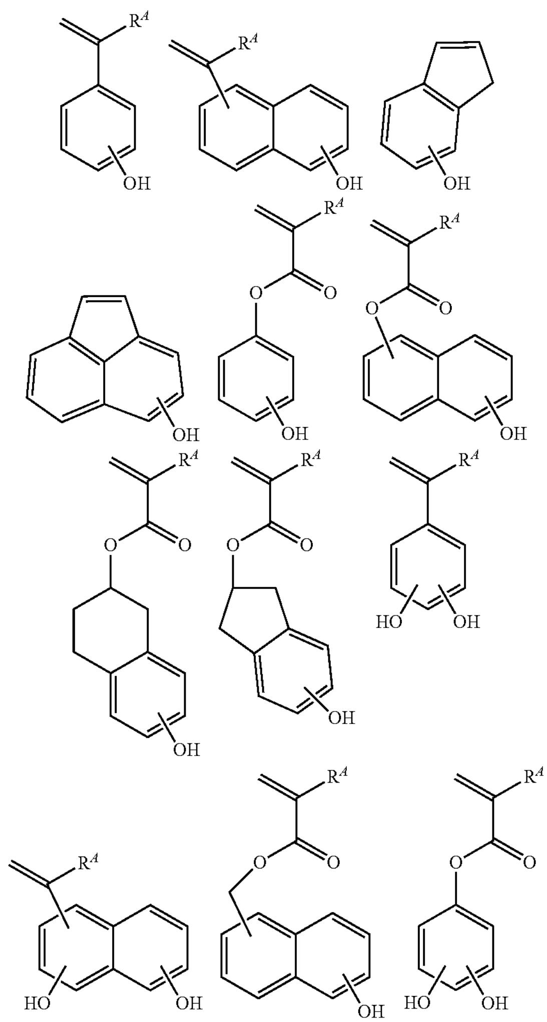

-continued

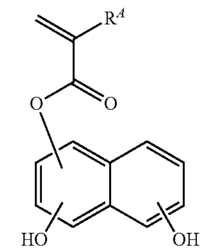
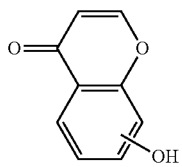
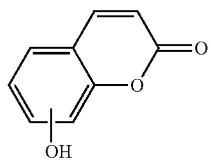
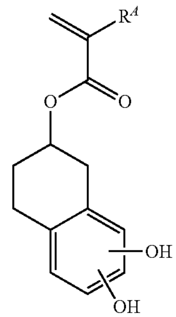
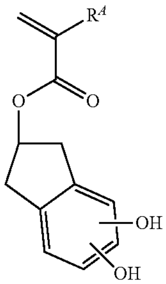

Further, recurring units (c) having another adhesive group selected from hydroxyl (other than the foregoing phenolic hydroxyl), lactone ring, ether bond, ester bond, carbonyl, cyano, and carboxyl groups may also be incorporated in the base polymer. Examples of suitable monomers from which recurring units (c) are derived are given below, but not limited thereto. Herein $R^A$ is as defined above.

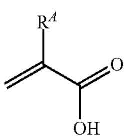
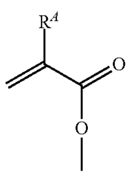
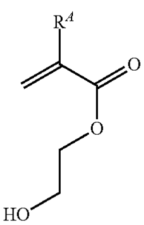
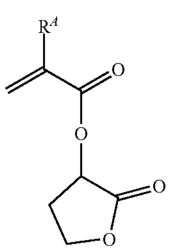
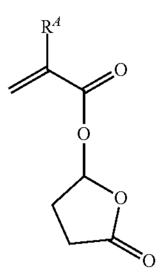
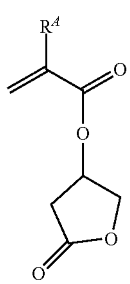
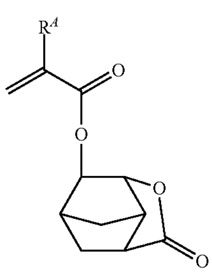
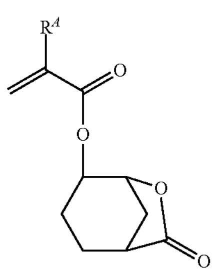

-continued

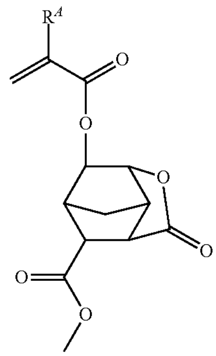
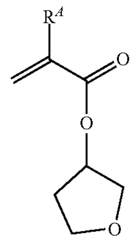
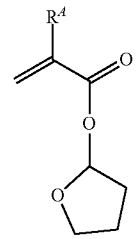
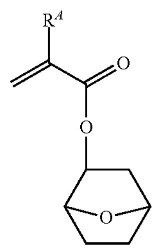
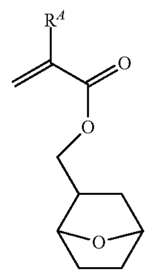
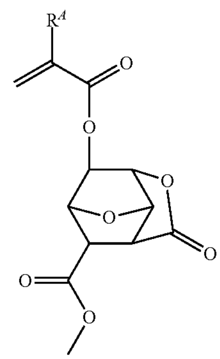
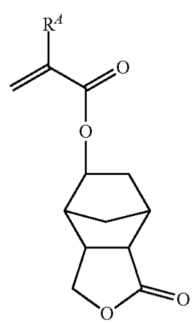
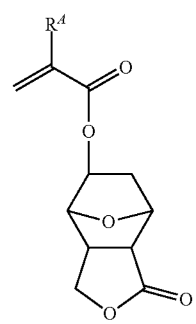
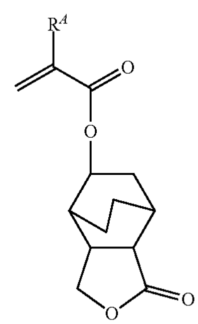
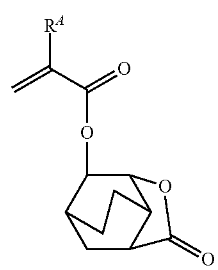
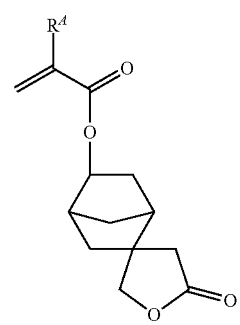
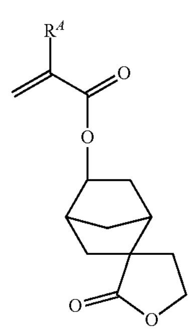
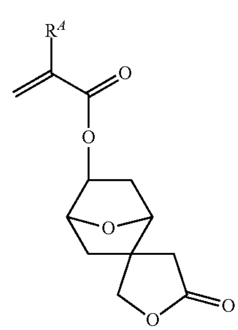

-continued
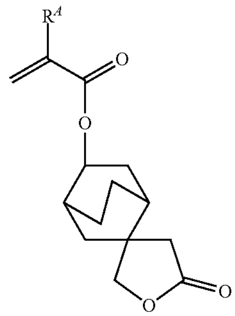
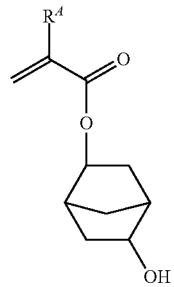
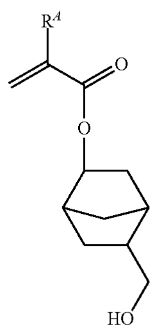
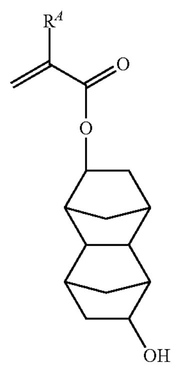
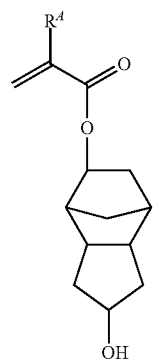
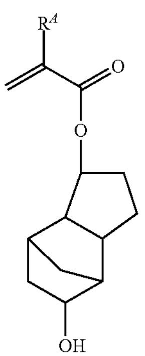
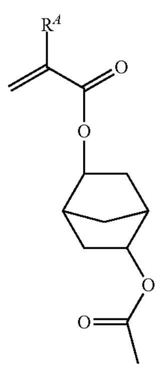
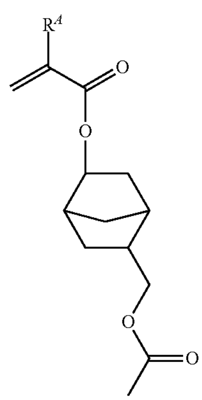
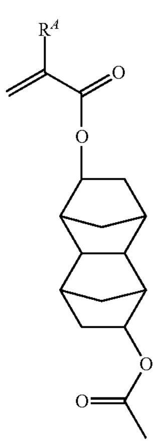
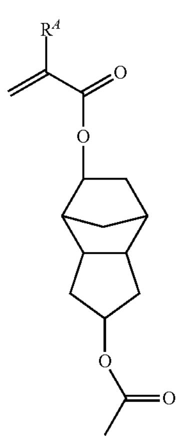
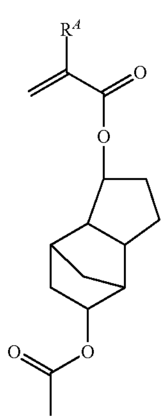
-continued
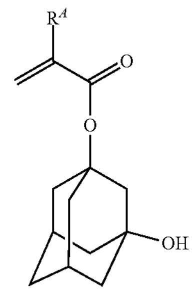
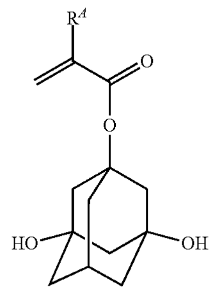
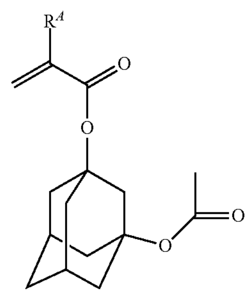
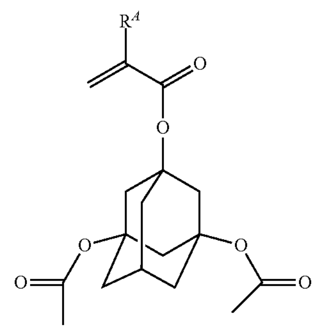
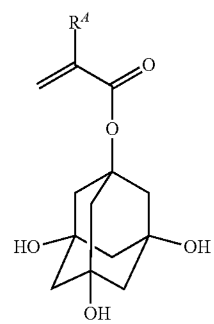
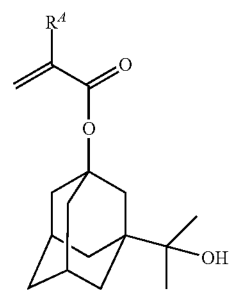
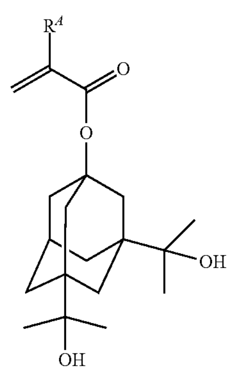
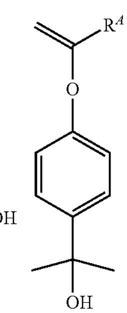
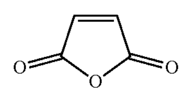
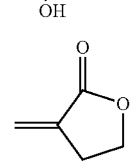
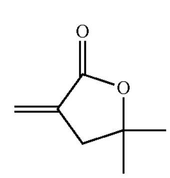
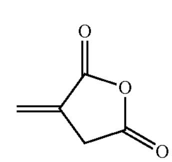
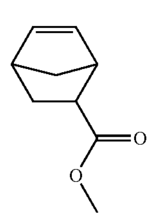
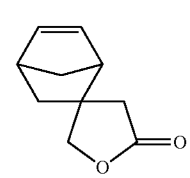
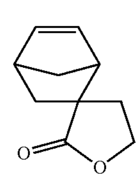

-continued
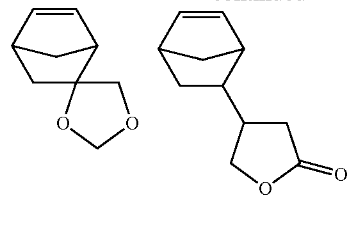
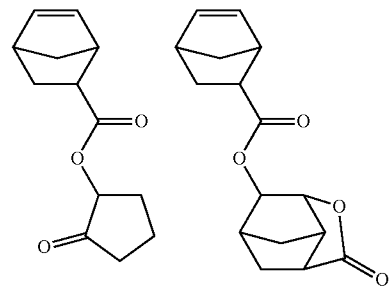
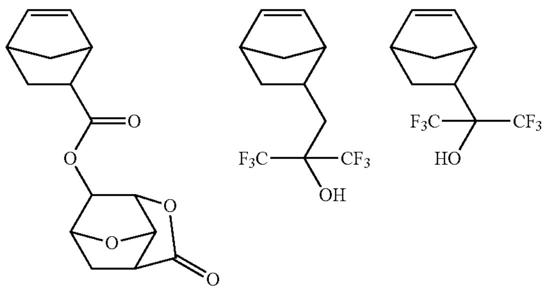
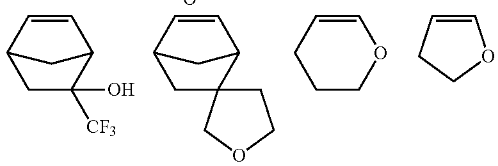
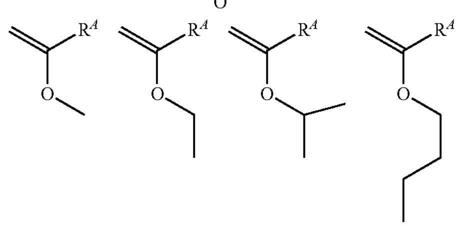
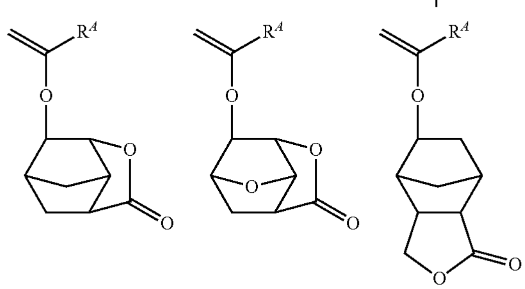
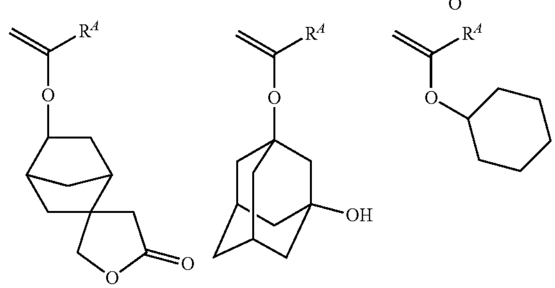
-continued
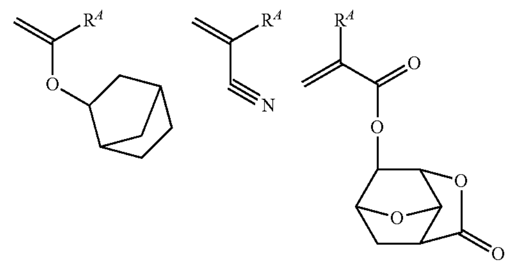
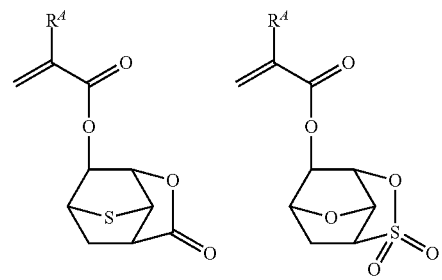
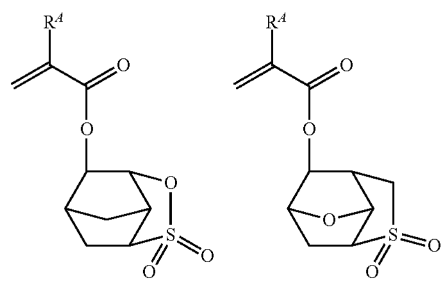
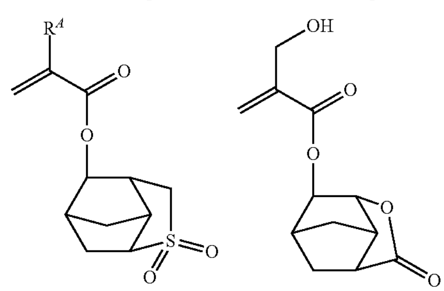
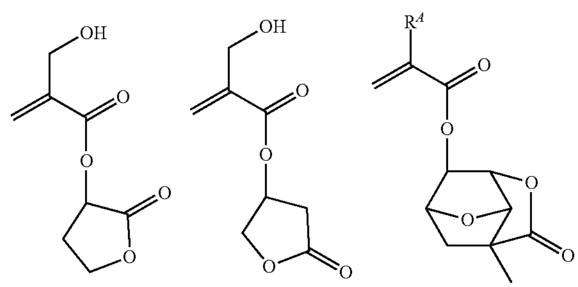
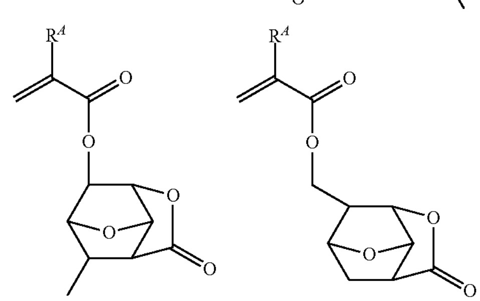

-continued
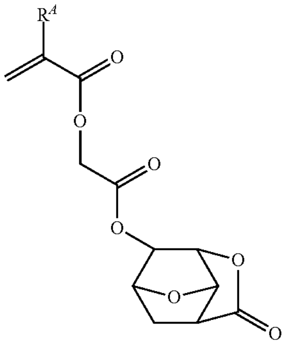
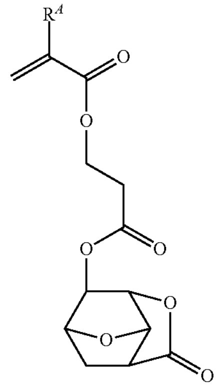
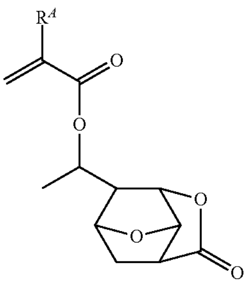
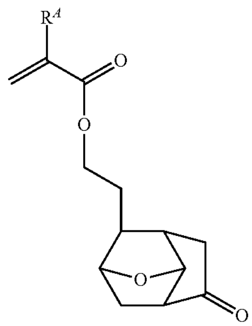
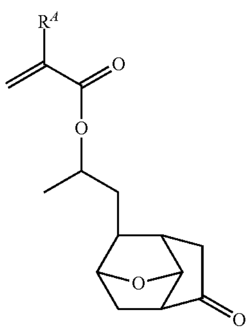
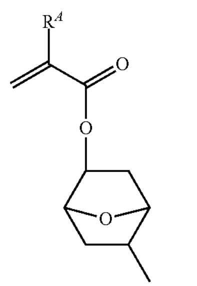
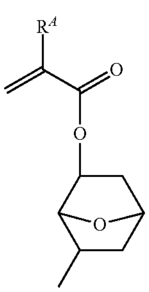
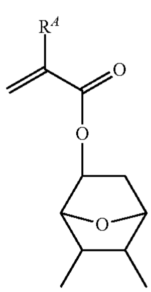
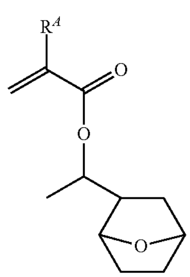
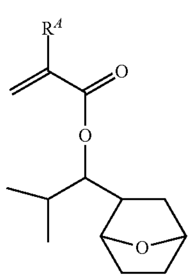
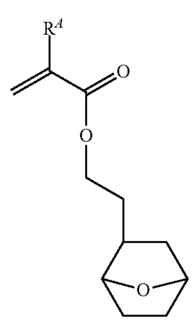
-continued
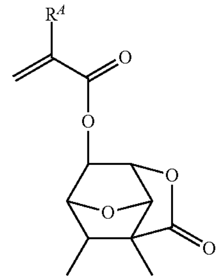
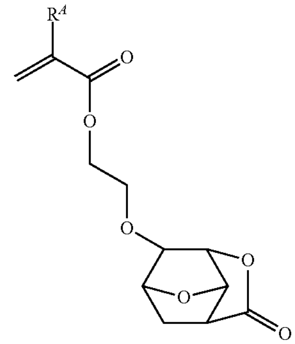
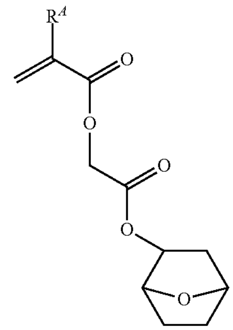
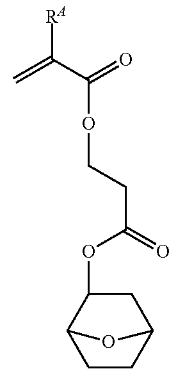
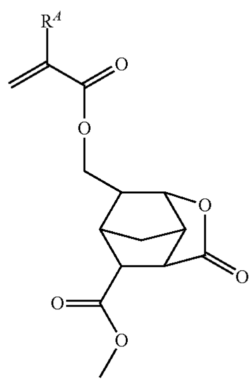
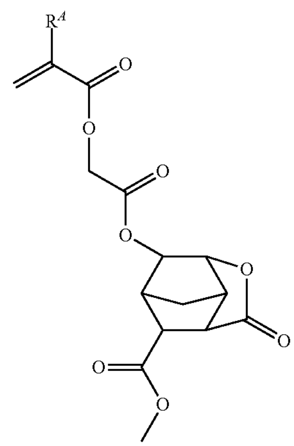
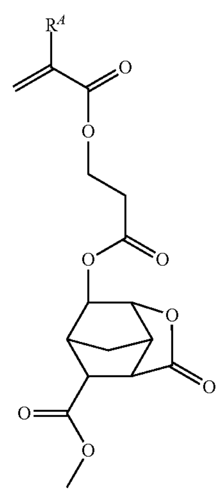
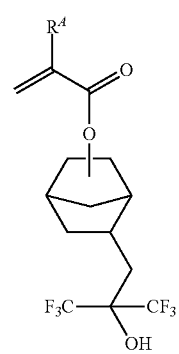

-continued
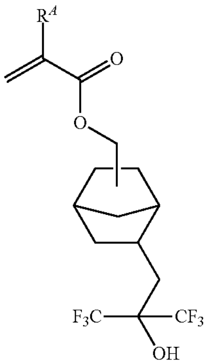
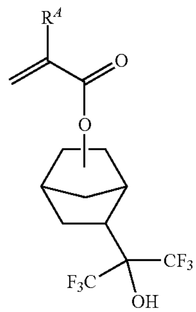
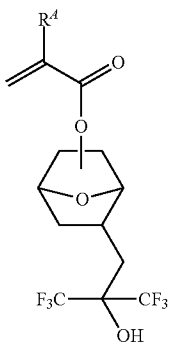
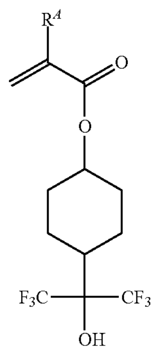
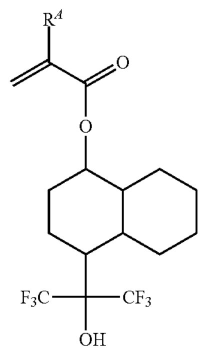
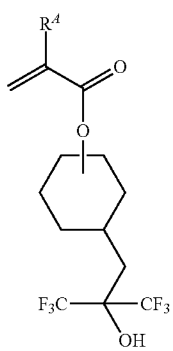
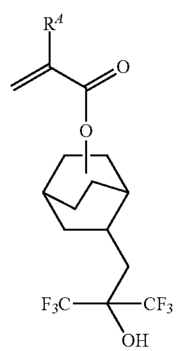
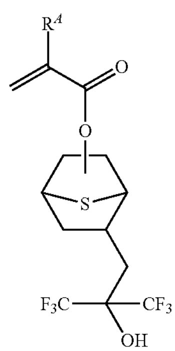
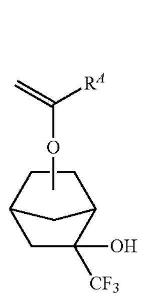
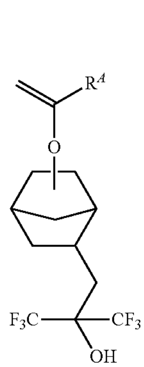
-continued
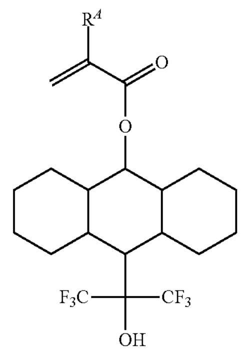
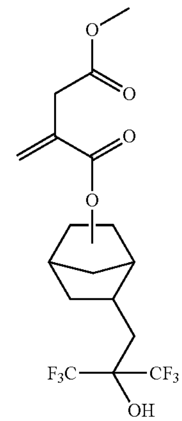
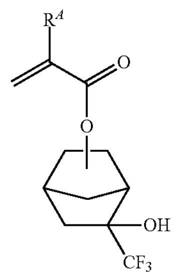
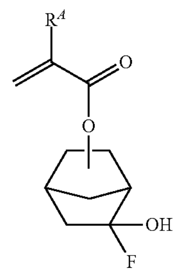
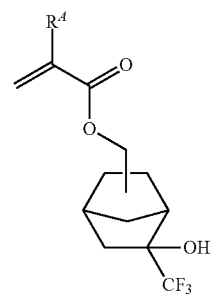
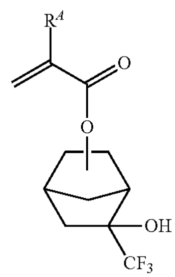
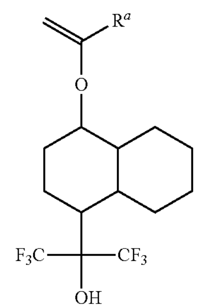
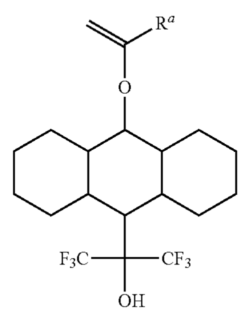
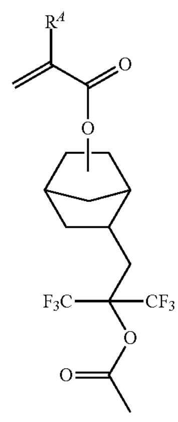
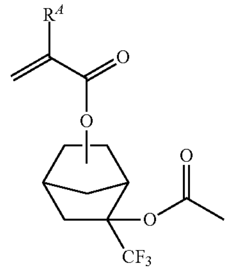
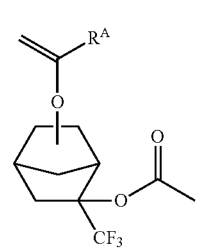

-continued
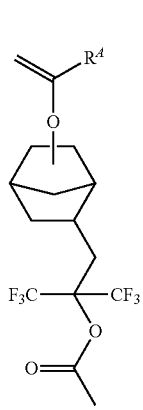
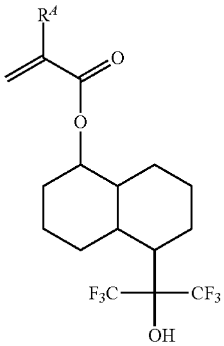
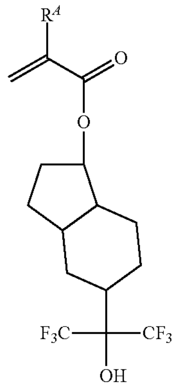
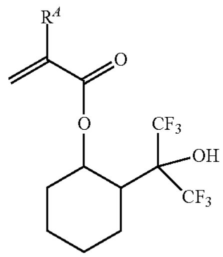
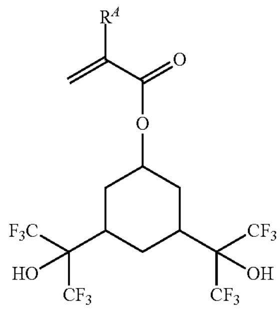
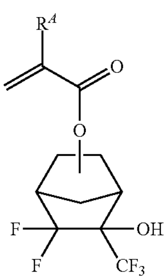
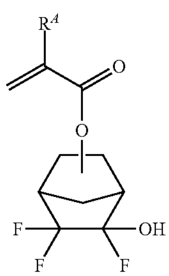
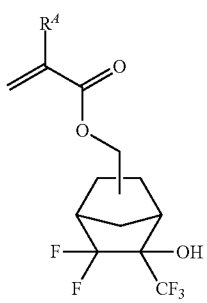
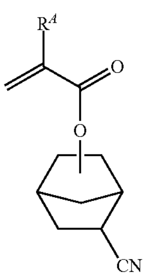
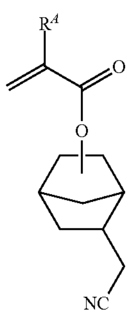
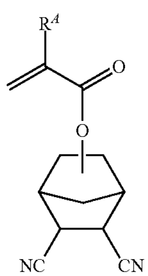
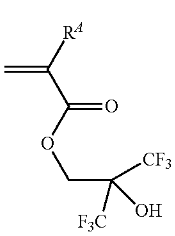
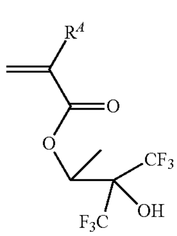
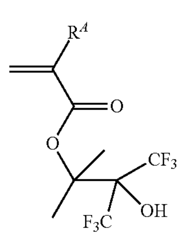
-continued
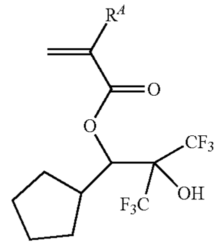
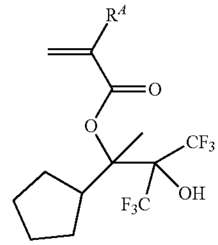
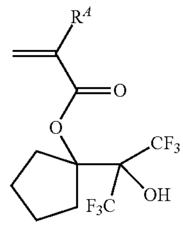
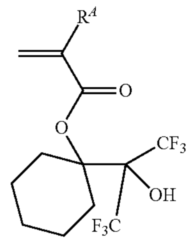
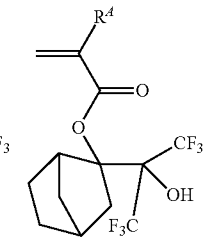
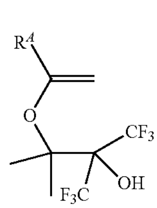
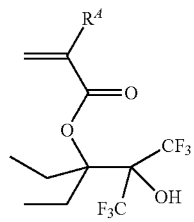
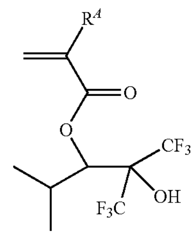
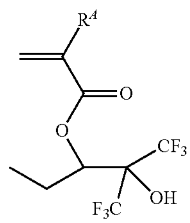
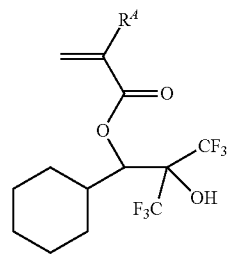
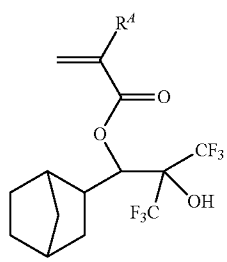
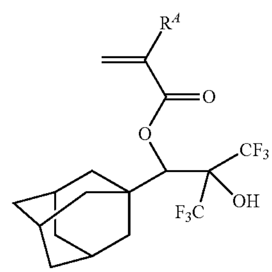
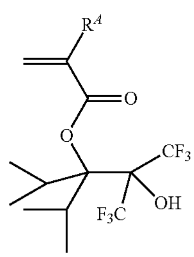
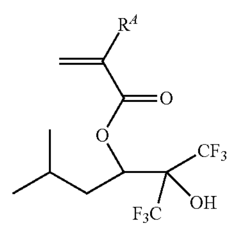
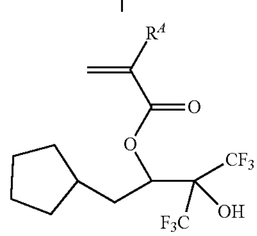
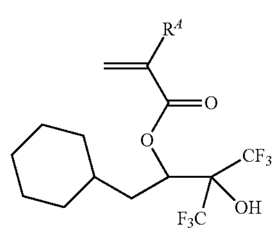

-continued
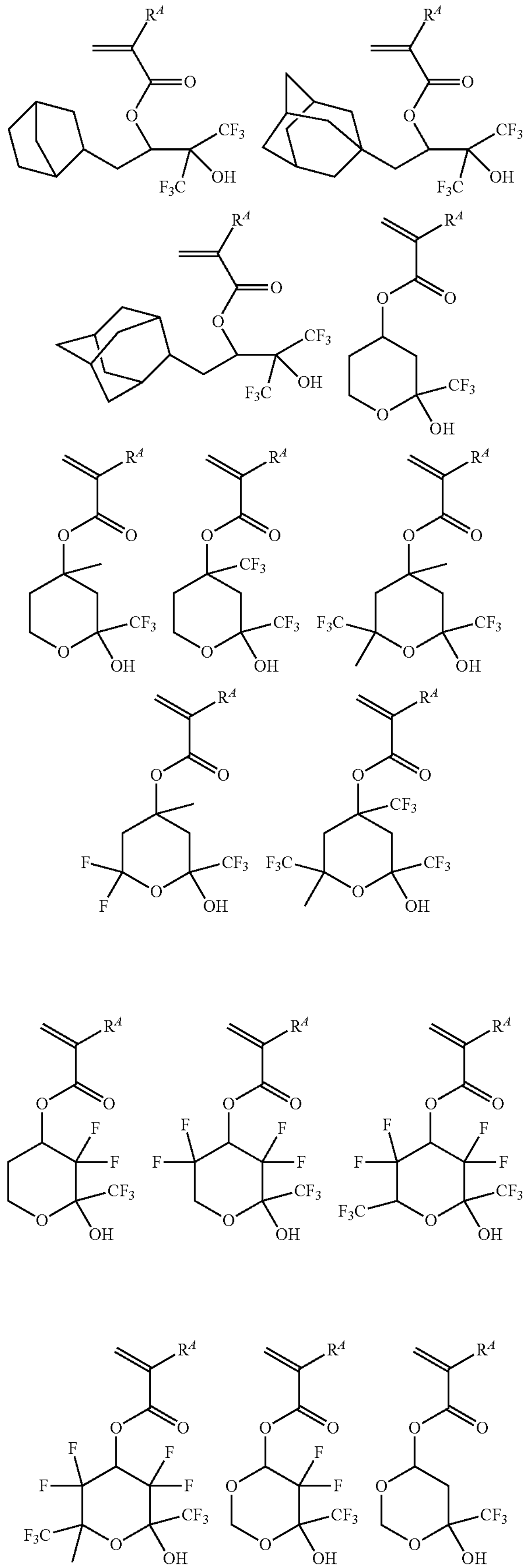
-continued
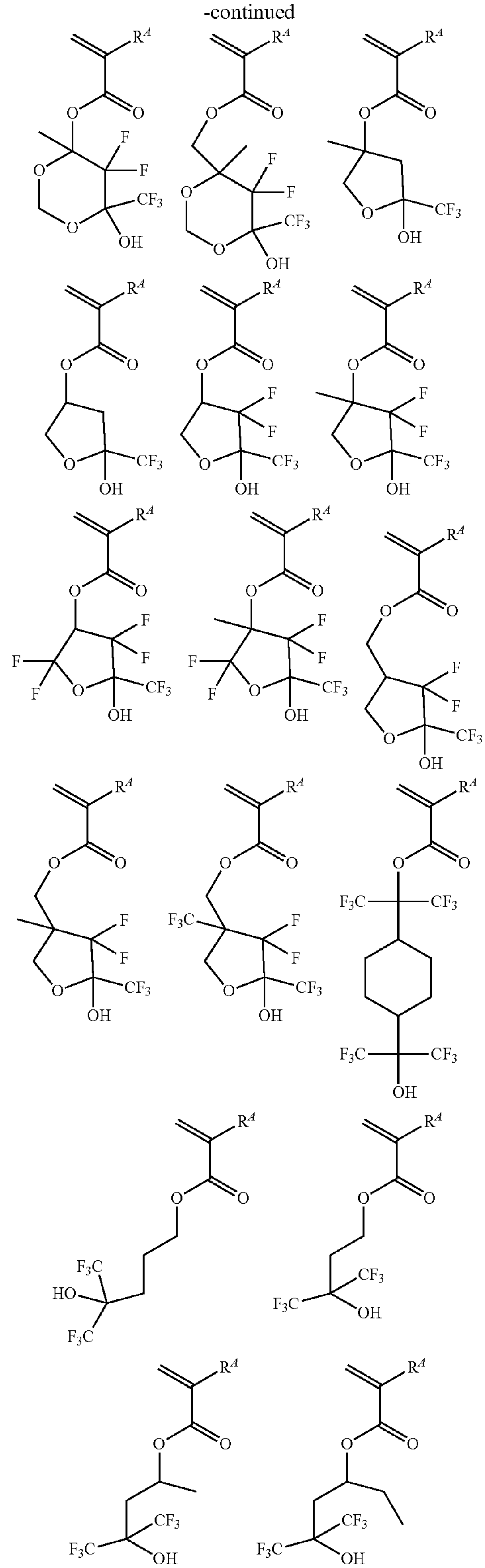

-continued
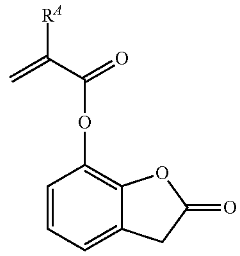
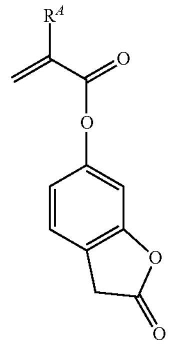
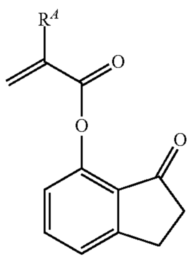
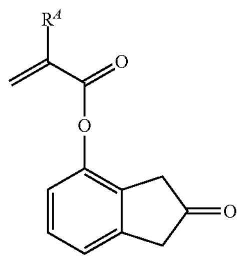
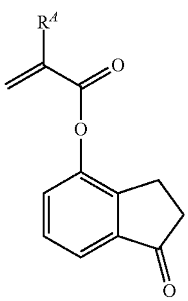
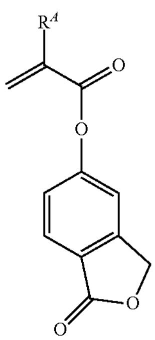
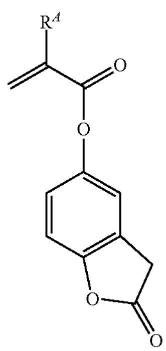
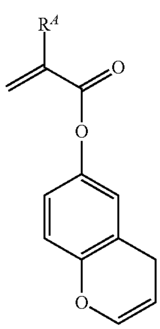
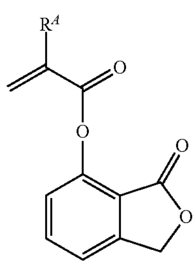
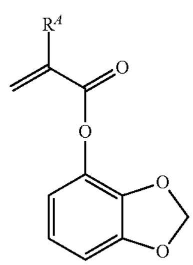
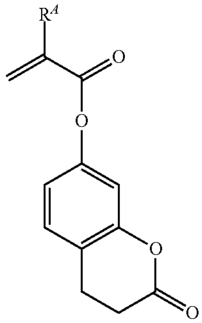
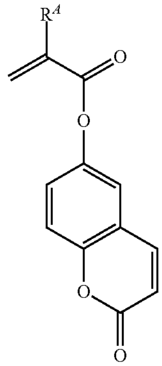
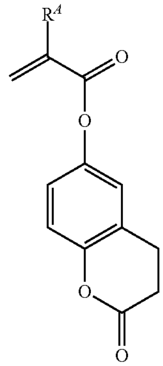
-continued
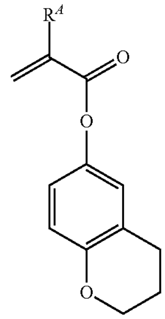
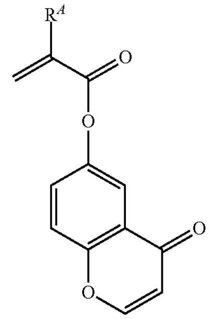
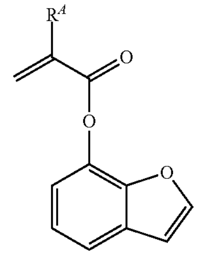
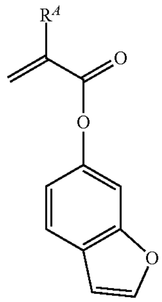
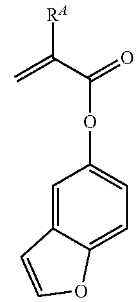
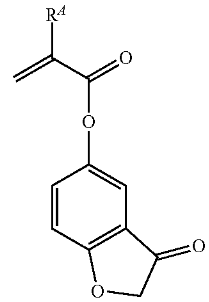
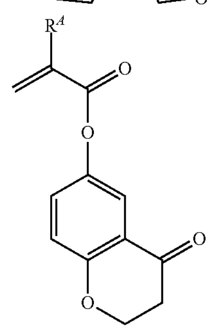
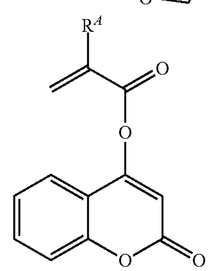
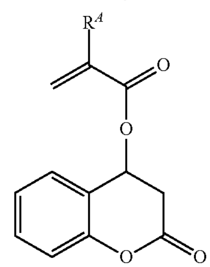
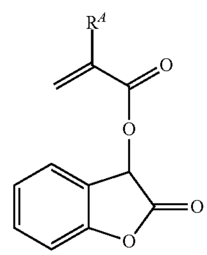
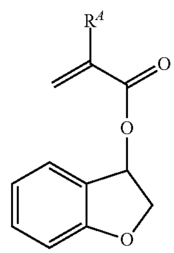
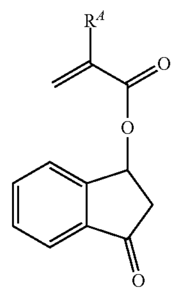
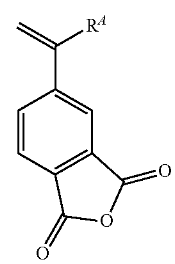
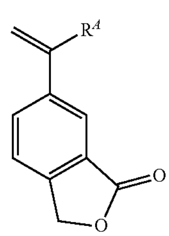
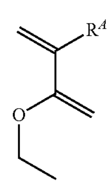
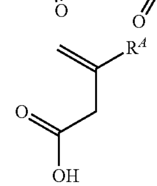
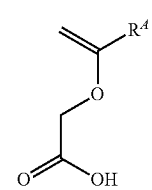

-continued
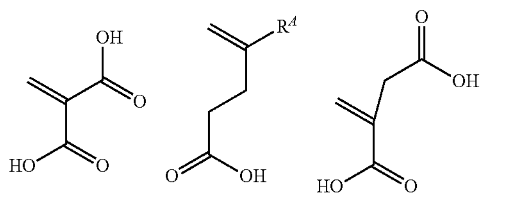
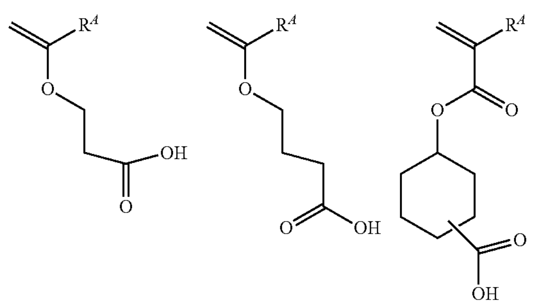
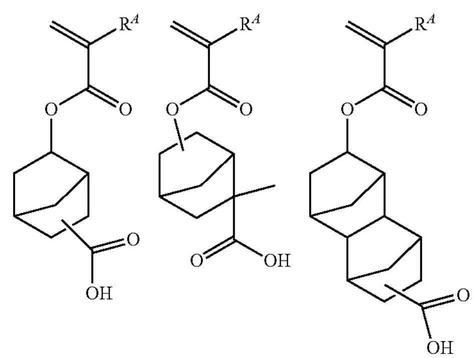
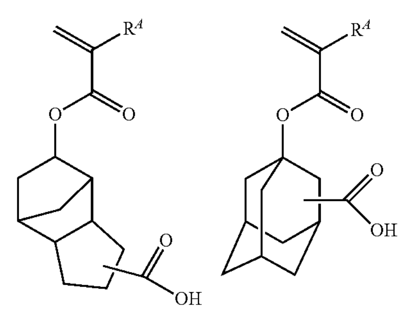
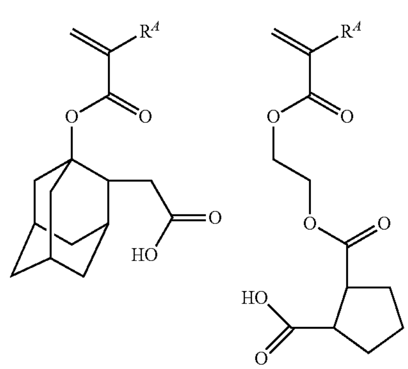
-continued
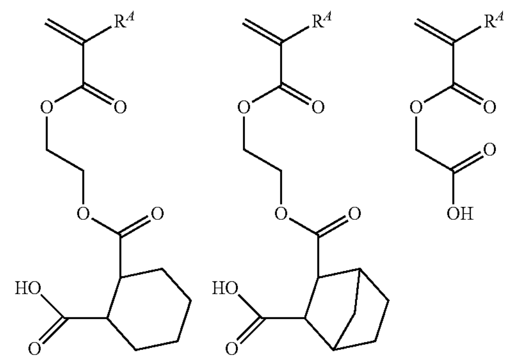
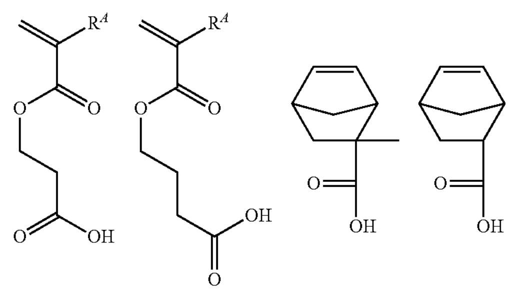
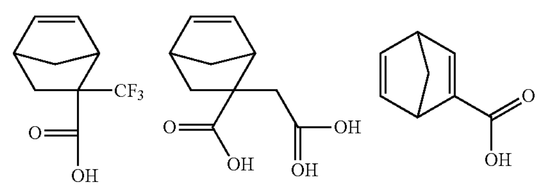
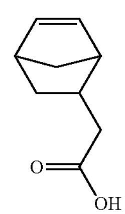
In another preferred embodiment, the base polymer may further comprise recurring units (d) selected from units of indene, benzofuran, benzothiophene, acenaphthylene, chromone, coumarin, and norbornadiene, or derivatives thereof. Suitable monomers are exemplified below.
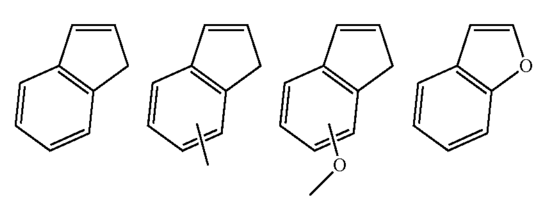
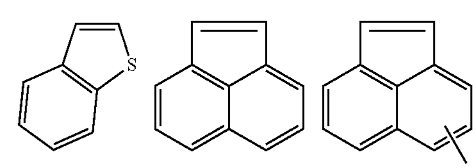

-continued

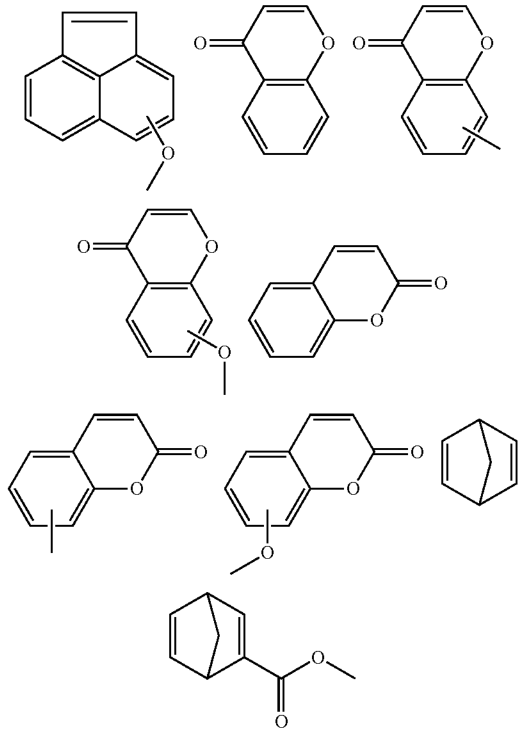

Furthermore, recurring units (e) may be incorporated in the base polymer, which are derived from styrene, vinylnaphthalene, vinylanthracene, vinylpyrene, methyleneindene, vinylpyridine, and vinylcarbazole.

In a further embodiment, recurring units (f) derived from an onium salt having a polymerizable unsaturated bond may be incorporated in the base polymer. Specifically, the base polymer may comprise recurring units of at least one type selected from formulae (f1), (f2) and (f3). These units are simply referred to as recurring units (f1), (f2) and (f3), which may be used alone or in combination of two or more types.

(f1)

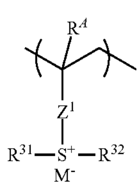

(f2)

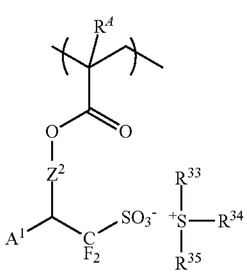

-continued (f3)

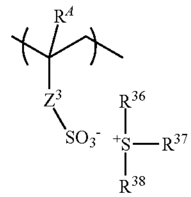

In formulae (f1) to (f3), $R^A$ is independently hydrogen or methyl. $Z^1$ is a single bond, phenylene group, —O—$Z^{11}$—, —C(═O)—O—$Z^{11}$—, or —C(═O)—NH—$Z^{11}$—, wherein $Z^{11}$ is a $C_1$-$C_6$ alkanediyl group, $C_2$-$C_6$ alkenediyl group, or phenylene group, which may contain a carbonyl, ester bond, ether bond or hydroxyl moiety. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ alkanediyl group which may contain a carbonyl moiety, ester bond or ether bond. $A^1$ is hydrogen or trifluoromethyl. $Z^3$ is a single bond, methylene, ethylene, phenylene, fluorinated phenylene, —O—$Z^{31}$—, —C(═O)—O—$Z^{31}$—, or —C(═O)—NH—$Z^{31}$—, wherein $Z^{31}$ is a $C_1$-$C_6$ alkanediyl group, $C_2$-$C_6$ alkenediyl group, phenylene group, fluorinated phenylene group, or trifluoromethyl-substituted phenylene group, which may contain a carbonyl moiety, ester bond, ether bond or hydroxyl moiety. The alkanediyl and alkenediyl groups may be straight, branched or cyclic.

In formulae (f1) to (f3), $R^{31}$ to $R^{38}$ are each independently a $C_1$-$C_{20}$ monovalent hydrocarbon group which may contain a heteroatom. The monovalent hydrocarbon groups may be straight, branched or cyclic, and examples thereof include $C_1$-$C_{12}$ alkyl groups, $C_6$-$C_{12}$ aryl groups, and $C_7$-$C_{20}$ aralkyl groups. In these groups, some or all of the hydrogen atoms may be substituted by $C_1$-$C_{10}$ alkyl groups, halogen, trifluoromethyl, cyano, nitro, hydroxyl, mercapto, $C_1$-$C_{10}$ alkoxy groups, $C_2$-$C_{10}$ alkoxycarbonyl groups, or $C_2$-$C_{10}$ acyloxy groups, and some carbon may be replaced by a carbonyl moiety, ether bond or ester bond. Any two of $R^{33}$, $R^{34}$ and $R^{35}$ or any two of $R^{36}$, $R^{37}$ and $R^{38}$ may bond together to form a ring with the sulfur atom to which they are attached.

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (K-1) and sulfonate ions having fluorine substituted at α- and β-positions as represented by the formula (K-2).

$$R^{51}—CF_2—SO_3^- \quad \text{(K-1)}$$

(K-2)

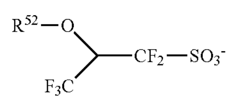

In formula (K-1), $R^{51}$ is hydrogen, or a $C_1$-$C_{20}$ alkyl group, $C_2$-$C_{20}$ alkenyl group, or $C_6$-$C_{20}$ aryl group, which may contain an ether bond, ester bond, carbonyl moiety, lactone ring, or fluorine atom. The alkyl and alkenyl groups may be straight, branched or cyclic.

In formula (K-2), $R^{52}$ is hydrogen, or a $C_1$-$C_{30}$ alkyl group, $C_2$-$C_{20}$ acyl group, $C_2$-$C_{20}$ alkenyl group, $C_6$-$C_{20}$ aryl group or $C_6$-$C_{20}$ aryloxy group, which may contain an ether bond, ester bond, carbonyl moiety or lactone ring. The alkyl, acyl and alkenyl groups may be straight, branched or cyclic.

Examples of the monomer from which recurring unit (f1) is derived are shown below, but not limited thereto. $R^A$ and $M^-$ are as defined above.

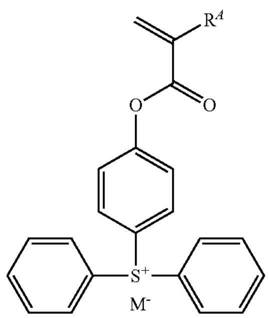

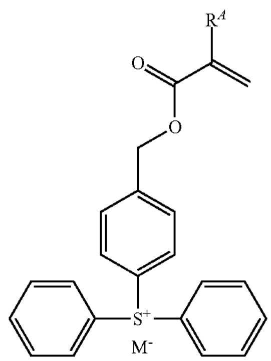

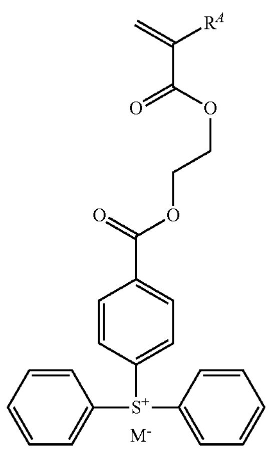

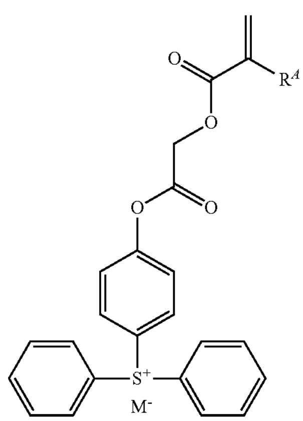

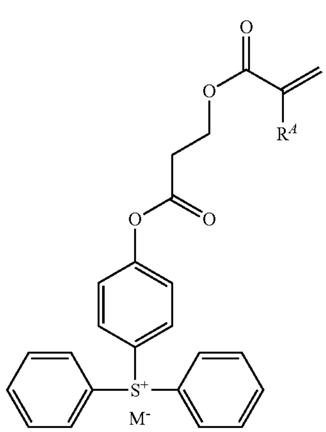

-continued

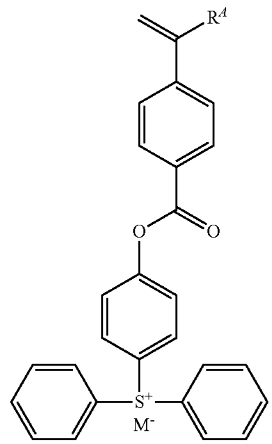

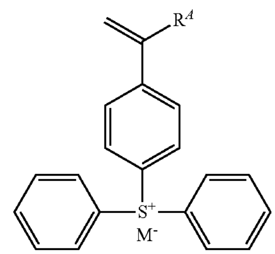

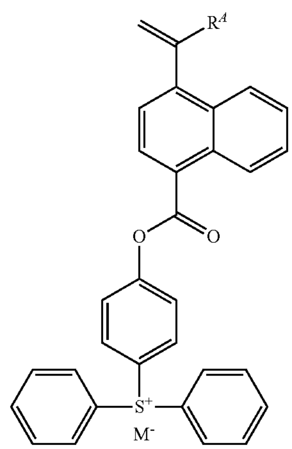

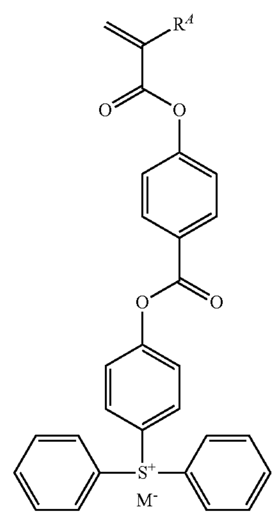

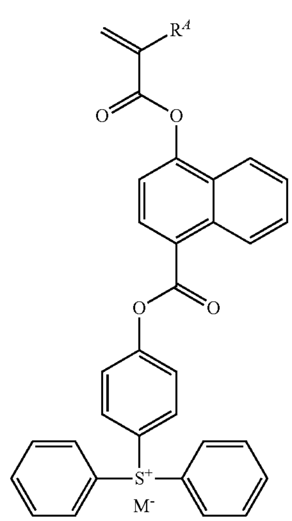

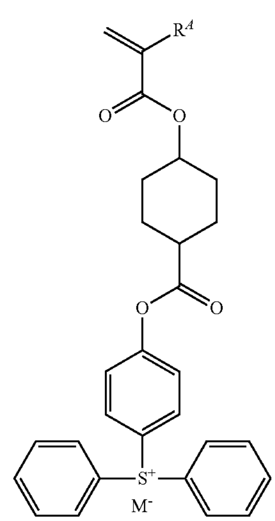

-continued
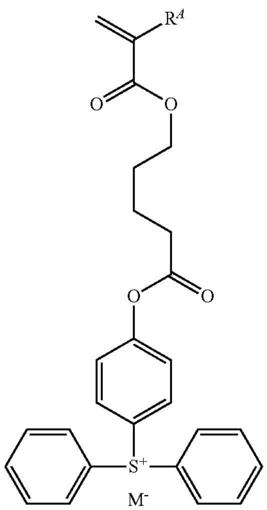
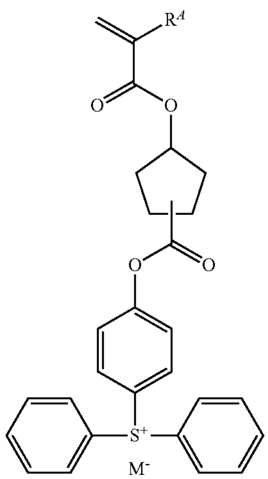
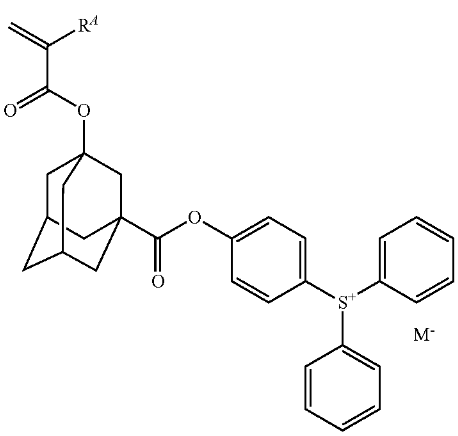
Examples of the monomer from which recurring unit (f2) is derived are shown below, but not limited thereto. $R^A$ is as defined above.
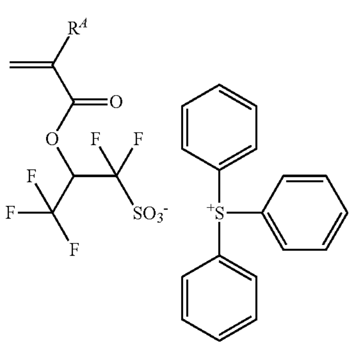
-continued
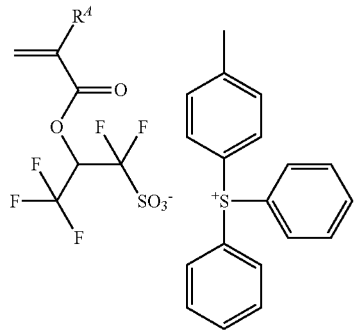
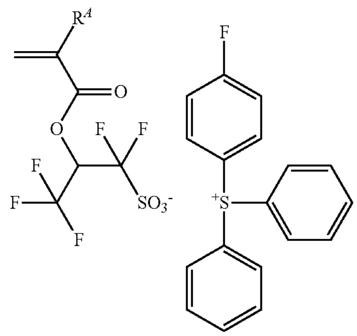
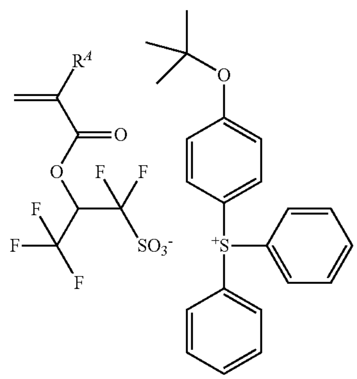
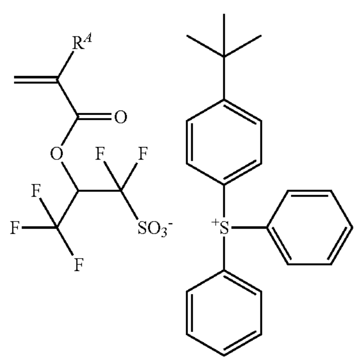
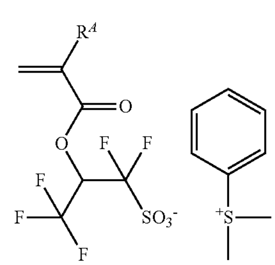

-continued
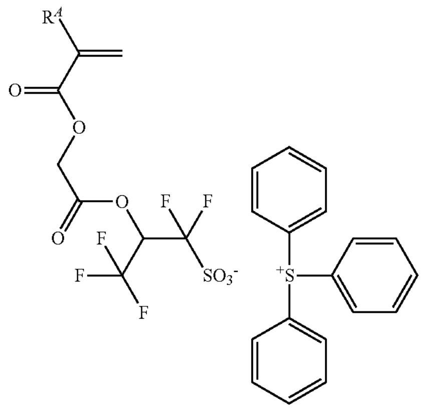
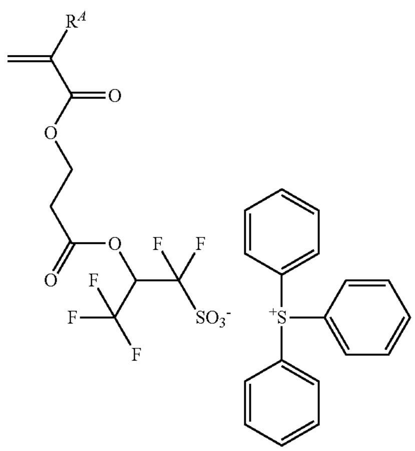
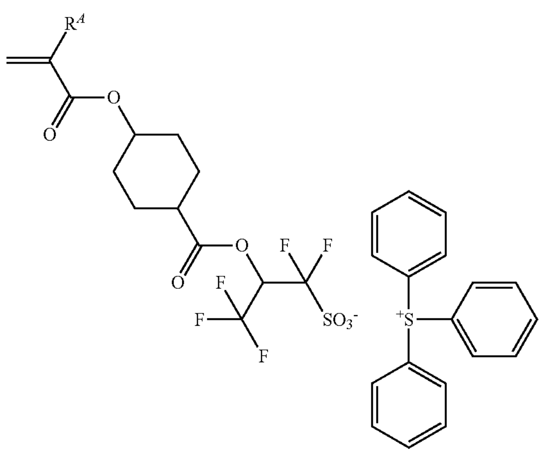
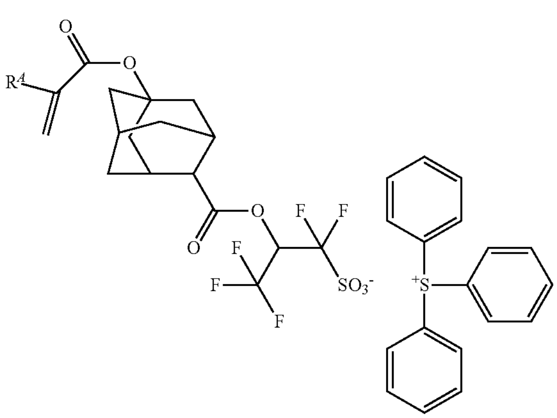
-continued
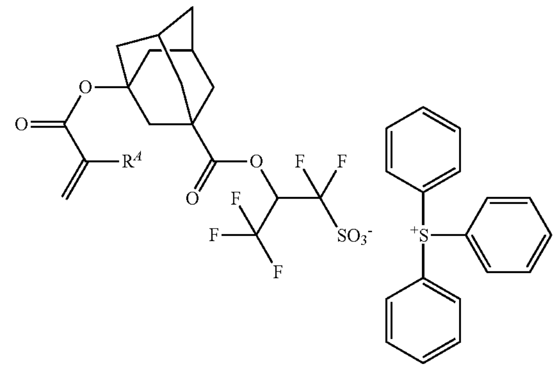
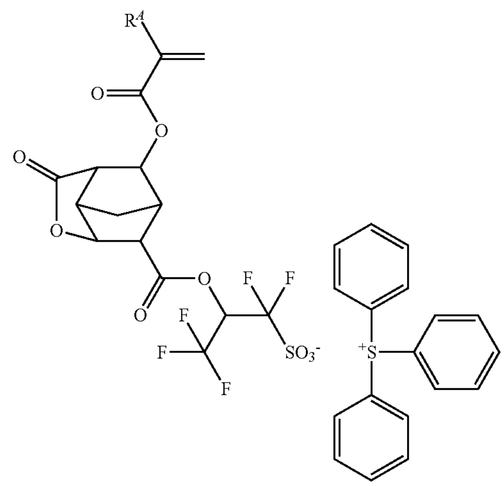
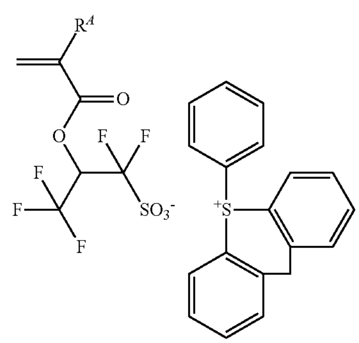
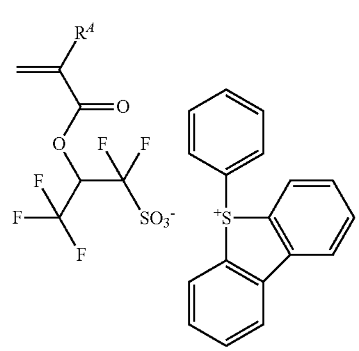

-continued
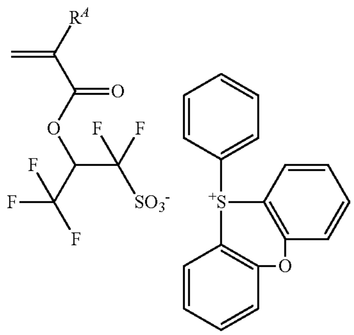
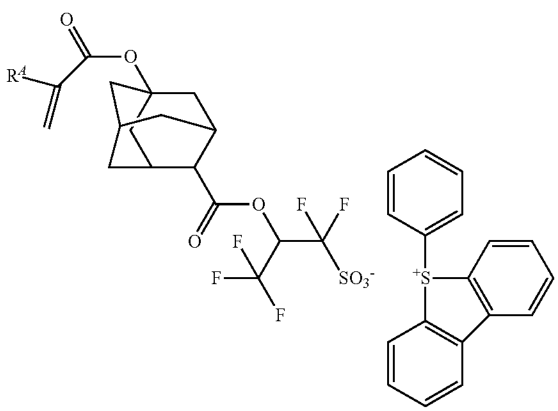
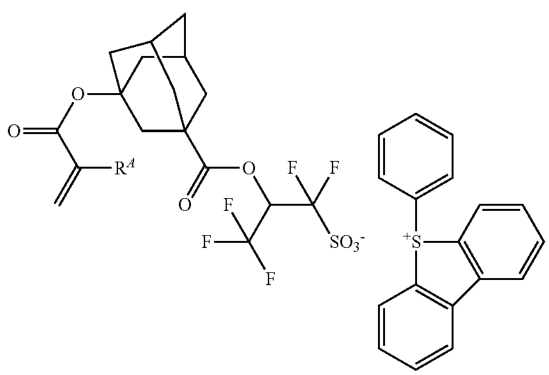
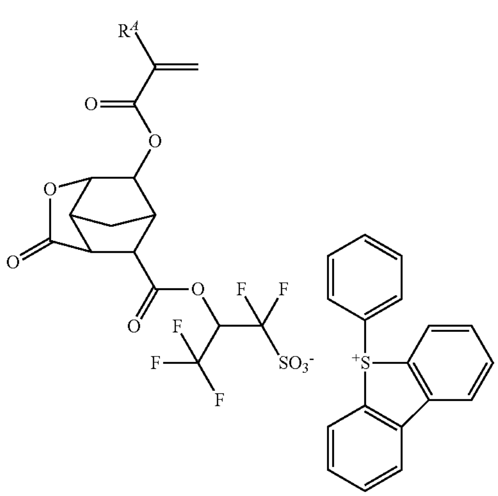
-continued
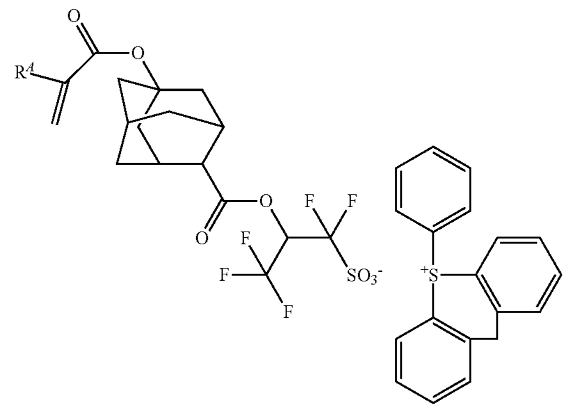
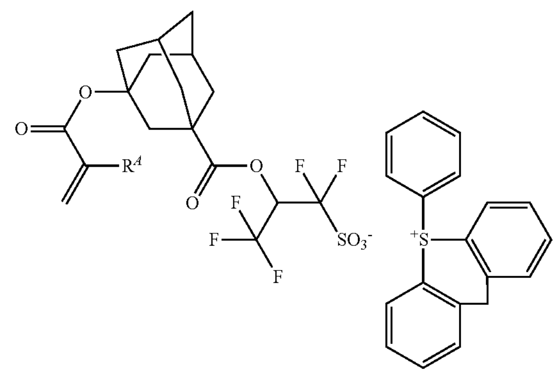
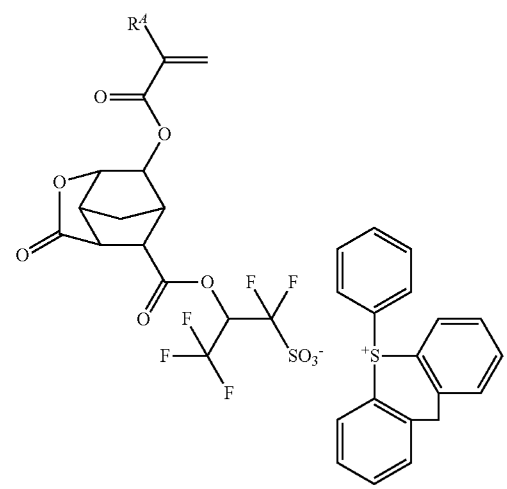
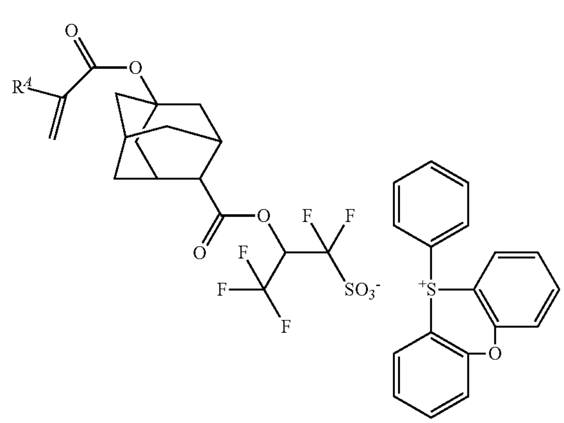

-continued
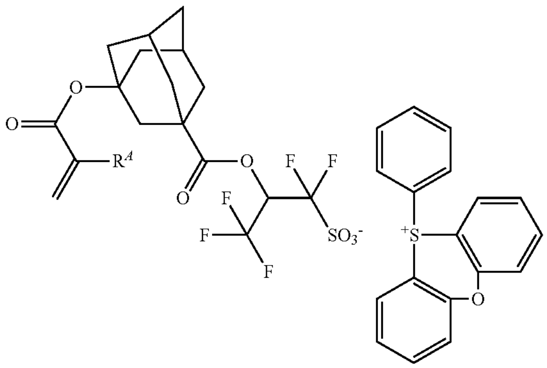
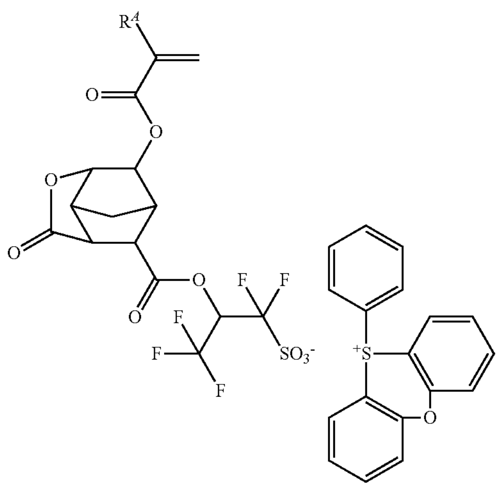
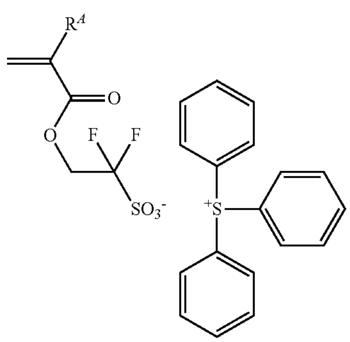
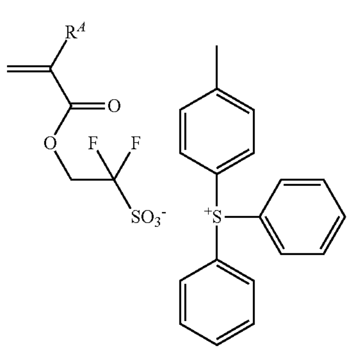
-continued
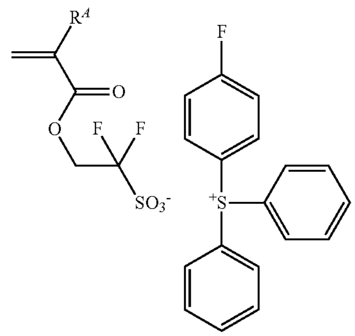
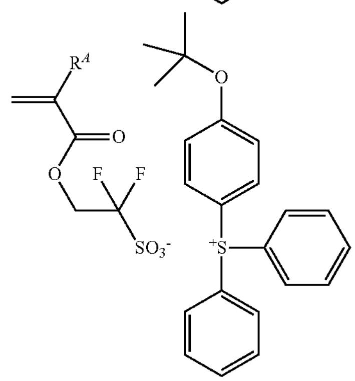
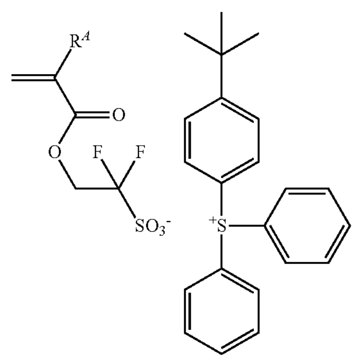
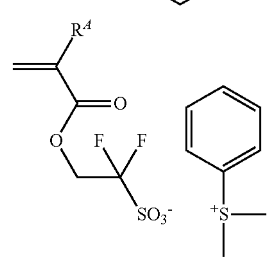
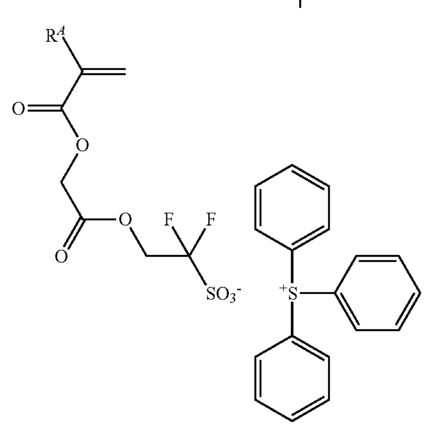

-continued
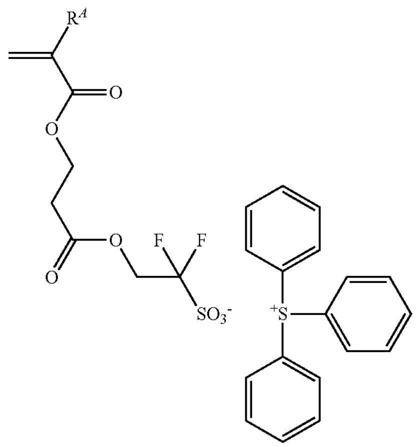
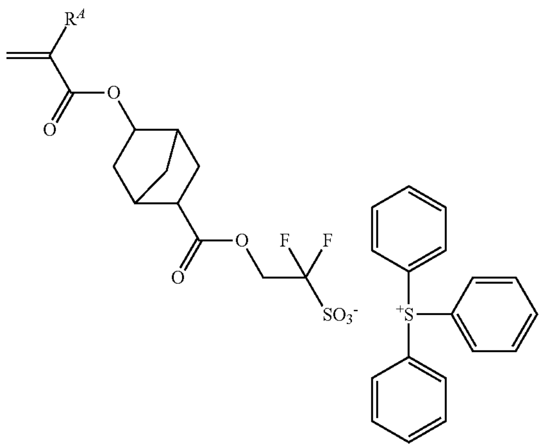
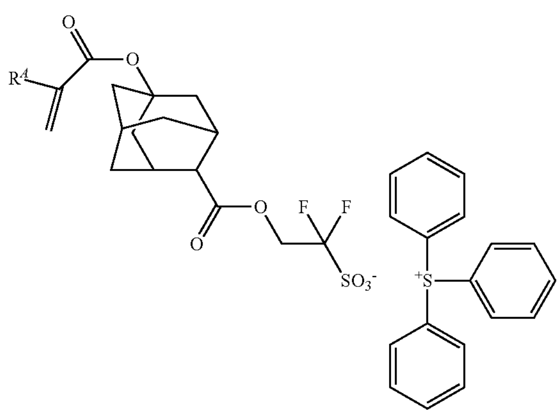
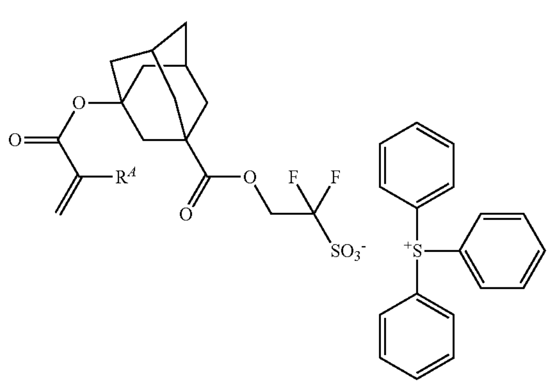
-continued
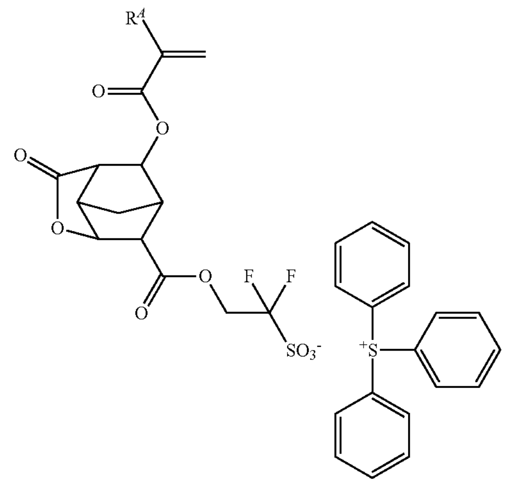
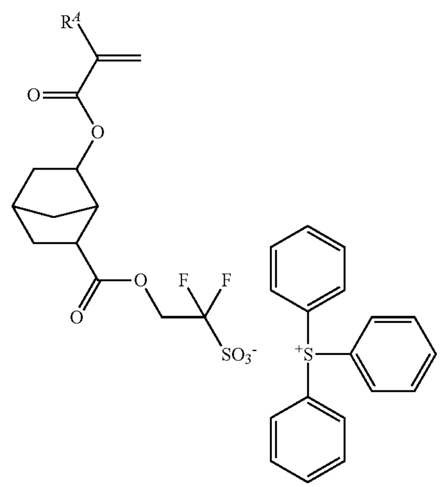
Examples of the monomer from which recurring unit (f3) is derived are shown below, but not limited thereto. $R^A$ is as defined above.
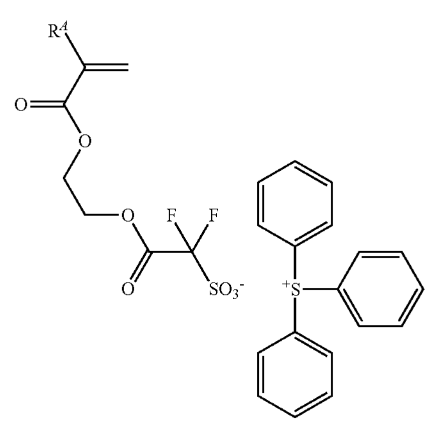

-continued
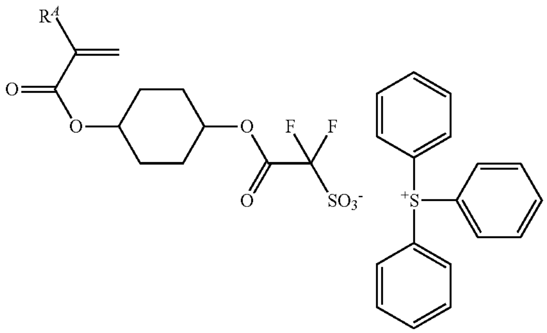
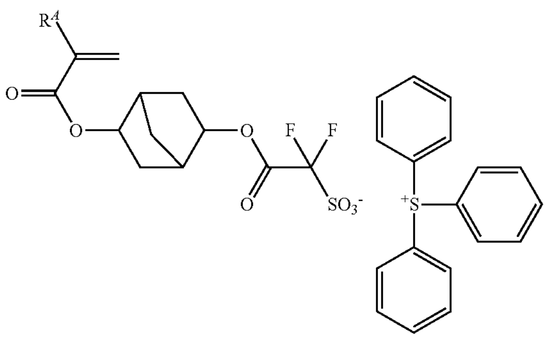
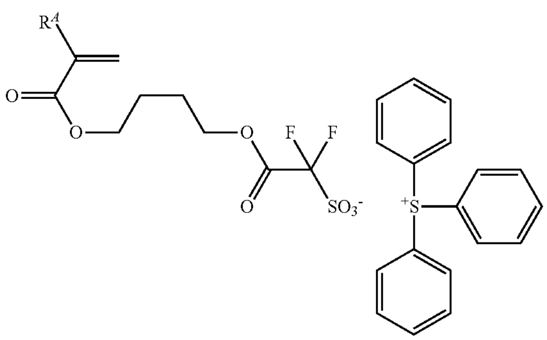
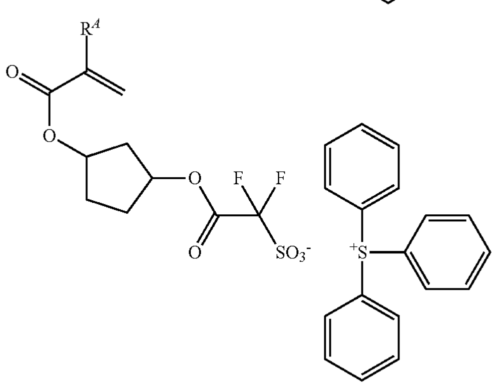
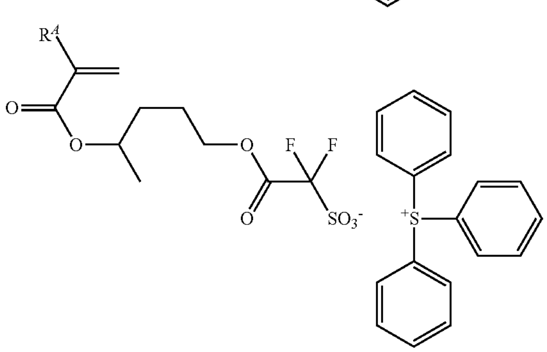
-continued
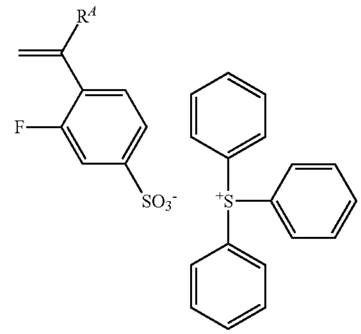
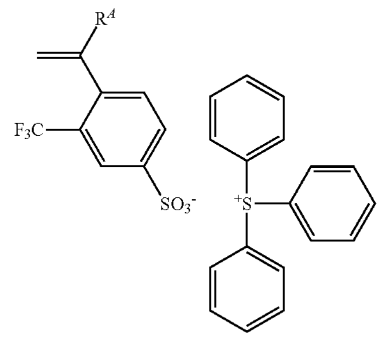
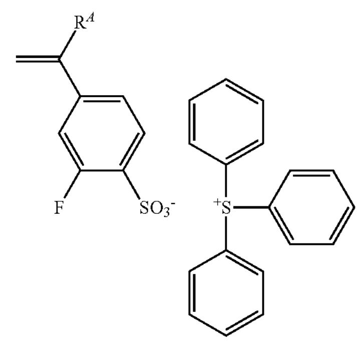
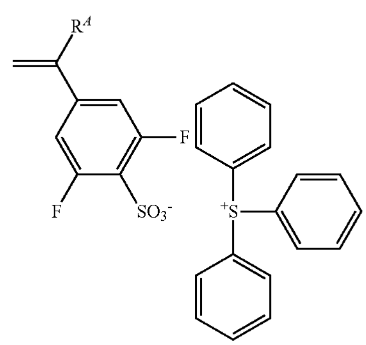
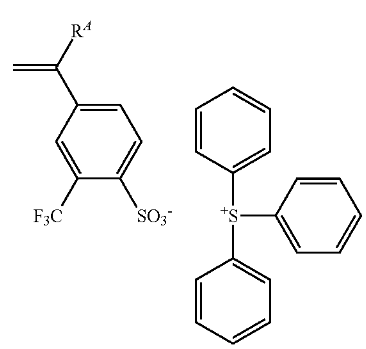

-continued
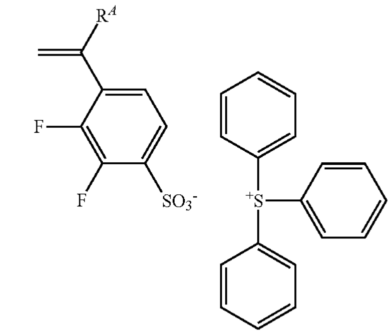
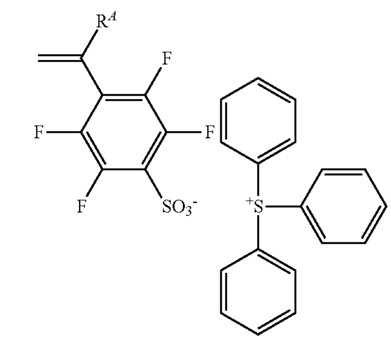
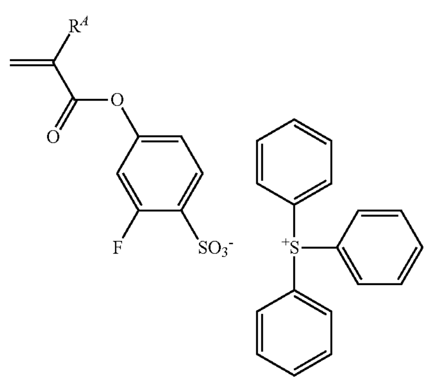
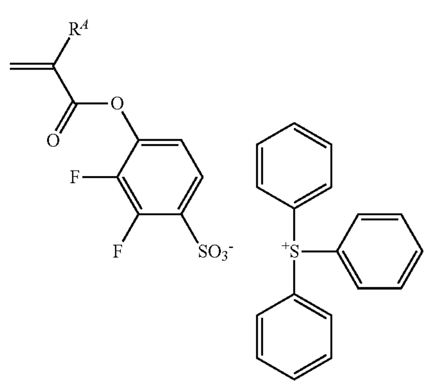
-continued
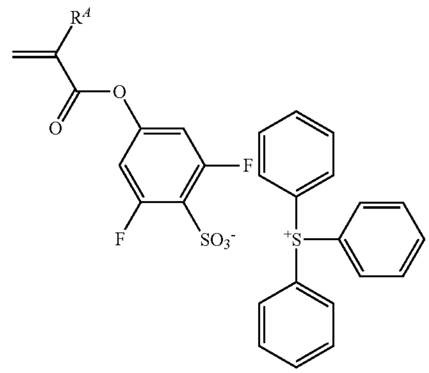
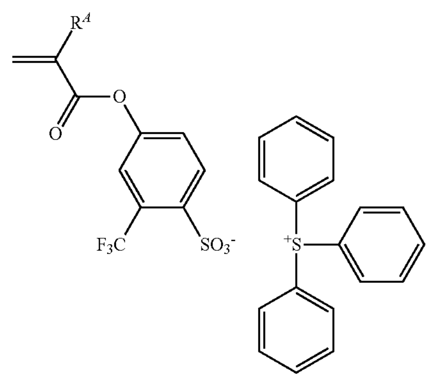
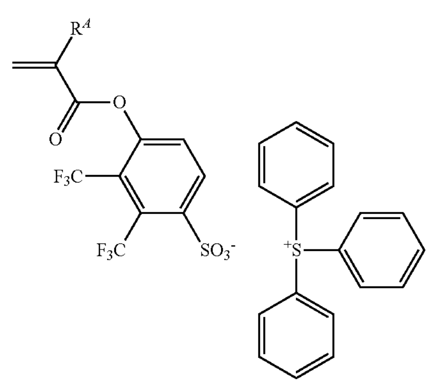
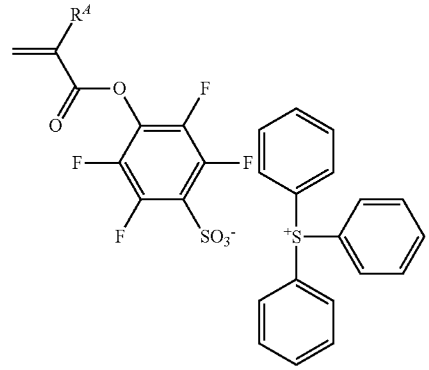

-continued

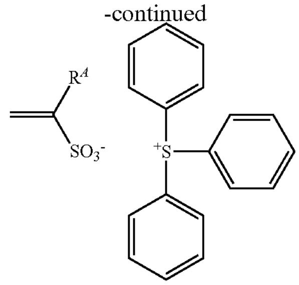

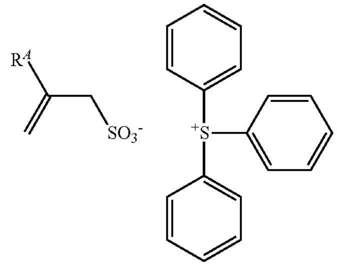

The attachment of an acid generator to the polymer main chain is effective in restraining acid diffusion, thereby preventing a reduction of resolution due to blur by acid diffusion. Also LWR or CDU is improved since the acid generator is uniformly distributed.

A base polymer containing recurring units (f) also functions as an acid generator. In this embodiment wherein the base polymer is integrated with the acid generator, that is, the acid generator is bound to the base polymer, the resist composition may or may not contain an acid generator of addition type.

The base polymer for formulating the positive resist composition comprises recurring units (a1) or (a2) having an acid labile group as essential component and additional recurring units (b), (c), (d), (e), and (f) as optional components. A fraction of units (a1), (a2), (b), (c), (d), (e), and (f) is: preferably $0 \le a1 < 1.0$, $0 \le a2 < 1.0$, $0 < a1+a2 < 1.0$, $0 \le b \le 0.9$, $0 \le c \le 0.9$, $0 \le d \le 0.8$, $0 \le e \le 0.8$, and $0 \le f \le 0.5$; more preferably $0 \le a1 \le 0.9$, $0 \le a2 \le 0.9$, $0.1 \le a1+a2 \le 0.9$, $0 \le b \le 0.8$, $0 \le c \le 0.8$, $0 \le d \le 0.7$, $0 \le e \le 0.7$, and $0 \le f \le 0.4$; and even more preferably $0 \le a1 \le 0.8$, $0 \le a2 \le 0.8$, $0.1 \le a1+a2 \le 0.8$, $0 \le b \le 0.75$, $0 \le c \le 0.75$, $0 \le d \le 0.6$, $0 \le e \le 0.6$, and $0 \le f \le 0.3$. Where the base polymer also functions as an acid generator, the fraction of recurring unit (f) is preferably $0 < f \le 0.5$, more preferably $0.01 \le f \le 0.4$, even more preferably $0.02 \le f \le 0.3$. Notably, $f=f1+f2+f3$, meaning that unit (f) is at least one of units (f1) to (f3), and $a1+a2+b+c+d+e+f=1.0$.

For the base polymer for formulating the negative resist composition, an acid labile group is not necessarily essential. The base polymer comprises recurring units (b), and optionally recurring units (c), (d), (e), and/or (f). A fraction of these units is: preferably $0 < b \le 1.0$, $0 \le c \le 0.9$, $0 \le d \le 0.8$, $0 \le e \le 0.8$, and $0 \le f \le 0.5$; more preferably $0.2 \le b \le 1.0$, $0 \le c \le 0.8$, $0 \le d \le 0.7$, $0 \le e \le 0.7$, and $0 \le f \le 0.4$; and even more preferably $0.3 \le b \le 1.0$, $0 \le c \le 0.75$, $0 \le d \le 0.6$, $0 \le e \le 0.6$, and $0 \le f \le 0.3$. Where the base polymer also functions as an acid generator, the fraction of recurring unit (f) is preferably $0 \le f \le 0.5$, more preferably $0.01 \le f \le 0.4$, even more preferably $0.02 \le f \le 0.3$. Notably, $f=f1+f2+f3$, meaning that unit (f) is at least one of units (f1) to (f3), and $b+c+d+e+f=1.0$.

The base polymer may be synthesized by any desired methods, for example, by dissolving one or more monomers selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is preferably 2 to 100 hours, more preferably 5 to 20 hours.

Where a monomer having a hydroxyl group is copolymerized, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes-finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Other Components

With the foregoing components, other components such as an organic solvent, surfactant, dissolution inhibitor, and crosslinker may be blended in any desired combination to formulate a chemically amplified positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs.

Examples of the organic solvent are described in JP-A 2008-111103, paragraphs [0144]-[0145] (U.S. Pat. No. 7,537,880). Exemplary solvents include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Exemplary surfactants are described in JP-A 2008-111103, paragraphs [0165]-[0166]. Inclusion of a surfactant may improve or control the coating characteristics of the resist composition. While the surfactant may be used alone or in admixture, it is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per[100] parts by weight of the base polymer. The dissolution inhibitor may be used alone or in admixture.

Where the inventive resist composition is of negative tone, a negative pattern may be obtained by adding a crosslinker to the composition for reducing the dissolution rate of the resist film in the exposed region. Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker.

Examples of the epoxy compound include tris(2,3-epoxypropyl) isocyanurate, trimethylolmethane triglycidyl ether, trimethylolpropane triglycidyl ether, and tiethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof; and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

To the resist composition, a polymeric additive or water repellency improver may also be added for improving the water repellency on surface of a resist film as spin coated. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. The water repellency improver may be used alone or in admixture. An appropriate amount of the water repellency improver is 0 to 20 parts, more preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

Pattern Forming Process

The resist composition is used in the fabrication of various integrated circuits. Pattern formation using the resist composition may be performed by well-known lithography processes. The process generally involves coating, prebaking, exposure, and development. If necessary, any additional steps may be added.

For example, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.01 to 2 μm thick.

The resist film is then exposed to a desired pattern of high-energy radiation such as UV, deep-UV, EB, EUV, x-ray, soft x-ray, excimer laser light, γ-ray or synchrotron radiation. When UV, deep-UV, EUV, x-ray, soft x-ray, excimer laser light, γ-ray or synchrotron radiation is used as the high-energy radiation, the resist film is exposed thereto through a mask having a desired pattern in a dose of preferably about 1 to 200 $mJ/cm^2$, more preferably about 10 to 100 $mJ/cm^2$. When EB is used as the high-energy radiation, the resist film is exposed thereto through a mask having a desired pattern or directly in a dose of preferably about 0.1 to 100 $\mu C/cm^2$, more preferably about 0.5 to 50 $\mu C/cm^2$. It is appreciated that the inventive resist composition is suited in micropatterning using KrF excimer laser, ArF excimer laser, EB, EUV, x-ray, soft x-ray, 7-ray or synchrotron radiation.

After the exposure, the resist film may be baked (PEB) on a hot plate at 60 to 150° C. for 10 seconds to 30 minutes, preferably at 80 to 120° C. for 30 seconds to 20 minutes.

After the exposure or PEB, in the case of positive resist, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonitum hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is to insolubilized and the unexposed area is dissolved in the developer.

In an alternative embodiment, a negative pattern may be formed via organic solvent development. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

Quenchers 1 to 22, Amine compound 1, Carboxylic acid 1 used in resist compositions have the structure shown below. Quenchers 1 to 22 were prepared by neutralization reaction of an ammonium hydroxide or amine compound providing the cation shown below with an iodized or brominated aromatic ring-bearing carboxylic acid providing the anion shown below.
Quencher 1
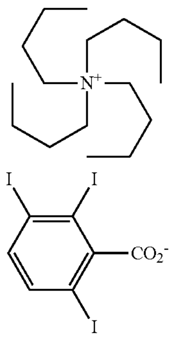
Quencher 2
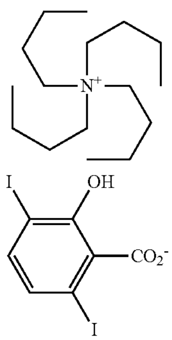
Quencher 3
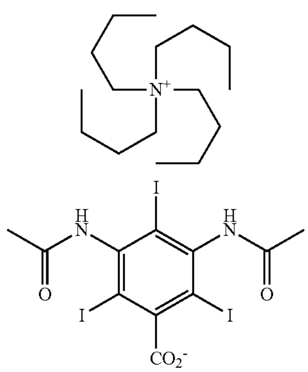
Quencher 4
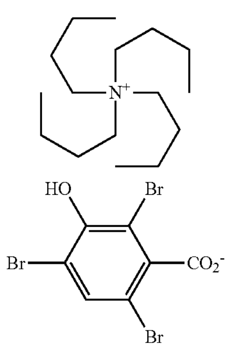
-continued
Quencher 5
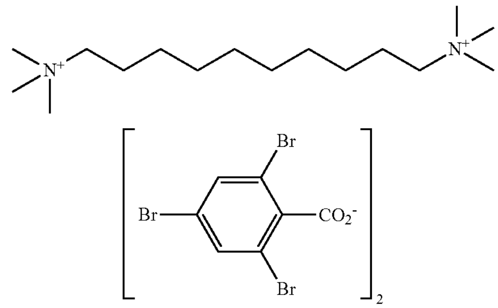
Quencher 6
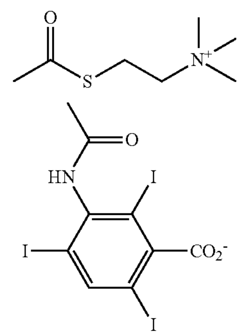
Quencher 7
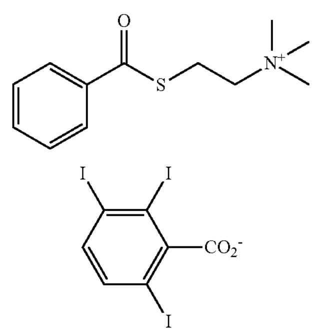
Quencher 8
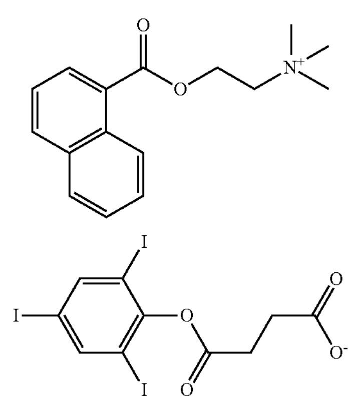

-continued
Quencher 9
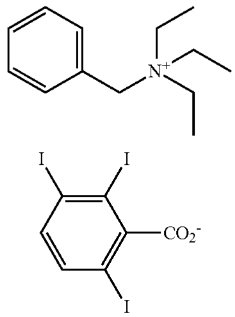
Quencher 10
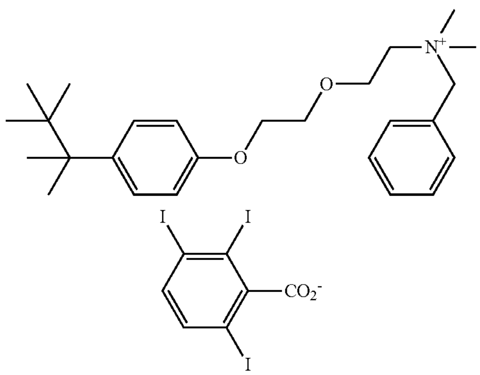
Quencher 11
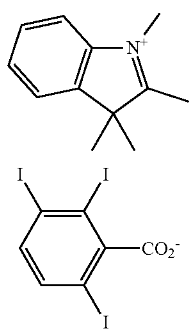
Quencher 12
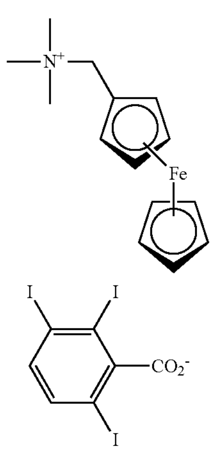
-continued
Quencher 13
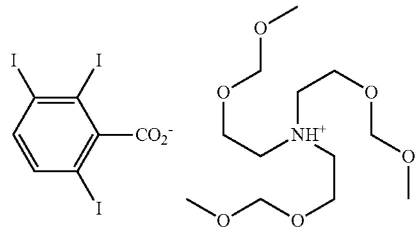
Quencher 14
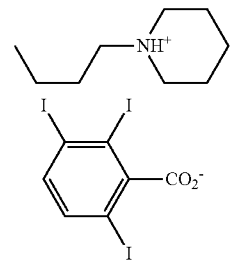
Quencher 15
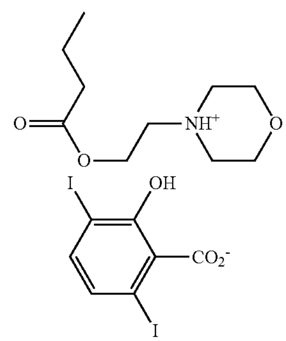
Quencher 16
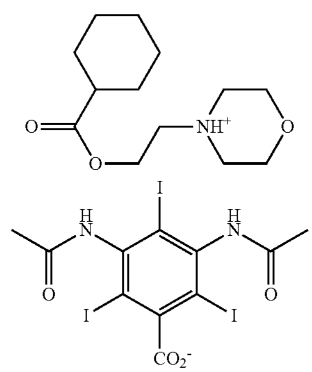
Quencher 17
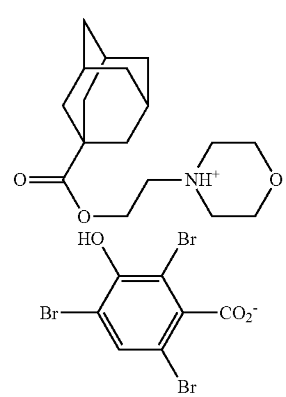

-continued

Quencher 18

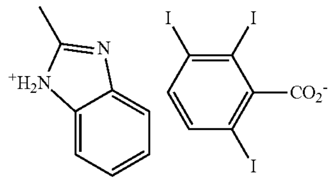

Quencher 19

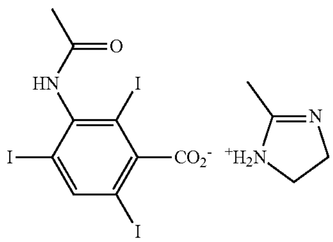

Quencher 20

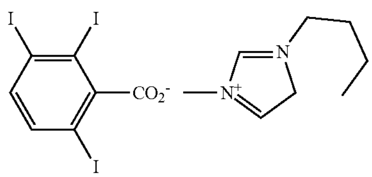

Quencher 21

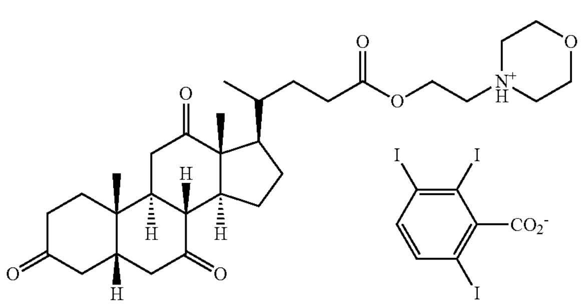

Quencher 22

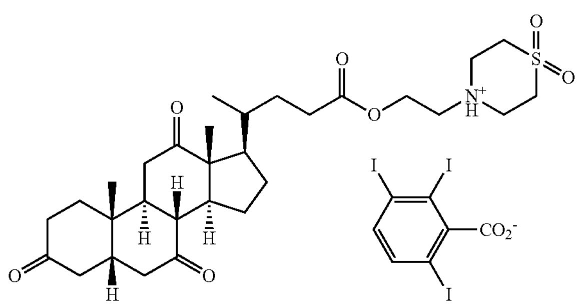

Amine compound 1

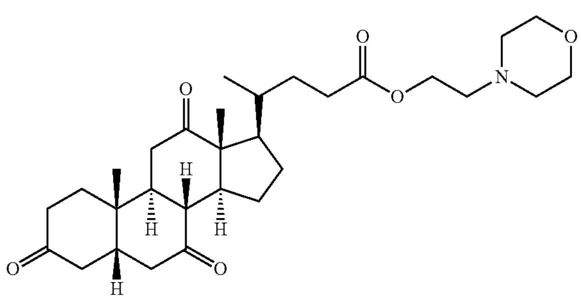

-continued

Carboxylic acid 1

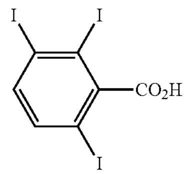

Synthesis Example

Synthesis of Base Polymers (Polymers 1 to 3)

Base polymers were prepared by combining suitable monomers, effecting copolymerization reaction thereof in tetrahydrouran (THF) solvent, pouring the reaction solution into methanol for crystallization, repeatedly washing with hexane, isolation, and drying. The resulting polymers, designated Polymers 1 to 3, were analyzed for composition by $^{1}$H-NMR spectroscopy, and for Mw and Mw/Mn by GPC versus polystyrene standards using THF solvent.

Polymer 1

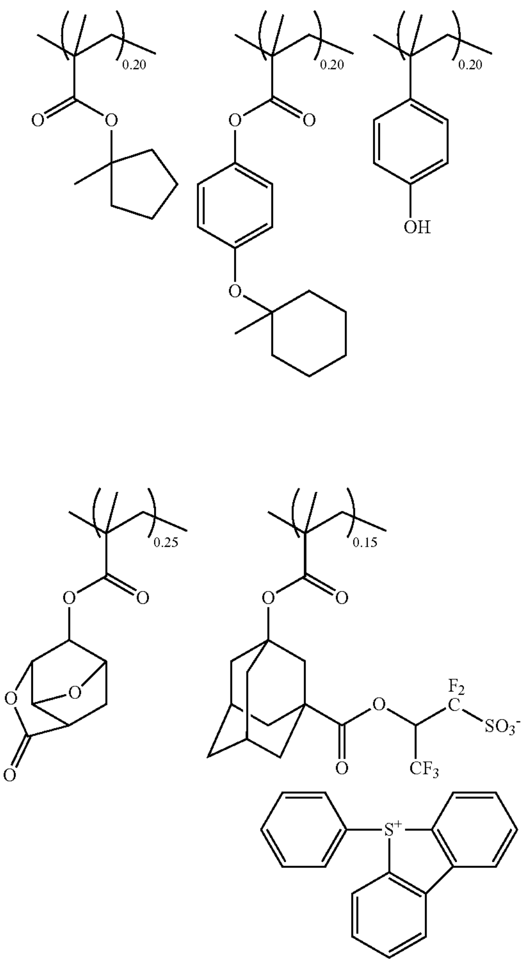

Mw = 7,400
Mw/Mn = 1.71

-continued

Polymer 2

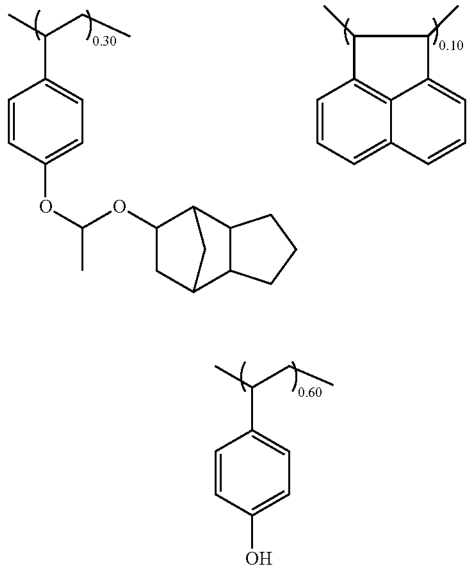

Mw = 5,100
Mw/Mn = 1.46

Polymer 3

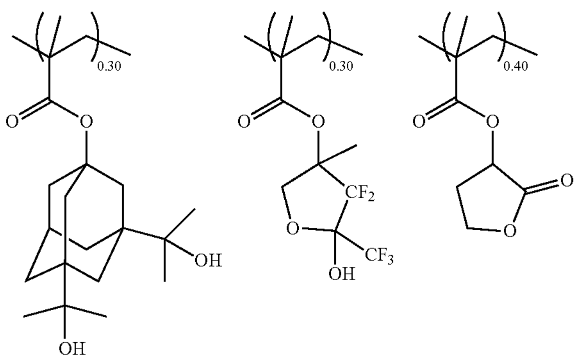

Mw = 8,100
Mw/Mn = 1.65

Examples 1 to 27 and Comparative Examples 1 to 7

Preparation of Resist Compositions

Resist compositions were prepared by dissolving components in a solvent in accordance with the recipe shown in Tables 1 to 3, and filtering through a filter having a pore size of 0.2 μm. The solvent contained 100 ppm of surfactant FC-4430 (3M). The components in Tables 1 to 3 are as identified below.

Base polymers: Polymers 1 to 3 of the above structural formulae

Organic Solvents:

PGMEA (propylene glycol monomethyl ether acetate)

CyH (cyclohexanone)

PGME (propylene glycol monomethyl ether)

Acid generators: PAG 1 to PAG 4 of the following structural formulae

PAG 1

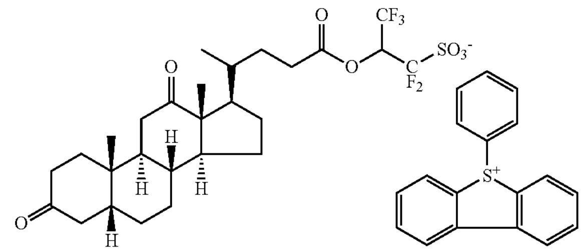

PAG 2

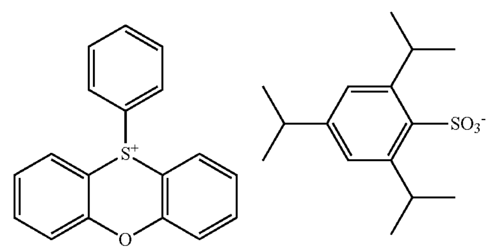

PAG 3

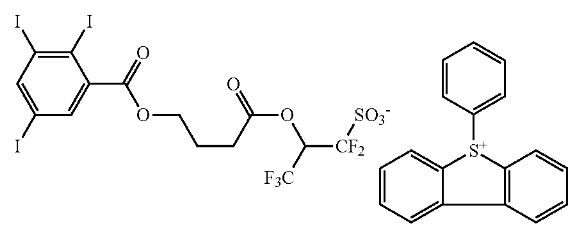

PAG 4

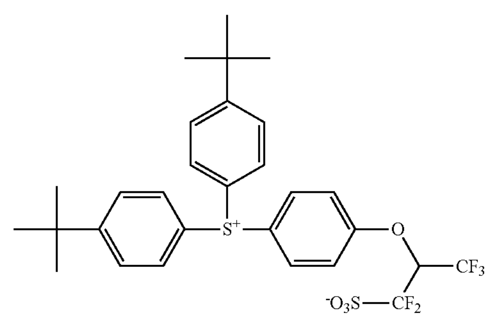

Comparative Quenchers 1 to 5:

Comparative Quencher 1

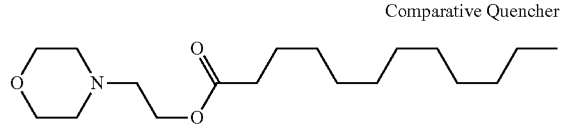

-continued

Comparative Quencher 2

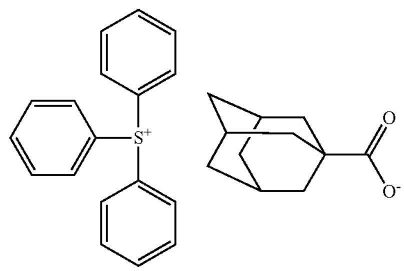

Comparative Quencher 3

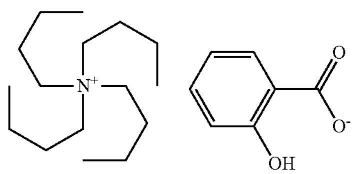

Comparative Quencher 4

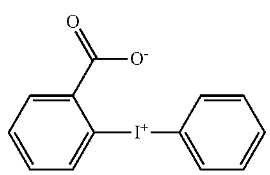

-continued

Comparative Quencher 5

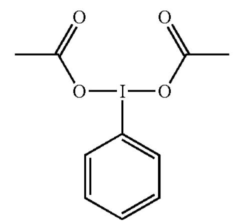

EUV Lithography Test

Each of the resist compositions in Tables 1 to 3 was spin coated on a silicon substrate having a 20-nm coating of silicon-containing spin-on hard mask SHB-A940 (Shin-Etsu Chemical Co., Ltd., silicon content 43 wt %) and prebaked on a hotplate at 105° C. for 60 seconds to form a resist film of 60 nm thick. Using an EUV scanner NXE3300 (ASML, NA 0.33, σ0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Tables 1 to 3 for 60 seconds and developed in a 2.38 wt % TMAH aqueous solution for 30 seconds to form a hole pattern having a size of 23 nm in Examples 1 to 25, 27 and Comparative Examples 1 to 6 or a dot pattern having a size of 23 nm in Example 26 and Comparative Example 7.

The resist pattern was evaluated using CD-SEM (CG-5000, Hitachi High-Technologies Corp.). The exposure dose that provides a hole or dot pattern having a size of 23 nm is reported as sensitivity. The size of 50 holes or dots was measured, from which a size variation (3a) was computed and reported as CDU.

The resist composition is shown in Tables 1 to 3 together with the sensitivity and CDU of EUV lithography.

TABLE 1

| | | Polymer (pbw) | Acid generator (pbw) | Base (pbw) | Organic solvent (pbw) | PEB temp. (° C.) | Sensitivity (mJ/cm²) | CDU (nm) |
|---|---|---|---|---|---|---|---|---|
| Example | 1 | Polymer 1 (100) | — | Quencher 1 (7.41) | PGMEA (400) CyH (2,000) PGME (100) | 80 | 23 | 2.9 |
| | 2 | Polymer 1 (100) | — | Quencher 2 (6.31) | PGMEA (400) CyH (2,000) PGME (100) | 80 | 25 | 2.7 |
| | 3 | Polymer 1 (100) | — | Quencher 3 (8.55) | PGMEA (400) CyH (2,000) PGME (100) | 80 | 22 | 2.3 |
| | 4 | Polymer 1 (100) | — | Quencher 4 (6.15) | PGMEA (400) CyH (2,000) PGME (100) | 80 | 26 | 2.8 |
| | 5 | Polymer 1 (100) | — | Quencher 5 (5.00) | PGMEA (400) CyH (2,000) PGME (100) | 80 | 22 | 2.8 |
| | 6 | Polymer 1 (100) | — | Quencher 6 (7.17) | PGMEA (400) CyH (2,000) PGME (100) | 80 | 26 | 2.5 |
| | 7 | Polymer 1 (100) | — | Quencher 7 (7.23) | PGMEA (400) CyH (2,000) PGME (100) | 80 | 26 | 2.6 |
| | 8 | Polymer 1 (100) | — | Quencher 8 (8.29) | PGMEA (400) CyH (2,000) PGME (100) | 80 | 25 | 2.8 |
| | 9 | Polymer 1 (100) | — | Quencher 9 (6.90) | PGMEA (400) CyH (2,000) PGME (100) | 80 | 22 | 2.3 |
| | 10 | Polymer 1 (100) | — | Quencher 10 (8.99) | PGMEA (400) CyH (2,000) PGME (100) | 80 | 24 | 2.5 |

TABLE 1-continued

| | | Polymer (pbw) | Acid generator (pbw) | Base (pbw) | Organic solvent (pbw) | PEB temp. (° C.) | Sensitivity (mJ/cm$^2$) | CDU (nm) |
|---|---|---|---|---|---|---|---|---|
| | 11 | Polymer 1 (100) | — | Quencher 11 (6.73) | PGMEA (400) CyH (2,000) PGME (100) | 80 | 22 | 2.9 |
| | 12 | Polymer 1 (100) | — | Quencher 12 (7.86) | PGMEA (400) CyH (2,000) PGME (100) | 80 | 20 | 2.8 |
| | 13 | Polymer 1 (100) | — | Quencher 13 (7.81) | PGMEA (400) CyH (2,000) PGME (100) | 80 | 25 | 2.3 |
| | 14 | Polymer 1 (100) | — | Quencher 14 (6.40) | PGMEA (400) CyH (2,000) PGME (100) | 80 | 26 | 2.7 |

TABLE 2

| | | Polymer (pbw) | Acid generator (pbw) | Base (pbw) | Organic solvent (pbw) | PEB temp. (° C.) | Sensitivity (mJ/cm$^2$) | CDU (nm) |
|---|---|---|---|---|---|---|---|---|
| Example | 15 | Polymer 1 (100) | — | Quencher 15 (5.90) | PGMEA (400) CyH (2,000) PGME (100) | 80 | 26 | 2.3 |
| | 16 | Polymer 1 (100) | — | Quencher 16 (8.54) | PGMEA (400) CyH (2,000) PGME (100) | 80 | 22 | 2.7 |
| | 17 | Polymer 1 (100) | — | Quencher 17 (6.64) | PGMEA (400) CyH (2,000) PGME (100) | 80 | 28 | 2.7 |
| | 18 | Polymer 1 (100) | — | Quencher 18 (6.31) | PGMEA (400) CyH (2,000) PGME (100) | 80 | 22 | 2.8 |
| | 19 | Polymer 1 (100) | — | Quencher 19 (6.40) | PGMEA (400) CyH (2,000) PGME (100) | 80 | 21 | 2.8 |
| | 20 | Polymer 1 (100) | — | Quencher 20 (6.40) | PGMEA (400) CyH (2,000) PGME (100) | 80 | 22 | 2.8 |
| | 21 | Polymer 1 (100) | — | Quencher 21 (10.16) | PGMEA (400) CyH (2,000) PGME (100) | 80 | 26 | 2.1 |
| | 22 | Polymer 1 (100) | — | Quencher 22 (10.65) | PGMEA (400) CyH (2,000) PGME (100) | 80 | 27 | 2.2 |
| | 23 | Polymer 1 (100) | PAG 1 (7) | Quencher 21 (10.16) | PGMEA (400) CyH (2,000) PGME (100) | 80 | 20 | 2.6 |
| | 24 | Polymer 1 (100) | PAG 3 (8) | Quencher 22 (10.65) | PGMEA (400) CyH (2,000) PGME (100) | 80 | 18 | 2.4 |
| | 25 | Polymer 2 (100) | PAG 2 (10) | Quencher 1 (7.41) | PGMEA (2,000) CyH (500) | 90 | 27 | 2.8 |
| | 26 | Polymer 3 (100) | PAG 4 (10) | Quencher 1 (7.41) | PGMEA (2,000) CyH (500) | 120 | 28 | 3.2 |
| | 27 | Polymer 1 (100) | — | Amine compound 1 (5.15) Carboxylic acid 1 (5.00) | PGMEA (400) CyH (2,000) PGME (100) | 80 | 28 | 2.3 |

TABLE 3

| | | Polymer (pbw) | Acid generator (pbw) | Base (pbw) | Organic solvent (pbw) | PEB temp. (° C.) | Sensitivity (mJ/cm$^2$) | CDU (nm) |
|---|---|---|---|---|---|---|---|---|
| Comparative Example | 1 | Polymer 1 (100) | — | Comparative Quencher 1 (2.50) | PGMEA (400) CyH (2,000) PGME (100) | 100 | 28 | 3.5 |
| | 2 | Polymer 1 (100) | — | Comparative Quencher 2 (4.42) | PGMEA (400) CyH (2,000) PGME (100) | 100 | 28 | 3.2 |
| | 3 | Polymer 1 (100) | — | Comparative Quencher 3 (3.63) Carboxylic acid 1 (5.00) | PGMEA (400) CyH (2,000) PGME (100) | 100 | 24 | 2.9 |
| | 4 | Polymer 1 (100) | — | Comparative Quencher 4 (3.23) | PGMEA (400) CyH (2,000) PGME (100) | 100 | 28 | 2.8 |
| | 5 | Polymer 1 (100) | — | Comparative Quencher 5 (3.20) | PGMEA (400) CyH (2,000) PGME (100) | 100 | 38 | 3.0 |
| | 6 | Polymer 2 (100) | PAG 2 (10) | Comparative Quencher 1 (2.50) | PGMEA (2,000) CyH (500) | 100 | 30 | 3.0 |
| | 7 | Polymer 3 (100) | PAG 1 (10) | Comparative Quencher 1 (2.50) | PGMEA (2,000) CyH (500) | 120 | 30 | 4.9 |

It is demonstrated in Tables 1 to 3 that resist compositions comprising an ammonium salt of an iodized or brominated aromatic ring-bearing carboxylic acid form patterns having a high sensitivity, satisfactory resolution, and reduced values of CDU.

Japanese Patent Application No. 2018-150146 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising a quencher containing an ammonium salt of a carboxylic acid having an iodized or brominated aromatic ring, and an acid generator, where the ammonium salt has the formula (2):

(2)

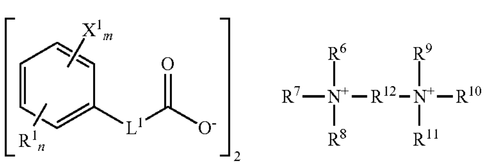

wherein $R^1$ is hydrogen, hydroxyl, fluorine, chlorine, amino, nitro, or cyano group, or a $C_1$-$C_6$ alkyl, $C_1$-$C_6$ alkoxy, $C_2$-$C_6$ acyloxy or $C_1$-$C_6$ alkylsulfonyloxy group, which may be substituted with halogen, or —$NR^{1A}$—C(═O)—$R^{1B}$ or —$NR^{1A}$—C(═O)—O—$R^{1B}$, wherein $R^{1A}$ is hydrogen or a $C_1$-$C_6$ alkyl group, $R^{1B}$ is a $C_1$-$C_6$ alkyl or $C_2$-$C_8$ alkenyl group, $R^6$ to $R^{11}$ are each independently hydrogen or a $C_1$-$C_{24}$ monovalent hydrocarbon group which may contain a halogen, hydroxyl, carboxyl, ether bond, ester bond, thioether bond, thioester bond, thionoester bond, dithioester bond, amino, nitro, sulfone or ferrocenyl moiety, $R^{12}$ is a $C_2$-$C_{12}$ alkanediyl group which may contain an ether bond, ester bond, carboxy moiety, thioester bond, thionoester bond or dithioester bond, $X^1$ is iodine or bromine, and may be the same or different when m is at least 2, $L^1$ is a single bond or a $C_1$-$C_{20}$ divalent linking group which may contain an ether bond, carbonyl moiety, ester bond, amide bond, sultone ring, lactam ring, carbonate bond, halogen, hydroxyl or carboxyl moiety, m and n each are an integer, meeting $1 \le m \le 5$, $0 \le n \le 3$, and $1 \le m+n \le 5$.

2. The resist composition of claim 1 wherein the acid generator is capable of generating sulfonic acid, imidic acid or methide acid.

3. The resist composition of claim 1, further comprising a base polymer.

4. The resist composition of claim 3 wherein the base polymer comprises recurring units having the formula (a1) or recurring units having the formula (a2):

(a1)

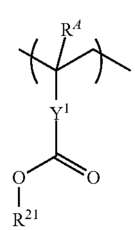

-continued (a2)

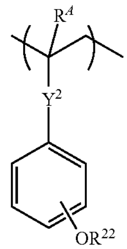

wherein $R^A$ is each independently hydrogen or methyl, $R^{21}$ and $R^{22}$ are each independently an acid labile group, $Y^1$ is a single bond, phenylene, naphthylene, or a $C_1$-$C_{12}$ linking group containing an ester bond and/or lactone ring, and $Y^2$ is a single bond or ester bond.

5. The resist composition of claim 4 which is a chemically amplified positive resist composition.

6. The resist composition of claim 3 wherein the base polymer is an acid labile group-free polymer.

7. The resist composition of claim 6 which is a chemically amplified negative resist composition.

8. The resist composition of claim 1, further comprising an organic solvent.

9. The resist composition of claim 1, further comprising a surfactant.

10. A chemically amplified resist composition comprising a quencher containing an ammonium salt of a carboxylic acid having an iodized or brominated aromatic ring, an acid generator, and a base polymer, wherein the base polymer comprises recurring units of at least one type selected from recurring units having the formulae (f1) to (f3):

(f1)

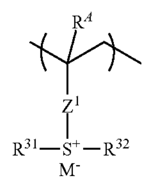

(f2)

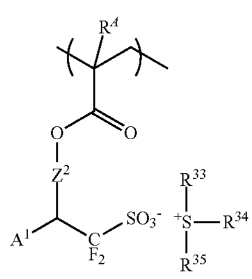

(f3)

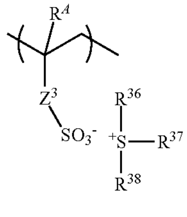

wherein $R^A$ is each independently hydrogen or methyl, $Z^1$ is a single bond phenylene —O—$Z^{11}$—, —C(═O)—O—$Z^{11}$—, or —C(═O)—NH—$Z^{11}$—, $Z^{11}$, is a $C_1$-$C_6$ alkanediyl group, $C_2$-$C_6$ alkenediyl group or phenylene group, which may contain a carbonyl moiety, ester bond, ether bond or hydroxyl moiety, $Z^2$ is a single bond, —$Z^{21}$—C(═O)—O—, —$Z^{21}$—O—, or —$Z^{21}$—O—C(═O)—, —$Z^{21}$ is a $C_1$-$C_{12}$ alkanediyl group which may contain a carbonyl moiety, ester bond or ether bond, $Z^3$ is a single bond, methylene, ethylene, phenylene, fluorinated phenylene, —O—$Z^{31}$—, —C(═O)—O—$Z^{31}$—, or —C(═O)—NH—$Z^{31}$—, $Z^{31}$ is a $C_1$-$C_6$ alkanediyl group, $C_2$-$C_6$ alkenediyl group, phenylene, fluorinated phenylene, or trifluoromethyl-substituted phenylene group, which may contain a carbonyl moiety, ester bond, ether bond or hydroxyl moiety, $R^{31}$ to $R^{38}$ are each independently a $C_1$-$C_{20}$ monovalent hydrocarbon group which may contain a heteroatom, any two of $R^{33}$, $R^{34}$ and $R^{35}$ or any two of $R^{36}$, $R^{37}$ and $R^{38}$ may bond together to form a ring with the sulfur atom to which they are attached, $A^1$ is hydrogen or trifluoromethyl, and $M^-$ is a non-nucleophilic counter ion.

11. The resist composition of claim 10 wherein the ammonium salt has the formula (1) or (2):

(1)

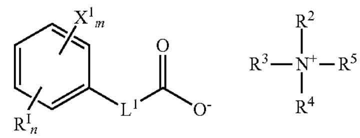

(2)

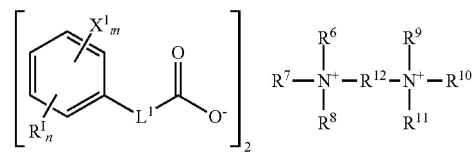

wherein $R^1$ is hydrogen, hydroxyl, fluorine, chlorine, amino, nitro, or cyano group, or a $C_1$-$C_6$ alkyl, $C_1$-$C_6$ alkoxy, $C_2$-$C_6$ acyloxy or $C_1$-$C_6$ alkylsulfonyloxy group, which may be substituted with halogen, or —$NR^{1A}$—C(═O)—$R^{1B}$ or —$NR^{1A}$—C(═O)—O—$R^{1B}$, wherein $R^{1A}$ is hydrogen or a $C_1$-$C_6$ alkyl group, $R^{1B}$ is a $C_1$-$C_6$ alkyl or $C_2$-$C_8$ alkenyl group, $R^2$ to $R^{11}$ are each independently hydrogen or a $C_1$-$C_{24}$ monovalent hydrocarbon group which may contain a halogen, hydroxyl, carboxyl, ether bond, ester bond, thioether bond, thioester bond, thionoester bond, dithioester bond, amino, nitro, sulfone or ferrocenyl moiety, at least two of $R^2$ to $R^5$ may bond together to form a ring, $R^2$ and $R^3$, taken together, may form ═C($R^{2A}$)($R^{3A}$), wherein $R^{2A}$ and $R^{3A}$ are each independently hydrogen or a $C_1$-$C_{16}$ monovalent hydrocarbon group, $R^{2A}$ and $R^4$ may bond together to form a ring with the carbon and nitrogen atoms to which they are attached, the ring optionally containing a double bond, oxygen, sulfur or nitrogen atom, $R^{12}$ is a $C_2$-$C_{12}$ alkanediyl group which may contain an ether bond, ester bond, carboxy moiety, thioester bond, thionoester bond or dithioester bond, $X^1$ is iodine or bromine, and may be the same or different when m is at least 2, $L^1$ is a single bond or a $C_1$-$C_{20}$ divalent linking group which may contain an ether bond, carbonyl moiety, ester bond, amide bond, sultone ring, lactam ring, carbonate bond, halogen, hydroxyl or carboxyl moiety, m and n each are an integer, meeting $1 \le m \le 5, 0 \le n \le 3$, and $1 \le m+n \le 5$.

12. A chemically amplified resist composition comprising a quencher containing an ammonium salt of a carboxylic acid having an iodized or brominated aromatic ring and an acid generator, wherein the acid generator also functions as a base polymer.

13. The resist composition of claim 12 wherein the acid generator is a polymer comprising recurring units of at least one type selected from recurring units having the formulae (f1) to (f3):

(f1)

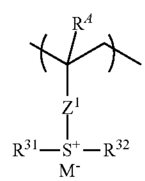

(f2)

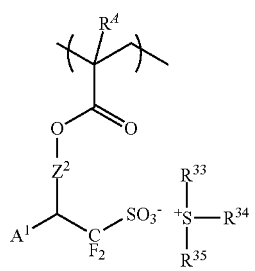

(f3)

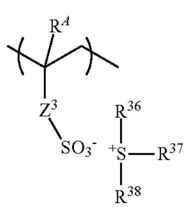

wherein $R^A$ is each independently hydrogen or methyl, $Z^1$ is a single bond, phenylene, —O—$Z^{11}$—, —C(═O)—O—$Z^{11}$—, or —C(═O)—NH—$Z^{11}$—, $Z^{11}$ is a $C_1$-$C_6$ alkanediyl group, $C_2$-$C_6$ alkenediyl group or phenylene group, which may contain a carbonyl moiety, ester bond, ether bond or hydroxyl moiety, $Z^2$ is a single bond, —$Z^{21}$—C(═O)—O—, —$Z^{21}$-O—, or —$Z^{21}$-O—C(═O)—, $Z^{21}$ is a $C_1$-$C_{12}$ alkanediyl group which may contain a carbonyl moiety, ester bond or ether bond, $Z^3$ is a single bond, methylene, ethylene, phenylene, fluorinated phenylene, —O—$Z^{31}$—, —C(═O)—O—$Z^{31}$—, or —C(═O)—NH—$Z^{31}$—, $Z^{31}$ is a $C_1$-$C_6$ alkanediyl group, $C_2$-$C_6$ alkenediyl group, phenylene, fluorinated phenylene, or trifluoromethyl-substituted phenylene group, which may contain a carbonyl moiety, ester bond, ether bond or hydroxyl moiety, $R^{31}$ to $R^{38}$ are each independently a $C_1$-$C_{20}$ monovalent hydrocarbon group which may contain a heteroatom, any two of $R^{33}$, $R^{34}$ and $R^{35}$ or any two of $R^{36}$, $R^{37}$ and $R^{38}$ may bond together to form a ring with the sulfur atom to which they are attached, $A^1$ is hydrogen or trifluoromethyl, and $M^-$ is a non-nucleophilic counter ion.

14. The resist composition of claim 12 wherein the ammonium salt has the formula (1) or (2):

(1)

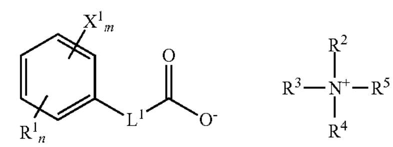

(2)

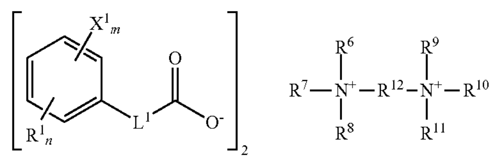

wherein $R^1$ is hydrogen, hydroxyl, fluorine, chlorine, amino, nitro, or cyano group, or a $C_1$-$C_6$ alkyl, $C_1$-$C_6$ alkoxy, $C_2$-$C_6$ acyloxy or $C_1$-$C_6$ alkylsulfonyloxy group, which may be substituted with halogen, or —$NR^{1A}$—C(═O)—$R^{1B}$ or —$NR^{1A}$—C(═O)—O—$R^{1B}$, wherein $R^{1A}$ is hydrogen or a $C_1$-$C_6$ alkyl group, $R^{1B}$ is a $C_1$-$C_6$ alkyl or $C_2$-$C_8$ alkenyl group, $R^2$ to $R^{11}$ are each independently hydrogen or a $C_1$-$C_{24}$ monovalent hydrocarbon group which may contain a halogen, hydroxyl, carboxyl, ether bond, ester bond, thioether bond, thioester bond, thionoester bond, dithioester bond, amino, nitro, sulfone or ferrocenyl moiety, at least two of $R^2$ to $R^5$ may bond together to form a ring, $R^2$ and $R^3$, taken together, may form ═C($R^{2A}$)($R^{3A}$), wherein $R^{2A}$ and $R^{3A}$ are each independently hydrogen or a $C_1$-$C_{16}$ monovalent hydrocarbon group, $R^{2A}$ and $R^4$ may bond together to form a ring with the carbon and nitrogen atoms to which they are attached, the ring optionally containing a double bond, oxygen, sulfur or nitrogen atom, $R^{12}$ is a $C_2$-$C_{12}$ alkanediyl group which may contain an ether bond, ester bond, carboxy moiety, thioester bond, thionoester bond or dithioester bond, $X^1$ is iodine or bromine, and may be the same or different when m is at least 2, $L^1$ is a single bond or a Ci-Cao divalent linking group which may contain an ether bond, carbonyl moiety, ester bond, amide bond, sultone ring, lactam ring, carbonate bond, halogen, hydroxyl or carboxyl moiety, m and n each are an integer, meeting $1 \le m \le 5, 0 \le n \le 3$, and $1 \le m+n \le 5$.

15. A pattern forming process comprising the steps of coating the resist composition of claim 1 onto a substrate, baking, exposing the resulting resist film to high-energy radiation, and developing the exposed resist film in a developer.

16. The process of claim 14 wherein the high-energy radiation is ArF excimer laser of wavelength 193 nm or KrF excimer laser of wavelength 248 nm.

17. The process of claim 14 wherein the high-energy radiation is EB or EUV of wavelength 3 to 15 nm.

* * * * *